(12) United States Patent
Tanimoto et al.

(10) Patent No.: US 8,799,838 B2
(45) Date of Patent: Aug. 5, 2014

(54) EQUIVALENCE CHECKING METHOD, EQUIVALENCE CHECKING PROGRAM, AND EQUIVALENCE CHECKING DEVICE

(71) Applicant: Renesas Electronics Corporation, Kanagawa (JP)

(72) Inventors: Tadaaki Tanimoto, Kanagawa (JP); Shintaro Imamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/769,892

(22) Filed: Feb. 19, 2013

(65) Prior Publication Data
US 2013/0227505 A1 Aug. 29, 2013

(30) Foreign Application Priority Data
Feb. 24, 2012 (JP) ................................. 2012-038393

(51) Int. Cl.
*G06F 17/50* (2006.01)

(52) U.S. Cl.
CPC .................................. *G06F 17/504* (2013.01)
USPC ........................................................ 716/107

(58) Field of Classification Search
None
See application file for complete search history.

(56) References Cited

U.S. PATENT DOCUMENTS

| | | | | |
|---|---|---|---|---|
| 6,745,160 B1 * | 6/2004 | Gupta et al. | ..................... | 703/14 |
| 7,124,070 B2 * | 10/2006 | Takenaka | ..................... | 703/14 |
| 7,383,166 B2 * | 6/2008 | Ashar et al. | ..................... | 703/14 |
| 7,523,029 B2 * | 4/2009 | Takenaka | ..................... | 703/14 |
| 7,647,570 B2 | 1/2010 | Kitai | | |

FOREIGN PATENT DOCUMENTS

| | | |
|---|---|---|
| JP | 2004-38617 A | 2/2004 |
| JP | 2007-265175 A | 10/2007 |
| JP | 2008-090865 A | 4/2008 |

* cited by examiner

*Primary Examiner* — Leigh Garbowski
(74) *Attorney, Agent, or Firm* — Mattingly & Malur, PC

(57) ABSTRACT

Specific characteristics of a branch structure between a behavioral description and a hardware description, a structural dependence relation therebetween, and the like are extracted and used to shorten the time of processing for equivalence checking, thereby contributing to the shortening of a processing time required for equivalence checking for a high-level description and a behavioral synthesis result. Upon checking of the equivalence of a high-level description and a synthesis result obtained by performing a behavior synthesis on the high-level description according to a behavioral synthesis restriction, correspondence information between flip-flops with a feedback loop in the synthesis result and variables associated therewith with a backward data dependence relation in a high-level description is generated and used.

24 Claims, 91 Drawing Sheets

FIG. 7
$$\begin{cases} x=a; \\ y=(b \wedge c) \wedge d; \\ fc=x\wedge y; \end{cases}$$
(EXAMPLE OF HIGH-LEVEL DESCRIPTION)
FIG. 8
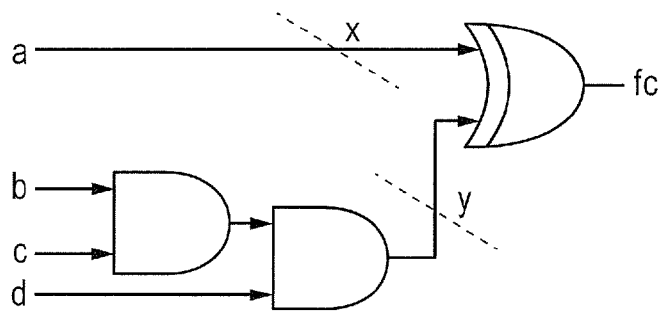
(DATA FLOW CORRESPONDING TO DESCRIPTION)
FIG. 9
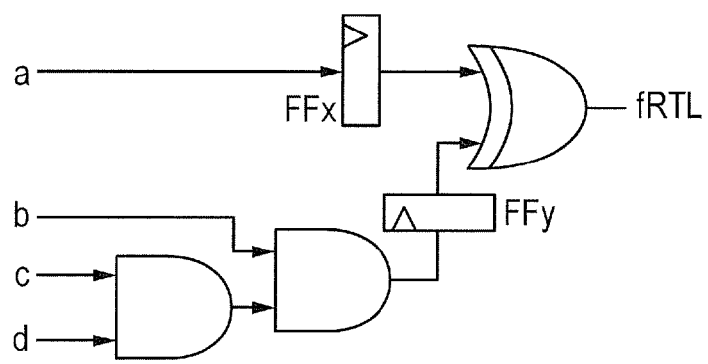
(BEHAVIORAL SYNTHESIS RESULTANT CIRCUIT)

(WHERE SYNTHESIS RESULTANT RTL IS ALWAYS TWO-PROCESS MODEL)

FIG. 12

(EXAMPLE OF TWO-PROCESS RTL DESCRIPTION)

```
always @ (posedge clk or negedge rst) begin
  if(~rst)begin
    state <= S0; x0 <= 0; x1 <= 0; out <= 0;
  end
  else begin
    state <= _state; x0 <= _x0; x1 <= _x1; out <= _out;
  end
end always @ ( * ) begin
  _state = state; _x0 = x0; _x1 = x1; _out = out;
  case(state)
    S0 : begin
        if(c1) begin
           if(d1) begin _x0 = in0; _x1 = in1; end
           if(d2) begin _x0 = in1; _x1 = in0; end
           _state = S1;
        end else begin
           _x0 = 0; _x1 = 0; _out = 0; _state = S1;
        end
      end
    S1 : begin
        if(d1) begin _x0 = x0+1; out = x0+x1; end
        else   begin _x1 = x1+1; out = x0*x1; end
        _state = S1;
      end
  endcase
end
```

(EXAMPLE OF FSMD DESCRIPTION)

| PRESENT STATE | TRANSITION CONDITION | NEXT STATE | EXECUTION CONDITION | EXECUTION STATEMENT |
|---|---|---|---|---|
| S0 | ¬c1 | S0 | – | x0=0;x1=0;out=0; |
| S0 | c1 | S1 | d1 | x0=in0;x1=in1; |
| | | | d2 | x0=in1;x1=in0; |
| S1 | – | S0 | d1 | x0++;out=x0+x1; |
| | | | ¬d1 | x1++;out=x0*x1; |

(EXAMPLE OF STATE TRANSITION TABLE)

FIG. 18

| VARIABLE NAME | BACKWARD DATA DEPENDENCE | LOOP CARRIED DATA DEPENDENCE | FORWARD DATA DEPENDENCE | SUBSTITUTION CONDITION | CLASSIFICATION |
|---|---|---|---|---|---|
| i | ○ | × | ○ | NIL | FEEDBACK |
| a | × | × | ○ | NIL | NO FEEDBACK |
| b[] | × | ○ | ○ | NIL | FEEDBACK |
| c | × | × | ○ | in.read()&0x0001 | FEEDBACK |

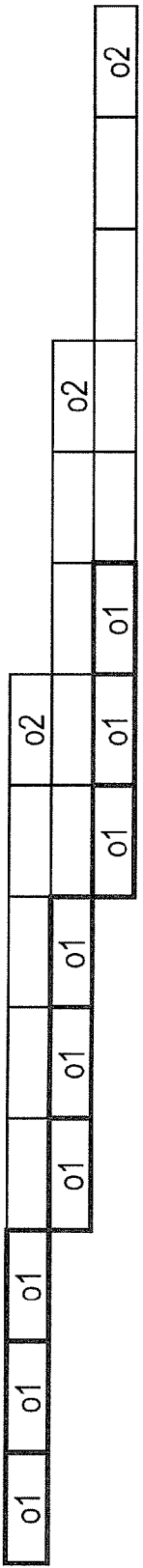
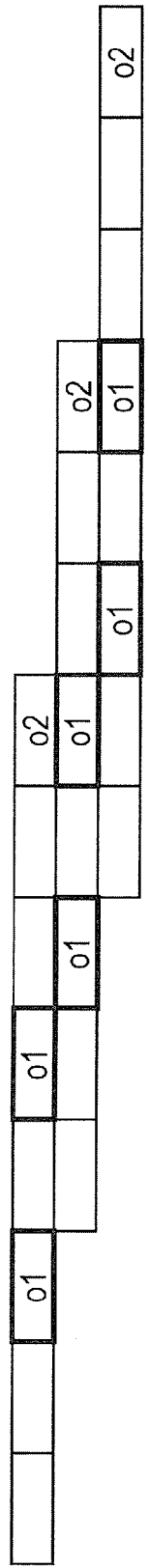
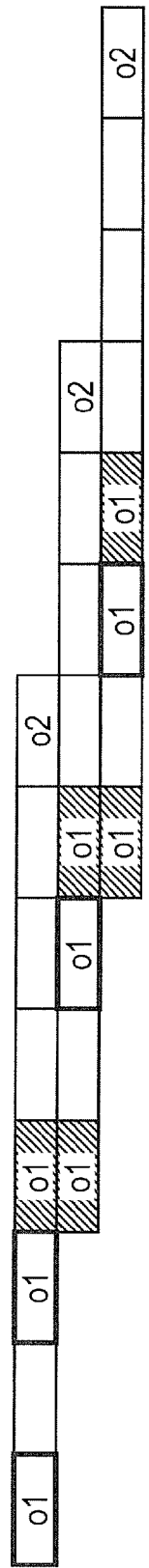

WHERE CONDITION 1) IS SATISFIED

WHERE CONDITION 2) IS SATISFIED

WHERE NEITHER
CONDITION 1) NOR CONDITION 2) ARE SATISFIED

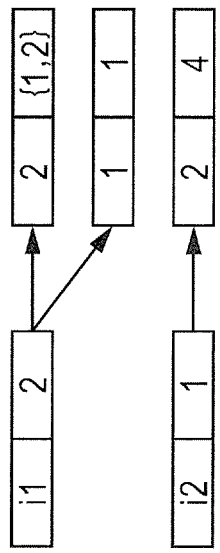
FIG. 31
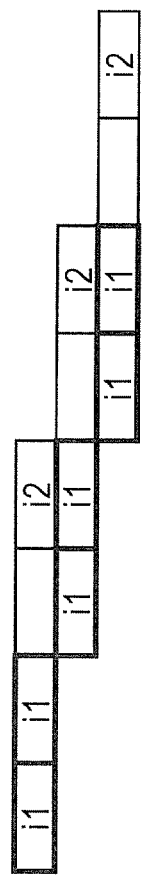
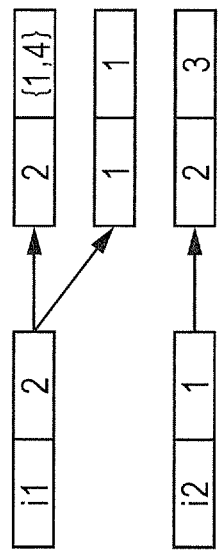
FIG. 32
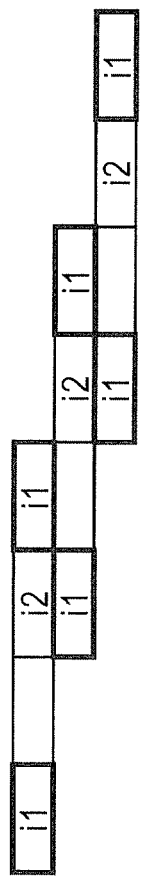

FIG. 33

| OUTPUT SIGNAL NAME | INITIAL Throughput CYCLE VALUE | Throughput CYCLE VALUE | PROPERTY | INPUT SIGNAL NAME | INITIAL Throughput CYCLE VALUE | Throughput CYCLE VALUE | PROPERTY |
|---|---|---|---|---|---|---|---|
| OUTPUT 1 | mo_1 | Mo_1 | A1 | INPUT 1 | mi_1 | Mi_1 | B1 |
| OUTPUT 2 | mo_2 | Mo_2 | A2 | INPUT 2 | mi_2 | Mi_2 | B2 |
| ... | | ... | ... | ... | | ... | ... |
| OUTPUT n | mo_n | Mo_n | An | INPUT m | mi_m | Mi_m | Bm |
| FULL OUTPUT | | To | AT | FULL INPUT | | Ti | BT |

Ai: CONSTANT or NONCONSTANT (i∈{1,2,...,n,T})

Ai: CONSTANT or NONCONSTANT (i∈{1,2,...,m,T})

FIG. 34
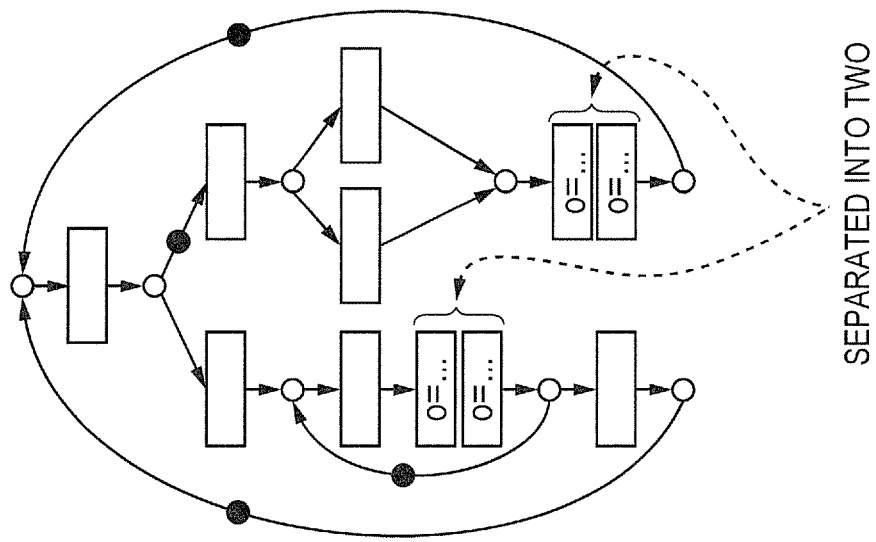
SEPARATED INTO TWO
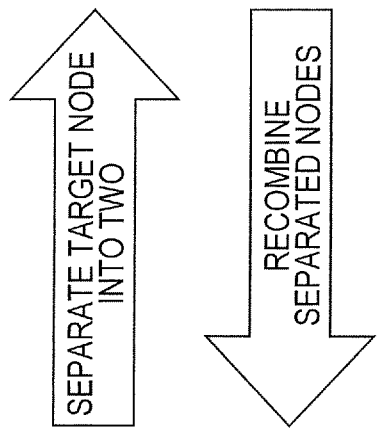
SEPARATE TARGET NODE INTO TWO
RECOMBINE SEPARATED NODES
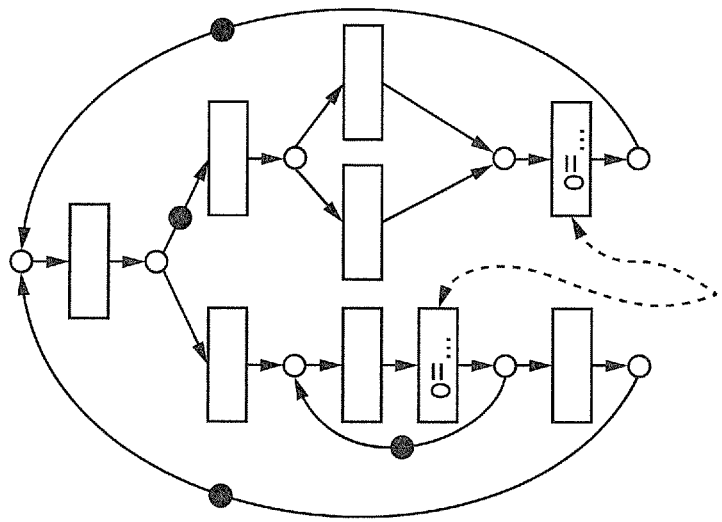
NODES THAT PERFORM ASSIGNMENT BEHAVIORS TO SPECIFIED VARIABLES

FIG. 35

| OUTPUT SIGNAL NAME | INITIAL Throughput CYCLE VALUE | Throughput CYCLE VALUE | PROPERTY |
|---|---|---|---|
| OUTPUT 1 | mo_1 | Mo_1 | A1 |
| OUTPUT 2 | mo_2 | Mo_2 | A2 |
| ... | ... | ... | ... |
| OUTPUT n | mo_n | Mo_n | An |
| FULL OUTPUT |  | To | AT |

Ai: CONSTANT or NONCONSTANT ($i \in \{1,2,...,n,T\}$)

FIG. 36

| INPUT SIGNAL NAME | INITIAL Throughput CYCLE VALUE | Throughput CYCLE VALUE | PROPERTY |
|---|---|---|---|
| INPUT 1 | mi_1 | Mi_1 | B1 |
| INPUT 2 | mi_2 | Mi_2 | B2 |
| ... | ... | ... | ... |
| INPUT m | mi_m | Mi_m | Bm |
| FULL INPUT |  | Ti | BT |

Ai: CONSTANT or NONCONSTANT ($i \in \{1,2,...,m,T\}$)

SUB CFG STRUCTURE OF LOOP TARGETED FOR
PIPELINING BEFORE TRANSFORMATION

SUB CFG STRUCTURE OF LOOP TARGETED FOR
PIPELINING AFTER TRANSFORMATION

SUB CFG STRUCTURE OF LOOP TARGETED FOR
PIPELINING BEFORE TRANSFORMATION

SUB CFG STRUCTURE OF LOOP TARGETED FOR
PIPELINING AFTER TRANSFORMATION

FIG. 42

| OUTPUT SIGNAL NAME | INITIAL Throughput CYCLE VALUE | Throughput CYCLE VALUE | PROPERTY |
|---|---|---|---|
| OUTPUT 1 | mo_1 | Mo_1 | A1 |
| OUTPUT 2 | mo_2 | Mo_2 | A2 |
| ... | ... | ... | ... |
| OUTPUT n | mo_n | Mo_n | An |
| FULL OUTPUT |  | To | AT |

Ai: CONSTANT or NONCONSTANT (i∈{1,2,...,n,T})

FIG. 43

| INPUT SIGNAL NAME | INITIAL Throughput CYCLE VALUE | Throughput CYCLE VALUE | PROPERTY |
|---|---|---|---|
| INPUT 1 | mi_1 | Mi_1 | B1 |
| INPUT 2 | mi_2 | Mi_2 | B2 |
| ... | ... | ... | ... |
| INPUT m | mi_m | Mi_m | Bm |
| FULL INPUT |  | Ti | BT |

Ai: CONSTANT or NONCONSTANT (i∈{1,2,...,m,T})

FIG. 44

| OUTPUT SIGNAL NAME | INITIAL Throughput CYCLE VALUE | Throughput CYCLE VALUE | PROPERTY | INPUT SIGNAL NAME | INITIAL Throughput CYCLE VALUE | Throughput CYCLE VALUE | PROPERTY |
|---|---|---|---|---|---|---|---|
| OUTPUT 1 | mo_1 | Mo_1 | A1 | INPUT 1 | mi_1 | Mi_1 | B1 |
| OUTPUT 2 | mo_2 | Mo_2 | A2 | INPUT 2 | mi_2 | Mi_2 | B2 |
| ... | ... | ... | ... | ... | ... | ... | ... |
| OUTPUT n | mo_n | Mo_n | An | INPUT m | mi_m | Mi_m | Bm |
| FULL OUTPUT | | To | AT | FULL INPUT | | Ti | BT |

Ai: CONSTANT or NONCONSTANT (i ∈ {1, 2, ..., n, T})

Ai: CONSTANT or NONCONSTANT (i ∈ {1, 2, ..., m, T})

FIG. 45

| OUTPUT SIGNAL NAME | INITIAL Throughput CYCLE VALUE | Throughput CYCLE VALUE | PROPERTY |
|---|---|---|---|
| OUTPUT 1 | mo_1 | Mo_1 | A1 |
| OUTPUT 2 | mo_2 | Mo_2 | A2 |
| ... | ... | ... | ... |
| OUTPUT n | mo_n | Mo_n | An |
| FULL OUTPUT | | To | AT |

Ai: CONSTANT or NONCONSTANT (i∈{1,2,...,n,T})

FIG. 46

| INPUT SIGNAL NAME | INITIAL Throughput CYCLE VALUE | Throughput CYCLE VALUE | PROPERTY |
|---|---|---|---|
| INPUT 1 | mi_1 | Mi_1 | B1 |
| INPUT 2 | mi_2 | Mi_2 | B2 |
| ... | ... | ... | ... |
| INPUT m | mi_m | Mi_m | Bm |
| FULL INPUT | | Ti | BT |

Ai: CONSTANT or NONCONSTANT (i∈{1,2,...,m,T})

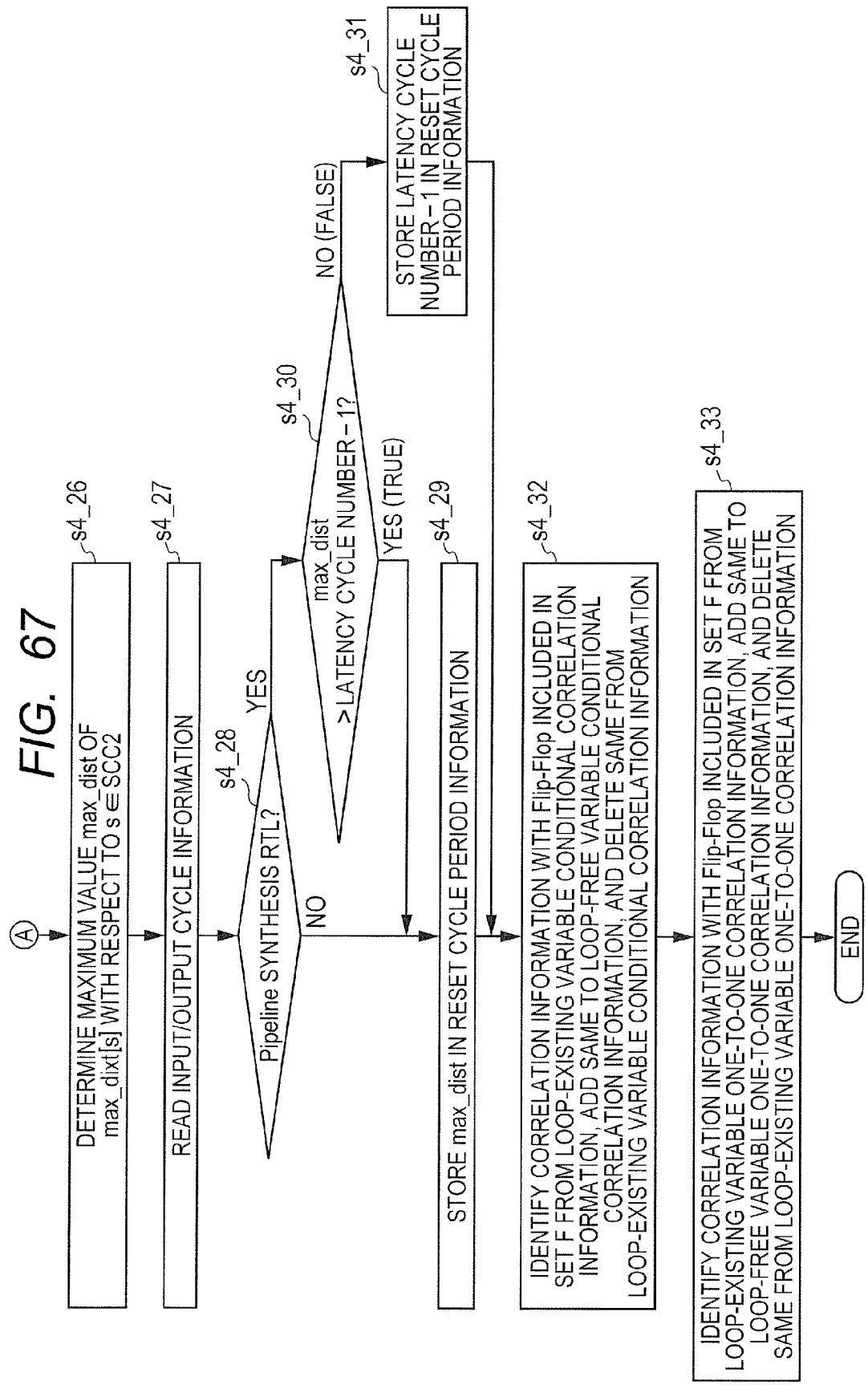

FIG. 68

| RESET CYCLE PERIOD SETTING COMMAND reset |
|---|
| reset {-r \| -i} [ <RESET PORT NAME> -length <RESET CYCLE PERIOD> <INPUT WAVEFORM> ]<br>{-r \| -i}:SPECIFY TARGET (HIGH-LEVEL DESCRIPTION(-r), RTL(-i)) FOR SETTING OF reset COMMAND<br><RESET PORT NAME>: SPECIFY RESET PORT NAME<br>-length <RESET CYCLE PERIOD>: SPECIFY RESET CYCLE PERIOD<br><WAVEFORM>: SPECIFY WAVEFORM INPUT TO SPECIFIED RESET PORT<br><br>EXAMPLE: RESET PERIOD FOR HIGH-LEVEL DESCRIPTION IS DENOTED TO BE 3 CYCLES,<br>         AND AS INPUT VALUES FOR RESET PERIOD, {0 1 1} IS SPECIFIED TO<br>         INPUT PORT rst_n : SPECIFY RESET CYCLE PERIOD WITH 0 AS 1 CYCLE AND<br>         1 AS TWO CYCLES<br>reset -r [ rst_n -length 3 {0 1 1}] |

FIG. 69

| Throughput CYCLE SETTING COMMAND throughput |
|---|
| SPECIFY Throughput OF ENTIRE CIRCUIT TO HIGH-LEVEL DESCRIPTION OR RTL |
| throughput {-r \| -i} <Throughput VALUE><br>{-r \| -i}: SPECIFY TARGET (HIGH-LEVEL DESCRIPTION(-r), RTL(-i)) FOR SETTING OF<br>     Throughput VALUE OF ENTIRE CIRCUIT<br><Throughput VALUE>: SPECIFY Throughput CYCLE OF ENTIRE CIRCUIT<br><br>EXAMPLE: SPECIFY Throughput CYCLE OF ENTIRE CIRCUIT FOR HIGH-LEVEL DESCRIPTION TO 3<br>throughput -r 3 |

FIG. 70

| |
|---|
| INPUT PORT CORRESPONDENCE SETTING COMMAND input_map |
| CORRESPONDING INPUT PORTS ARE SPECIFIED BETWEEN HIGH-LEVEL DESCRIPTION AND RTL. INPUT PORTS SPECIFIED BY PRESENT COMMAND BETWEEN HIGH-LEVEL DESCRIPTION AND RTL ARE INPUTTED WITH INPUT VALUES OF SAME PATTERNS. CYCLE NUMBER (Latency CYCLE VALUE) AND INPUT VALUE CHANGE PERIODIC CYCLE VALUE FROM RESET PROCESS TO FIRST CHANGE IN INPUT VALUE CAN BE SPECIFIED TO HIGH-LEVEL DESCRIPTION AND RTL RESPECTIVELY. |
| input_map -r [*<INPUT PORT NAME>*-lat*<Latency CYCLE VALUE>*-freq*<INPUT VALUE CHANGE PERIODIC CYCLE VALUE>*] <br> -i [*<INPUT PORT NAME>*-lat*<Latency CYCLE VALUE>*-freq*<INPUT VALUE CHANGE PERIODIC CYCLE VALUE>*] <br> -r, -i: SPECIFY TARGETS (HIGH-LEVEL DESCRIPTION(-r), RTL(-i)) FOR SETTING OF FOLLOWING INPUT PORT NAME, Latency CYCLE VALUE AND INPUT VALUE CHANGE PERIODIC CYCLE VALUE <br> *<INPUT PORT NAME>*: SPECIFY INPUT PORT NAME <br> -lat*<Latency CYCLE VALUE>*: SPECIFY CYCLE NUMBER FROM RESET PROCESS TO FIRST CHANGE IN INPUT VALUE <br> -freq*<INPUT VALUE CHANGE PERIODIC CYCLE VALUE>*: SPECIFY INPUT VALUE CHANGE PERIODIC CYCLE VALUE |
| EXAMPLE: SPECIFY CORRESPONDENCES OF INPUT PORT in1 FOR HIGH-LEVEL DESCRIPTION AND INPUT PORT in_1 FOR RTL. HOWEVER, in1 OF HIGH-LEVEL DESCRIPTION SPECIFIES Latency CYCLE VALUE TO 2 AND INPUT VALUE CHANGE PERIODIC CYCLE VALUE TO 1 RESPECTIVELY, AND in_1 OF RTL SPECIFIES Latency CYCLE VALUE TO 2 AND INPUT VALUE CHANGE PERIODIC CYCLE VALUE TO 2 RESPECTIVELY <br> input_map -r [in1 -lat 2 -freq 1] -i [in_1 -lat 4 -freq 2] |
| IMAGES OF CHANGE IN INPUT VALUE <br> HIGH-LEVEL DESCRIPTION in1  S0 S0 S0 S1 S2 S3 S4 S5 S6 S7 S8 ... <br> RTL                      in_1 S0 S0 S0 S0 S1 S1 S2 S2 S3 S3 ... <br> ※Si: SYMBOLIC VALUE |

FIG. 71

| OUTPUT PORT CORRESPONDENCE SETTING COMMAND output_map |
|---|
| CORRESPONDING OUTPUT PORTS ARE SPECIFIED BETWEEN HIGH-LEVEL DESCRIPTION AND RTL. COMPARATIVE OPERATION IS PERFORMED ON OUTPUT PORTS SPECIFIED BY PRESENT COMMAND BETWEEN HIGH-LEVEL DESCRIPTION AND RTL. CYCLE NUMBER (Latency CYCLE VALUE) AND OUTPUT VALUE COMPARISON PERIODIC CYCLE VALUE FROM RESET PROCESS TO FIRST OUTPUT VALUE COMPARISON CAN BE SPECIFIED TO HIGH-LEVEL DESCRIPTION AND RTL RESPECTIVELY. |
| output_map −r [ <OUTPUT PORT NAME>-lat<Latency CYCLE VALUE>-freq<OUTPUT VALUE COMPARISON PERIODIC CYCLE VALUE> ]<br>         −i [ <OUTPUT PORT NAME>-lat<Latency CYCLE VALUE>-freq<OUTPUT VALUE COMPARISON PERIODIC CYCLE VALUE>]<br>−r, −i: SPECIFY TARGETS (HIGH-LEVEL DESCRIPTION(−r), RTL(−i)) FOR SETTING OF FOLLOWING OUTPUT PORT NAME, Latency CYCLE VALUE AND OUTPUT VALUE COMPARISON PERIODIC CYCLE VALUE<br><OUTPUT PORT NAME>: SPECIFY OUTPUT PORT NAME<br>−lat<Latency CYCLE VALUE>: SPECIFY CYCLE NUMBER FROM RESET PROCESS TO FIRST OUTPUT VALUE COMPARISON<br>−freq<OUTPUT VALUE COMPARISON PERIODIC CYCLE VALUE>: SPECIFY OUTPUT VALUE COMPARISON PERIODIC CYCLE VALUE |
| EXAMPLE: SPECIFY CORRESPONDENCES OF OUTPUT PORT out1 FOR HIGH-LEVEL DESCRIPTION AND OUTPUT PORT out_1 FOR RTL. HOWEVER, out1 OF HIGH-LEVEL DESCRIPTION SPECIFIES Latency CYCLE VALUE TO 2 AND OUTPUT VALUE COMPARISON PERIODIC CYCLE VALUE TO 1 RESPECTIVELY, AND out_1 OF RTL SPECIFIES Latency CYCLE VALUE TO 2 AND OUTPUT VALUE COMPARISON PERIODIC CYCLE VALUE TO 2 RESPECTIVELY<br>output_map −r [ out1 −lat 2 −freq 1 ] −i [ out_1 −lat 4 −freq 2 ] |
| IMAGES OF OUTPUT VALUE COMPARISON<br>  HIGH-LEVEL DESCRIPTION out1  X X O1 O2 O3 O4 O5 O6 O7 O8 ...<br>  RTL                        out_1  X X X X X O1 X O2 X O3 X ...<br>    ※O: OUTPUT VALUE TARGETED FOR COMPARISON, X: OUTPUT VALUE UNTARGETED FOR COMPARISON |

FIG. 72

| VARIABLE/Flip-Flop ONE-TO-ONE CORRESPONDENCE SETTING COMMAND flop_map |
|---|
| VARIABLE/Flip-Flop CORRESPONDING IN ONE-TO-ONE RELATIONSHIP ARE SPECIFIED BETWEEN HIGH-LEVEL DESCRIPTION AND RTL. COMPARATIVE OPERATION IS PERFORMED ON VARIABLE IN HIGH-LEVEL DESCRIPTION AND Flip-Flop FOR RTL BOTH SPECIFIED BY PRESENT COMMAND. CYCLE NUMBER (Latency CYCLE VALUE) AND VALUE COMPARISON PERIODIC CYCLE VALUE FROM RESET PROCESS TO FIRST VALUE COMPARISON CAN BE SPECIFIED TO HIGH-LEVEL DESCRIPTION AND RTL RESPECTIVELY. |
| flop_map -r [<VARIABLE/Flip-Flop NAME>-lat<Latency CYCLE VALUE>-freq<VALUE COMPARISON PERIODIC CYCLE VALUE>]<br>-i [<VARIABLE/Flip-Flop NAME>-lat<Latency CYCLE VALUE>-freq<VALUE COMPARISON PERIODIC CYCLE VALUE>]<br>-r, -i: SPECIFY TARGETS (HIGH-LEVEL DESCRIPTION(-r), RTL(-i)) FOR SETTING OF FOLLOWING VARIABLE/Flip-Flop NAME, Latency CYCLE VALUE AND VALUE COMPARISON PERIODIC CYCLE VALUE<br><VARIABLE/Flip-Flop NAME>: SPECIFY VARIABLE/Flip-Flop NAME<br>-lat <Latency CYCLE VALUE>: SPECIFY CYCLE NUMBER FROM RESET PROCESS TO FIRST VALUE COMPARISON<br>-freq <VALUE COMPARISON PERIODIC CYCLE VALUE>: SPECIFY VALUE COMPARISON PERIODIC CYCLE VALUE |
| EXAMPLE: SPECIFY CORRESPONDENCES OF VARIABLE var1 FOR HIGH-LEVEL DESCRIPTION AND reg_1 BEING Flip-Flop FOR RTL. HOWEVER, var1 OF HIGH-LEVEL DESCRIPTION SPECIFIES Latency CYCLE VALUE TO 2 AND OUTPUT VALUE COMPARISON PERIODIC CYCLE VALUE TO 1 RESPECTIVELY, AND reg_1 OF RTL SPECIFIES Latency CYCLE VALUE TO 2 AND OUTPUT VALUE COMPARISON PERIODIC CYCLE VALUE TO 2 RESPECTIVELY<br>flop_map -r [ var1 -lat 2 -freq 1 ] -i [ reg_1 -lat 4 -freq 2 ] |
| IMAGES OF VALUE COMPARISONS OF VARIABLE/Flip-Flop<br>HIGH-LEVEL DESCRIPTION var1 X X V1 V2 V3 V4 V5 V6 V7 V8 ....<br>RTL reg_1 X X X X V1 X V2 X V3 X ....<br>※ Vi: VALUE TARGETED FOR COMPARISON, X: VALUE UNTARGETED FOR COMPARISON |

FIG. 73

| VARIABLE/Flip-Flop NON ONE-TO-ONE CORRESPONDENCE SETTING COMMAND conditional_flop_map |
|---|
| VARIABLE/Flip-Flop CORRESPONDING WITH CONDITIONS ARE SPECIFIED BETWEEN HIGH-LEVEL DESCRIPTION AND RTL. COMPARATIVE OPERATION IS PERFORMED ON VARIABLE IN HIGH-LEVEL DESCRIPTION AND Flip-Flop FOR RTL BOTH SPECIFIED BY PRESENT COMMAND. IN PRESENT EMBODIMENT, IT IS ASSUMED THAT VARIABLES IN HIGH-LEVEL DESCRIPTION ARE ASSOCIATED WITH Flip-Flops FOR RTL IN PLURAL FORM. CONDITIONS (ASSIGNMENT EXECUTION CONDITIONS) FOR CORRESPONDING TO Flip-Flops FOR RTL ARE ALSO SPECIFIED TO RESPECTIVE VARIABLES TOGETHER. | conditional_flop_map −i [ <Flip-Flop NAME> ]
    −r [ <VARIABLE> -cond <ASSIGNMENT EXECUTION CONDITION ∧ EXECUTION CONDITION> ]
-r, -i: SPECIFY TARGETS (HIGH-LEVEL DESCRIPTION(-r), RTL(-i)) FOR SETTING OF FOLLOWING VARIABLE/Flip-Flop NAME AND CORRESPONDING CONDITIONS
<Flip-Flop NAME>: SPECIFY Flip-Flop NAME OF RTL
<VARIABLE NAME>: SPECIFY VARIABLE NAME OF HIGH-LEVEL DESCRIPTION
-cond <ASSIGNMENT EXECUTION CONDITION>: SPECIFY CYCLE NUMBER FROM RESET PROCESS TO FIRST VALUE COMPARISON (CAPABLE OF BEING SPECIFIED IN PLURAL FORM)

EXAMPLE: SPECIFY CORRESPONDENCES OF VARIABLES var1, var2, var3, var4 and var5 FOR HIGH-LEVEL DESCRIPTION TO regs BEING Flip-Flops OF RTL ASSIGNMENT EXECUTION CONDITIONS ARE AS FOLLOWS:

| PRESENT STATE | TRANSITION CONDITION | NEXT STATE | EXECUTION CONDITION | CORRESPONDENCE RELATION |
|---|---|---|---|---|
| S0 | ¬c1 | S0 | − | reg=var1 |
| S0 | c1 | S1 | d1 | reg=var2 |
| S0 | c1 | S1 | d2 | reg=var3 |
| S1 | − | S0 | d1 | reg=var4 |
| S1 | − | S0 | ¬d1 | reg=var5 | conditional_flop_map −i [ reg ] ¥
    −r [ var1 -cond S0 ∧ ¬c1 ]  [ var2 -cond S0 ∧ c1 ∧ d1 ] ¥
    [ var3 -cond S0 ∧ c1 ∧ d2 ] [ var4 -cond S1 ∨ d1 ] ¥
    [ var5 -cond S1 ∧ ¬d1 ] ]

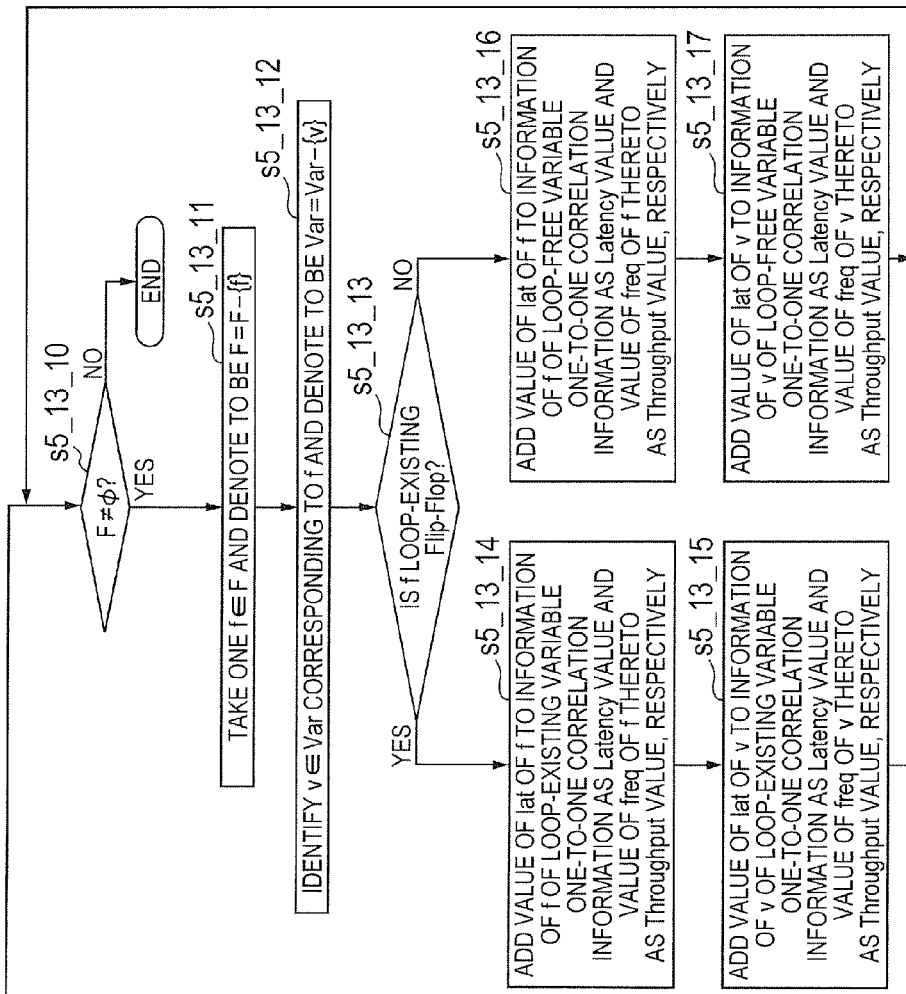
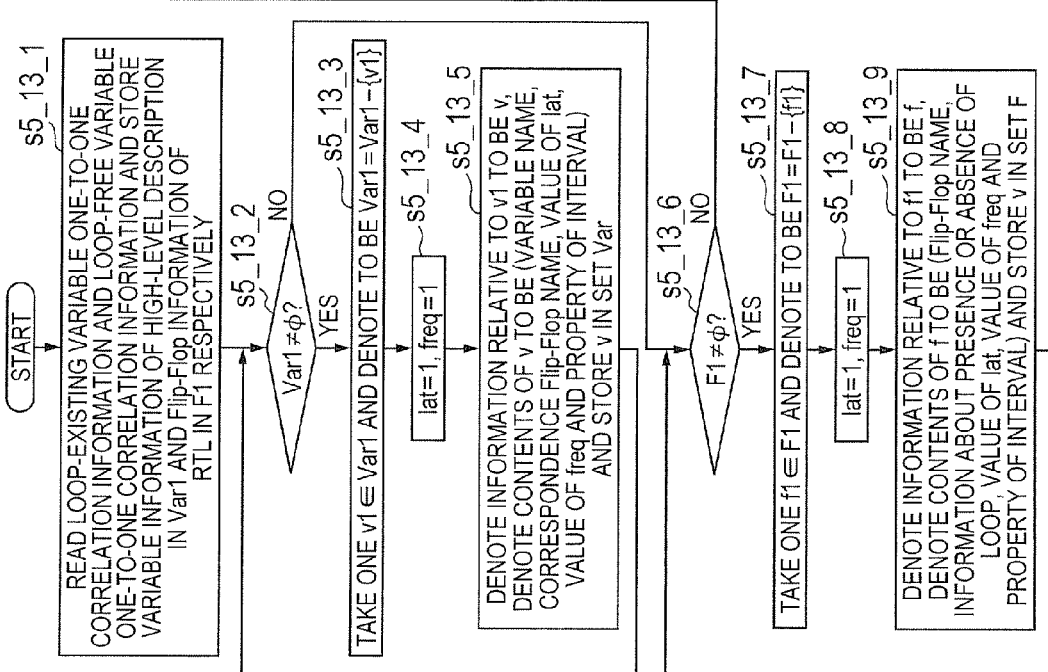
FIG. 85

FIG. 98

| OUTPUT SIGNAL NAME | INITIAL Throughput CYCLE VALUE | Throughput CYCLE VALUE | PROPERTY | INPUT SIGNAL NAME | INITIAL Throughput CYCLE VALUE | Throughput CYCLE VALUE | PROPERTY |
|---|---|---|---|---|---|---|---|
| OUTPUT 1 | mo_1 | Mo_1 | A1 | INPUT 1 | mi_1 | Mi_1 | B1 |
| OUTPUT 2 | mo_2 | Mo_2 | A2 | INPUT 2 | mi_2 | Mi_2 | B2 |
| ... | | | ... | ... | | | ... |
| OUTPUT n | mo_n | Mo_n | An | INPUT m | mi_m | Mi_m | Bm |
| FULL OUTPUT | | To | AT | FULL INPUT | | Ti | BT |

Ai: CONSTANT or NONCONSTANT (i∈{1,2,...,n,T})

Ai: CONSTANT or NONCONSTANT (i∈{1,2,...,m,T})

FIG. 99

| OUTPUT SIGNAL NAME | INITIAL Throughput CYCLE VALUE | Throughput CYCLE VALUE | PROPERTY |
|---|---|---|---|
| OUTPUT 1 | mo_1 | Mo_1 | A1 |
| OUTPUT 2 | mo_2 | Mo_2 | A2 |
| ... | ... | ... | ... |
| OUTPUT n | mo_n | Mo_n | An |
| FULL OUTPUT |  | To | AT |

Ai: FULLY CONSTANT or CONSTANT WITH OFFSET
or NONCONSTANT (i∈{1,2,...,n,T})

| INPUT SIGNAL NAME | INITIAL Throughput CYCLE VALUE | Throughput CYCLE VALUE | PROPERTY |
|---|---|---|---|
| INPUT 1 | mi_1 | Mi_1 | B1 |
| INPUT 2 | mi_2 | Mi_2 | B2 |
| ... | ... | ... | ... |
| INPUT m | mi_m | Mi_m | Bm |
| FULL INPUT |  | Ti | BT |

Ai: FULLY CONSTANT or CONSTANT WITH OFFSET
or NONCONSTANT (i∈{1,2,...,m,T})

| FOURTH EMBODIMENT (FIG. 16) | FIFTH EMBODIMENT (FIG. 97) |
|---|---|
| CYCLE ACCURATE SYNTHESIS RTL | CYCLE ACCURATE RTL |
| Pipeline SYNTHESIS RTL | Pipeline RTL |
| INPUT/OUTPUT THROUGHPUT RATIO CONSTANT RTL | PERIODIC RATIO CONSTANT RTL |
| INPUT/OUTPUT THROUGHPUT RATIO NON-CONSTANT RTL | PERIODIC RATIO NON-CONSTANT RTL |

| FOURTH EMBODIMENT (FIG. 16) | FIFTH EMBODIMENT (FIG. 97) |
|---|---|
| CYCLE ACCURATE SYNTHESIS RTL | CYCLE ACCURATE RTL |
| Pipeline SYNTHESIS RTL | Pipeline RTL |
| INPUT/OUTPUT THROUGHPUT RATIO CONSTANT RTL | PERIODIC RATIO CONSTANT RTL |
| INPUT/OUTPUT THROUGHPUT RATIO NON-CONSTANT RTL | PERIODIC RATIO NON-CONSTANT RTL |

FIG. 107

| FOURTH EMBODIMENT (FIG. 16) | FIFTH EMBODIMENT (FIG. 97) |
|---|---|
| CYCLE ACCURATE SYNTHESIS RTL CONSTANT IN INPUT/OUTPUT THROUGHPUT RATIO | CYCLE ACCURATE SYNTHESIS RTL CONSTANT IN PERIODIC RATIO |
| CYCLE ACCURATE SYNTHESIS RTL NON-CONSTANT IN INPUT/OUTPUT THROUGHPUT RATIO | CYCLE ACCURATE SYNTHESIS RTL NON-CONSTANT IN PERIODIC RATIO |
| Pipeline SYNTHESIS RTL | Pipeline RTL |
| INPUT/OUTPUT THROUGHPUT RATIO CONSTANT RTL | PERIODIC RATIO CONSTANT RTL |

FIG. 108

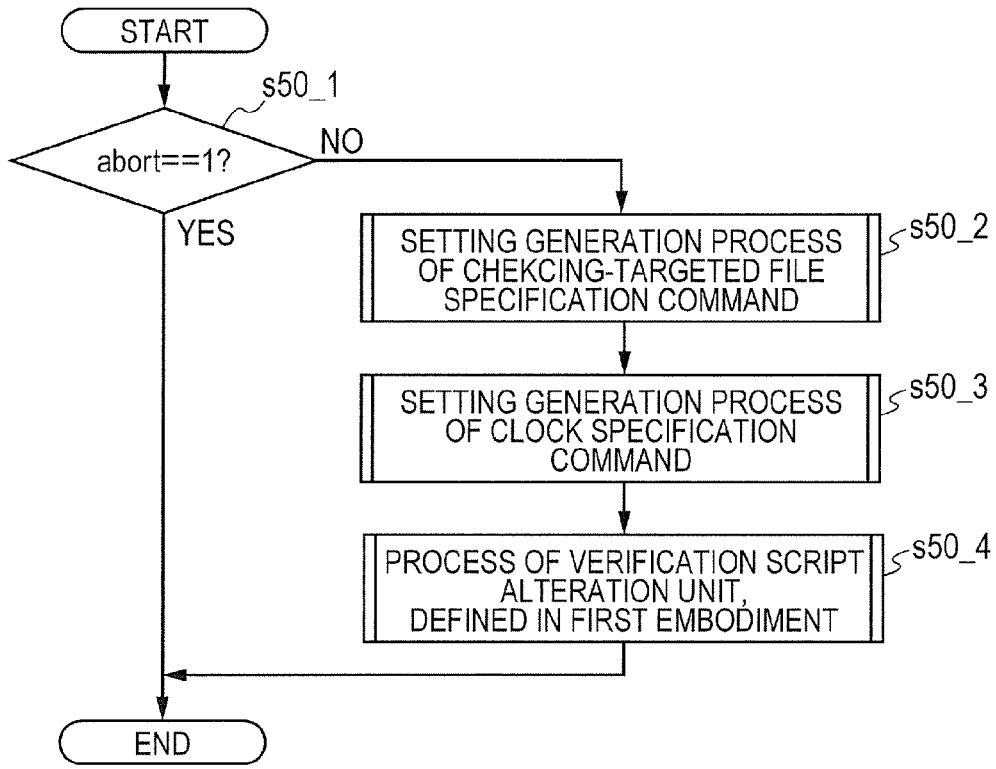

EQUIVALENCE CHECKING METHOD, EQUIVALENCE CHECKING PROGRAM, AND EQUIVALENCE CHECKING DEVICE

CROSS-REFERENCE TO RELATED APPLICATIONS

The disclosure of Japanese Patent Application No. 2012-038393 filed on Feb. 24, 2012 including the specification, drawings and abstract is incorporated herein by reference in its entirety.

BACKGROUND

The present invention relates to a technology for checking the equivalence of a high-level description and a synthesis result obtained by a behavioral synthesis therewith. The present invention relates to, for example, a technology effective when applied to the support of design of a semiconductor device with a digital logic circuit integrated therein, such as a microcomputer, an SoC (system-on-chip semiconductor integrated circuit), an analog-digital mixed integrated circuit, or the like.

Upon the design of a semiconductor integrated circuit, for example, an RTL (Register-Transfer Level) description capable of logic synthesis by a behavioral synthesis system is often synthesized from a behavioral description high in abstraction level. This design method is capable of reducing the amount of description by execution of design in a behavioral level at which the abstraction level is high and greatly improving productivity of design and checking. A high-level description such as an extended language of a C language, a System C language or the like is used for the behavioral description.

In general, the behavioral synthesis system is comprised of software. As long as the software is used, it is difficult to eliminate a possibility that even with meticulous attention to detail, bugs will be included in the system itself. With the expansion of the scope of application of a behavioral synthesis, the bugs are appearing even where all checking and maintenance are conducted on the behavioral description. When, however, an erroneous RTL description is generated depending on the bugs of the behavioral synthesis system, the checking conducted on the behavioral description can be not only meaningless but also a cause that brings on rework at a post-process. The occurrence of the rework at the post-process causes increases in development period and time consuming, thus resulting in large loss. Due to such a reason, when the behavioral synthesis system is applied to actual LSI design, it is necessary to confirm the correctness of a synthesized RTL description, i.e., check that the behavioral description and the RTL description are equivalent to each other.

In terms of checking for the equivalence between the behavioral description and the RTL description, a Patent Document 1 has disclosed a method of outputting intermediate representations and correspondence relation or correlation information about variables between the intermediate representations at respective steps (pre-process step, scheduling/register binding step, arithmetic-unit binding step, and post-process step) for a behavioral synthesis, and sequentially performing equivalence checking between the intermediate representations, thereby speeding up the equivalence checking.

A method for identifying intermediate logic cones associated with each other under a given condition from a transformation history in a behavioral synthesis to thereby perform the speedup of equivalence checking has been disclosed in a Patent Document 2.

Disclosed in a Patent Document 3 is a method for extracting logic cones from both an object code obtained by compiling a behavioral level description, and an RTL description derived from the behavioral level description and assuming that a correspondence relation or correlation (pair of signals) between the behavioral level description and the RTL description is being given. That is, there has been disclosed a method for allowing the equivalence of each logic cone obtained by a symbolic simulation from the correlation information with respect to each pair of signals corresponding between the object code and the RTL description to lead to a satisfiability determination problem, thereby carrying out equivalence checking.

RELATED ART DOCUMENTS

Patent Documents

[Patent Document 1]
Japanese Unexamined Patent Publication No. 2008-090865
[Patent Document 2]
Japanese Unexamined Patent Publication No. 2007-265175
[Patent Document 3]
Japanese Unexamined Patent Publication No. 2004-038617

SUMMARY

The present inventors have discussed a technology for checking whether the equivalence, i.e., synthesis of a behavioral description described in a high description language such as a System C or the like, and a synthesis result obtained by a behavioral synthesis with the behavioral description, e.g., an RTL description has properly been conducted. According to it, the checking (it is hereinafter also simply called "equivalence checking") for the equivalence for the RTL description being of the behavioral synthesis result aims to mathematically check the coincidence between a result obtained based on the behavioral description and a result obtained based on the behavioral RTL description in consideration of even an output timing on assumption of all input sequences. This shows a large difference from an RTL simulation for examining the presence or absence of bugs relative to the RTL description. Since this checking aims to perform static checking like model checking, a speed-up in checking is expected. In terms of this, even if the equivalence checking is done with high functionality of a semiconductor integrated circuit such as an SoC and its complication, an increase in its processing time is inevitable. The present inventors have discussed that specific characteristics of a branch structure between a behavioral description and a hardware description, a structural dependence relation therebetween, and the like are grasped, thereby shortening the time of processing for the equivalence checking.

A further discussion has however been needed on what characteristics of data are effective in shortening the processing time if attention is paid thereto. Any cited reference does not describe that the specific characteristics of the branch structure between the behavioral description and the hardware description, the structural dependence relation therebetween, and the like are extracted and used to shorten the processing time for the equivalence checking.

The above, other objects and novel features of the present invention will become apparent from the description of the present specification and the accompanying drawings.

A summary of a representative one of the inventions disclosed in the present application will be explained in brief as follows:

When the equivalence of a high-level description that serves as a behavioral description, and a hardware description obtained based on the high-level description is checked, correlation information formed from flip-flops (hereinafter called "FFs") with a feedback loop in the synthesis result and variables associated therewith with a backward data dependence in a high-level description is generated and used.

According to this, a situation can be suppressed in which when an equivalence checking unit is divided small to reduce each individual verification scope, a checking time becomes long in reverse with an increase in the number of the checking units.

An advantageous effect obtained by a typical one of the inventions disclosed in the present application will be explained in brief as follows:

It is possible to contribute to the shortening of a processing time necessary to check the equivalence of a high-level description and a behavioral synthesis result.

BRIEF DESCRIPTION OF THE DRAWINGS

FIG. 7 is an explanatory diagram showing one example of a high-level description;

FIG. 8 is an explanatory diagram illustrating a data flow corresponding to a high description;

FIG. 9 is an explanatory diagram illustrating a circuit diagram for a behavioral synthesis result corresponding to FIGS. 7 and 8;

FIG. 12 is an explanatory diagram illustrating a two-process RTL description;

FIG. 18 is an explanatory diagram having collectively described a data dependence relation of a high-level description in FIG. 17;

FIG. 21 is a timing chart showing a pipeline operation in which the same output signals are provided as plural and they exist from a first stage to a throughput cycle-th stage;

FIG. 22 is a timing chart illustrating a pipeline operation in which the same output signals exist in plural stages and are allocated to different stages within interval cycles during which stages corresponding to latency cycles are partitioned for each throughput cycle interval;

FIG. 23 is a timing chart illustrating a pipeline operation in which the same output signals are provided in plural stages and cause output collisions;

FIG. 31 is an explanatory diagram illustrating a storage format of input cycle information corresponding to the pipeline operation example shown in FIG. 24;

FIG. 32 is an explanatory diagram illustrating a storage format of input cycle information corresponding to the pipeline operation example shown in FIG. 25;

FIG. 33 is an explanatory diagram illustrating the format of input/output cycle information targeted for a cycle accurate synthesis RTL;

FIG. 34 is an explanatory diagram showing an example of the operation of both the separation of nodes in which sentences including specified variable in each CFG are executed, and their recombination;

FIG. 35 is an explanatory diagram showing the format of output cycle information in input/output cycle information, targeted for a path latency setting synthesis RTL;

FIG. 36 is an explanatory diagram showing the format of input cycle information in input/output cycle information, targeted for a path latency setting synthesis;

FIG. 42 is an explanatory diagram showing the format of output cycle information in input/output cycle information, targeted for an internal loop pipeline synthesis RTL;

FIG. 43 is an explanatory diagram showing the format of input cycle information in input/output cycle information, targeted for an internal loop pipeline synthesis RTL;

FIG. 44 is an explanatory diagram showing the format of input/output cycle information targeted for a non-cycle accurate synthesis RTL;

FIG. 45 is an explanatory diagram showing the format of output cycle information in input/output cycle information, targeted for a high-level description;

FIG. 46 is an explanatory diagram showing the format of input cycle information in input/output cycle information, targeted for a high-level description;

FIG. 67 is a flowchart illustrating the details of the latter half of the reset elongation cycle extraction process;

FIG. 68 is an explanatory diagram of a reset cycle period setting command (reset);

FIG. 69 is an explanatory diagram of a Throughput cycle setting command (throughput);

FIG. 70 is an explanatory diagram of an input port correspondence setting command (input_map);

FIG. 71 is an explanatory diagram of an output port correspondence setting command (output_map);

FIG. 72 is an explanatory diagram of a variable/FF one-to-one correspondence setting command (flop_map);

FIG. 73 is an explanatory diagram of a variable/FF non one-to-one correspondence setting command (conditional_flop_map);

FIG. 85 is a flowchart illustrating a one-to-one correspondence variable/FF-based cycle information extraction process targeted for a cycle accurate synthesis RTL non-constant in input/output throughput ratio in s5_13;

FIG. 98 is an explanatory diagram illustrating the output format of output cycle information in FIG. 97;

FIG. 99 is an explanatory diagram illustrating the format of storage of the number of throughput cycles;

FIG. 107 is an explanatory diagram showing the correspondence of classified names of different manpower RTLs between the fifth and fourth embodiments in a verification script generation process s50;

FIG. 108 is a flowchart illustrating a "verification script generation process" having taken into consideration dissimilarities from the fourth embodiment of FIG. 16;

DETAILED DESCRIPTION

1. Summary of the Embodiments

Figure 1:
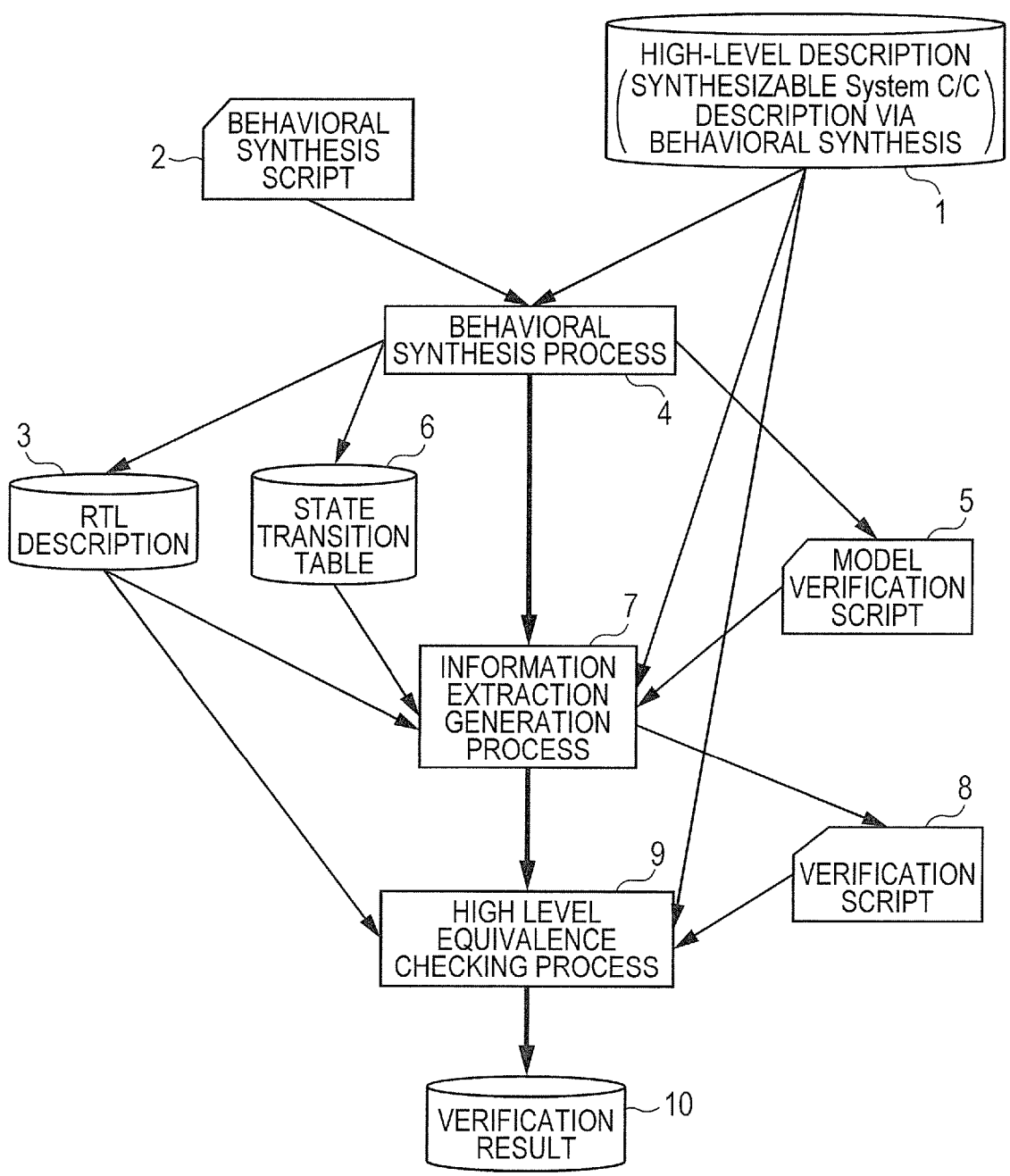
FIG. 1 is a flowchart illustrating an entire process flow from a high-level description to the acquisition of a result of equivalence checking.

A summary of typical embodiments of the inventions disclosed in the present application will first be explained. Reference numerals of the accompanying drawings referred to with parentheses in the description of the summary of the typical embodiments only illustrate elements included in the concept of components to which the reference numerals are given.

[1] <Correspondence Between Flip-Flop and Variable with Backward Data Dependence in High-Level Description>

An equivalence checking method according to a typical embodiment is a method for checking the equivalence of a high-level description (1) taken as a behavioral description, and a hardware description (3, 30) obtained based on the high-level description, using a computer. This method includes a step for generating information (8) about correspondence relations or correlations between flip-flops with a feedback loop in the hardware description and variables associated therewith with a backward data dependence in a high-level description. The computer checks the equivalence using the correlation information (9). The hardware description serves as, for example, a synthesis result such as an RTL description obtained by performing a synthesis on a high-level description according to a behavioral synthesis restriction, or an RTL description generated via manpower, based on a high-level description.

According to this, a situation in which when an equivalence checking unit based on an input and an output is divided small to reduce each individual verification scope, the time for checking becomes long in reverse with an increase in the number of checking can be suppressed by thinning out correspondence relations not included in the above correlation through the use of the correlation information. It is thus possible to contribute to the shortening of a processing time required for the equivalence checking for the high-level description and the hardware description.

[2] <Equivalence Checking Based on Inductive Method and Extraction of Reset Cycle>

Figure 6:
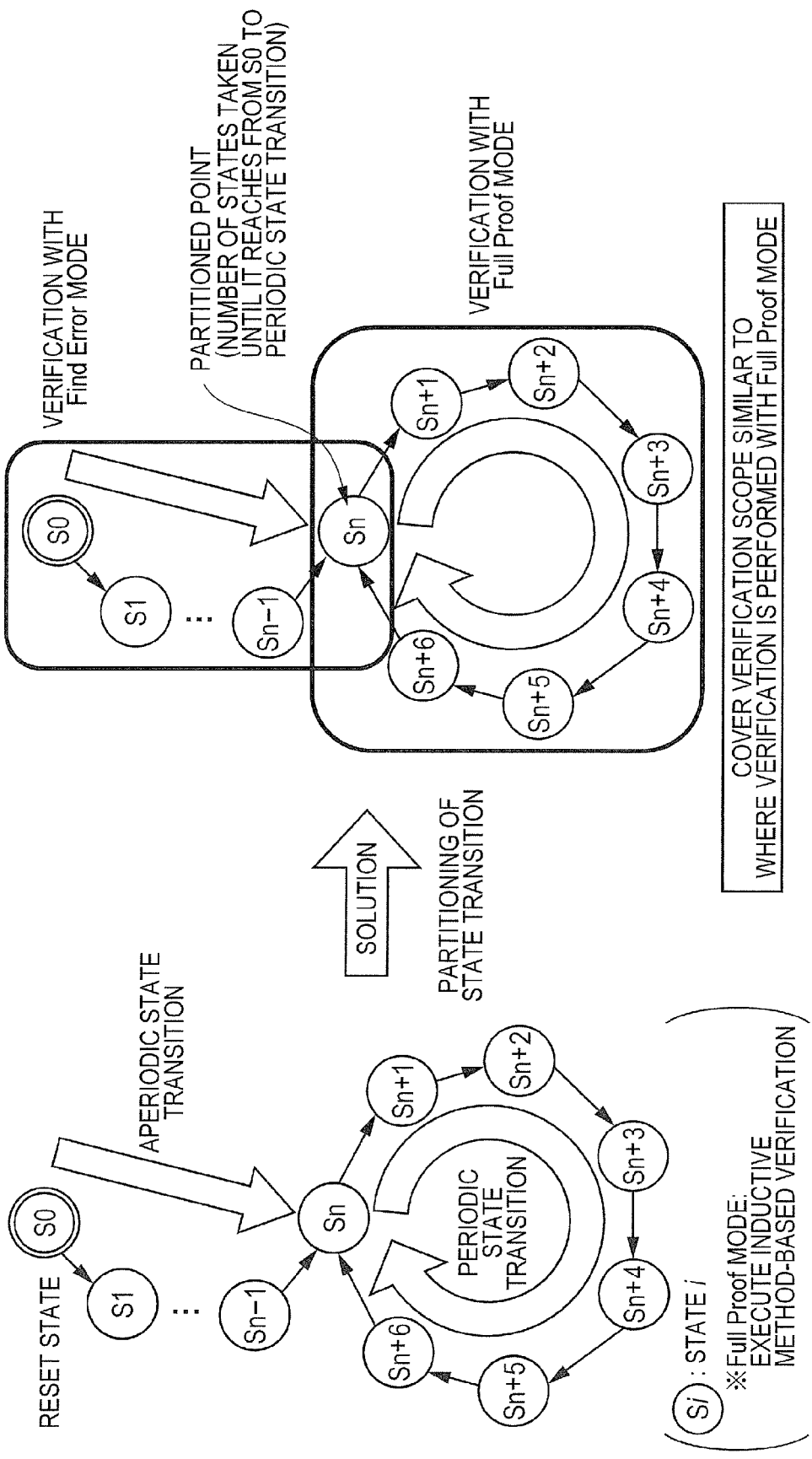
FIG. 6 is an explanatory diagram illustrating the operation of extracting a reset cycle pulse and utilizing it.

In the paragraph 1, when the equivalence is checked by an inductive method, the computer pays attention to flip-flops with a feedback loop, i.e., flip-flops associated with variables with a backward data dependence in a high-level description and thereby extracts a reset cycle number corresponding to the minimum number of stages of flip-flops necessary to propagate values to the flip-flops in the feedback loop, and executes equivalence checking using a symbolic simulation result about the extracted reset cycle number in an initial state of the feedback loop (refer to FIG. 6).

According to this, a speed-up by a reduction in a process for determining the depth of an induction step performed in inductive method-based equivalence checking, logic simplification made possible by executing a symbolic simulation in advance, and a speed-up in internal equivalence-point determination by the logic simplification can be expected. This contributes to the shortening of a processing time for equivalence checking correspondingly.

[3] <Solely-Determined Correspondence Between Flip-Flop and Variable>

In the paragraph 1 or 2, the computer generates as the correlation information, first correlation information in which flip-flops corresponding to variables are placed in a one-to-one correspondence with the variables.

According to this, the first correlation information is suitable for, for example, partitioning small, a logic cone which is a checking unit for equivalence checking and in which each flip-flop with a feedback loop is taken as an end point.

[4] <Correspondence Dependent on Time Cycle or the like Between Flip-Flop and Variable>

In the paragraph 3, the computer generates as the correlation information, second correlation information in which flip-flops corresponding to variables are put in a one-to-many correspondence with the variables.

According to this, the second correlation information is suitable for grasping a logic cone with each flip-flop as an end point in a feedback cycle unit of a feedback loop.

[5] <Correspondence Between Flip-Flop and Variable with Forward Data Dependence in High-Level Description>

In the paragraph 4, a generation step is further included in which the computer generates correlation information between flip-flops without a feedback loop in the hardware description and variables associated therewith with only a forward data dependence in a high-level description. At this time, the computer performs equivalence checking using the correlation information related to the forward data dependence along with the correlation information related to the backward data dependence.

According to this, the equivalence checking can be performed in conjunction with not only the correlation information based on the backward data dependence but also the correlation information based on the forward data dependence.

[6] <Solely-Determined Correspondence Between Flip-Flop and Variable>

In the paragraph 5, the computer generates as the correlation information related to the forward data dependence, third correlation information in which flip-flops corresponding to variables are placed in a one-to-one correspondence with the variables.

According to this, the third correlation information is suitable for, for example, partitioning small, a logic cone which is a checking unit for equivalence checking and in which each flip-flop with no feedback loop is taken as an end point.

[7] <Correspondence Dependent on Time Cycle or the like Between Flip-Flop and Variable>

In the paragraph 6, the computer generates as the correlation information related to the forward data dependence, fourth correlation information in which flip-flops corresponding to variables are put in a one-to-many correspondence with the variables.

According to this, the fourth correlation information is suitable for grasping a logic cone with each different flip-flop as an end point in a process cycle unit with respect to the same function.

[8] <Addition and Modification Made to Correlation Information in Accordance with Priorities>

In the paragraph 7, the computer checks equivalence while performing an addition and a modification on the reset cycle number, the first correlation information related to the backward data dependence, the second correlation information related to the backward data dependence, the third correlation information related to the forward data dependence and the fourth correlation information related to the forward data dependence. At this time, as priorities related to the addition and the modification, the reset cycle number is denoted to be assigned a first priority, the first correlation information related to the backward data dependence is denoted to be assigned a second priority, the second correlation information related to the backward data dependence is denoted to be assigned a third priority, the third correlation information related to the forward data dependence is denoted to be assigned a fourth priority, and the fourth correlation information related to the forward data dependence is denoted to be assigned a fifth priority, respectively. The addition and modification in accordance with the priorities are performed when a process for the equivalence checking is not completed within a predetermined restricted time (refer to FIGS. 10 and 15).

According to this, the addition and modification are given priority as high as elements considered to be large in the degree of contribution to the shortening of a processing time for checking of the equivalence. Using the first correlation information rather than the second correlation information is considered to contribute to the shortening of an equivalence checking time, and using the correlation information related to the backward data dependence rather than the correlation information related to the forward data dependence is considered to contribute to the shortening of an equivalence checking time. It is thus possible to prevent the amount of information such as dependence relation information used in equivalence checking from becoming excessive. The checking for equivalence can efficiently be completed by performing the addition of lower dependence relation information or the modification of a reset cycle number or the like when it is not possible to complete the equivalence checking within a restricted time.

[9] <Correspondence Between Flip-Flop and Variable with Backward Data Dependence in High-Level Description>

An equivalence checking program (40) according to another embodiment is a program for causing a computer (41) to check the equivalence of a high-level description (1) that serves as a behavioral description, and a hardware description (3, 30) obtained based on the high-level description. The program allows the computer to execute the following steps. First, the program causes the computer to execute a generation step (7, 12) for generating as support information for equivalence checking, correlation information (8) between flip-flops with a feedback loop in the hardware description and variables associated therewith with a backward data dependence in a high-level description. Second, the program causes the computer to execute a checking step (9) for performing checking for the equivalence using the correlation information.

According to this, it is possible to easily realize the method of the paragraph 1 that the checking for equivalence is performed using the correlation information related to the backward data dependence. In brief, a processing time for checking of the equivalence of the high-level description and the hardware description can easily be shortened.

[10] <Equivalence Checking Based on Inductive Method and Extraction of Reset Cycle>

In the paragraph 9, the generation step causes the computer to extract a reset cycle number corresponding to the minimum number of stages of flip-flops necessary to propagate values to the flip-flops in the feedback loop. The checking step causes the computer to check equivalence by an inductive method, using a symbolic simulation result about the extracted reset cycle number in an initial state of the feedback loop.

According to this, the paragraph 10 contributes to the shortening of a processing time for equivalence checking as with the paragraph 2.

[11] <Solely-Determined Correspondence Between Flip-Flop and Variable>

In the paragraph 9 or 10, the generation step causes the computer to generate as the correlation information related to the backward data dependence, first correlation information in which flip-flops corresponding to variables are put in a one-to-one correspondence with the variables.

According to this, as with the paragraph 3, the first correlation information is suitable for partitioning small, a logic cone with each flip-flop with a feedback loop being taken as an end point.

[12] <Correspondence Dependent on Time Cycle or the like Between Flip-Flop and Variable>

In the paragraph 11, the generation step causes the computer to generate as the correlation information related to the backward data dependence, second correlation information in which flip-flops corresponding to variables are placed in a one-to-many correspondence with the variables.

According to this, as with the paragraph 4, the second correlation information is suitable for grasping a logic cone with each flip-flop as an end point in a feedback cycle unit of a feedback loop.

[13] <Correspondence Between Flip-Flop and in-High-Level Description Variable Placed in Forward Data Dependence>

In the paragraph 12, the generation step further causes the computer to generate as support information for equivalence checking, information indicative of a correlation between flip-flops with no feedback loop in the hardware description and variables associated therewith with only a forward data dependence in a high-level description. The checking step causes the computer to check equivalence using the correlation information related to the forward data dependence along with the correlation information related to the backward data dependence.

According to this, as with the paragraph 5, the correlation information related to the forward data dependence is also used in combination to enable the equivalence checking.

[14] <Solely-Determined Correspondence Between Flip-Flop and Variable>

In the paragraph 13, the generation step causes the computer to generate as the correlation information related to the forward data dependence, third correlation information in which flip-flops corresponding to variables are placed in a one-to-one correspondence with the variables.

According to this, as with the paragraph 6, the third correlation information is suitable for partitioning small, a logic cone with each flip-flop with no feedback loop being taken as an end point.

[15] <Correspondence Dependent on Time Cycle or the like Between Flip-Flop and Variable>

In the paragraph 14, the generation step causes the computer to generate as the correlation information related to the forward data dependence, fourth correlation information in which flip-flops corresponding to variables are placed in a one-to-many correspondence with the variables.

According to this, as with the paragraph 7, the fourth correlation information is suitable for grasping a logic cone with each different flip-flop as an end point in a process cycle unit with respect to the same function.

[16] <Addition and Modification Made to Correlation Information in Accordance with Priorities>

In the paragraph 15, the generation step causes the computer to execute a necessary addition and modification on the reset cycle number, the first correlation information related to the backward data dependence, the second correlation information related to the backward data dependence, the third correlation information related to the forward data dependence and the fourth correlation information related to the forward data dependence in accordance with priorities. The checking step causes the computer to check equivalence by reflection of the support information for the equivalence checking subjected to the necessary addition and modification thereon. As priorities related to the addition and modification, the reset cycle number is denoted to be assigned a first priority, the first correlation information related to the backward data dependence is denoted to be assigned a second priority, the second correlation information related to the backward data dependence is denoted to be assigned a third priority, the third correlation information related to the forward data dependence is denoted to be assigned a fourth priority, and the fourth correlation information related to the forward data dependence is denoted to be assigned a fifth priority, respectively. The addition and modification in accordance with the priorities are performed when a process for the equivalence checking is not completed within a predetermined restricted time.

According to this, as with the paragraph 8, it is possible to prevent the amount of information such as dependence relation information used in equivalence checking from becoming excessive. The checking for equivalence can efficiently be completed by performing the addition of lower dependence relation information or the modification of a reset cycle number or the like when it is not possible to complete the equivalence checking within a restricted time. Further, the order of using the dependence relation information can be optimized, thus resulting in the contribution to a further reduction in processing time for the equivalence checking.

[17] <Correspondence Between Flip-Flop and Variable with Backward Data Dependence in High-Level Description>

An equivalence checking device (42) according to a further embodiment checks by a program process, the equivalence of a high-level description (1) taken as a behavioral description, and a hardware description (3, 39) obtained based on the high-level description. This equivalence checking device has a generation unit (41A) and a checking unit (42B). The generation unit generates by the program process, as support information for equivalence checking, correlation information (8) between flip-flops with a feedback loop in the hardware description and variables associated therewith with a backward data dependence in a high-level description (7, 12). The checking unit performs by the program process, checking for the equivalence using the correlation information related to the backward data dependence (9).

According to this, as with the paragraph 1, since the equivalence checking is performed using the correlation information related to the backward data dependence, it is possible to shorten a processing time for checking of the equivalence of the high-level description and the hardware description.

[18] <Equivalence Checking Based on Inductive Method and Extraction of Reset Cycle>

In the paragraph 17, the generation unit extracts by the program process, a reset cycle number corresponding to the minimum number of stages of flip-flops necessary to propagate values to the flip-flops in the feedback loop. The checking unit checks by the program process, equivalence by an inductive method, assuming a symbolic simulation result corresponding to the extracted reset cycle number as an initial state of the feedback loop.

According to this, as with the paragraph 2, a processing time for the equivalence checking can be shortened.

[19] <Solely-Determined Correspondence Between Flip-Flop and Variable>

In the paragraph 17 or 18, the generation unit generates by the program process, as the correlation information related to the backward data dependence, first correlation information in which flip-flops corresponding to variables are placed in a one-to-one correspondence with the variables.

According to this, as with the paragraph 3, the first correlation information is suitable for partitioning small, a logic cone with each flip-flop with a feedback loop being taken as an end point.

[20] <Correspondence Dependent on Time Cycle or the like Between Flip-Flop and Variable>

In the paragraph 19, the generation unit generates by the program process, as the correlation information related to the backward data dependence, second correlation information in which flip-flops corresponding to variables are put in a one-to-many correspondence with the variables.

According to this, as with the paragraph 4, the second correlation information is suitable for grasping a logic cone with each flip-flop as an endpoint in a feedback cycle unit of a feedback loop.

[21] <Correspondence Between Flip-Flop and in-High-Level Description Variable Placed in Forward Data Dependence>

In the paragraph 20, the generation unit further generates by the program process, as support information for equivalence checking, information indicative of a correlation between flip-flops with no feedback loop in the hardware description and variables associated therewith with only a forward data dependence in a high-level description. The checking unit checks by the program process, equivalence using the correlation information related to the forward data dependence along with the correlation information related to the backward data dependence.

According to this, as with the paragraph 5, the correlation information related to the forward data dependence is also used in combination to enable the equivalence checking.

[22] <Solely-Determined Correspondence Between Flip-Flop and Variable>

In the paragraph 21, the generation unit generates by the program process, as the correlation information related to the forward data dependence, third correlation information in which flip-flops corresponding to variables are put in a one-to-one correspondence with the variables.

According to this, as with the paragraph 6, the third correlation information is suitable for partitioning small, a logic cone with each flip-flop with no feedback loop being taken as an end point.

[23] <Correspondence Dependent on Time Cycle or the like Between Flip-Flop and Variable>

In the paragraph 22, the generation unit generates by the program process, as the correlation information related to the forward data dependence, fourth correlation information in which flip-flops corresponding to variables are placed in a one-to-many correspondence with the variables.

According to this, as with the paragraph 7, the fourth correlation information is suitable for grasping a logic cone with each different flip-flop as an end point in a process cycle unit with respect to the same function.

[24] <Addition and Modification Made to Correlation Information in Accordance with Priorities>

In the paragraph 23, the generation unit performs by the program process, a necessary addition and modification on the reset cycle number, the first correlation information related to the backward data dependence, the second correlation information related to the backward data dependence, the third correlation information related to the forward data dependence and the fourth correlation information related to the forward data dependence in accordance with priorities. The checking unit checks by the program process, equivalence by reflection of the support information for the equivalence checking subjected to the necessary addition and modification thereon. As priorities related to the addition and modification, the reset cycle number is denoted to be assigned a first priority, the first correlation information related to the backward data dependence is denoted to be assigned a second priority, the second correlation information related to the backward data dependence is denoted to be assigned a third priority, the third correlation information related to the forward data dependence is denoted to be assigned a fourth priority, and the fourth correlation information related to the forward data dependence is denoted to be assigned a fifth priority, respectively. The addition and modification in accordance with the priorities are performed when a process for equivalence checking is not completed within a predetermined restricted time.

According to this, as with the paragraph 8, it is possible to prevent the amount of information such as dependence relation information used in equivalence checking from becoming excessive. The checking for equivalence can efficiently be completed by performing the addition of lower dependence relation information or the modification of a reset cycle number or the like when it is not possible to complete the equivalence checking within a restricted time.

2. Further Detailed Description of the Embodiments

Embodiments will be explained in further detail.

2-1. First Embodiment

Entire Flow for Behavioral Synthesis and Equivalence Checking

Figure 2:
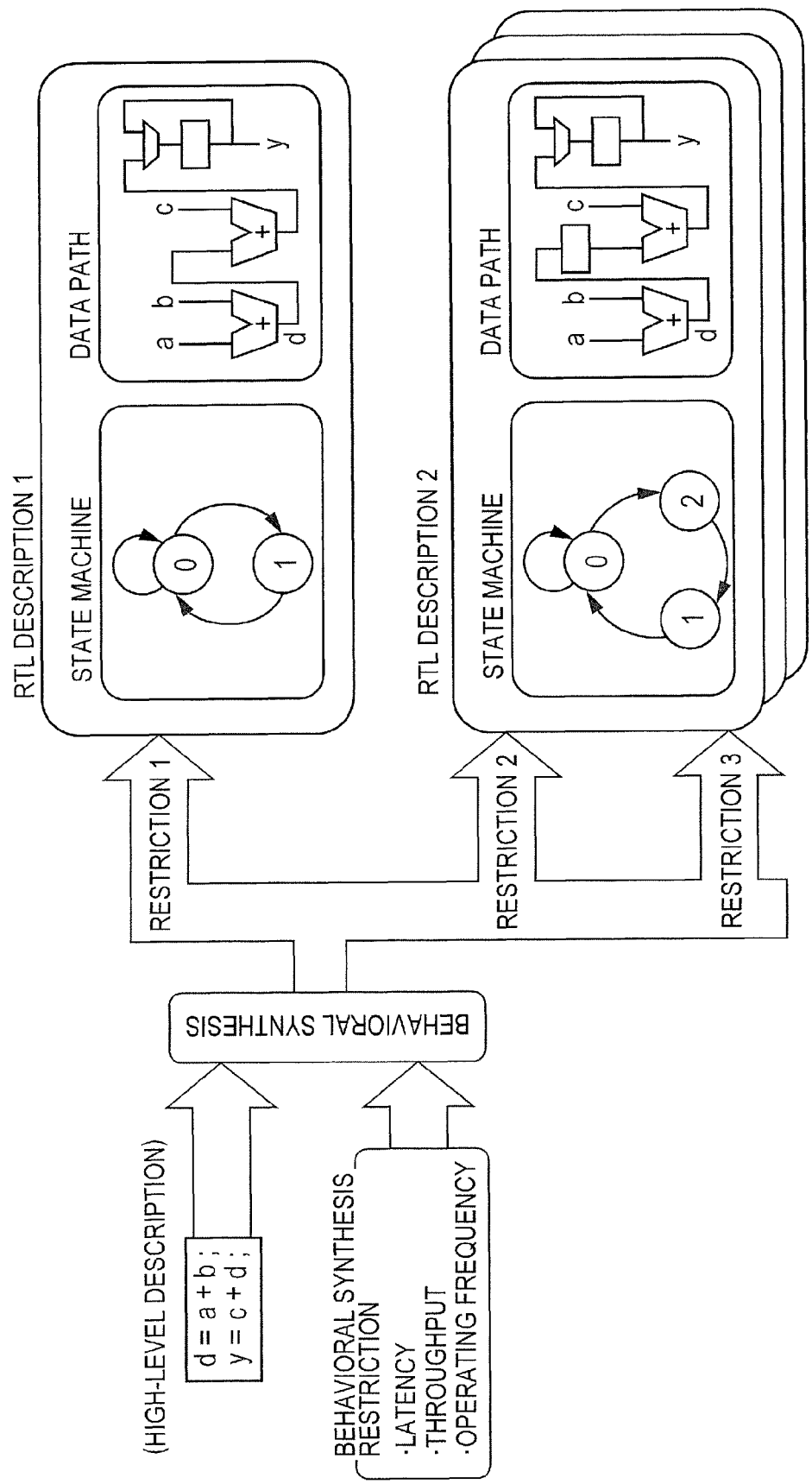
FIG. 2 is an explanatory diagram showing an outline of a behavioral synthesis to generate an RTL description by a behavioral synthesis script.

An entire process flow from a high-level description to the acquisition of a result of equivalence checking is illustrated in FIG. 1. A behavior-synthesizable high-level description (also called behavioral description) 1 is described using a System C or a programming language C or the like that is a system level language. A behavioral synthesis script 2 is a description (behavioral synthesis restriction) that specifies from the high-level description which circuits should be synthesized. A behavioral synthesis process 4 is a process which executes a behavioral synthesis of the high-level description 1 in accordance with the behavioral synthesis script 2 and thereby generates a description based on a hardware description language of RTL (Register Transfer Level) as a behavioral synthesis result 3. This behavioral synthesis result is hereinafter also called simply "an RTL description 3". The behavioral synthesis process 4 is realized by executing a behavioral synthesis program by a computer such as an EWS (Engineering Work Station) or a PC (Personal Computer) or the like. As conceptually illustrated in FIG. 2, the TRL description makes it possible to generate different RTL descriptions such as latency, throughput or operating frequencies from the same high-level description by the behavioral synthesis restriction based on the behavioral synthesis script 2.

In FIG. 1, the behavioral synthesis process 4 generates a model verification script (hereinafter also simply called "model verification script) 5 having described information necessary to execute equivalence checking. The model verification script 5 is descriptive of the correlation between input/output ports in the high-level description and the RTL description, a cycle of comparison between both output ports, etc.

In addition to the above, the behavioral synthesis process 4 generates a state transition table 6 obtainable after scheduling, sharing of resources and execution of a behavioral synthesis and before the output of the RTL description.

An information extraction generation process 7 generates information for manifesting a dependence relation between each register used as a flip-flop in the RTL description and each variable in the high-level description, based on the high-level description 1, the RTL description 3 obtained as the behavioral synthesis result, the state transition table 6 and the model verification script 5 and holds it as a verification script 8. The verification script 8 is ranked as information in which the addition of the information for manifesting the dependence relation and a modification based on such added information have been performed on the model verification script 5.

As the information for manifesting the dependence relation, information about a correlation between each flip-flop with a feedback loop in the RTL description as the synthesis result and each variable with a backward data dependence in a high-level description, which is associated with this, is generated. The correlation information related to the backward data dependence includes first correlation information (variable one-to-one correlation information with the existence of a loop) in which each flip-flop is associated with a variable in a one-to-one relationship, and second correlation information (variable non one-to-one correlation information with the existence of a loop) in which flip-flops each corresponding to a variable are associated therewith in a one-to-many relationship.

As the information for manifesting the correlation related to the dependence relation, information about a correlation between each flip-flop with no feedback loop in the RTL description as the synthesis result and each variable with only a forward data dependence in a high-level description, which is associated with this, is generated. The correlation information related to the forward data dependence includes third correlation information (variable one-to-one correlation information with no loop) in which each flip-flop is associated with a variable in a one-to-one relationship, and fourth correlation information (variable non one-to-one correlation information with no loop) in which a flip-flop corresponding to variables are associated with the variables in a one-to-many relationship.

In addition to the above, as the information for manifesting the dependence relation, the number of reset cycles corresponding to the minimum stage number of flip-flops necessary to propagate values to flip-flops in the feedback loop is extracted. A symbolic simulation result corresponding to the extracted number of reset cycles is applied to the feedback loop as an initial state and utilized for equivalence checking. In the present specification, a feedback loop is grasped as a wide concept including a periodic state transition loop. In the present specification, the flip-flop is also described simply as a register or FF.

In the information extraction generation process 7, the information to be extracted for manifesting the dependence relation may be part of the above information. Alternatively, all information may not be used from the beginning, or the information may be added in conjunction with the progress of equivalence checking. As to which information should first be used, it is desirable to first use one having an effect in shortening an equivalence checking processing time. Assume that for example, a first priority order of priorities to be used is denoted to be a reset cycle period (the number of reset cycles corresponding to the required minimum number of stages of flip-flops) and the execution of bounded equivalence checking corresponding to the reset cycle period (simulation result based on a find error mode). Then, information of variables having the potential for being associated with registers with feedback loops are extracted by an RTL description taken as a behavioral synthesis result, based on variables in a high-level description. In order of decreasing precedence, they may be set as one-to-one correlation information between the variables and their corresponding registers in the RTL description (loop-existing variable one-to-one correlation information), correlation information in which the variable and its corresponding register in the RTL description are not necessarily placed in a one-to-one relationship (loop-existing variable non one-to-one correlation information), one-to-one correlation information between variables in a high-level description other than the above and their corresponding registers in the RTL description (loop-free variable one-to-one correlation information), and non one-to-one correlation information between variables in a high-level description other than the above and their corresponding registers in the RTL description (loop-free variable non one-to-one correlation information).

A high level equivalence checking process 9 determines whether when all input sequences are simulated and an equivalent input is applied to the high-level description and the RTL description, the outputs of the two coincide with each other. For example, equivalence checking is carried out by inductive method-based model checking. In the equivalence checking, the time required for equivalence checking is shortened using the information for manifesting the dependence relation along with the RTL description and the high-level description. Designated at numeral 10 is a result of checking by the high level equivalence checking process 9.

A description will be made of the behavior based on the use of the information for manifesting the dependence relation while referring to conceptual diagrams shown in FIGS. 3 through 6 in order to shorten the equivalence checking time.

Figure 3:
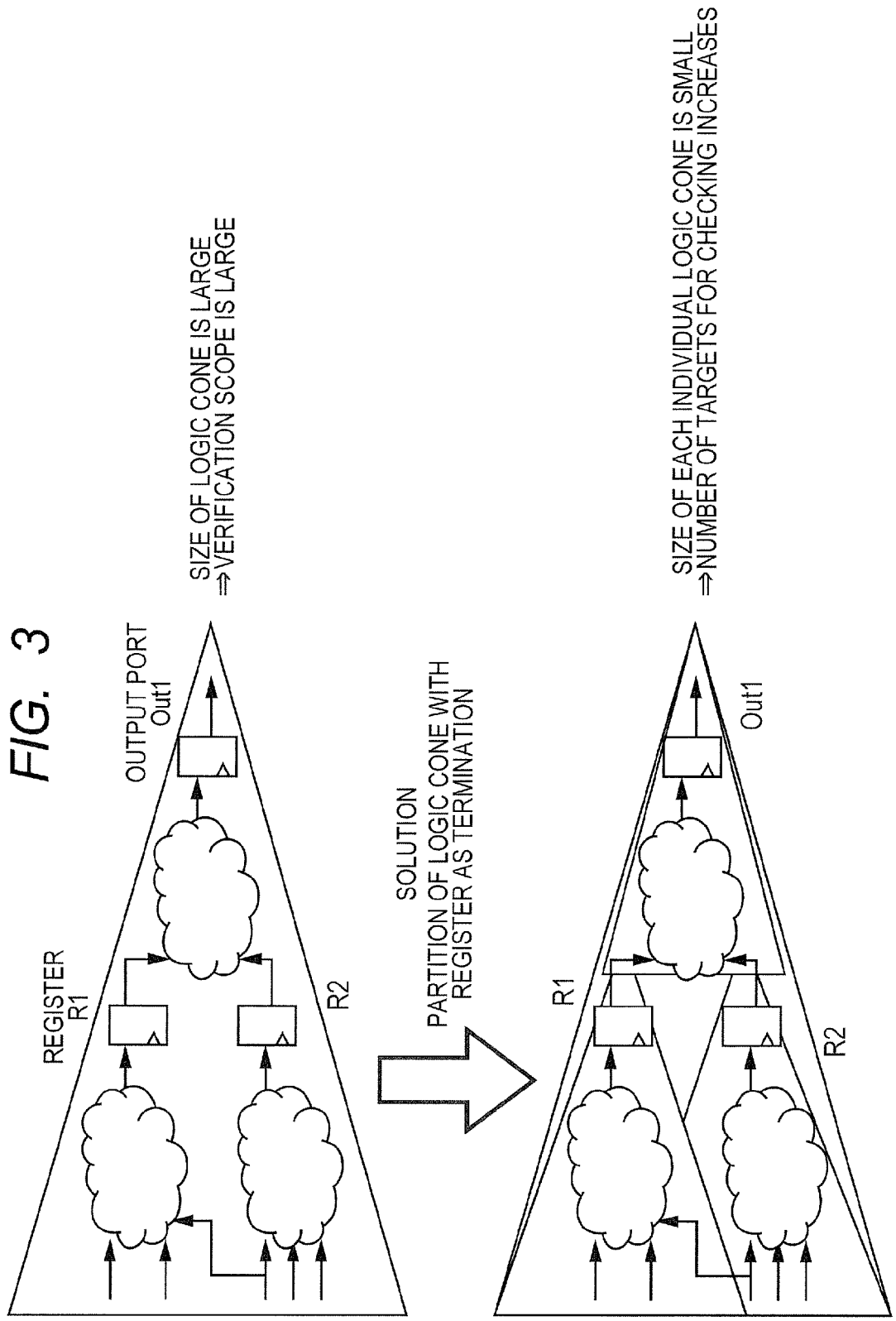
FIG. 3 is an explanatory diagram illustrating an effect obtained by applying a correlation between specific variables and registers.
Figure 4:
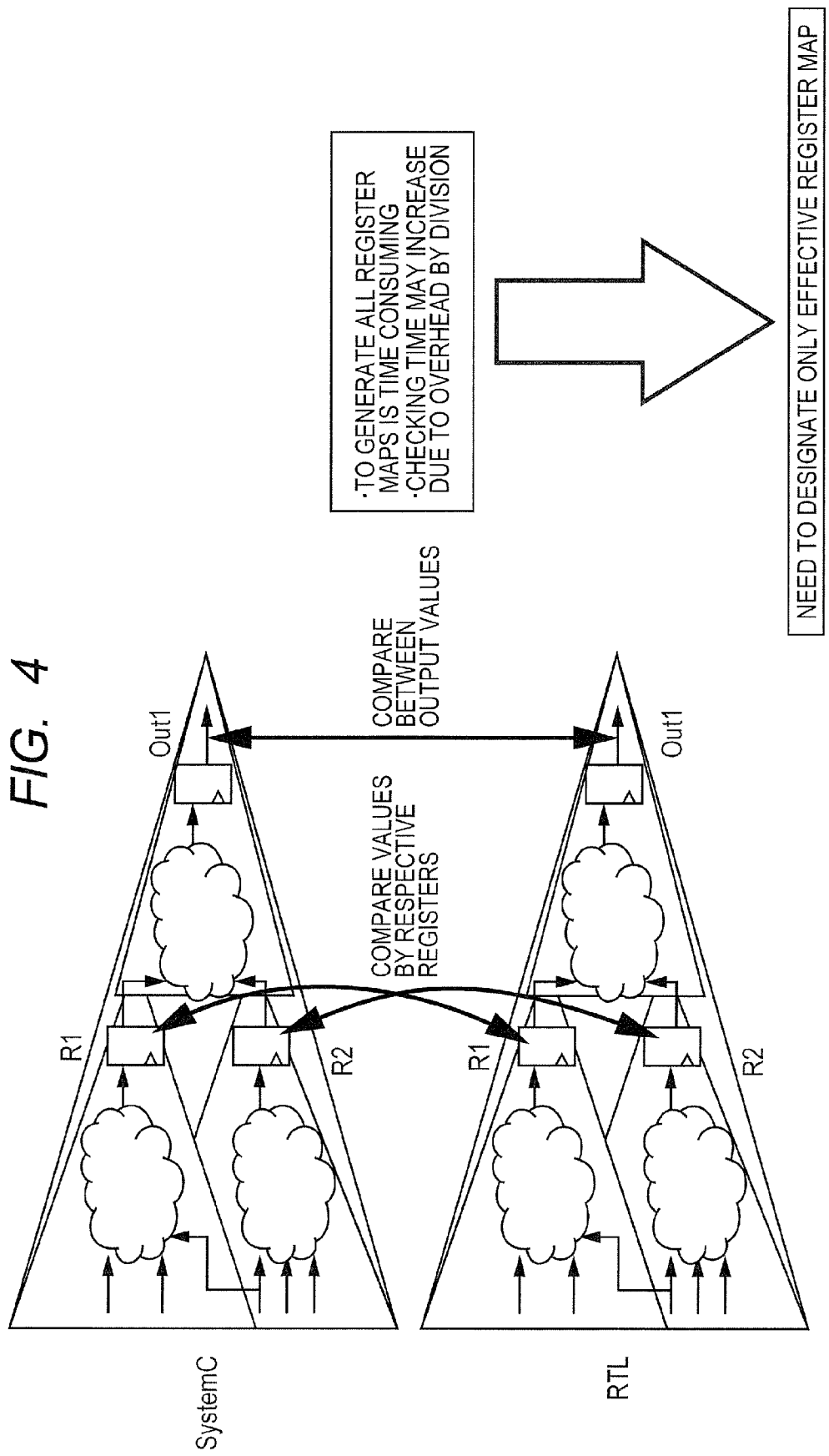
FIG. 4 is an explanatory diagram showing that when the size of a logic cone is reduced, the number of targets for checking increases.
Figure 5:
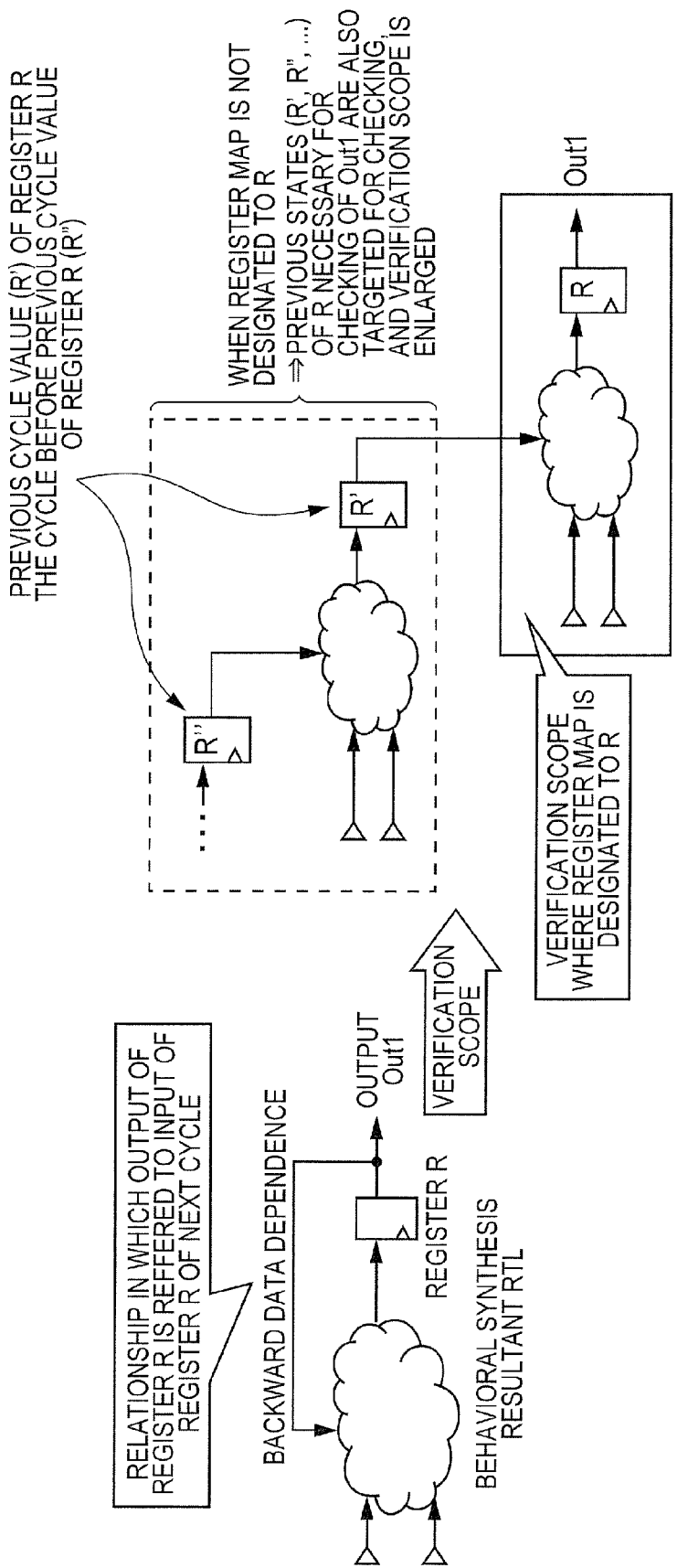
FIG. 5 is an explanatory diagram illustrating the meaning that correspondence with each variable is designated to each register placed in a backward data dependence relation, which configures a feedback loop, and a logic cone is partitioned with respect to each designated register to perform equivalence checking.

An effect developed by applying a correlation between specific variables and registers is conceptually illustrated in FIG. 3. Assume that a logic cone is a unit of equivalence checking. When the logic size of the logic cone is large, a verification scope also becomes massive depending on it. On the other hand, if the logic cone is partitioned into logic cones small in logic scale with registers as terminations, then a verification scope at each individual logic cone becomes small. On the other hand, it is also feared that the number of targets for checking increases as illustrated in FIG. 4 even if the size of each individual logic cone becomes small, thereby resulting in an increase in the checking time in reverse. Thus, the logic cone may preferably be partitioned only where the effect of shortening the equivalence checking time is brought about by virtue of cone's partitioning. As noted by the present inventors, correspondence to each variable with a backward data dependence is designated to each register that configures a feedback loop, and a logic cone is partitioned with respect to the so-designated register to thereby perform equivalence checking. As illustrated in FIG. 5, a feedback loop is placed in a relationship in which the output of a register is referred to the input thereof. Applying a correlation with a variable corresponding to the register as a register map makes it possible to result in equivalence checking between logic cones obtained by cutting the feedback loop. That is, it is possible to suppress the occurrence of a situation that in order to check or verify the output of each register in the feedback loop, a lot of previous states of the register over a plurality of cycles must be targeted for checking, thereby enlarging a verification scope.

A behavior where the number of the reset cycles is extracted and used is conceptually illustrated in FIG. 6. Assuming that when a loop-free state transition path is in connection to a feedback loop, an attempt to perfectly prove equivalence on the inductive method base at its entirety with a reset state S0 taken as an initial state, the state of a feedback loop in which the state of Sn is not determined, is not determined or established either, thus resulting in the need for much processing time to obtain a verification result. At this time, the minimum number of stages of flip-flops necessary to propagate values to the flip-flops in the feedback loop is denoted to be the number of stages of flip-flop sequences (reset cycle pulses) S0 through Sn on the loop-free state transition path coupled to the feedback loop, and the number of reset cycles by such a stage number is extracted. The minimum number of stages of flip-flops necessary to propagate the values to the flip-flops in the feedback loop can be grasped as the minimum number of stages of flip-flops that may be considered at the maximum path of reset cycle paths coupled to the noted feedback loop. This is also referred to as the flip-flop stage number on the minimum and maximum paths by its simplification. A symbolic simulation result corresponding to the number of the reset cycles with respect to the extracted reset cycle path is used in checking of the equivalence of the feedback loop as an initial state of the state Sn in the feedback loop. In brief, it is possible to verify up to the point of partitioning Sn with a Find Error Mode that is of the bounded checking technique and to perform equivalence checking based on an inductive method-based perfect proof like a Full Proof Mode on a periodic state transition loop. Regarding a range similar to the case where the entirety is verified with the Full Proof Mode, the verification scope is divided to make it possible to shorten the processing time.

Although partly overlapped with the above behavioral description, operative effects obtained by using the information for manifesting the dependence relation will be complemented in detail.

An operative effect brought about by applying a Correlation between specific variables and FFs will first be complemented. Assuming that for example, the high-level description shown in FIG. 7 is taken by way of example, a data flow corresponding to the high-level description is illustrated in FIG. 8, and a circuit diagram showing a behavioral synthesis result corresponding to it is illustrated in FIG. 9.

Applying information of a correlation between variables in a high-level description and FFs in an RTL description enables the division of a data flow to be compared in equivalence determination, thus making it possible to perform a speedup by a reduction in the scale targeted for determination. As illustrated in FIGS. 7 through 9, such a speedup in determination as described below is enabled by indicating the correlation between the variable and the FF. That is, assume that correlations between variables x and y, and FFx and FFy are given. It is first verified whether a and a, and (b∧ c)∧ d and b∧ (c∧ d) are equivalent to each other. These are equivalent to each other. It is proved by EOR (Exclusive OR) operations with both fc and fRTL having an equivalent input that fc and fRTL are equivalent to each other.

On the other hand, a problem arises in that checking for whether the correlation is correct is not necessary for equivalence checking, and the checking is executed extra, so that its execution time overhead becomes innegligible. Accordingly, for example, the provision of all correlation information is considered not to be generally preferable. If attention is paid to variables having a backward data dependence in a high-level description, FFs in a corresponding RTL description denote FFs having a feedback loop within an RTL structure. Generally, this structure configures a large state space as compared with a structure with no feedback loop. Therefore, when attention is given to the variables having the backward data dependence, and variable/FF correlation information is provided, the feedback loop can be cut off, thereby making it possible to reduce a state space targeted for checking and achieve the speedup of an equivalence determination process. Paying attention to the variables having the backward data dependence makes it possible to reduce the designated number of correlations between variables and FFs and cut down even a checking overhead as to whether the correlation between the variable and the FF is correct.

Operative effects brought about by a reset cycle calculation will next be complemented.

One implementing means of the high level equivalence checking verifies by the execution of a state expansion based on a symbolic simulation (also simply described as signal Sim) on both of the high-level description and the RTL description, and the like, whether outputs corresponding to all states output or produce the same values. Here, whether the corresponding output becomes the same value can be described in propositional logic. Therefore, in many cases, Safety Property checking targeted for the propositional logic is hence executed.

Those available as techniques for Safety Property Checking include: 1. Checking technology based on inductive method (refer to C. A. J. van Eijk, "Sequential Equivalence Checking Based on Structural Similarities," IEEE Trans. CAD, pp. 814-819, July 2000., M. Sheeran, S. Singh and G. Stalmarck, "Checking Safety Properties Using Induction and a SAT-Solver," In Proc. of Int. Conf. Formal Methods in Computer-Aided Design (FMCAD), pp. 108-125, 2000., P. Bjesse and K. Claessen, "SAT-Based Verification without State Space Traversal," In Proc. of Int. Conf. Formal Methods in Computer-Aided Design (FMCAD), 2000. and Alan Mishchenko, Michael Case, Robert Brayton, and Stephan Jang, "Scalable and Scalably-Verifiable Sequential Synthesis," In Proc. of ICCAD, pp. 234-241, 2008.), 2. Symbolic Model Inspection Method (refer to Edmund M. Clarke and Daniel Kroening, "Checking Consistency of C and Verilog Using Predicate Abstraction and Induction," In Proc. of ICCAD, pp. 66-72, 2004.), 3. Non-bounded Model Inspection Method (refer to J. Baumgartner, A. Kuehlmann, and J. Abraham, "Property Checking via Structural Analysis," In Proc of the 14th Int. Conf. on Computer Aided Verification (CAV), LNCS Vol. 2004, pp. 151-165, 2002., Daniel Kroening, "Computing Over-Approximation with Bounded Model Checking," Electronic Notes in Theoretical Computer Science Vol. 144, pp.

79-92, 2006., and Michael Case, Alan Mishchenko, and Robert Brayton, "Cut-based Inductive Invariant Computation," In Proc. of IWLS, pp 253-258, 2008.), 4. Checking by Achievable State Space Approximation, based on Inductive Invariant Extraction (refer to Michael Case, Alan Mishchenko, and Robert Brayton, "Cut-Based Inductive Invariant Computation," In Proc. of IWLS, pp. 253-258, 2008.), etc.

Even if any of the above technologies is used, the following advantageous effects are obtained by properly applying a reset cycle and bringing a state obtained as a result of execution of a state expansion by a symbol Sim during its cycle period to an initial state.

Firstly, an equivalence checking speedup based on the speedup of an internal equalization point determination or the speedup of an image calculation on a next-state calculation basis can be expected by logic simplification based on constant propagation, respective variables by condition division or identification of a range available with Bits, which has been shown in a document of G. Ritter, "Formal Sequential Equivalence Checking of Digital System by Symbolic Simulation," PhD Thesis, Darmstat University of Technology, Germany, & Universite Joseph Fourier, France March 2001.

Secondly, when the calculation of an achievable state is required as in the case of the above 2., 3., and 4., the state expansion in which the logic simplification is expected is executed in advance in a range in which the coincidence of output values cannot be proved, whereby the speedup of an equivalence determination process by the speedup of an image calculation on a next-state calculation basis can be expected.

Thirdly, the technique described in the above 1. needs to verify that output values coincide in a state space in which a state expansion is done till K times and indicate that the coincidence of output values is established in like manner even in a state space in which state expansion is done till K+1 times, but since a checking speed depends on the value of K, an improvement in the checking speed can be expected by properly selecting this K.

On the other hand, a problem also arises in that when the reset cycle becomes long, a newly-set initial state becomes large. Even if the simplification of a new initial state representation based on the Reparameterization technique by a document of Pankaj Chauhan, Edmund M. Clarke, and Daniel Kroening, "A SAT-Based Algorithm for Reparameterization in Symbolic Simulation," In Proc. of DAC, pp. 524-529, 2004. is performed, there is a fear that processing becomes slow in reverse.

Thus, the proper calculation of the number of reset cycles is required to obtain the effects shown above. In the method according to the present embodiment, attention is focused on the FFs that configure the feedback loop in the RTL structure, i.e., FFs associated with the variables placed in the backward data dependence in the high-level description, and the number of stages of FFs on the minimum and maximum paths loop-free with respect to the feedback loop is extracted as the reset cycle. This reason comes from the following.

When FFs with a feedback loop exist where attention has been focused on the RTL structure, the propagation of symbol values in the symbol Sim does not run through all FFs unless state expansions corresponding to cycles greater than or equal to cycles corresponding to the number of FF stages of the minimum and maximum paths loop-free with respect to the feedback loop are performed.

Since attention is paid to the number of stages of FFs, there are provided values sufficiently smaller than cycles necessary to cover the state space included in the loop. A new initial state obtained after the reset cycle is also supposed not to be large.

Thus, in the case of the techniques described in the above 2., 3., and 4., it is considered that even if the state expansions are performed by the cycles, the number of expansions or less necessary for an achievable state is reached to thereby benefit from the logic simplification.

Even in the case of the technique described in the above 1., the expansion cycles do not exceed the loop-free minimum and maximum paths in the state space defined by all FFs in terms of how to select the number of expansion cycles, i.e., the way of selection in which attention is focused on a loop comprised of some of all FFs. Therefore, a decrease in efficiency due to an increase in Induction Depth (depth of inductive step) K shown in a document of M. Sheeran, S. Singh and G. Stalmarck, "Checking Safety Properties Using Induction and a SAT-Solver," In Proc. of Int. Conf. Formal Methods in Computer-Aided Design (FMCAD), pp. 108-125, 2000, i.e., the speed-down of processing due to a search more than necessary does not occur. Thus, a speed-up based on a reduction in inductive step by setting K shown in the document to a value larger than zero, and a speed-up of an internal equalization point determination by the logic simplification can be expected.

By the above discussions, the equivalence checking technique that results in safety checking by the reset cycle calculation based on the proposed technique is considered to be capable of achieving a processing speedup without depending on its implementation technique.

On the other hand, a problem arises in that if the reset cycle is long, then a newly set initial state becomes large. Even if the representation of a new initial state by a Reparameterization technique descried in a document of Pankaj Chauhan, Edmund M. Clarke, and Daniel Kroening, "A SAT-Based Algorithm for Reparameterization in Symbolic Simulation," In Proc. of DAC, pp. 524-529, 2004. is simplified, a state transition representation comes in danger of becoming complex, thus resulting in a fear that processing becomes slow in reverse.

In the present embodiment, attention is paid to the FFs that configure the feedback loop in the RTL structure, i.e., the FFs associated with the variables having the backward data dependence in the high-level description, and the stage number of FFs on the loop-free minimum/maximum path in the feedback loop is extracted as the reset cycle number. The reason therefor is as follows. When the FFs with the feedback loop exist where attention is given to the RTL structure, the propagation of the symbol values in the symbolic Sim does not run through all FFs unless the state expansions corresponding to the cycles more than the cycles corresponding to the stage number of FFs on the internal loop-free minimum/maximum path in the feedback loop is performed, so that the effect of logic simplification by the constant propagation or the like cannot be expected.

By the reset cycle calculation, the processing speedup of the already-existing equivalence checking in each of the high-level description and the RTL description is considered to be achievable without depending on its implementation technique.

Figure 110:
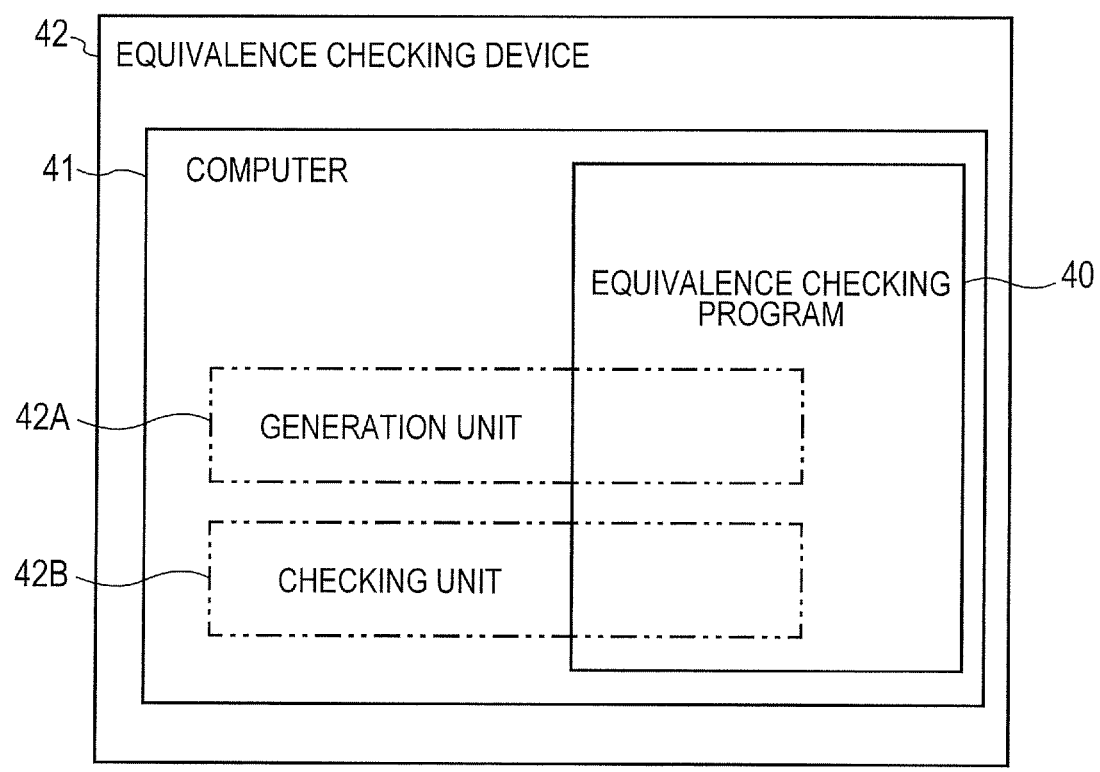
FIG. 110 is an explanatory diagram showing the relationship between a computer, an equivalence checking program and an equivalence checking device.

The information extraction generation process 7 and the high level equivalence checking process 9 are implemented by executing an equivalence checking program 40 by a computer 41 such as an EWS (Engineering Work Station) or a PC (Personal Computer) or the like as illustrated by way of example in FIG. 110. The equivalence checking program is of a program which causes the computer to verify the equivalence of a high-level description 1 and an RTL description 3 in which the high-level description 1 is behavior-synthesized by a behavioral synthesis process 4. Firstly, the present program causes the computer to execute the information extraction generation process 7 taken as a generation step, which generates as restriction information of equivalence checking, correlation information between each register with the feedback loop at the synthesis result and each variable with the backward data dependence in the high-level description, which is associated therewith. Secondly, the program causes the computer to execute the high level equivalence checking process 9 as a checking step which verifies the equivalence using the correlation information related to the backward data dependence. The contents of the respective processes 7 and 9 are as already described.

A device in which the equivalence checking program 40 is installed on the computer 41 configures an equivalence checking device 42. The equivalence checking device has a generation unit 41A which performs the information extraction process 7 by program processing of the computer, and a checking unit 42B which performs the high level equivalence checking process by program processing of the computer. The generation unit and the checking unit are ranked as function implementation means realized by allowing the computer to execute a specific program.

2-2. Second Embodiment

High Level Equivalence Checking is Provided with Time Constraint

Figure 10:
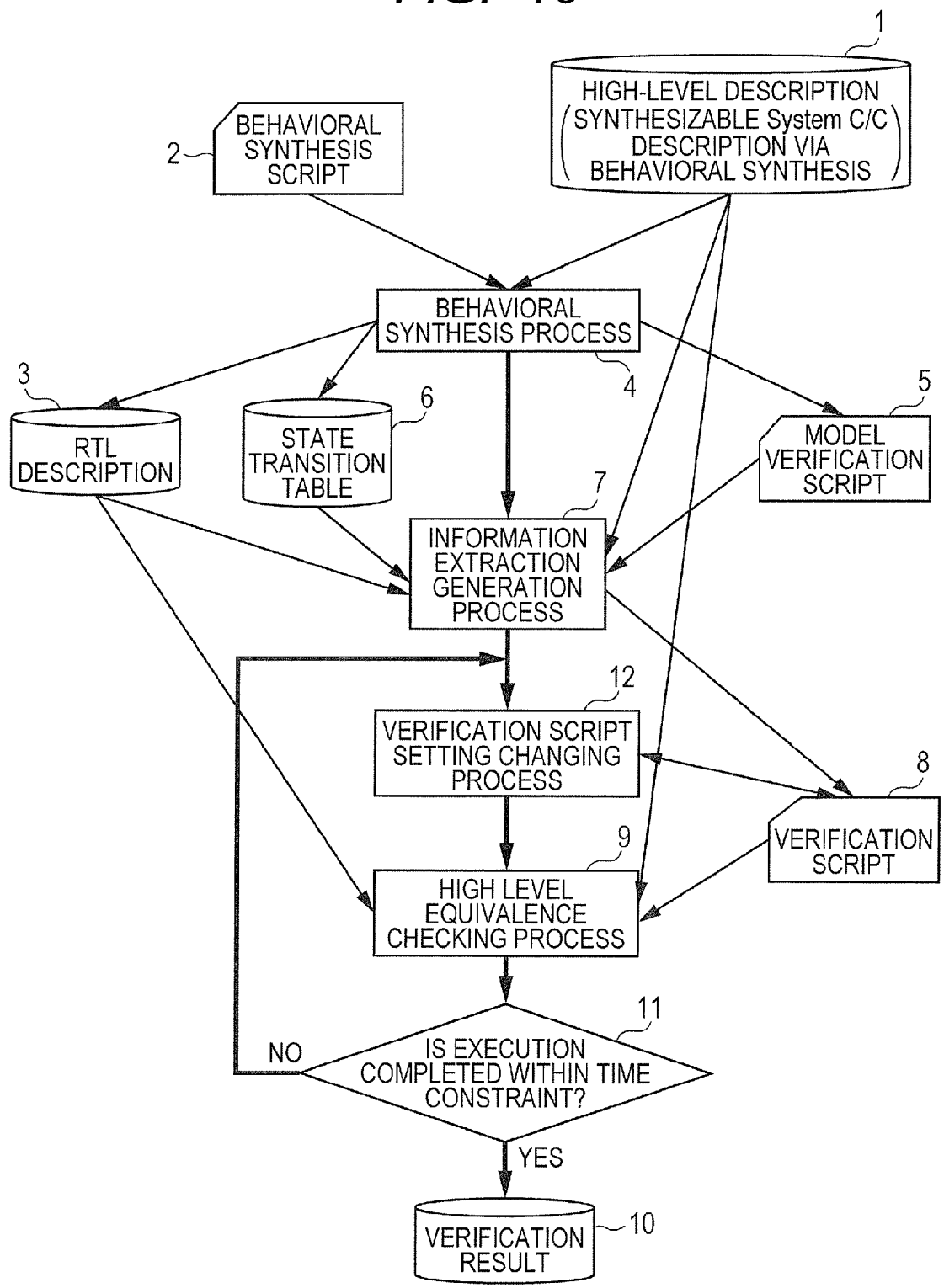
FIG. 10 is a flowchart illustrating an entire equivalence checking process flow where a time constraint is placed on high level equivalence checking.

An entire equivalence checking process flow where high level equivalence checking is provided with a time constraint is illustrated in FIG. 10. A point different from that in FIG. 1 resides in that a time constraint is given to perform high level equivalence checking. That is, a determination process 11 is made as to whether the high level equivalence checking process 9 is completed within a time constraint. When it is determined that the high level equivalence checking process 9 has not been completed within the time constraint, a setting changing process 12 for a verification script is performed, so that the contents of change in its setting thereby are reflected on the verification script 8. Thereafter, a high level equivalence checking process is stated using the verification script 8 with the contents thereof reflected thereon.

The verification script setting changing process 12 is a process which performs the addition and modification of information for manifesting the dependence relation in accordance with priority. For example, the highest priority is assigned to the fact that information of a reset cycle pulse is extracted and made available by applying thereto an initial state obtained by executing a symbolic Sim with attention focused on the reset cycle pulse upon verification of equivalence of each feedback loop. A process for sequentially adding, as information high in priority, first correlation information (loop-existing variable one-to-one correlation information), second correlation information (loop-existing variable non one-to-one correlation information), third correlation information (loop-free variable one-to-one correlation information), and fourth correlation information (loop-free variable non one-to-one correlation information) to the verification script 8 each time a time constraint passes, is carried out. A setting change process for modifying the reset cycle pulse may be added in midstream. Further, several correlation information may collectively be added to the verification script 8 in order of priority.

As a typical example, the extraction of information is performed in order of the following 1) through 6) where the information for manifesting the dependence relation are extracted in the information extraction generation process and given priority. They are 1) information of each variable in a high-level description and having the potential for being associated with each register with a feedback loop in an RTL description taken as a behavioral analysis result, 2) one-to-one correlation information between the extracted variable and its corresponding register in the RTL description (loop-existing variable one-to-one correlation information), 3) correlation information between the extracted variable and its corresponding register in the RTL description, which is not necessarily placed in a one-to-one relationship, 4) one-to-one correlation information between each variable in a high-level description, which is other than the above extracted one, and its corresponding register in the RTL description (loop-free variable one-to-one correlation information), 5) non one-to-one correlation information between each variable in the high-level description other than the above extracted one, and its corresponding register in the RTL description (loop-free variable non one-to-one correlation information), and 6) a reset cycle period (reset cycle path) and the execution of bounded equivalence checking corresponding to the reset cycle period (simulation result with a find error mode). Those information are given priority in order of 6), 2), 3), 4) and 5), and the addition and modification of information to the verification script may be carried out in that order.

In the present embodiment provided with the time constraint, when the execution of equivalence checking cannot be completed within the time constraint where the equivalence checking is first performed using the condition of 6), the process of adding correlation information between each variable and its corresponding register to the verification script 8 may be performed in accordance with priority in the verification script setting changing process 12 to execute the high level equivalence checking.

In the second embodiment, the information extraction generation process 7, the verification script setting changing process and the high level equivalence checking process 9 are achieved by executing an equivalence checking program by a computer such as an EWS (Engineering Work Station) or a PC (Personal Computer) or the like. The equivalence checking program in the second embodiment is of a program that causes the computer to verify the equivalence of a high-level description 1 and an RTL description 3 in accordance with the processing procedure of FIG. 10. A relationship in which a device in which the equivalence checking program is installed in the computer configures an equivalence checking device is identical to the first embodiment.

2-3. Third Embodiment

Direct Extraction of State Transition Table from RTL Description

Figure 11:
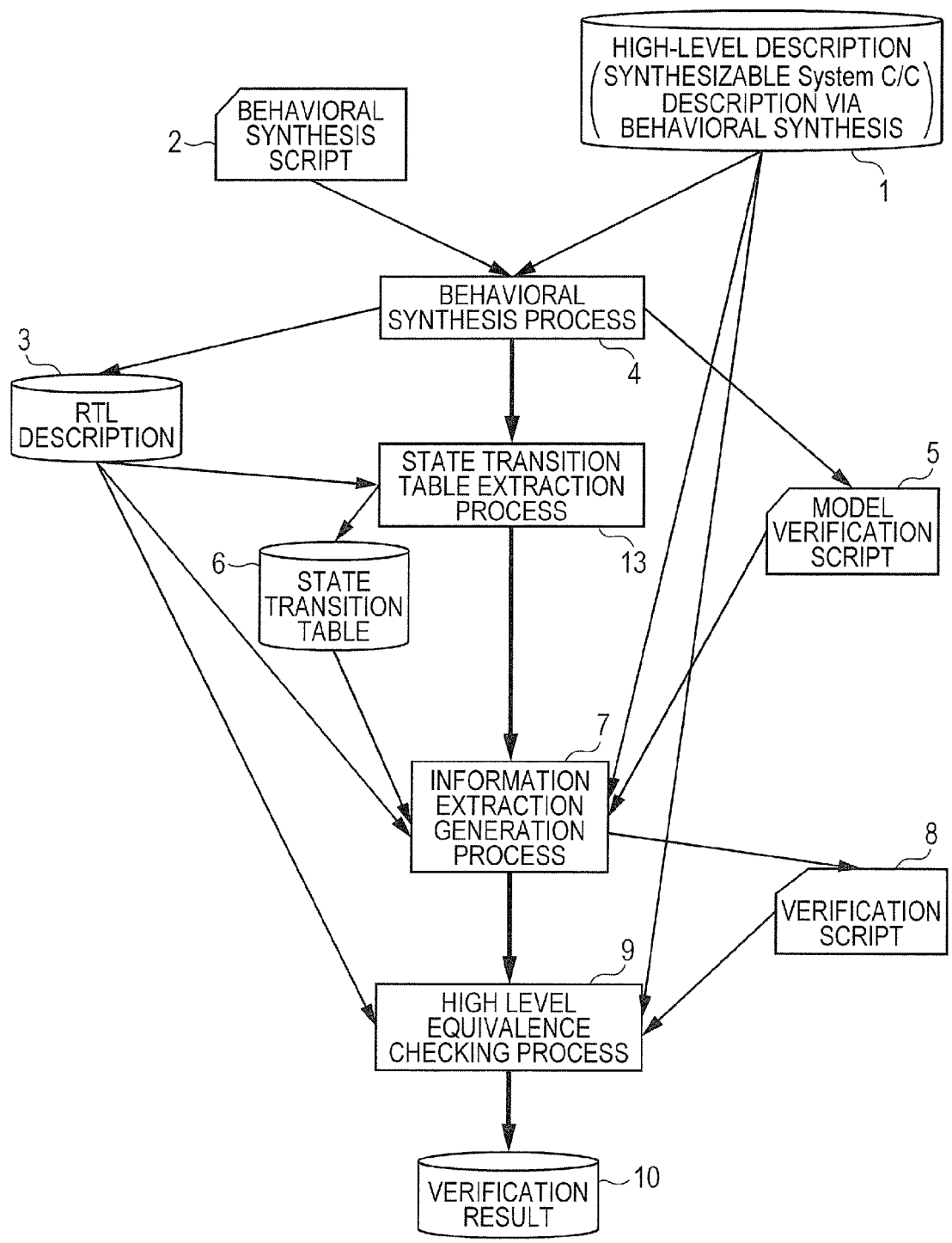
FIG. 11 is a flowchart illustrating an entire equivalence checking process where a state transition table is extracted from an RTL description.

An entire equivalence checking process flow where a state transition table is directly extracted from an RTL description is illustrated in FIG. 11. A point different from that in FIG. 1 resides in that a state transition table 6 is directly extracted from an RTL description 3 by a state transition table extraction process 13.

Figures 13, 14:
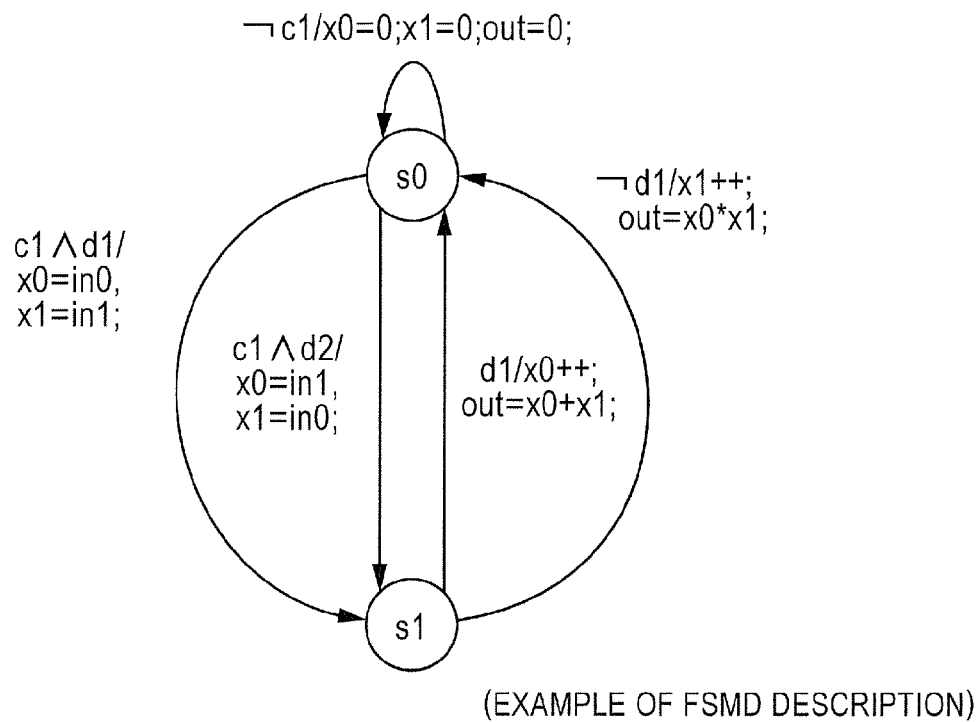
FIG. 13 is an explanatory diagram illustrating an FSMD description corresponding to FIG. 12.
FIG. 14 is an explanatory diagram illustrating a state transition table corresponding to FIG. 12.

The state transition table 6 is a table format of a so-called finite state machine with datapath (FSMD). This directly corresponds to a so-called two-process model in an RTL description in HDL (Hardware Description Language). The two-process model is an RTL description format described in two processes of an always block descriptive of flip-flops such as state FFs, FFs each indicative of a register, etc., and an always block indicative of a combinational circuit comprised of execution statements executed in respective states or state transitions. When a synthesis resultant RTL from a behavioral synthesis tool is described in the two-process model, a state FF can be identified and the operation of substitution into a register FF can also be identified from a combinational circuit description. It is therefore possible to directly extract a state transition table from the synthesis resultant RTL. In such a case, the generation of the state transition table from the behavioral synthesis tool can be substituted with its extraction from an RTL. An example of a two-process RTL description is shown in FIG. 12. An FSMD description corresponding to it is illustrated in FIG. 13, and its corresponding state transition table 6 is illustrated in FIG. 14. As illustrated in FIG. 14, the state transition table 6 involves transition conditions from the present state to the next state. The operation of substitution into each register FF and its execution conditions are described in the state transition table 6 during a state transition. As to further details of the state transition table, there is known a document of H.-P. Juan, "Design Methodology and Algorithms for Interactive Behavioral Synthesis," PhD Thesis, CECS U. C Irvine, 1997.

Figure 15:
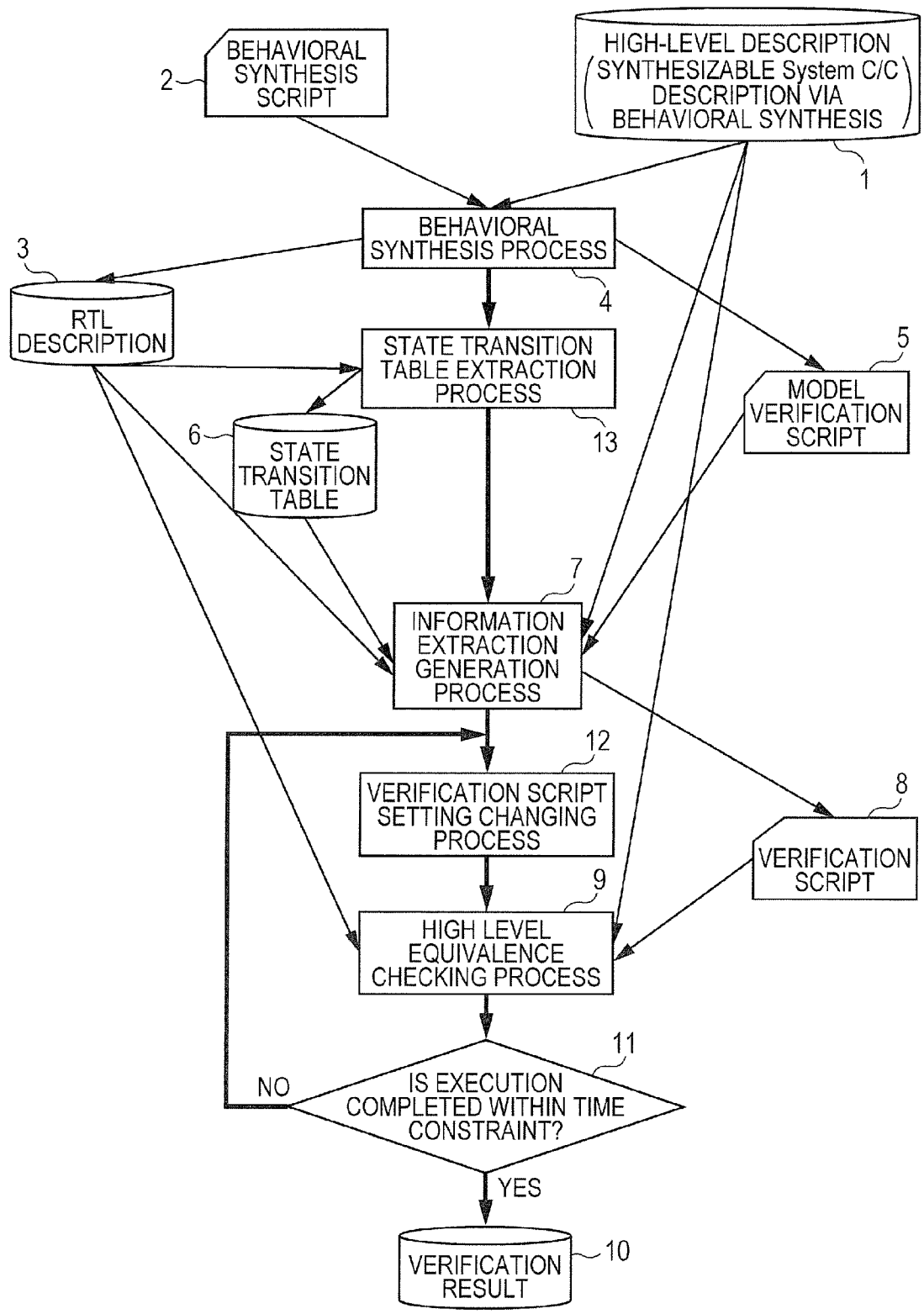
FIG. 15 is a flowchart illustrating an entire equivalence checking process where an RTL description being a synthesis result is always a two-process model and high-level equivalence checking is performed under the provision of a time constraint.

An entire equivalence checking process flow where an RTL description being a synthesis result is always a two-process model, and a time constraint is given to execute high level equivalence checking, is illustrated in FIG. 15.

2-4. Fourth Embodiment

Outline of Information Extraction Process

Figure 16:
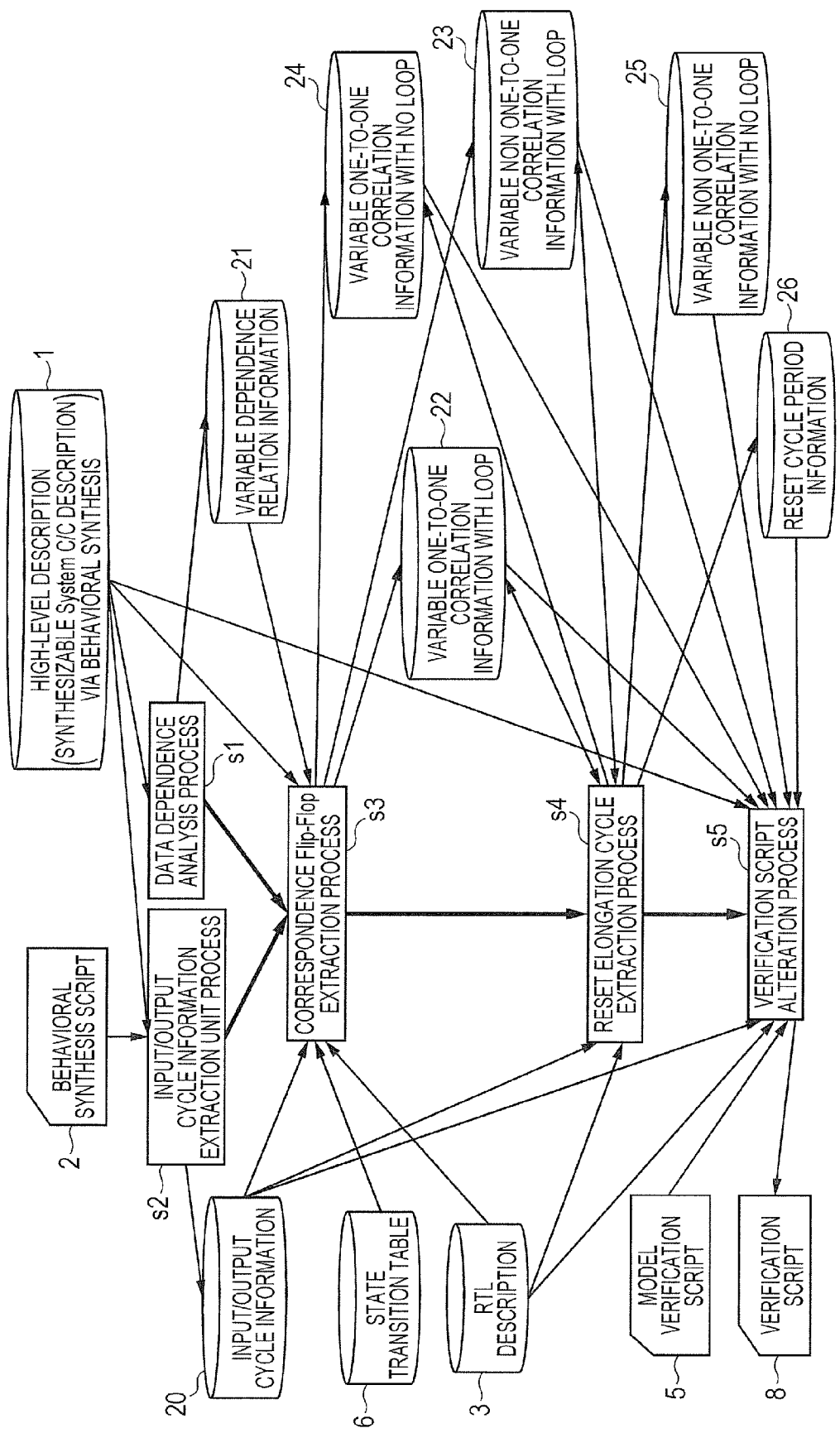
FIG. 16 is a flowchart illustrating a detailed process of an information extraction process in whole.

A detailed processing procedure about an information extraction process 7 is entirely illustrated in FIG. 16. In FIG. 16, the information extraction process 7 is comprised of a data dependence analysis process s1, an input/output cycle information extraction process s2, a correspondence-FF extraction process s3, a reset elongation cycle extraction process s4, and a verification script alternation process s5.

In the data dependence analysis process s1, a data dependence relation analysis for each variable is executed with a high-level description 1 as an input. It is estimated whether the respective variables have the potential for being associated with FFs with a feedback loop in a synthesis resultant RTL description 3. The result of their classification is stored in variable dependence relation information 21.

In the input/output cycle information extraction process s2, the high-level description 1 and a behavioral synthesis script 2 are read. An analysis as to whether the synthesis resultant RTL description 3 is a pipeline circuit and an analysis as to whether throughput of each input/output is a constant cycle are executed. In the case of the constant cycle, a throughput cycle number of each input/output is acquired. In the case of the pipeline circuit, a latency cycle number is acquired in addition to it. Further, a throughput cycle number is acquired with an input high-level description being regarded as a cycle accurate description. These acquired information are stored in their corresponding input/output cycle information 20.

In the correspondence-FF extraction process s3, the high-level description 1, synthesis resultant RTL description 3, variable dependence relation information 21, state transition table 6 and input/output cycle information 20 are read to analyze the correlation between each variable in the high-level description 1 and each FF in the synthesis resultant RTL description 3. Here, as to each variable (hereinafter called loop-free variable) having no potential for being associated with each FF with the feedback loop in the synthesis resultant RTL description 3, an analysis is made as to whether the FF to be associated in a one-to-one relationship exists in each variable. If it is found to exist therein, its correspondence relation or correlation is stored in variable one-to-one correlation information 24. If it is found not to exist therein, its correlation is stored in variable non one-to-one correlation information 25. As to variables (hereinafter called loop-existing variables) each having the potential for being associated with each FF with the feedback loop in the synthesis resultant RTL description 3, an analysis is first made as to whether the FF to be associated in a one-to-one relationship exists in each variable. If it is found to exist therein, its correlation is stored in variable one-to-one correlation information 22. If the variables in which the FFs be associated in the one-to-one relationship do not exist, still remain, then attention is given to the condition of assignment to each FF in the state transition table 6. An analysis is then made as to whether each FF to be associated under condition exists. If it is found to exist, its correlation is stored in loop-existing variable non one-to-one correlation information 23.

In the reset elongation cycle extraction process s4, the synthesis resultant RTL description 3, loop-existing variable one-to-one correlation information 22, loop-existing variable non one-to-one correlation information 23, and input/output cycle information 20 are taken as inputs. An analysis is then made as to whether each feedback loop formed by the FFs associated with the loop-existing variables in the RTL description 3 exists. If it is found to exist, then the minimum cycle number required to propagate values to all FFs in each feedback loop is determined. Of this cycle information, the maximum value is stored in reset cycle period information 26 when the pipeline circuit is not taken. In the case of the pipeline circuit, the large one between the maximum value and the value of a latency cycle number −1 is stored in the reset cycle period information 26. On the other hand, when the feedback loop is not configured by the RTL description 3, correlation information that variables in the RTL description have are respectively stored in the loop-free variable one-to-one correlation information 24 and the loop-free variable non one-to-one correlation information 25, and the variables are respectively deleted from the loop-existing variable one-to-one correlation information 22 and the loop-existing non one-to-one correlation information 23.

In the verification script alternation process s5, the high-level description 1, synthesis resultant RTL description 3, input/output cycle information 20, four variable/FF correlation information (loop-existing variable non one-to-one correlation information 23, loop-existing variable one-to-one correlation information 22, loop-free variable non one-to-one correlation information 25 and loop-free variable one-to-one correlation information 24), reset cycle period information 26 and model verification script 5 outputted by the behavioral synthesis process 4 are set as inputs. These information are added by modifying the model verification script 5, and a verification script 8 is outputted.

<<Data Dependence Analysis Process>>

The data dependence analysis process s1 will be described in detail.

With the high-level description 1 as an input, a data dependence relation analysis for each variable is executed using the existing compiler technology. It is estimated whether the respective variables have the potential for being associated with FFs each having a feedback loop in the synthesis resultant RTL description 3. The result of their classification is stored in the variable dependence relation information 21.

Figure 17:
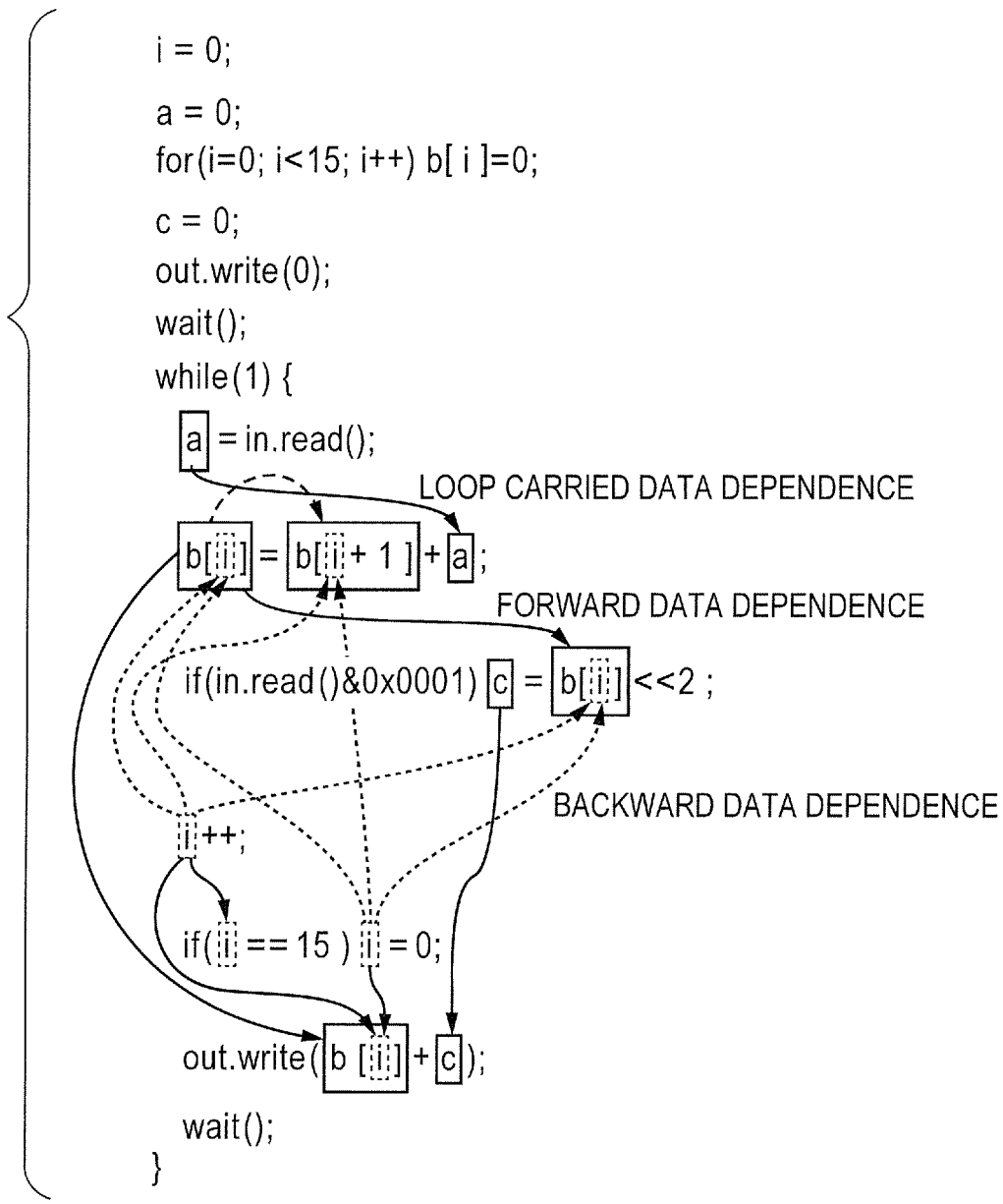
FIG. 17 is an explanatory diagram illustrating a backward data dependence relation.

Here, the backward data dependence means a relation in which as illustrated in FIG. 17, the definition and reference of each variable are performed in the direction opposite to the execution of a program. Each variable having the backward data dependence is identified as the variable having the potential for being associated with each FF with the feedback loop. The data dependence relations of the high-level description 1 of FIG. 12 are collectively described in FIG. 18.

In the high-level description capable of a behavioral synthesis, the entire behavioral description is described within an infinite loop to bring the operation of hardware to modeling. Even where a loop carried data dependence relation, i.e., the reference to each variable after having gone around a loop once or more after such a definition to each variable as shown in FIG. 17 may be made, the variable is identified as a variable having the potential for being associated with each FF with the feedback loop.

In the present analysis, there is no problem even if the analysis is done with the loop carried data dependence relation taken as the backward data dependence. Therefore, as to a loop carried data dependence analysis between array elements, an array variable is taken as one scalar variable, and only an analysis as to whether the backward data dependence exists may be performed.

Further, while the variable definition is done within each branch as shown in FIG. 17, in all branches, variables in which the variable definition is not performed, are also identified as variables each having the potential for being associated with each FF with the feedback loop.

Variables each having a forward data dependence are variables in a high-level language description as shown in FIG. 17 and indicate variables in each of which the data dependence relation exists, and which has no backward data dependence and loop carried data dependence relation. This variable is identified as a variable having no potential for being associated with each FF with the feedback loop.

In the analysis related to the data dependence relation, attention is given only to the assignment and reference to each variable. Only an assignment statement to each variable targeted for analysis and its reference are analyzed as objects, and an analysis having considered a transitive closure of an assignment operation is not carried out.

Incidentally, the data dependence analysis technology necessary for the present analysis can make use of the data dependence relation analysis based on the existing compiler technology as it is. It has been disclosed in a document of Kunio Nakata "Configuration and Optimization of Compilers" Asakura Publishing Co., Ltd., 1999 and Alfred V. Aho, Monica S. Lam, Ravi Sethi, and Jeffrey D. Ullman, "Compilers: Principles, Techniques, & Tools with Gradiance (2nd Edition)," Addison Wesley, 2007, etc.

Figure 19:
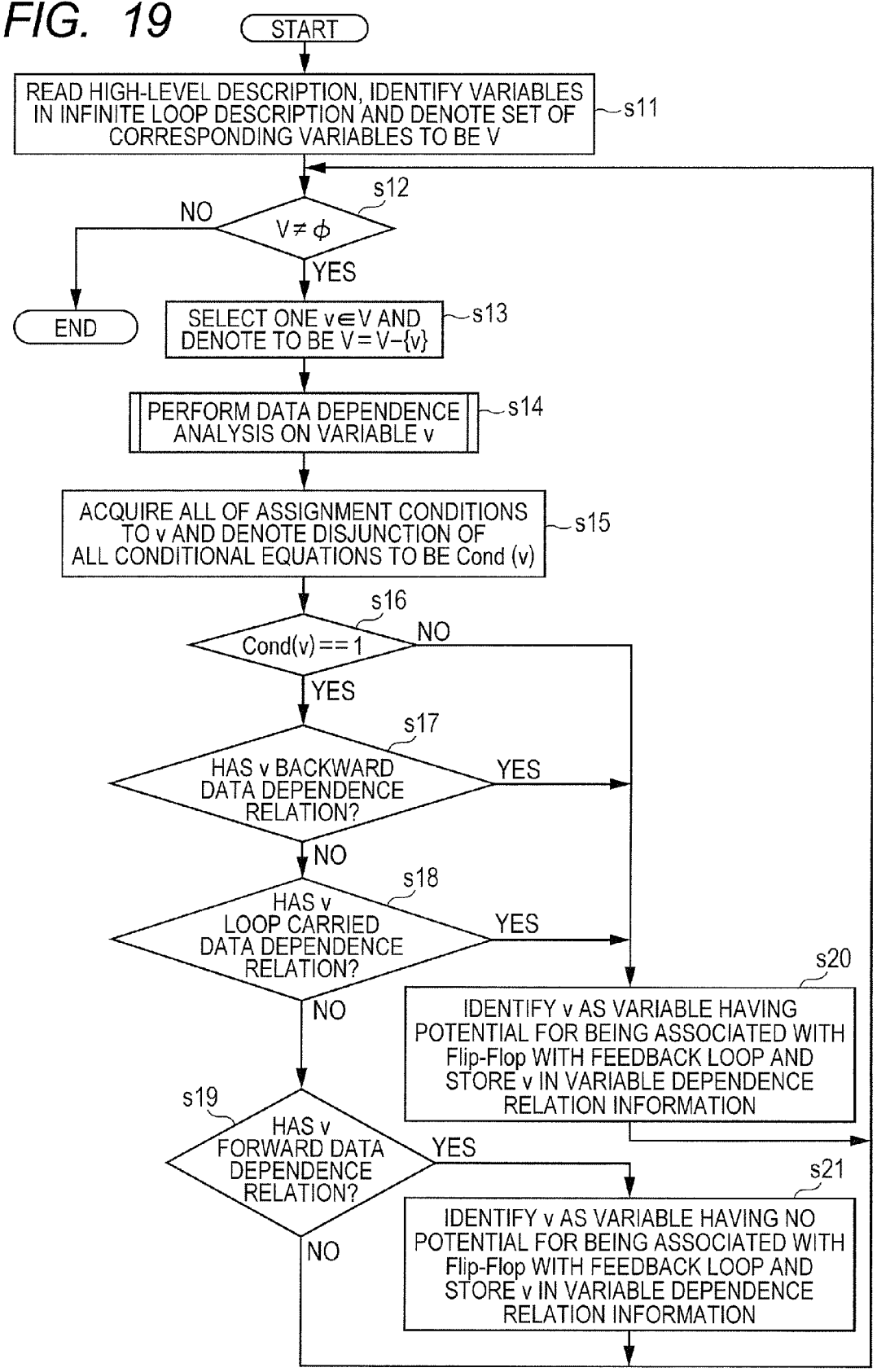
FIG. 19 is a flowchart showing one example of a data dependence analysis process.

A flowchart of a data dependence analysis process is illustrated in FIG. 19. The contents of processing in respective Steps in the data dependence analysis process s1 are as follows. Incidentally, in the flowcharts referred to in the present specification, rectangles in which vertical lines are respectively applied to the right and left positions means function calls and are shown in the drawings as distinguished from simple rectangles which mean a process.

In s11, a high-level description is read to identify variables in an infinite loop description. A set of the corresponding variables is denoted to be V, and the process proceeds to s12.

In s12, it is determined whether the set V is an empty set. If it is determined to be the empty set, then the process is terminated. If it is determined not to be the empty set, then the process proceeds to s13.

In s13, one variable v is selected from the set V, and the variable v is deleted from the set V, after which the process proceeds to s14.

In s14, a data dependence analysis on the variable v is performed using the existing compiler technology, and the process proceeds to s17. Incidentally, when the high-level description is accompanied by a pointer variable, it is changed to a description free of the existence of a pointer. When the variable v is of an array variable, a data dependence analysis between array elements is also performed together.

In s15, assignment conditions to the variable v are all acquired. A conditional expression Cond(v) in which they are disjunctioned is formed, and the process proceeds to s15.

In s16, it is determined whether Cond(v) is true. If it is determined to be true, then the process proceeds to s16. If not so, then the process proceeds to s20. Here, in the valid determination, the identification of an assignment statement to each variable in Cond(v) is executed if necessary, and the replacement of each variable in Cond(v) is performed. Then, a valid determination based on a satisfiability determination is carried out.

In s17, it is determined whether the variable v is of a variable having a backward data dependence relation. If it is determined to have it, then the process proceeds to s20. If it is determined not to have it, then the process proceeds to s18.

In s18, it is determined whether the variable v is of a variable having a loop carried data dependence relation. If it is determined to have it, then the process proceeds to s20. If it is not so, then the process proceeds to s19.

In s19, it is determined whether the variable v is of a variable having a forward data dependence relation. If it is determined to have it, then the process proceeds to s21. If it is no so, then the process proceeds to s12.

In s20, the variable v is identified as a variable having a loop and stored in its corresponding variable dependence relation information. Thereafter, the process proceeds to s12.

In s21, the variable v is identified as a loop-free variable and stored in its corresponding variable dependence relation information. Thereafter, the process proceeds to s12.

Figure 20:
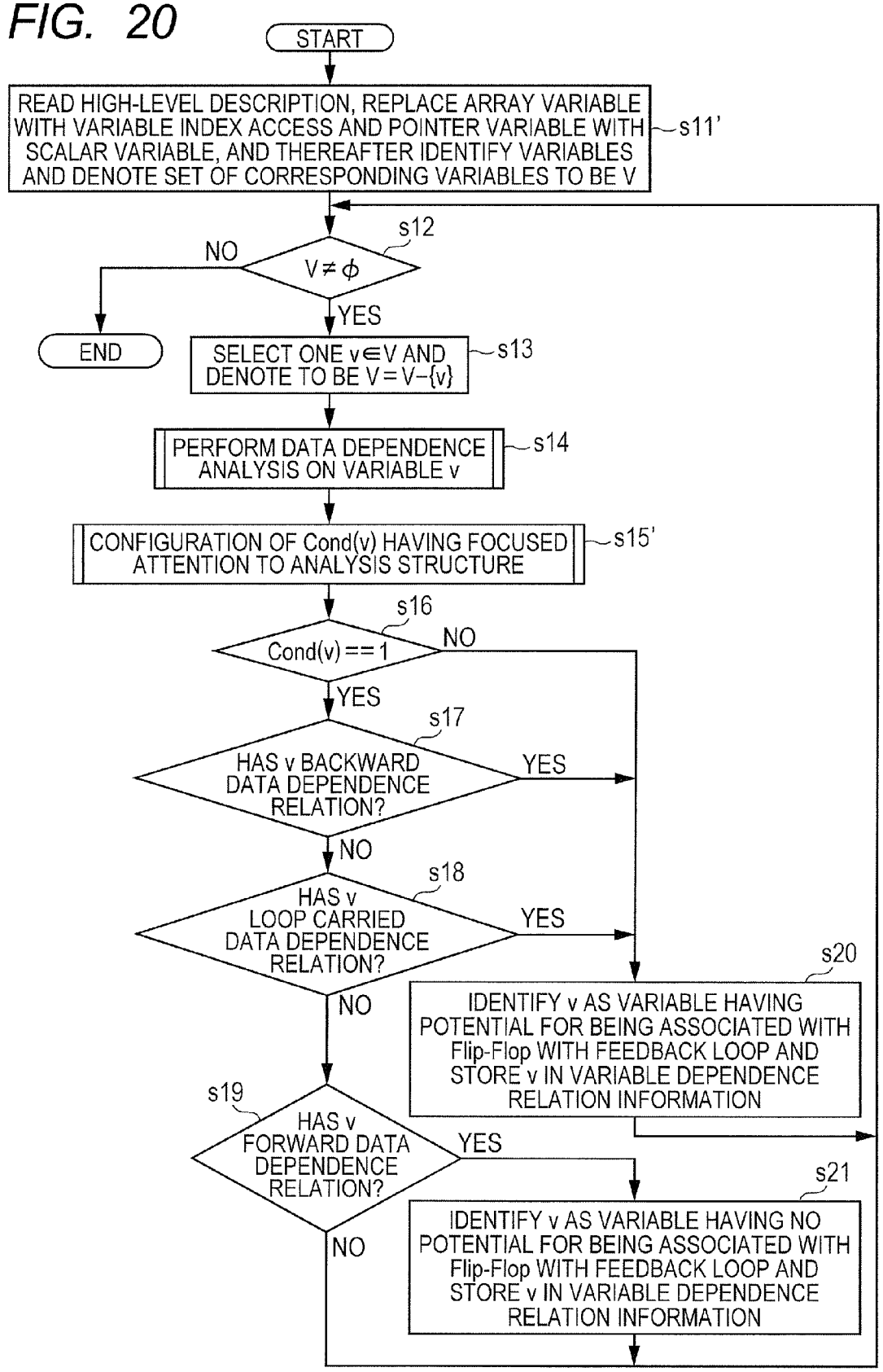
FIG. 20 is a flowchart showing one example of a data dependence analysis process using a speed-up technique.

One example of a data dependence analysis process using a speed-up technique is shown in FIG. 20. Before FIG. 20 is described in detail, the essential point of the speed-up technique will be explained.

In order to make it possible to handle an array variable without identifying a difference in index, the array variable is replaced with a scalar variable to perform its analysis where the index is a variable.

When the array index is the variable, there is a possibility that the loop carried data dependence relation will exist. When the loop carried data dependence exists, it can be identified as backward data dependence, whereas even when the loop carried data dependence does not exist, there is a possibility that the backward data dependence relation will be identified as being present. Since, however, a reset elongation cycle extraction unit determines whether the latter variable is actually being associated with each FF with a feedback loop in an RTL, safe abstraction is made. Owing to the safe abstraction, the data dependence analysis between the array elements high in computational cost becomes unnecessary.

The pointer variable is substituted with the scalar variable to perform its analysis. In terms of discussions similar to the array variable, safe abstraction is made. With this safe abstraction, a pointer analysis and a data dependence analysis between array elements both high in computational cost become unnecessary.

A valid determination as to variable assignment conditions by a branch structure analysis in which a variable assignment is being made, is done without determining whether the variable assignment conditions based on ORing or disjunction of branch conditions for the variable assignment conditions are valid. When an assignment statement to an array variable v accompanied by a pointer variable v and a variable index exists in each branch, the conditional expression or the variable is denoted to be Cond(v)≠1 in this case (even after the substitution of the scalar variable). If the assignment to the same variable v is being done in the form unaccompanied by a branch structure before the branch, the variable is denoted to be Cond(v)=1. If the assignment to the same variable v is being done in the form unaccompanied by the branch structure after the branch, the variable is denoted to be Cond(v)=1. When a case other than the above is taken and if the assignment to the same variable v is being made to all other branches in an if-else statement or a switch-case statement, the variable is denoted to be Cond(v)=1. If not so, then the variable is denoted to be Cond(v)≠1. The above series of processes are called a "configuration of Cond(v) having focused attention to a branch structure". An adverse effect due to the above processing is that there is a case where a variable to be originally determined to be Cond(v)=1 is determined to be Cond(v)≠1, but the adverse effect will present no problem in terms of discussions similar to the array variable. Owing to the substitution to the above processing, the process of determining whether Cond(v)=1 is speeded up.

The contents of processing of respective steps in the speeded-up data dependence analysis process s1 in FIG. 20 are as follows.

In s11', a high-level description is read, and an array variable and/or a pointer variable in which each array index in an infinite loop description is a variable, are respectively replaced with scalar variables, followed by their identification. A set of the corresponding variables is denoted to be V, and the process proceeds to s12. Here, array variables each accompanied by a constant index alone are also replaced with mutually-different scalar variables capable of identifying differences between index values.

In s12, it is determined whether the set V is an empty set. If it is determined to be the empty set, then the process is terminated. If it is determined not to be the empty set, then the process proceeds to s13.

In s13, one variable v is selected from the set V and the variable v is deleted from the set V, after which the process proceeds to s14.

In s14, a data dependence analysis on the variable v is performed using the existing compiler technology, and the process proceeds to s17.

In s15', a "configuration of Cond(v) having focused attention to a branch structure" is made, and the process proceeds to s15.

In s16, it is determined whether Cond(v) is valid. If it is determined to be valid, then the process proceeds to s16. If not so, then the process proceeds to s20. Incidentally, since whether or not Cond(v) is valid is determined in s15, only a branch of processing is carried out in s16.

In s17, it is determined whether the variable v is of a variable having a backward data dependence relation. If it is determined to have it, then the process proceeds to s20. If it is determined not to have it, then the process proceeds to s18.

In s18, it is determined whether the variable v is of a variable having a loop carried data dependence relation. If it is determined to have it, then the process proceeds to s20. If it is not so, then the process proceeds to s19.

In s19, it is determined whether the variable v is of a variable having a forward data dependence relation. If it is determined to have it, then the process proceeds to s21. If it is no so, then the process proceeds to s12.

In s20, the variable v is identified as a variable having a loop and stored in its corresponding variable dependence relation information. Thereafter, the process proceeds to s12.

In s21, the variable v is identified as a loop-free variable and stored in its corresponding variable dependence relation information. Thereafter, the process proceeds to s12.

<<Input/Output Cycle Information Extraction Process_Process Outline>>

An outline of the input/output cycle information extraction process s2 will be explained.

First, the input/output cycle information process s2 reads the high-level description 1 and the behavioral synthesis script 2 and performs the following processing.

(1) Input information is analyzed and synthesis resultant RTLs3 are classified as follows: a) pipeline (hereinafter also called Pipeline) synthesis RTL: RTL in which the entire circuit is accompanied by a fixed Throughput/latency cycle, b) cycle accurate synthesis RTL: RTL in which a consumption cycle from each input of the high-level description to each output thereof is maintained, c) path latency setting synthesis RTL: synthesis resultant RTL where an execution cycle number is designated to a program path in the high-level description by a synthesis script or synthesis directive aside from a program description separately, d) internal loop Pipeline synthesis RTL: synthesis resultant RTL where Pipelining accompanied by the specification of a fixed Throughput/Latency cycle is designated to an internal loop in the high-level description by a synthesis script or a synthesis directive aside from a program description separately, and e) non-cycle accurate synthesis RTL: synthesis resultant RTL where an execution cycle number designates or specifies a fixed Throughput/Latency cycle with respect to an internal loop and Pipelining is designated or specified to a program path in the high-level description by a synthesis script or a synthesis directive aside from a program description separately.

(2) Input/output cycle information of a high-level description is acquired.

(3) Input/output cycle information of a synthesis resultant RTL corresponding to each RTL structure after classification is acquired.

(4) Based on the acquired input/output cycle information, synthesis resultant RTLs other than the Pipeline synthesis RTL and the cycle accurate synthesis RTL are classified again as follows: a) input/output throughput ratio constant RTL: RTL in which each input/output throughput of a high-level description is constant, each input/output throughput of RTL is constant, and the ratio between respective throughput cycles becomes a constant value, and b) input/output throughput ratio non-constant RTL:RTL other than the above.

Second, the input/output cycle information process s2 further performs a synthesis resultant RTL structure classification process using input information as follows:

The process s2 interprets a command in the behavioral synthesis script and a synthesis directive in the high-level description.

When a Pipeline synthesis specification is being performed on the entire description, the process s2 identifies it as a Pipeline synthesis RTL.

When only an execution cycle specification for the program path in the high-level description is specified by the synthesis command or the synthesis directive, the process s2 identifies it as a path latency setting synthesis RTL.

When only a Pipelining specification with the specification of the fixed Throughput/Latency cycle is specified only with respect to an internal loop in the high-level description by the synthesis command or the synthesis directive, the process s2 identifies it as an internal loop Pipeline synthesis RTL.

When both described above are designated, the process s2 identifies it as a non-cycle accurate synthesis RTL.

In the case other than the above, the process s2 identifies it as a cycle accurate synthesis RTL.

<<Information Extraction Targeted for Input/Output Cycle Information Extraction Process_Pipeline Synthesis RTL>>

A description will be made of the information extraction targeted for the Pipeline synthesis RTL in the input/output cycle information extraction process s2.

Information to be extracted by the information extraction process targeted for the Pipeline synthesis RTL is the greatest common divisors of Throughput/Latency cycles of the respective inputs/outputs in a Pipeline circuit, and acquired Throughput values.

Figure 24:
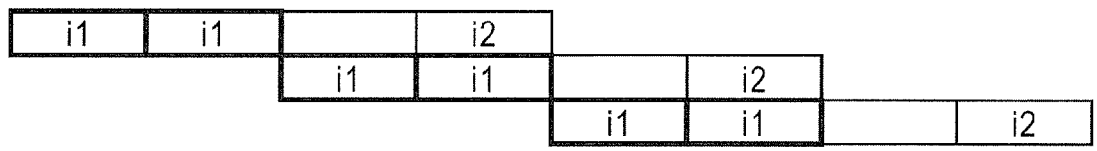
FIG. 24 is a timing chart illustrating a pipeline operation in which the same input signals are provided in plural stages and exist from a first stage to a throughput cycle-th stage.
Figure 25:
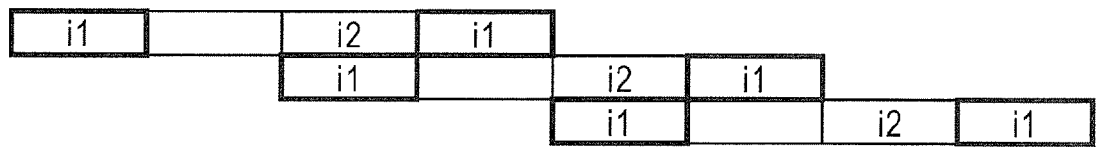
FIG. 25 is a timing chart illustrating a pipeline operation in which the same input signals are assigned to different stages within interval cycles during which stages corresponding to latency cycles are partitioned for each throughput cycle interval.
Figure 26:
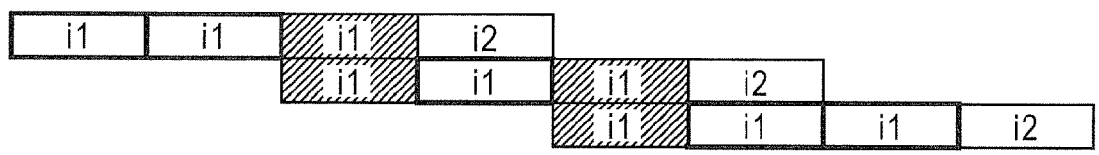
FIG. 26 is a timing chart illustrating a pipeline operation in which the same output signals are provided in plural stages and the dropping of input data occurs.

Regarding a Pipeline architecture, each input/output is assigned to any of respective stages of a Pipeline. Particularly when the inputs/outputs are assigned to a plurality of stages, the inputs or the outputs are either one of 1) whether they exist in any of Throughput cycle-th stages as viewed from the first stage, and 2) whether the outputs are assigned to different stages within interval cycles during which stages each corresponding to a Latency cycle are partitioned every Throughput cycle interval. When the above conditions of 1) and 2) are not actually met, the output collisions occur as shown in FIGS. 21 through 26. In the case of the inputs, input collisions occur, and the dropping of input data occurs by the number of collisions, thus resulting in an input operation different from the high-level description. FIG. 21 shows a pipeline operation in which the same output signals are provided as plural and they exist from a first stage to a throughput cycle-th stage. FIG. 22 illustrates a pipeline operation in which the same output signals exist in plural stages and are allocated to different stages within interval cycles during which stages corresponding to latency cycles are partitioned for each throughput cycle interval. FIG. 23 illustrates a pipeline operation in which the same output signals are provided in plural stages and cause output collisions. FIG. 24 illustrates a pipeline operation in which the same input signals are provided in plural stages and exist from a first stage to a throughput cycle-th stage. FIG. 25 illustrates a pipeline operation in which the same input signals are provided in plural stages and assigned to different stages within interval cycles during which stages corresponding to latency cycles are partitioned for each throughput cycle interval. FIG. 26 illustrates a pipeline operation in which the same output signals are provided in plural stages and the dropping of input data occurs.

The acquisition of Throughput/Latency information is performed in the following manner. A command in the behavioral synthesis script and a synthesis directive in the high-level description are interpreted. Thus, a throughput latency cycle number is acquired over the entire Pipeline circuit. Then, which input/output operation is assigned to any stage in the Pipeline is acquired by interpreting the command in the behavioral synthesis script and/or the synthesis directive in the high-level description. As to Throughput of all outputs, the number of inputs/outputs that appear is denoted to be 1 with respect to the input/output assigned only to one stage, and a cycle up to one stage is denoted to be a Latency cycle. A Throughput value for the entire Pipeline circuit is calculated as a Throughput cycle. As to the inputs/outputs allocated to a plurality of stages, the following two information are outputted. Firstly, the number of the same inputs/outputs that appear, and cycle information up to the assigned stages are all calculated as Latency information, and each of Throughput cycles for the entire Pipeline circuit is calculated as a Throughput cycle. Secondly, ceil (Latency cycle number/Throughput cycle number) are calculated, and a list indicative of Pipeline architectures corresponding to their values is generated. Next, the minimum cycle between the same inputs/outputs is determined and outputted as a Throughput cycle value. The Latency cycle number is calculated as the greatest common divisor of the entire assigned cycle numbers of the respective same inputs/outputs in the Pipeline. Here, ceil ( ) indicates the function of rounding up digits after the decimal point and is used as such a function even subsequently.

Figure 27:
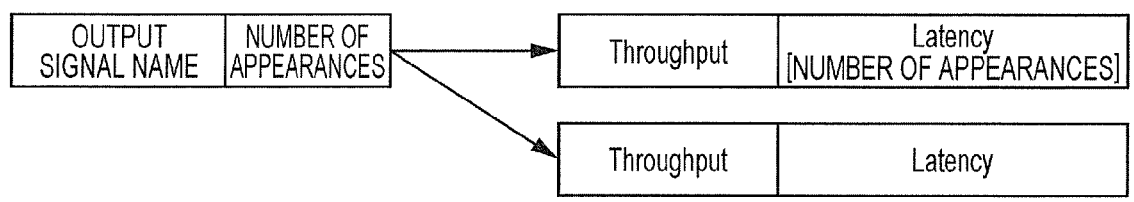
FIG. 27 is an explanatory diagram illustrating a storage format of input cycle information in input/output cycle information, which is targeted for a pipeline operation.
Figure 28:
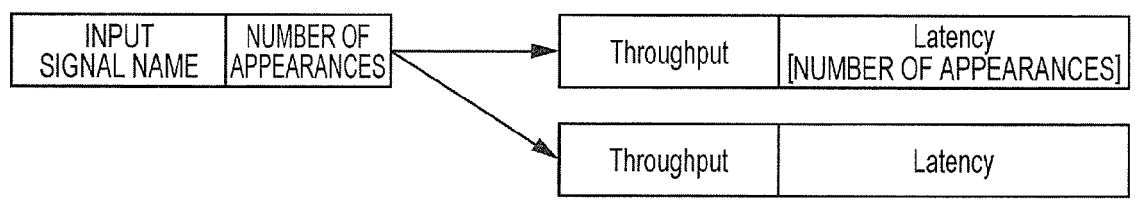
FIG. 28 is an explanatory diagram illustrating a storage format of output cycle information in input/output cycle information, which is targeted for a pipeline operation.

As to the output of the input/output cycle information, its output being a Pipeline circuit and throughput latency cycle information of each output acquired are stored in input/output cycle information. As shown in FIGS. 27 and 28, the input/output cycle information is represented by a list structure in order of the input or output signal name, the number of appearances, Throughput and Latency. Particularly when the number of appearances is two or more, pointers to two lists as viewed from the number of appearances are denoted to exist. Incidentally, the representation of this structure may make use of a nested structure. FIG. 27 illustrates a storage format of input cycle information in the input/output cycle information, which is targeted for a pipeline operation. FIG. 28 illustrates a storage format of output cycle information in the input/output cycle information, which is targeted for a pipeline operation.

Figure 29:
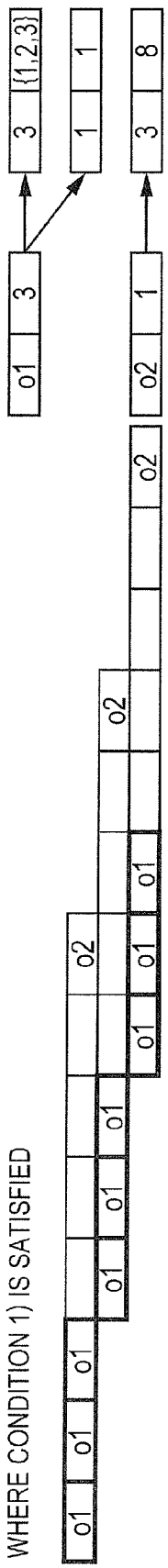
FIG. 29 is an explanatory diagram illustrating a storage format of output cycle information corresponding to the pipeline operation example shown in FIG. 21.
Figure 30:
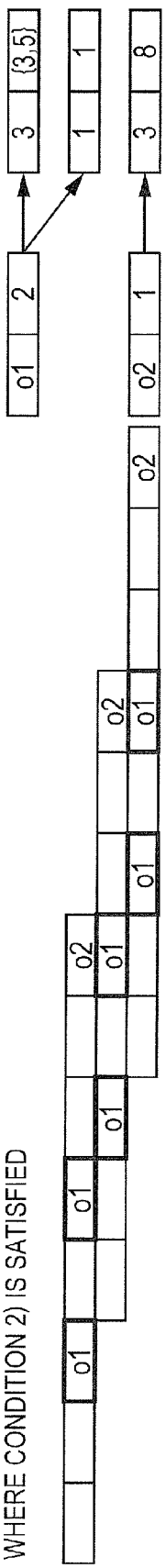
FIG. 30 is an explanatory diagram illustrating a storage format of output cycle information corresponding to the pipeline operation example shown in FIG. 22.

As output examples of input/output cycle information in an information extraction process, targeted for the Pipeline synthesis RTL, output examples of output cycle information where the conditions of the above 1) and 2) are met are shown in FIGS. 23 through 26. FIG. 29 shows output cycle information corresponding to the pipeline operation example shown in FIG. 21. FIG. 30 shows output cycle information corresponding to the pipeline operation example shown in FIG. 21. FIG. 30 shows input cycle information corresponding to the pipeline operation example shown in FIG. 22. FIG. 31 shows input cycle information corresponding to the pipeline operation example shown in FIG. 24. FIG. 32 shows input cycle information corresponding to the pipeline operation example shown in FIG. 25.

<<Information Extraction Targeted for Input/Output Cycle Information Extraction Process_Cycle Accurate Synthesis RTL>>

A description will be made of the information extraction targeted for the cycle accurate synthesis RTL in the input/output cycle information extraction process s2.

Information to be extracted are Throughput cycle information of each input/output, and Throughput cycle information related to the entire input and output. Here, initial Throughput cycle information (cycle number up to the first change in signal) and Throughput cycle information (signal change interval cycle number) are denoted to be included in the Throughput cycle information of the respective inputs/outputs. The Throughput cycle numbers for the entire input and output are comprised of the Throughput cycle information.

Consider where a high-level description is transformed to a CFG (Control Flow Graph) in relation to a program structure. When a non determination loop structure is included in an infinite loop of the CFG, and even one of the output and input does not exist thereinside, a value change cycle for the output or input not included in the corresponding non determination loop can not lead to be periodic according to the number of executions of a loop. Thus, in such a case, the output and input not included in the corresponding non determination loop have no other choice but to be treated as taking on each cycle change.

The acquisition of Throughput cycle information of each output is as follows:

(1) A set of output signals is denoted to be 0.

(2) The high-level description is transformed into a CFG. A CFG configuration method has been described in Japanese Patent No. 3909073.

(3) Loops capable of loop-unrolling are all unrolled in loops in the infinite loop of the CFG.

(4) If $(\#)0=\phi$, then the greatest common divisor of all values is determined with respect to Throughput cycle number information every output acquired. It is denoted to be a Throughput cycle value for the entire output and the process is terminated.

(5) One output $o \in 0$ is selected and 0 is set to be $0=0-\{o\}$.

(6) A node that performs an assignment behavior to o in the CFG is separated into two. No connection side is denoted to exist between the nodes at the new two points. A division to strongly connected components is performed on the acquired CFG. When the strongly connected components appear, a non determination loop not including o exists. Therefore, the Throughput cycle value of the output o is denoted to be 1, and the process proceeds to (#). If not so, then the following is executed. That is, a cycle number on a program path from the head of the infinite loop to the output o is acquired and denoted to be an initial Throughput cycle. When a program path from the output o to the same output o exists, a cycle number on the path is acquired. Here, upon search for the program path, a false path determination is performed if necessary. The determination as to the false path configures a conditional expression in which branch conditions that appear on the path are all ANDed. Whether the conditional expression is true or false may be determined by a satisfiability determination technique. The program path determined to be the false path will abandon the acquired cycle information. It is determined whether the acquired cycle numbers all coincide with respect to each output o. If it is determined that they coincide, then the property of Throughput is denoted to be "constant". If not so, then the property thereof is denoted to be "nonconstant" and thereafter the greatest common divisor of the acquired cycle numbers is determined and denoted to be a Throughput cycle value of the output o, after which the process proceeds to (#).

(7) The above process is executed with the set being substituted with a set I of input signals.

As to the output of input/output cycle information, Throughput cycle information (as to whether or not being constant) corresponding to each input/output, and Throughput cycle information (as to whether or not being constant) common to the full output/full input are outputted in the form of a table shown in FIG. 33. FIG. 33 illustrates the format of input/output cycle information targeted for a cycle accurate synthesis RTL.

Regarding the operation of separating a node in which the execution of a statement including specified variables in each CFG is done into two, the separation, the division to the strongly connected components and the recombination are executed like FIG. 34 to be shown below. When the strongly connected components do not exist after the separation, a non-cyclic graph is always taken. Therefore, the identification of a path from the head of a while loop to the corresponding assignment behavior, and a path from the corresponding assignment behavior to an assignment behavior to another same variable are searchable on the graph. The identification of the number of clocks existing on the identified path is executable upon the path identification.

<<Information Extraction Targeted for Input/Output Cycle Information Extraction Process_Path Latency Setting Synthesis RTL>>

A description will be made of the information extraction targeted for the path latency setting synthesis RTL in the input/output cycle information extraction process s2.

Information to be extracted is information of the same format as the cycle accurate synthesis RTL.

Consider where the high-level description is transformed to a CFG (Control Flow Graph) in relation to a program structure. When only the setting of each cycle to a program path is done, a loop on the CFG of the high-level description is set such that its start and end points are designated or specified to the program path. And a clock cycle specification is denoted to be made between the start and end points. In particular, a program path on each of CFGs targeted in different specifications is denoted not to have a common node. Thus, if clock boundary nodes are continuously added so as to make a specified clock cycle number immediately before the end point of the corresponding program path, it results in one treatable as a CFG obtained from the cycle accurate synthesis.

As to the acquisition of Throughput cycle information of respective outputs, a synthesis script and a synthesis directive are interpreted, program paths to which cycles are set and set cycle numbers are identified, and a set thereof is denoted to be $\{\{s,e\},n\} \in Th \subseteq (S*E)*N$. Here, S is denoted to be a set of start points of the program paths, E is denoted to be a set of end points of the program paths, N is denoted to be a set of the set cycle numbers, $\{\{s,e\},n\}$ is denoted to be a group of the program path set of the start and end points s and e and the cycle numbers set thereto. The high-level description is transformed to a CFG. If $(\#)Th=\phi$, then a process of acquisition of each output Throughput cycle information in the cycle accurate synthesis RTL is applied to the resulting CFG. Denote $\{\{s,e\},n\}$ to be $\{\{s,e\},n\} \in Th$ and Th to be $Th=Th-\{\{s,e\},n\}$. Each path set that becomes the stand and end points s and e on the CFG is identified, and a set thereof is denoted to be P. As in the case where if $(*)P=\phi$, clock boundary nodes corresponding to the minimum cycle number in the resulting modified cycle numbers are inserted immediately before the end point e, and clock boundary nodes corresponding to the minimum cycle number in the remaining cycles are disposed immediately before a path's junction in the case of a shared path while identifying the path's junction, the clock boundary nodes are inserted while sequentially tracing the paths from the end point, whereby the CFG is modified, and hence the process proceeds to (#). One $p \in P$ is taken and P is set to be $P=P-\{p\}$. The number of appearances of clock boundary nodes on a program path p is acquired. With the number thereof as n(p), n−n(p) is calculated.

As to the output of input/output cycle information, Throughput cycle information (as to whether or not being constant) corresponding to each input/output, and Throughput cycle information (as to whether or not being constant) common to the full output/full input are outputted in such table formats as shown in FIGS. 35 and 36.

<<Information Extraction Targeted for Input/Output Cycle Information Extraction Process_Internal Loop Pipeline Synthesis RTL>>

A description will be made of the information extraction targeted for the internal loop Pipeline synthesis RTL in the input/output cycle information extraction process s2.

Information to be extracted is information of the same format as the cycle accurate synthesis RTL.

As to a program structure, consider where the high-level description is transformed to a CFG (Control Flow Graph). When only the setting of Pipelining is performed on an internal loop description, the corresponding loop can be treated as a CFG obtained from the cycle accurate synthesis if the loop can be replaced with a structure having suitable output intervals.

Figure 37:
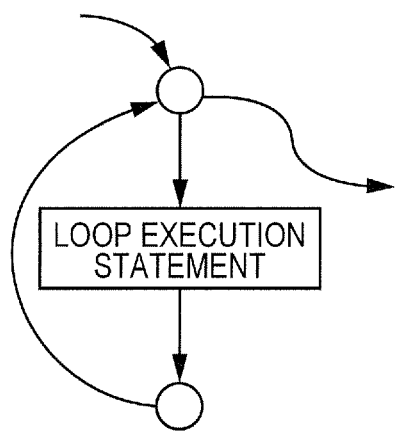
FIG. 37 is an explanatory diagram showing a sub CFG structure of a pre-transformation loop targeted for pipelining.
Figure 38:
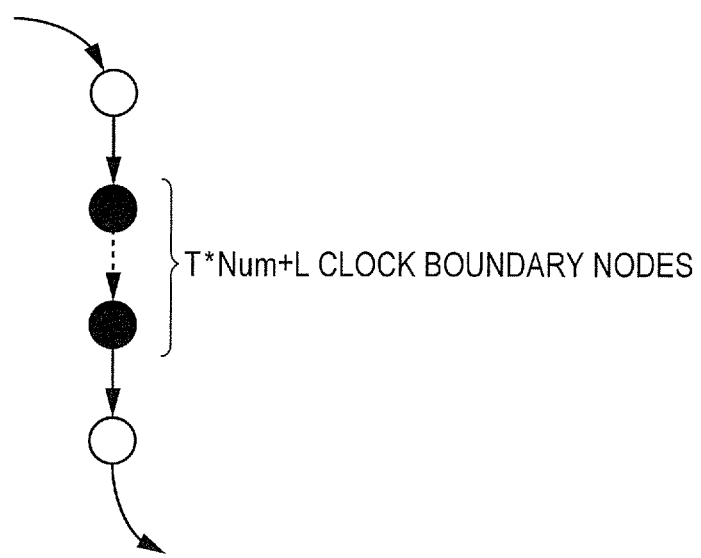
FIG. 38 is an explanatory diagram showing a sub CFG structure in which transformation is performed on a partial CFG of FIG. 37.

As to the acquisition of Throughput cycle information of respective outputs, a synthesis script and a synthesis directive are interpreted, internal loops to which Pipelining is specified are identified, and a set thereof is denoted to be Loop. If (#)Loop=ϕ, then a process for acquisition of each input/output Throughput cycle information in the cycle accurate synthesis RTL is applied to the resulting CFG. One l∈Loop is taken and Loop is set to be Loop=Loop−{l}. When l does not include even both input and output, other full input and output cannot periodically be achieved when the loop is of a nondetermination loop. Therefore, the Throughput cycles of the full input and output are denoted to be 1, and the process is terminated. If it is not so, then the loop can be unrolled. Therefore, the number of loop executions is denoted to be Num, and Throughput and Latency are denoted to be Throughput=T and Latency=L. Then, the replacement of the corresponding loop l is performed on a sub CFG including clock boundary nodes by T*Num+L, and the process proceeds to (#). A sub CFG structure of a pre-transformation loop targeted for Pipelining is illustrated in FIG. 37. A sub CFG structure in which transformation is performed on a part CFG in FIG. 37, is illustrated in FIG. 38.

Figure 39:
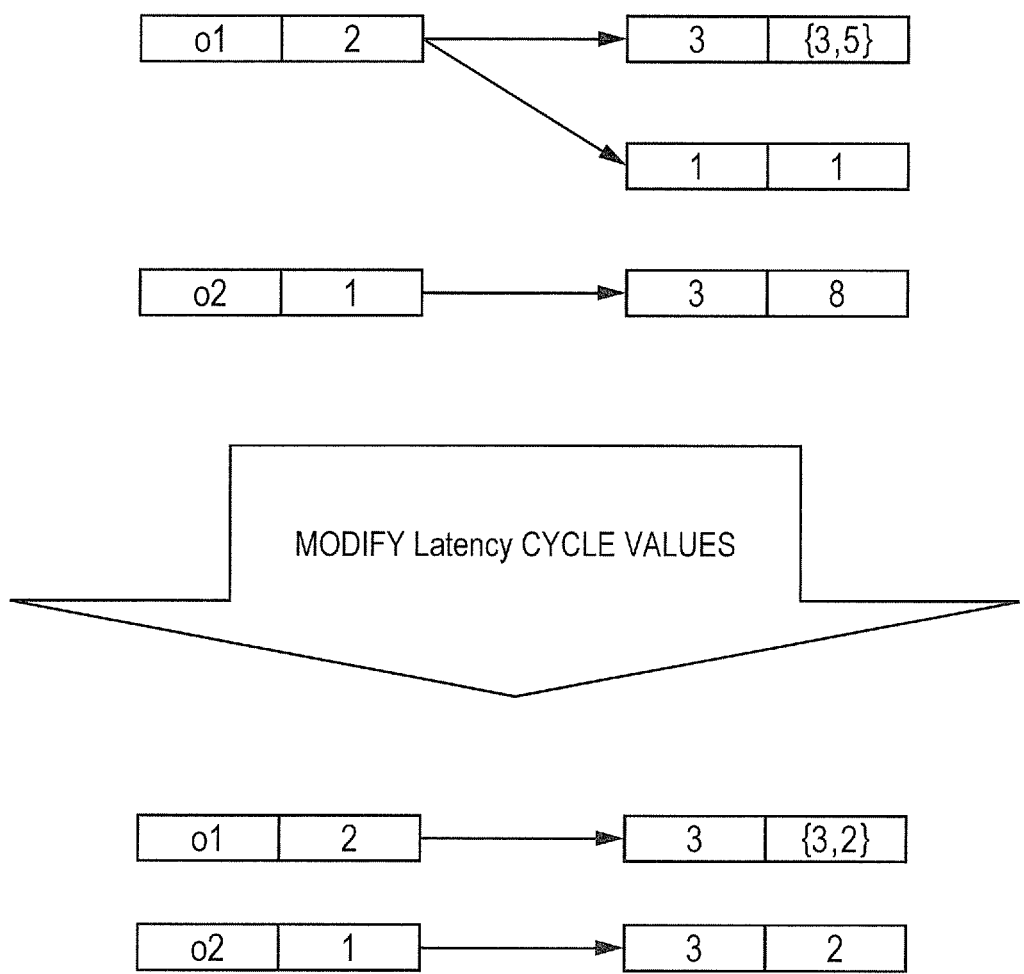
FIG. 39 is an explanatory diagram showing a modified example of an input/output cycle targeted for pipeline operations.
Figure 40:
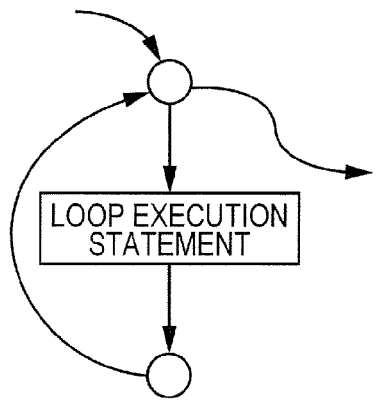
FIG. 40 is a state transition diagram illustrating a partial CFG of a loop targeted for pipelining.
Figure 41:
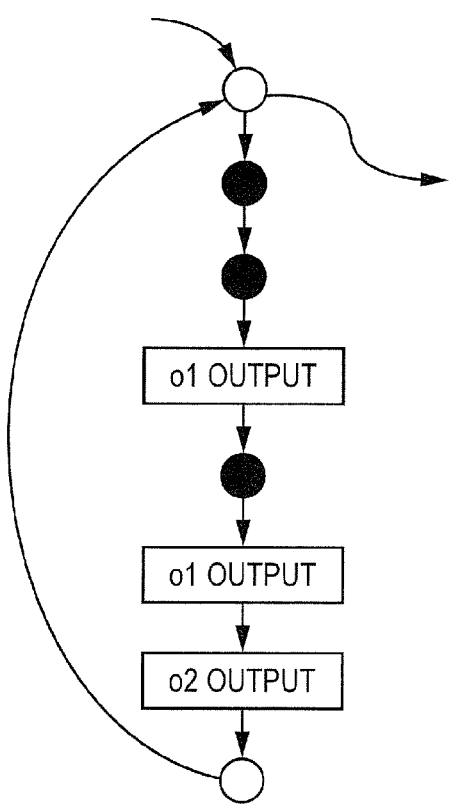
FIG. 41 is a state transition diagram showing an example in which transformation is performed on the partial CFG of FIG. 40.

As to the acquisition of Throughput cycle information of each input/output, when l is accompanied by the input and output, a Pipeline circuit comprised of l is taken as an entire circuit, and an information extraction targeted for a Pipeline synthesis RTL is executed. Only first information is acquired from the resulting input/output cycle information with respect to each input/output. When the Latency cycles exist in plural form and exceed the Throughput cycle, they are respectively changed to the value of its cycle number % Throughput cycle number, and the output is performed in a resulting cycle. And the transformation to a loop structure comprised of Throughput cycles as a whole is done, and the process proceeds to (#). A modified example of input/output cycles, targeted for a pipeline operation is illustrated in FIG. 39. An example of a part CFG of a loop targeted for pipelining is shown in FIG. 40. An example (including input/output operations) in which transformation is performed on the part CFG of FIG. 40, is shown in FIG. 41. Here, although Latency information is diluted in the present process, a target to be desired now is directed to the Throughput cycle information of each input/output, and hence no problem arises even if such transformation is performed.

As to the output of input/output cycle information, Throughput cycle information (as to whether or not being constant) corresponding to each input/output, and Throughput cycle information (as to whether or not being constant) common to the full output/full input are outputted in an output cycle format shown in Table of FIG. 42 and an input cycle format shown in Table of FIG. 43.

<<Information Extraction Targeted for Input/Output Cycle Information Extraction Process_Non Cycle Accurate Synthesis RTL>>

A description will be made of the information extraction targeted for the non cycle accurate synthesis RTL in the input/output cycle information extraction process s2.

Information to be extracted is information of the same format as the cycle accurate synthesis RTL.

As to a program structure, consider where the high-level description is transformed to a CFG (Control Flow Graph). It is premised that no path latency setting is performed on a program path in a loop which is an internal loop and to which a Pipeline synthesis specification is made. When it has been done, it is interpretable that the maximum cycle has been determined in a path lying within an execution block in the internal loop, and a Pipeline synthesis to which Latency greater than or equal to this value is set, has been executed. Thus, the generality is not lost under that premise. If a location where a cycle setting to a program path in an internal level description is done, and a location being an internal loop and where a Pipelining setting is done are respectively given a CFG transformation process related to a path latency setting synthesis RTL, and a CFG transformation process related to an internal loop Pipeline synthesis RTL, they can be treated as a CFG obtained from the cycle accurate synthesis.

Regarding the acquisition of Throughput cycle information of each output, a CFG transformation process for a path latency synthesis RTL is carried out. A CFG transformation process for an internal loop Pipeline synthesis RTL is performed on the resulting CFG. A process for acquisition of each input/output Throughput cycle information in the cycle accurate synthesis RTL is applied to the resulting CFG.

As to the output of input/output cycle information, Throughput cycle information (as to whether or not being constant) corresponding to each input/output, and Throughput cycle information (as to whether or not being constant) common to the full output/full input are outputted in a table format showing input/output cycle information in FIG. 44.

<<Information Extraction Targeted for Input/Output Cycle Information Extraction Process_High-Level Description>>

A description will be made of the information extraction targeted for the high-level description in the input/output cycle information extraction process s2.

Information to be extracted is information of the same format as the cycle accurate synthesis RTL.

Regarding the acquisition of Throughput cycle information of each output, a synthesis script and a synthesis directive are changed to thereby modify it to the contents for performing the cycle accurate synthesis. Then, the input/output Throughput cycle information extraction process targeted for the cycle accurate synthesis RTL may be performed as it is.

As to the output of input/output cycle information, Throughput cycle information (as to whether or not being constant) corresponding to each input/output, and Throughput cycle information (as to whether or not being constant) common to the full output/full input are outputted in table formats shown in FIGS. 45 and 46.

<<Input/Output Cycle Information Extraction Process_Entire Process Flow>>

Figure 47:
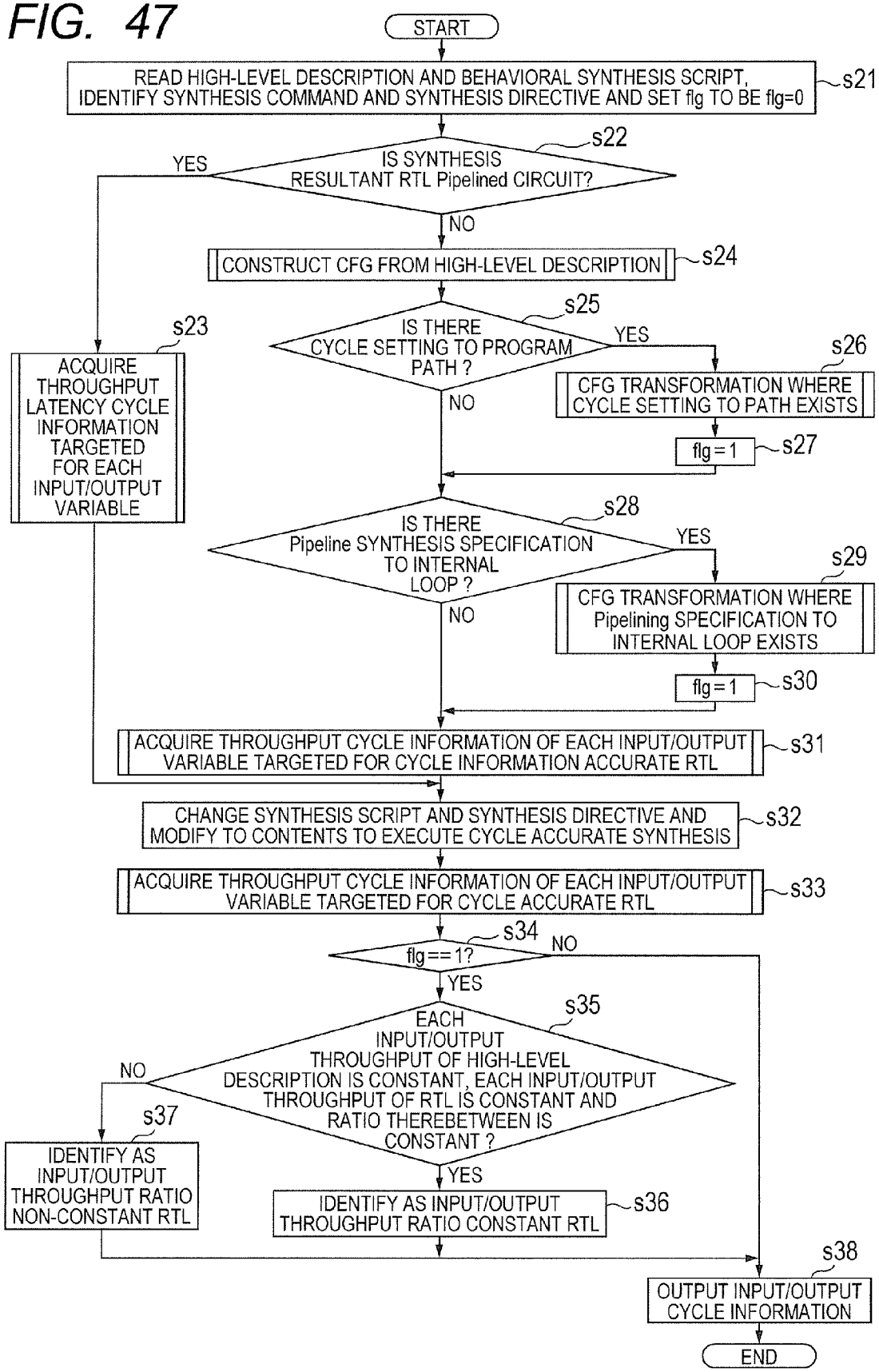
FIG. 47 is a flowchart illustrating an entire process of an input/output cycle information extraction process s2.

The entire process flow for the input/output cycle information extraction process s2 is illustrated in FIG. 47. The contents of processing of respective steps are follows:

In s21, a high-level description and a behavioral synthesis script are read. Thus, a synthesis command and a synthesis directive are identified. The result of identification thereof is stored as synthesis restriction information. A variable flg is initialized to 0, and the process proceeds to s22.

In s22, the synthesis restriction information is read to determine whether a synthesis specification is of a Pipelining specification for an entire description. If it is determined to be the Pipelining specification, then the process proceeds to s23. If it is determined not to be the Pipelining specification, then the process proceeds to s24.

Figure 48:
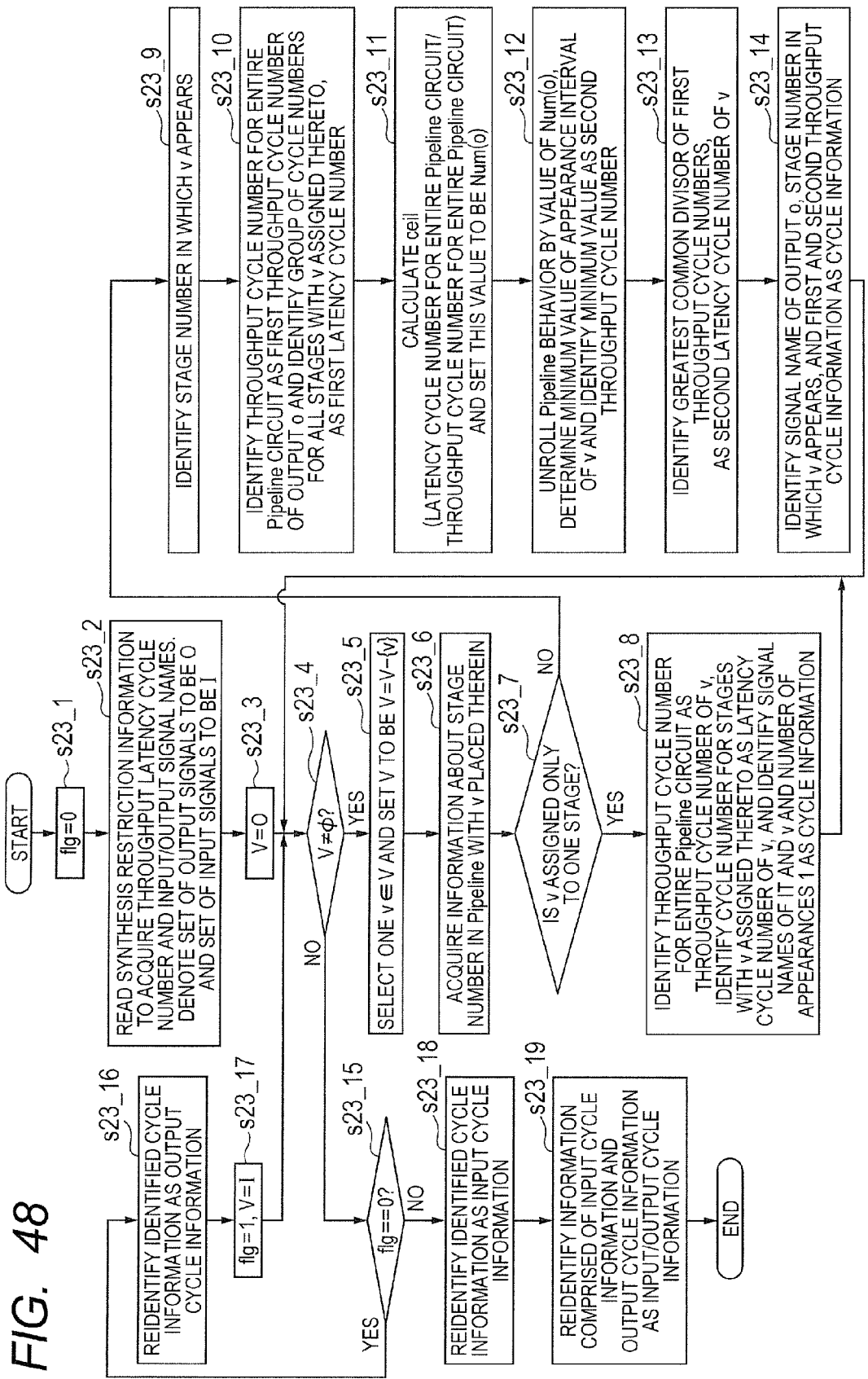
FIG. 48 is a flowchart illustrating a detailed process about the extraction of information targeted for a pipeline synthesis RTL of s23 in FIG. 47.

In s23, an "information extraction targeted for a Pipeline synthesis RTL" targeted fro each input/output variable and defined in FIG. 48 separately is performed. The extraction of Throughput latency cycle information is performed. Thereafter, the process proceeds to s32.

In s24, a process for transformation to a CFG accompanied by each clock boundary node in the high-level description is performed. The corresponding CFG is stored and the process proceeds to s25. Here, the definition of the CFG with each clock boundary node, and a method for transformation from the high-level description to the CFG have been described in detail in Japanese Patent No. 3909073.

In s25, synthesis restriction information is read to determine whether a cycle setting to a program path in the high-level description is included in a synthesis specification or designation. If it is determined to be included therein, then the process proceeds to s26. If it is not so, then the process proceeds to s28.

Figure 49:
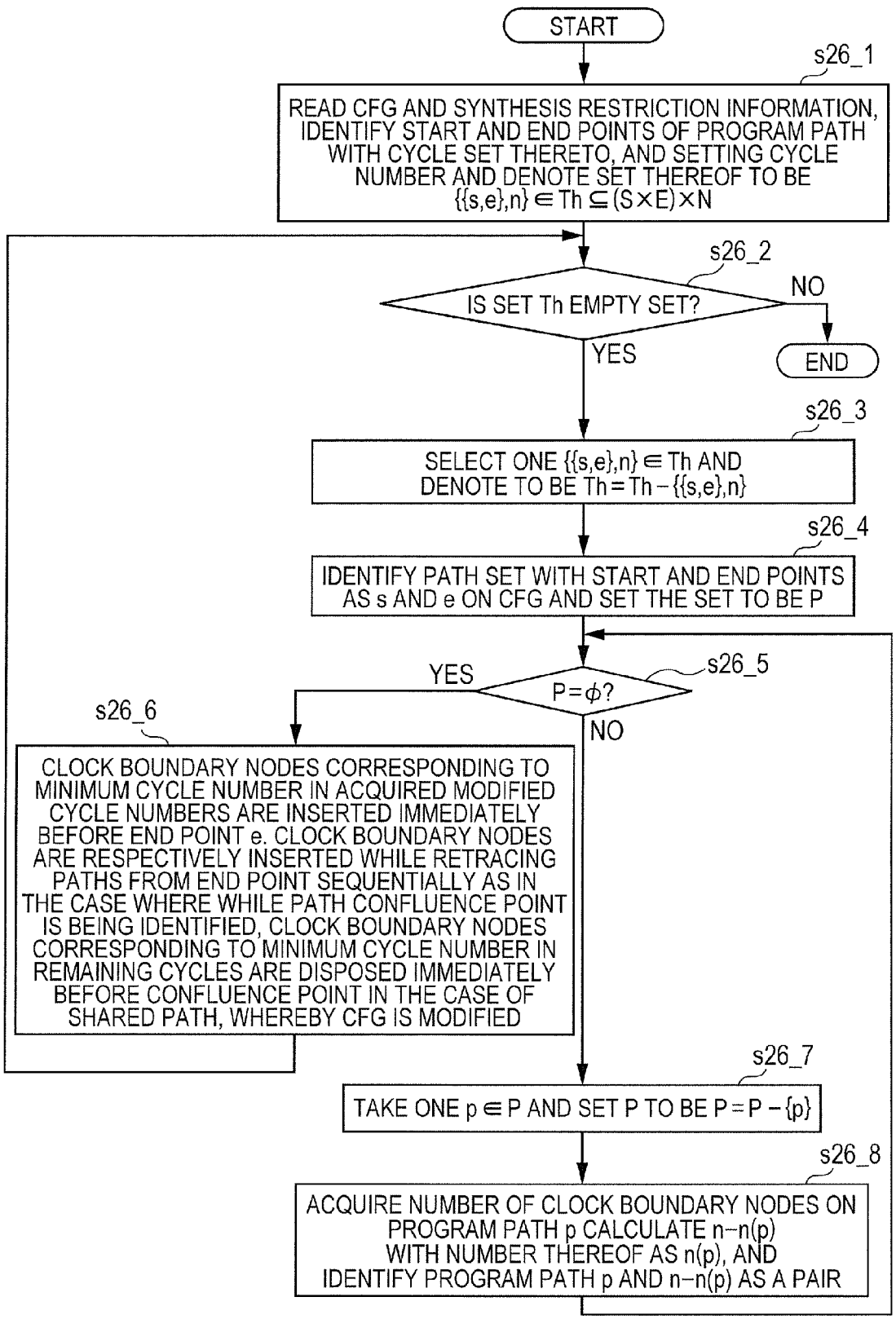
FIG. 49 is a flowchart illustrating a detailed process of CFG transformation targeted for a path latency setting synthesis RTL of s26 in FIG. 47.

In s26, a "CFG transformation targeted for a path latency synthesis RTL" defined in FIG. 49 separately is executed based on information about the cycle setting to the program path. The post-transformation CFG is stored and the process proceeds to s27.

In s27, 1 is substituted into a variable flg, and the process proceeds to s28.

In s28, synthesis restriction information is read to determine whether a Pipelining specification to an internal loop in the high-level description is included in a synthesis specification. If it is determined to be included therein, then the process proceeds to s29. If it is determined not to be included therein, then the process proceeds to s31.

Figure 50:
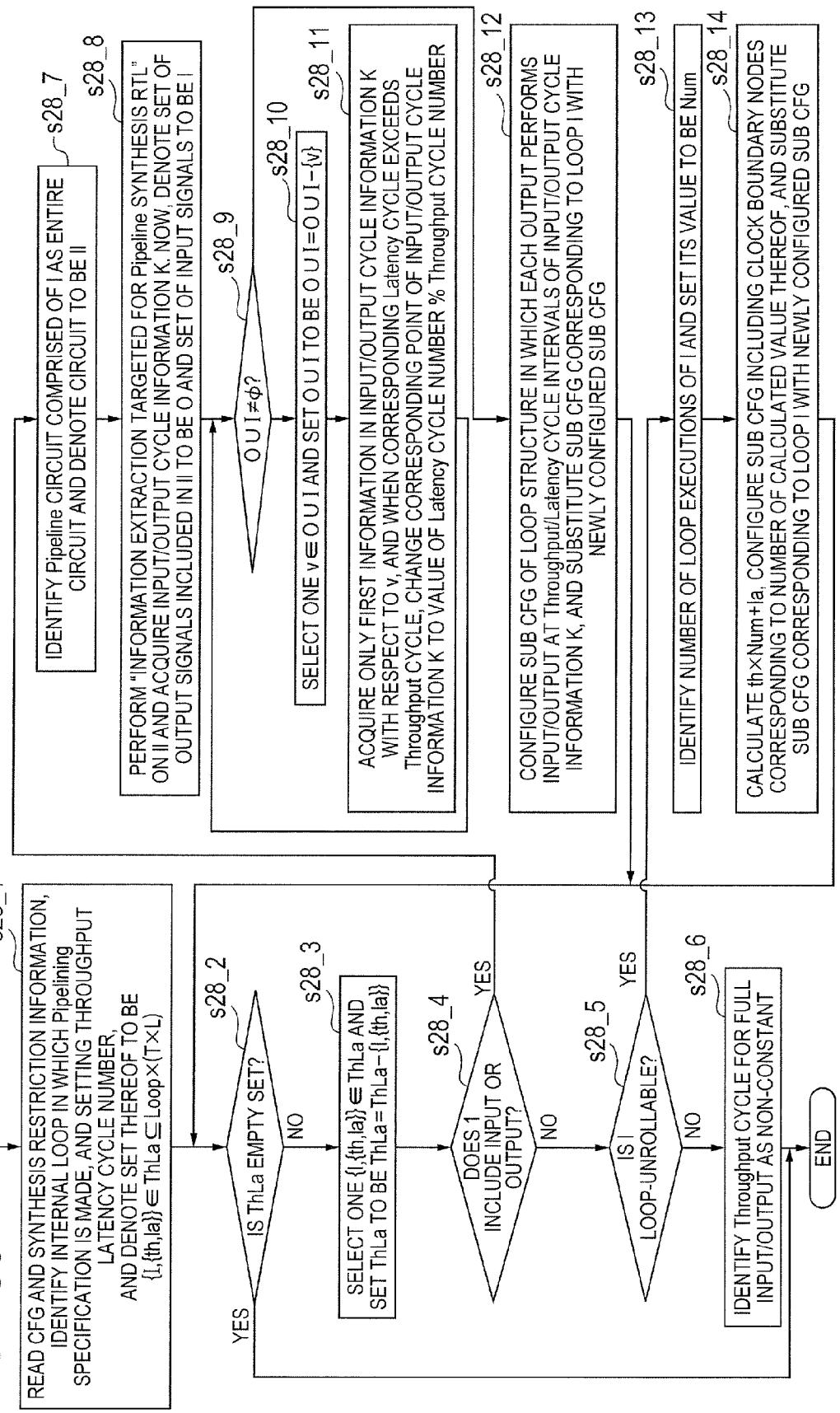
FIG. 50 is a flowchart showing a process of CFG transformation targeted for an internal loop pipeline synthesis RTL of s29 in FIG. 47.

In s29, a "CFG transformation targeted for an internal loop Pipeline synthesis RTL" defined in FIG. 50 separately is performed based on the Pipelining specification to the internal loop. The post-transformation CFG is stored, and the process proceeds to s30.

In s30, 1 is substituted in a variable flg, and the process proceeds to s31.

Figure 51:
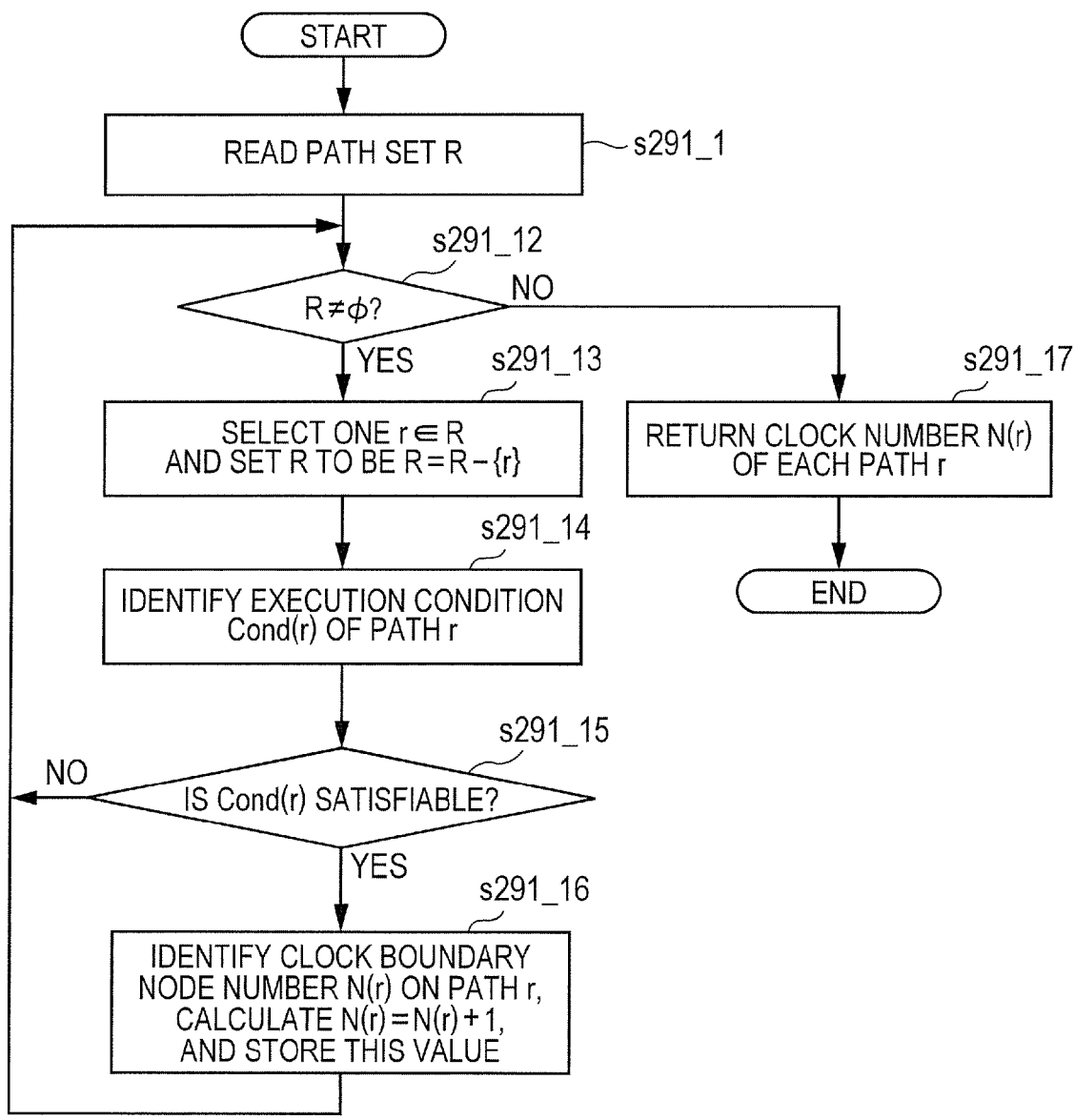
FIG. 51 is a flowchart illustrating a clock number acquisition process.

In s31, an "information extraction means targeted for a cycle accurate synthesis RTL" defined in FIG. 51 separately is carried out, and thereafter the process proceeds to s32.

In s32, a synthesis script and a synthesis directive are changed, and the contents for performing a cycle accurate synthesis are modified. Then, the process proceeds to s33. This modification can be realized only by deleting the Pipelining specification and the cycle specification to the program path.

In s33, an "information extraction means targeted for a cycle accurate synthesis RTL" defined separately is performed, and the process proceeds to s34.

In s34, it is determined whether a variable flg is 1. If it is determined to be 1, then the process proceeds to s35. If it is determined not to be 1, then the process proceeds to s38.

In s35, it is determined whether each input/output throughput in the high-level description is constant, each input/output throughput in an RTL is constant, and the ratio therebetween is constant. If it is determined to be constant, then the process proceeds to s36. If it is determined not to be constant, then the process proceeds to s37.

In s36, the result of determination is identified as an input/output throughput ratio constant RTL, and the process proceeds to s38.

In s37, the result of determination is identified as an input/output throughput non-constant RTL, and the process proceeds to s38.

In s38, in the case of a Pipeline synthesis RTL, a path latency setting synthesis RTL, an internal loop Pipeline synthesis RTL, a non-cycle accurate synthesis RTL, a cycle accurate synthesis RTL, circuit type information of an input high-level description, a Pipeline synthesis RTL, and an input high-level description all of which are types for an RTL structure, the signal name of each input/output, the number of stages in which each input/output appears, and a throughput/latency cycle number of each input/output are outputted. When other than the above, the signal name of each input/output, the throughput cycle number of each input/output and its property (as to whether or not being constant), and the throughput cycle number and property (as to whether or not being constant) common to the full output/full input are taken as input/output cycle information, and the input/output cycle information are outputted.

<<Detailed Flow of s23 of Input/Output Cycle Information Extraction Process_FIG. 47>>

A detailed flow for the "information extraction targeted for the Pipeline synthesis RTL" of s23 in FIG. 47 is illustrated in FIG. 48. The contents of processing in respective steps are as follows:

In s23_1, 0 is substituted in a variable flg, and the process proceeds to s23_2.

In s23_2 synthesis restriction information is read to acquire a throughput latency cycle number for an entire Pipeline circuit, and input/output signal names are acquired. A set of output signals is denoted to be O, and a set of input signals is denoted to be I. Then, the process proceeds to s23_3.

In s23_3, the set O is substituted into a set V, and the process proceeds to s23_4.

In s23_4, it is determined whether the set V is empty. If it is determined to be empty, then the process proceeds to s23_15. If it is determined not to be empty, then the process proceeds to s23_5.

In s23_5, one v∈V is selected, and V is set to be V=V−{v}. Then, the process proceeds to s23_6.

In s23_6, information about the number of stages in a Pipeline with v placed therein is acquired, and the process proceeds to s23_7.

In s23_7, it is determined whether v is assigned only to one stage. If it is determined to be affirmative, then the process proceeds to s23_8. If it is determined to be negative, then the process proceeds to s23_9.

In s23_8, a throughput cycle number for the entire Pipeline circuit is identified as a throughput cycle number of v, and a cycle number for stages with v allocated thereto is identified as a latency cycle number of v. Signal names of it and v, and the number of appearances 1 are identified as cycle information, and the process proceeds to s23_4.

In s23_9, the total number of stages in which v appears is identified, and the process proceeds to s23_10.

In s23_10, the throughput cycle number for the entire Pipeline circuit is identified as a first throughput cycle number. A group or set of cycle numbers for all stages with v assigned thereto is identified as a first latency cycle number. Then, the process proceeds to s23_11.

In s23_11, ceil (latency cycle number for the entire Pipeline circuit/throughput cycle number for the entire Pipeline circuit) is calculated. This value is denoted to be Num(v), and the process proceeds to s23_12.

In s23_12, a Pipeline behavior is unrolled by the value of Num(v) (refer to the example in p. 43). The minimum value of an appearance interval of v is determined. The minimum value thereof is identified as a second throughput cycle number of v, and the process proceeds to s23_13.

In s23_13, the greatest common divisor of first throughput cycle numbers, which forms a pair or set of values thereof, is identified as a second latency cycle number of v, and the process proceeds to s23_14.

In s23_14, the signal name of v, a stage number in which an output o appears, and first and second throughput cycle information are identified as cycle information, and the process proceeds to s23_4.

In s23_15, it is determined whether a variable flg is 0. If it is determined to be 0, then the process proceeds to s23_16. If it is determined not to be 0, then the process proceeds to s23_18.

In s23_16, the cycle information identified before now are reidentified as output cycle information, and the process proceeds to s23_17.

In s23_17, 1 is substituted in a variable flg and a set I is substituted in a set V. Then, the process proceeds to s23_4.

In s23_18, the cycle information identified before now are reidentified as input cycle information, and the process proceeds to s23_19.

In s23_19, information comprised of the input cycle information and the output cycle information is reidentified as input/output cycle information, and the process is terminated.

<<Detailed Flow of s26 in Input/Output Cycle Information Extraction Process_FIG. 47>>

A detailed process flow for the "CFG transformation targeted for the path latency setting synthesis RTL" of s26 in FIG. 47 is illustrated in FIG. 49. The contents of processing in respective steps are as follows:

In s26_1, a CFG and synthesis restriction information are read to identify start and end points of each program path with a cycle set thereto and each setting cycle number. A set thereof is denoted to be $\{\{s,e\},n\} \in Th \subseteq (S*E)*N$, and the process proceeds to s26_2. Here, S is denoted to be a set of the start points of the program paths, E is denoted to be a set of the end points of the program paths, N is denoted to be a set of the setting cycle numbers, and $\{\{s,e\},n\}$ is denoted to be a group or set of the program path set of the start and end points s and e, and the cycle numbers set.

In s26_2, it is determined whether Th is an empty set. If it is determined to be the empty set, then the process is terminated. If it is determined not to be the empty set, then the process proceeds to s26_3.

In s26_3, one $\{\{s,e\},n\} \in Th$ is selected, and Th is set to be $Th=Th-\{\{s,e\},n\}$. Then, the process proceeds to s26_4.

In s26_4, a path set taken as the start and end points s and e on the CFG is identified, and the set is denoted to be P. Then, the process proceeds to s26_5.

In s26_5, it is determined whether the path set P is empty. If it is determined to be empty, then the process proceeds to s26_6. If it is determined not to be empty, then the process proceeds to s26_7.

In s26_6, clock boundary nodes corresponding to a minimum cycle number in acquired modified cycle numbers are inserted immediately before an end point e. Clock boundary nodes are respectively inserted while retracing paths from the end point sequentially as in the case where while a path confluence point is being identified, clock boundary nodes corresponding to a minimum cycle number in the remaining cycles are disposed immediately before the confluence point in the case of a shared path. The CFG is modified in this manner, and the process proceeds to s26_2.

In s26_7, one p∈P is taken and P is set to be P=P-{p}. Then, the process proceeds to s26_8.

In s26_8, the number of clock boundary nodes on the program path p is acquired, and n−n(p) is calculated with the number thereof as n(p). The program path p and n−n(p) are identified as a pair, and the process proceeds to s26_5.

<<Detailed Flow of s29 of Input/Output Cycle Information Extraction Process_FIG. 47>>

A detailed process flow of the "CFG transformation targeted for the internal loop Pipeline synthesis RTL" of s29 in FIG. 47 is illustrated in FIG. 50. The contents of processing in respective steps are as follows:

In s28_1, a CFG and synthesis restriction information are read to identify internal loops to each of which a Pipelining specification is made, and setting throughput latency cycle numbers. A set thereof is denoted to be $\{l,\{th,la\}\} \in ThLa \subseteq Loop*(T*L)$, and the process proceeds to s28_2. Here, Loop indicates a set of internal loops to each of which a Pipelining specification is made, T indicates a set of Throughput cycle numbers, L indicates a set of Latency cycle numbers, and $\{l,\{th,la\}\}$ indicates a set or group of an internal loop l, a Throughput cycle number th set to l, and a Latency cycle number la.

In s28_2, it is determined whether Loop*(T*L) is an empty set. If it is determined to be the empty set, then the process is terminated. If it is determined not to be the empty set, then the process proceeds to s28_3.

In 28_3, one $\{l,\{th,la\}\} \in ThLa$ is selected and ThLa is set to be $ThLa=ThLa-\{l,\{th,la\}\}$. Then, the process proceeds to s28_4.

In s28_4, it is determined whether the internal loop l includes an output operation. If it is determined to include it, then the process proceeds to s28_7. If it is determined not to include it, then the process proceeds to s28_5.

In s28_5, it is determined whether the internal loop l is loop-unrollable. If it is determined to be loop-unrollable, then the process proceeds to s28_13. If it is determined not to be loop-unrollable, then the process proceeds to s28_6.

In s28_6, a Throughput cycle number for the full output is identified as 1 and stored in input/output cycle information. Thereafter, the process is terminated.

In s28_7, a Pipeline circuit comprised of l is identified as an entire circuit, which is taken as ll, and the process proceeds to s28_8.

In s28_8, an "information extraction targeted for a Pipeline synthesis RTL" is performed on the ll to thereby acquire input/output cycle information K. Then, the process proceeds to s28_9. Here, a set of output signals included in ll is denoted to be O, and a set of input signals is denoted to be I. Then, the process proceeds to s28_9.

In s28_9, it is determined whether a set O∪I of inputs/outputs is an empty set. If it is determined to be the empty set, then the process proceeds to s28_12. If it is not so, then the process proceeds to s28_10.

In 28_10, one v∈O ⊂ I is selected, and O∪I is denoted to be O∪I-{v}. Then, the process proceeds to s28_11.

In s28_11, only first information is acquired within the input/output cycle information K with respect to v. When the corresponding Latency cycle exceeds the Throughput cycle, the corresponding location or point of the input/output cycle information K is changed to the value of a Latency cycle number % Throughput cycle number. Then the process proceeds to s28_9.

In s28_12, a sub CFG of a loop structure in which each output performs output at Throughput/Latency cycle intervals of the input/output cycle information K is configured. The sub CFG corresponding to the loop l is substituted with the newly-configured sub CFG, and the process proceeds to s28_2.

In s28_13, the number of loop executions in the internal loop l is identified, and the value thereof is denoted to be Num. Then, the process proceeds to s28_14.

In s28_14, th*Num+la is calculated, and a sub CFG including clock boundary nodes corresponding to the number of its value is configured. The sub CFG corresponding to the loop l is substituted with the newly-configured sub CFG, and the process proceeds to s28_2.

<<Detailed Flow Related to s31 of Input/Output Cycle Information Extraction Process_FIG. 47>>

Before the description of the detailed flow for the information extraction targeted for the cycle accurate synthesis RTL in s31 of FIG. 47, a clock number acquisition process illustrated in FIG. 51 will be explained. The clock number acquisition process is a process for identifying a clock number included in each program path where a program path set is given. The contents of the clock number acquisition process in respective steps are as follows:

In s291_1, R=P∪Q is determined, and the process proceeds to s291_2.

In s291_2, it is determined whether the set R is empty. If it is determined to be empty, then the process proceeds to s291_17. If it is determined not to be empty, then the process proceeds to s291_3.

In s291_3, one r∈R is selected and R is set to be R=R−{r}. Then, the process proceeds to s291_4.

In s291_4, an execution condition Cond(r) of a path r is identified, and the process proceeds to s291_5.

In s291_5, it is determined whether Cond(r) is satisfiable. If it is determined to be satisfiable, then the process proceeds to s291_6. If it is determined not to be satisfiable, then the process proceeds to s291_2.

In s291_6, a clock boundary node number N(r) on the path r is identified, and N(r)=N(r)+1 is calculated. This value is stored, and the process proceeds to s291_2.

In s291_7, a cycle number N(r) for each path r is returned as a returned value, and the process is terminated.

Figure 52:
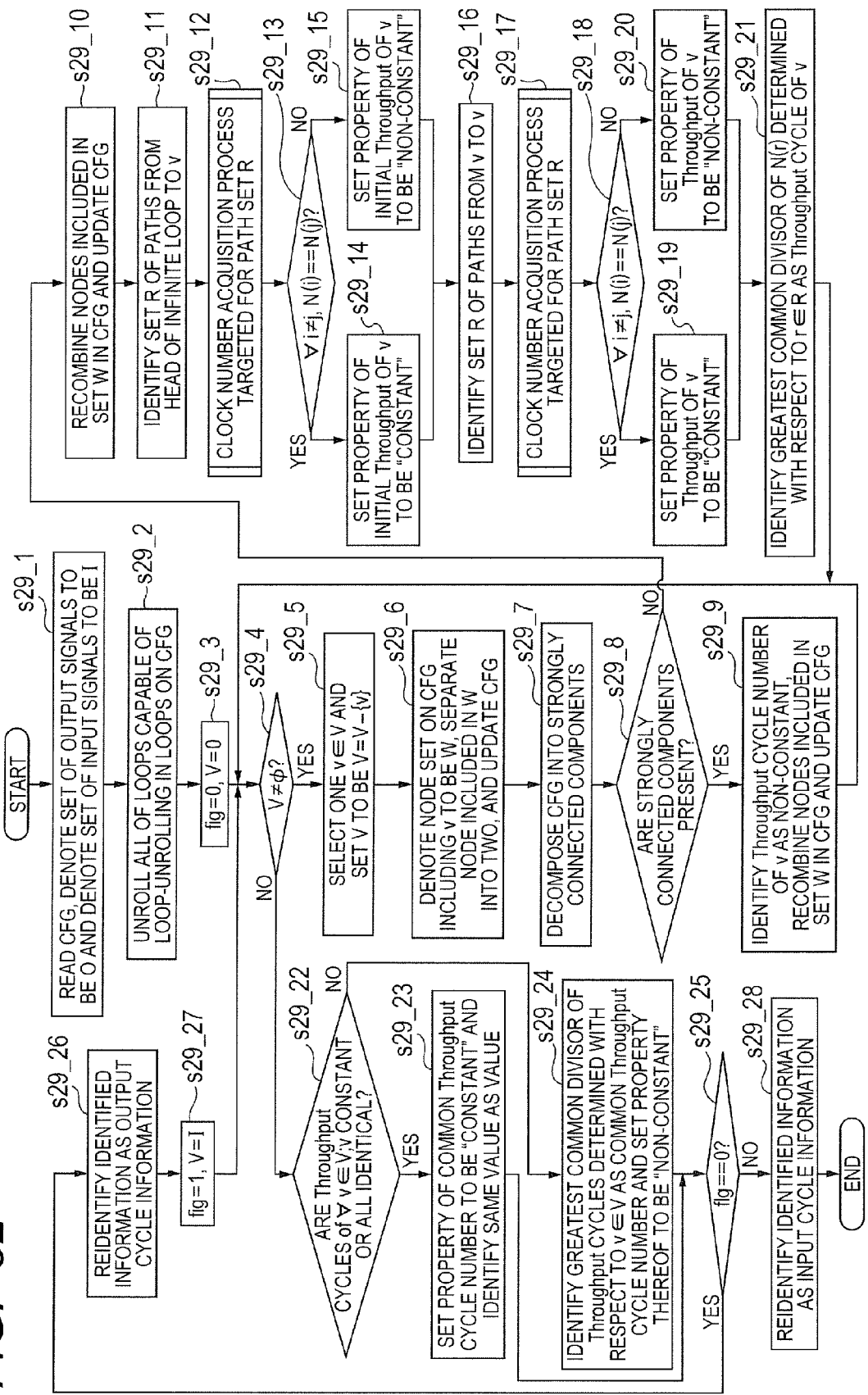
FIG. 52 is a flowchart illustrating the details of an information extraction process targeted for a cycle accurate synthesis RTL related to s31 in FIG. 47.

A detailed flow for an information extraction process targeted for the cycle accurate synthesis RTL related to s31 of FIG. 47 is illustrated in FIG. 52. The contents of processing in respective steps are as follows:

In s29_1, a CFG is read, and a set of outputs is denoted to be O and a set of inputs is denoted to be I. Then, the process proceeds to s29_2.

In s29_2, loops which are loops on the CFG and unrollable, are all unrolled. Then, the process proceeds to s29_3.

In s29_3, a variable flg is initialized to 0, and the set O is substituted in a set variable V. Then, the process proceeds to s29_4.

In s29_4, it is determined whether the set V is empty. If it is determined to be empty, then the process proceeds to s29_22. If it is determined not to be empty, then the process proceeds to s29_5.

In s29_5, one v∈V is selected, and V is set to be V=V−{v}. Then, the process proceeds to s29_6.

In s29_6, a set of output branches of nodes including v is denoted to be W. The nodes included in W are separated into two to update the CFG. Then, the process proceeds to s29_7.

In s29_7, the CFG is treated as a digraph, and its decomposition into strongly connected components is performed. Then, the process proceeds to s29_8.

In s29_8, it is determined whether the strongly connected components exist. If it is determined that they exist, then the process proceeds to s29_9. If it is determined that they do not exist, then the process proceeds to s29_10.

In s29_9, a Throughput cycle of v is identified as a non-constant. The branches included in the set W are reconnected in the CFG to update the CFG. Then, the process proceeds to s29_4.

In s29_10, the nodes included in the set W are reconnected in the CFG to update the CFG. Then, the process proceeds to s29_11.

In s29_11, a set R of program paths from the head of an infinite loop to v is identified, and the process proceeds to s29_12.

In s29_12, the defined process "clock number acquisition process" targeted for the path set R is performed to acquire a clock number N(r) on each path r∈R. Then, the process proceeds to s29_13.

In s29_13, it is determined whether N(r) determined with respect to the respective r∈R are all consistent. If it is determined that they coincide, then the process proceeds to s29_14. If it is determined that they are not consistent, then the process proceeds to s29_15.

In s29_14, the property of Throughput of v is denoted to be "constant", and the process proceeds to s29_16.

In s29_15, the property of Throughput of v is denoted to be "non-constant", and the process proceeds to s29_16.

In s29_16, a set R of program paths from v to v is identified, and the process proceeds to s29_17.

In s29_17, the defined process "clock number acquisition process" targeted for the path set R is performed to acquire a clock number N(r) on each path r∈R. Then, the process proceeds to s29_18.

In s29_18, it is determined whether N(r) determined with respect to the respective r∈R are all consistent. If it is determined that they are consistent, then the process proceeds to s29_19. If it is determined that they are not consistent, then the process proceeds to s29_20.

In s29_19, the property of Throughput of v is denoted to be "constant", and the process proceeds to s29_21.

In s29_20, the property of Throughput of v is denoted to be "non-constant", and the process proceeds to s29_21.

In s29_21, the greatest common divisor of N(r) determined with respect to the respective r∈R is identified as a Throughput cycle number of v, and the process proceeds to s29_4. Here, when a "non-constant" is included in N(r), the Throughput cycle number of v is denoted to be 1.

In s29_22, it is determined whether the properties of all Throughput cycle numbers of v are "constant" and the Throughput cycle numbers are identical. If it is so, then the process proceeds to s29_23. If it is not so, then the process proceeds to s29_24.

In s29_23, the property of a common Throughput cycle is denoted to be "constant", and the Throughput cycle numbers are identified as the same value. Then, the process proceeds to s29_25.

In s29_24, the property of a common Throughput cycle is denoted to be "non-constant", and the greatest common divisor of Throughput cycles determined with v∈V is identified as the common Throughput cycle. Then, the process proceeds to s29_25.

In s29_25, it is determined whether the variable flg is 0. If it is determined to be 0, then the process proceeds to s29_26. If other than 0, then the process proceeds to s29_28.

In s29_26, the information identified before now are reidentified as output cycle information, and the process proceeds to s29_27.

In s29_27, 1 is substituted in the variable flg, and a set I is substituted in a set variable V. The information corresponding to the set V is abandoned, and the process proceeds to s29_4.

In s29_28, the information identified before now are reidentified as input cycle information, and the process is terminated.

<<Correspondence-FF Extraction Process_Process Outline>>

An outline of the correspondence-FF extraction process s3 will be described.

The correspondence-FF extraction process s3 is a process for reading a high-level description, a synthesis resultant RTL, a variable dependence relation information, a state transition table, and input/output cycle information and analyzing the correlation between each variable in the high-level description and each FF in the synthesis resultant RTL. Here, as to variables (hereinafter called loop-free variables) having no potential for being associated with FFs each accompanied by a feedback loop in the synthesis resultant RTL, it is analyzed whether FFs to be associated in a one-to-one relationship exist in respective variables. When they exist therein, the correspondence relation or correlation therebetween is stored in loop-free variable one-to-one correlation information. As to variables (hereinafter called loop-existing variables) having the potential for being associated with FFs each accompanied by a feedback loop in the synthesis resultant RTL, it is first analyzed whether FFs to be associated in a one-to-one relationship exist in respective variables. When they exist therein, the correlation therebetween is stored in loop-existing variable one-to-one correlation information. If the variables in which the FFs to be associated therewith in the one-to-one relationship do not exist, remain, attention is paid to conditions for substitution of the state transition table into FFs, and an analysis is made as to whether FFs to be associated with conditions exist. If they exist, their correlation is stored in loop-existing variable non one-to-one correlation information.

Upon acquisition of the correlation between each variable in the high-level description and each FF in the synthesis resultant RTL, processing is switched in accordance with the classification of each synthesis resultant RTL. Here, the above classification includes a cycle accurate synthesis RTL, a Pipeline synthesis RTL and RTLs other than the above. As the RTL other than the above, there are known an input/output throughput ratio constant RTL, and an input/output throughput ratio non constant RTL. With respect to the above cases, a "one-to-one correlation between each variable in a high-level description and each FF in an RTL", a "conditional correlation between each variable in a high-level description and each FF in an RTL" and a "variable/FF correlation where a resource is shared by variables in a behavioral synthesis" are respectively acquired by leading to the existing method.

<<Correspondence-FF Extraction Process_Cycle Accurate Synthesis RTL>>

A description will be made of the correspondence-FF extraction process s3 related to the cycle accurate synthesis RTL.

As to a one-to-one correlation between each variable in a high-level description and each FF in an RTL, a random Sim is performed over several cycles on both of the high-level description and RTL to thereby take one with which a sequence comprised of each set or pair of a value and a cycle obtained by the random Sim coincides, as a one-to-one correlation candidate. By boiling down to the problem of regarding each variable in the high-level description taken as the candidate as the output of each FF and verifying whether the corresponding variable always and the output of each FF in the synthesis resultant RTL description taken as its corresponding candidate always coincide with each other in an arbitrary cycle, a set or pair of FFs having a signal output sequence equivalent within an existing flip-flop is capable of leading to a method of extracting the same as an inductive invariant. Accordingly, the details of the processing will be omitted, and this operation will hereinafter be referred to as a "flip-flop variable/FF correlation acquisition process".

As the existing method, there is known a Register-correspondence extraction method described in a document: Alan Mishchenko, Michael Case, Robert Brayton, and Stephan Jang, "Scalable and Scalably-Verifiable Sequential Synthesis" In Proc. of ICCAD, pp. 234-241, 2008. The resulting variable/FF one-to-one correlations are classified into loop-exiting variables and loop-free variables, which are types of the variables in the high-level description, whereby loop-existing variable one-to-one correlation information and loop-free variable one-to-one correlation information are outputted.

The above method can lead to an inductive invariant extraction method disclosed in 3. Computing inductive invariants of a document: Michael Case, Alan Mishchenko, and Robert Brayton, "Cut-Based Inductive Invariant Computation," In Proc. of IWLS, pp. 253-258, 2008. In the present document, there has been disclosed a method of inserting a cut into a connection group between gates in flip-flops and determining whether a minterm composed of literals that appear on the cut always becomes 1.

On the other hand, execution conditions for assignment behaviors to respective registers in the RTL description are described in a state transition table being one of the inputs of the present extraction unit in a group of a present state, a state transition condition and an execution condition. The latter two are described in logical expressions. The present state can also be expressed in a logical expression using a state variable. A set of the respective logical expressions is denoted to be X, Y, Z, a set of FFs is denoted to be F, and $\{\{x,y,z\}, f\} \in \text{PredFF} \subseteq (X \times Y \times Z) \times F$ is denoted to be a group of three logical expressions in which an assignment execution condition to an FF variable f is $x \wedge y \wedge z$, and FF variables.

A set of loop-existing variables in the high-level description is denoted to be Var.

A logical expression of $\neg (\text{Mi} \wedge (v==f)) = \neg \text{Mi} \vee (v!=f)$ is configured with respect to a minterm ({described as $\{M1, \ldots, M8\}$} comprised of literals x, y, z of $\{\{x,y,z\}, f\} \in \text{PredFF}$, and $v \in \text{Var}$.

If these logical expressions are regarded as the minterms each comprised of the cut in the above document, and the inductive invariant extraction method described in the above document is applied, it is possible to extract one that reaches an inductive invariant in the logic described in the form of $\text{Mi} \wedge (v==f)$.

All logical expressions extracted as inductive invariants are listed with respect to respective $v \in \text{Var}$. Denote that Ex. $\{\text{Pred1} \wedge (v==f1), \text{Pred2} \wedge (v==f2), \ldots, \text{Predn} \wedge (v==fn)\}$ is obtained.

Minterms each comprised of three literals that configure assignment conditions to FFs are extracted from the sets of the logical expressions. They are shown, for example, Ex $\{\text{Pred1}, \text{Pred2}, \ldots, \text{Predn}\}$.

When the logical sum of those minterms is always true, a correlation between a variable v and an FF with the minterm as a condition can be extracted. When, for example, Ex. $\text{Pred1} \vee \text{Pred2} \vee \ldots \vee \text{Predn} = 1$ is reached, $v = (\text{Pred1} \wedge f1) \vee (\text{Pred2} \wedge f2) \vee \ldots \vee (\text{Predn} \wedge fn)$ can be obtained as a conditional correlation between each variable and its corresponding FF.

There is also known another method. That is, a random Sim is executed, and attention is given to the values of respective minterms configured from a state transition table. A set or group of $v \in \text{Var}$ and $f \in F$ in each of which a value coincidence occurs in a cycle in which the value of the minterm becomes 1, and the corresponding minterm is extracted. When the present minterm is described as Pred, (plural) propositional logics represented as $\text{Pred} \wedge (v==f)$ are extracted as inductive invariant candidates. Thereafter, it is checked if inductive invariants are reached, in accordance with a method of a document: "M. Sheeran, S. Singh and G. Stalmarck, "Checking Safety Properties Using Induction and a SAT-Solver," In Proc. of Int. Conf. Formal Methods in Computer-Aided Design (FMCAD), pp. 108-125, 2000." or "P. Bjesse and K.

Claessen, "SAT-Based Verification without States Space Traversal," In Proc. of Int. Conf. Formal Methods in Computer-Aided Design (FMCAD), 2000.".

Here, a method of extracting the conditional variable/FF correlation from the resulting inductive invariants is the same as the previously-shown method.

<<Correspondence-FF Extraction Process_Pipeline Synthesis RTL>>

A description will be made of the correspondence-FF extraction process s3 related to the Pipeline synthesis RTL.

This case relates to a one-to-one correlation between each variable in a high-level description and each FF in an RTL. It is generally difficult to acquire a variable/FF correlation using a random Sim. This is because the high-level description and the synthesis resultant RTL are different in input/output cycle from each other. A difference in signal change cycle interval between the input and output however becomes a difference that generally has a constant ratio.

Therefore, a description will be made of a method for acquiring a difference between a variable/FF one-to-one correlation candidate and a cycle using the equivalence checking technology disclosed in Japanese Unexamined Patent Publication No. 2009-230451 that is the previous application by the present inventors.

Disclosed in Japanese Unexamined Patent Publication No. 2009-230451 is a method for checking or verifying by a random Sim whether an output signal sequence having the same value change is obtained in disregard of cycles from each output pair in which a high-level description and a synthesis resultant RTL are placed in a correspondence relation, where an input signal sequence having the same value change is given to the high-level description and the synthesis resultant RTL in disregard of cycles. Thus, each variable in the high-level description and each FF in the synthesis resultant RTL are regarded as outputs, a method disclosed in Japanese Unexamined Patent Publication of the same number is applied. A set or group of each variable and each FF that are coincident in value's change sequence with each other is extracted. This may be extracted as a one-to-one correlation candidate. It is determined whether a difference between signal change cycle intervals in a change sequence of associated values becomes the same ratio that is constant. If it is determined to be constant, then the same ratio is stored. When the ratio between the signal change cycle intervals is constant among all candidates, and the ratio is the same between all correspondence relations, a proof procedure targeted for an input/output ratio constant RTL, to be described later may be performed as to whether the one-to-one correlation candidates are actually in a correspondence relation or correlation.

Specifically, a correspondence relation on each one-to-one correlation candidate can be proved by regarding each variable in a high-level description and each FF in a synthesis resultant RTL in each one-to-one correlation candidate as outputs and leading to a method described in a document "Panka j Chauhan, Deepak Goyal, Gagan Hasteer, Anmol Mathur, and Nikhil Sharma, "Non-cycle-accurate Sequential Equivalence Checking," In Proc. of DAC, pp. 460-465, 2009.". If it is not so, a proof procedure where an input/output throughput ratio non-constant RTL, to be described later is taken, may be performed. The resulting variable/FF one-to-one correspondence relations are classified into loop-existing variables and loop-free variables that are types of variables in a high-level description, whereby loop-existing variable one-to-one correlation information and loop-free variable one-to-one correlation information are outputted.

Attention is given to the values of minterms configured by regarding each variable in a high-level description and each FF in a synthesis resultant RTL as outputs, applying the method disclosed in Japanese Unexamined Patent Publication No. 2009-230451 and regarding as literals, three logical expressions that configure FF assignment conditions extracted from a state transition table. A set or group of v∈Var and f∈F in each of which a value coincidence occurs when the value of the minterm becomes 1, and the corresponding minterm, is extracted within a signal value change sequence. When the present minterm is described as Pred, (plural) propositional logics represented as Pred∧(v==f) are first extracted as inductive invariant candidates.

As with the extraction of each one-to-one correlation candidate, it is determined whether a difference between signal change cycle intervals in a change sequence of associated values becomes the same ratio that is constant. If it is determined to be constant, the same ratio is stored. When the ratio between the signal change cycle intervals is constant to all candidates, and the ratio is the same between all correspondence relations, a proof procedure targeted for an input/output ratio constant RTL, to be described later may be performed. Specifically, whether the conditional correlation candidates are actually in a correspondence relation, can be proved by regarding each variable in a high-level description and each FF in a synthesis resultant RTL in each conditional correlation candidate as outputs and modifying to Pred∧(v==f), the Mitter logic used in the document "Panka j Chauhan, Deepak Goyal, Gagan Hasteer, Anmol Mathur, and Nikhil Sharma, "Non-cycle-accurate Sequential Equivalence Checking," In Proc. of DAC, pp. 460-465, 2009.". If it is not so, then a proof procedure targeted for an input/output throughput ratio non-constant RTL, to be described later may be performed.

<<Correspondence-FF Extraction Process_Input/Output Throughput Ratio Constant RTL>>

A description will be made of the correspondence-FF extraction process s3 related to the input/output throughput ratio constant RTL that is an RTL other than the above.

This case relates to a one-to-one correlation between each variable in a high-level description and each FF in an RTL. It is generally difficult to acquire a variable/FF correlation using a random Sim. This is because the high-level description and the synthesis resultant RTL are different in input/output cycle from each other. Therefore, likewise, a description will be made of a method of acquiring each variable/FF one-to-one correlation candidate using the method disclosed in Japanese Unexamined Patent Publication No. 2009-230451.

In Japanese Unexamined Patent Publication No. 2009-230451, there has been disclosed the method for checking or verifying by a random Sim whether an output signal sequence having the same value change is obtained in disregard of cycles from each output pair in which a high-level description and a synthesis resultant RTL are placed in a correspondence relation, where an input signal sequence having the same value change is given to the high-level description and the synthesis resultant RTL in disregard of cycles. Accordingly, each variable in the high-level description and each FF in the synthesis resultant RTL are regarded as the outputs, the method disclosed in Japanese Unexamined Patent Publication No. 2009-230451 is applied. A set or group of each variable and each FF that are coincident in value's change sequence with each other is extracted. This may be extracted as a one-to-one correlation candidate.

Whether the one-to-one correlation candidates are actually placed in a correspondence relation, can be proved by regarding each variable in a high-level description and each FF in a synthesis resultant RTL in each conditional correlation candidate as outputs and leading to the method of the document "Panka j Chauhan, Deepak Goyal, Gagan Hasteer, Anmol Mathur, and Nikhil Sharma, "Non-cycle-accurate Sequential Equivalence Checking," In Proc. of DAC, pp. 460-465, 2009.".

Attention is given to the values of minterms configured by regarding each variable in a high-level description and each FF in a synthesis resultant RTL as outputs, applying the method disclosed in Japanese Unexamined Patent Publication No. 2009-230451 and regarding as literals, three logical expressions that configure FF assignment conditions extracted from a state transition table. A set or group of v∈Var and f∈F in each of which a value coincidence occurs when the value of the minterm becomes 1, and the corresponding minterm, is extracted in a noted signal value change sequence. When the present minterm is described as Pred, (plural) propositional logics represented as Pred∧(v==f) are first extracted as inductive invariant candidates. As with the extraction of each one-to-one correlation candidate, it is determined whether a difference between signal change cycle intervals in a change sequence of associated values is the same ratio that is constant. If it is determined to be constant, the same ratio is stored.

When the ratio between the signal change cycle intervals is constant to all candidates, and the ratio is the same between all correspondence relations, whether the one-to-one correlation candidates are actually in a correspondence relation, can be proved by regarding each variable in a high-level description and each FF in a synthesis resultant RTL in each one-to-one correlation candidate as outputs and modifying to Pred∧(v==f), the Mitter logic used in the document "Panka j Chauhan, Deepak Goyal, Gagan Hasteer, Anmol Mathur, and Nikhil Sharma, "Non-cycle-accurate Sequential Equivalence Checking," In Proc. of DAC, pp. 460-465, 2009.".

<<Correspondence-FF Extraction Process_Input/Output Throughput Ratio Non-Constant RTL>>

A description will be made of the correspondence-FF extraction process s3 related to the input/output throughput ratio non-constant RTL that is an RTL other than the above.

This case relates to a one-to-one correlation between each variable in a high-level description and each FF in an RTL. It is generally difficult to acquire a variable/FF correlation using a random Sim. This is because the high-level description and the synthesis resultant RTL are different in input/output cycle from each other. A description will therefore be made of a method of acquiring each variable/FF one-to-one correlation candidate using the method disclosed in Japanese Unexamined Patent Publication No. 2009-230451.

In Japanese Unexamined Patent Publication No. 2009-230451, there has been disclosed the method for checking or verifying by a random Sim whether an output signal sequence having the same value change is obtained in disregard of cycles from each output pair in which a high-level description and a synthesis resultant RTL are placed in a correspondence relation, where an input signal sequence having the same value change is given to the high-level description and the synthesis resultant RTL in disregard of cycles.

Accordingly, each variable in the high-level description and each FF in the synthesis resultant RTL are regarded as the outputs, the method disclosed in Japanese Unexamined Patent Publication No. 2009-230451 is applied. A set or group of each variable and each FF that are coincident in value's change sequence with each other, is extracted. This may be extracted as a one-to-one correlation candidate.

Whether the one-to-one correlation candidates are actually in a correspondence relation, can be proved by leading to the method of the document "Daniel Kroening and Edmund Clarke, "Checking Consistency of C and Verilog Using Predicate Abstraction and Induction," In Proc. of ICCAD, pp. 66-72, 2004." if it is supposed to be provable. This may not be handled. In such a case, however, even if inductive invariants are truly given, they are not determined to be inductive invariants. Since, however, those that are not inductive invariants are not determined as inductive invariants, no problem arises. The number of resulting inductive invariants merely becomes an actual total number or less.

In the above document "Daniel Kroening and Edmund Clarke, "Checking Consistency of C and Verilog Using Predicate Abstraction and Induction," In Proc. of ICCAD, pp. 66-72, 2004.", there has been disclosed a method for proving whether value change sequences of output signals are the same by leading it to a safety checking problem of a model inspection method under the premise that value change sequences of input signals are the same.

Specifically, an equivalence determination problem is regarded as labeled transition systems in which a high-level description and a synthesis resultant RTL are set as operations or behaviors that enable input/output operations to be observed, and those other than them are set as internal operations or behaviors. They are denoted to be synchronized under the same inputs and outputs, and their internal operations or behaviors are freely operable. Thus, the equivalence determination problem results in a checking problem in which the product of the two labeled transition systems obtained by this is configured and as to whether operations having output behaviors or operations on the product always perform the same value output. Particularly when the product of the labeled transition systems is deadlocked, an inability of determination is reached. Thus, if the set or group of each variable and each FF, which takes on the one-to-one correlation candidate obtained by the above random Sim, is denoted to be the same output, and the method of the above document is applied, it is checked whether they are placed in a one-to-one correspondence relation in an arbitrary cycle.

The resulting variable/FF one-to-one correspondence relations are classified into loop-existing variables and loop-free variables that are types of variables in the high-level description, whereby loop-existing variable one-to-one correlation information and loop-free variable one-to-one correlation information are outputted.

Attention is given to the values of minterms configured by regarding each variable in a high-level description and each FF in a synthesis resultant RTL as outputs, applying the method disclosed in Japanese Unexamined Patent Publication No. 2009-230451 and regarding as literals, three logical expressions that configure FF assignment conditions extracted from a state transition table. A set or group of v∈Var and f∈F in each of which a value coincidence occurs when the value of the minterm becomes 1, and the corresponding minterm, is extracted in a signal value change sequence. When the present minterm is described as Pred, (plural) propositional logics represented as Pred∧(v==f) are first extracted as inductive invariant candidates.

Whether the inductive invariant candidates are actually brought to inductive invariants, can be proved by leading to the method of the document "Daniel Kroening and Edmund Clarke, "Checking Consistency of C and Verilog Using Predicate Abstraction and Induction," In Proc. of ICCAD, pp. 66-72, 2004.". This may not be handled. In such a case, however, even if inductive invariants are truly given, they are not determined to be inductive invariants. Since, however, those that are not inductive invariants are not determined as inductive invariants, no problem arises. The number of resulting inductive invariants merely becomes an actual total number or less.

Actually, if it is proved that the propositional logic Pred∧ (v==f) accompanied by the corresponding minterms is always established in all states in which the set or group of each variable and each FF that becomes each inductive invariant candidate obtained by the random Sim is regarded as the same output, the method disclosed in the document "Daniel Kroening and Edmund Clarke, "Checking Consistency of C and Verilog Using Predicate Abstraction and Induction," In Proc. of ICCAD, pp. 66-72, 2004." is applied, the product transition systems are configured, and value output operations of the variables and FFs brought to the inductive invariant candidates are performed, it is possible to check or verify whether the inductive invariant candidates take inductive invariants in arbitrary cycles.

<<Correspondence-FF Extraction Process_Entire Process Flow>>

Figure 53:
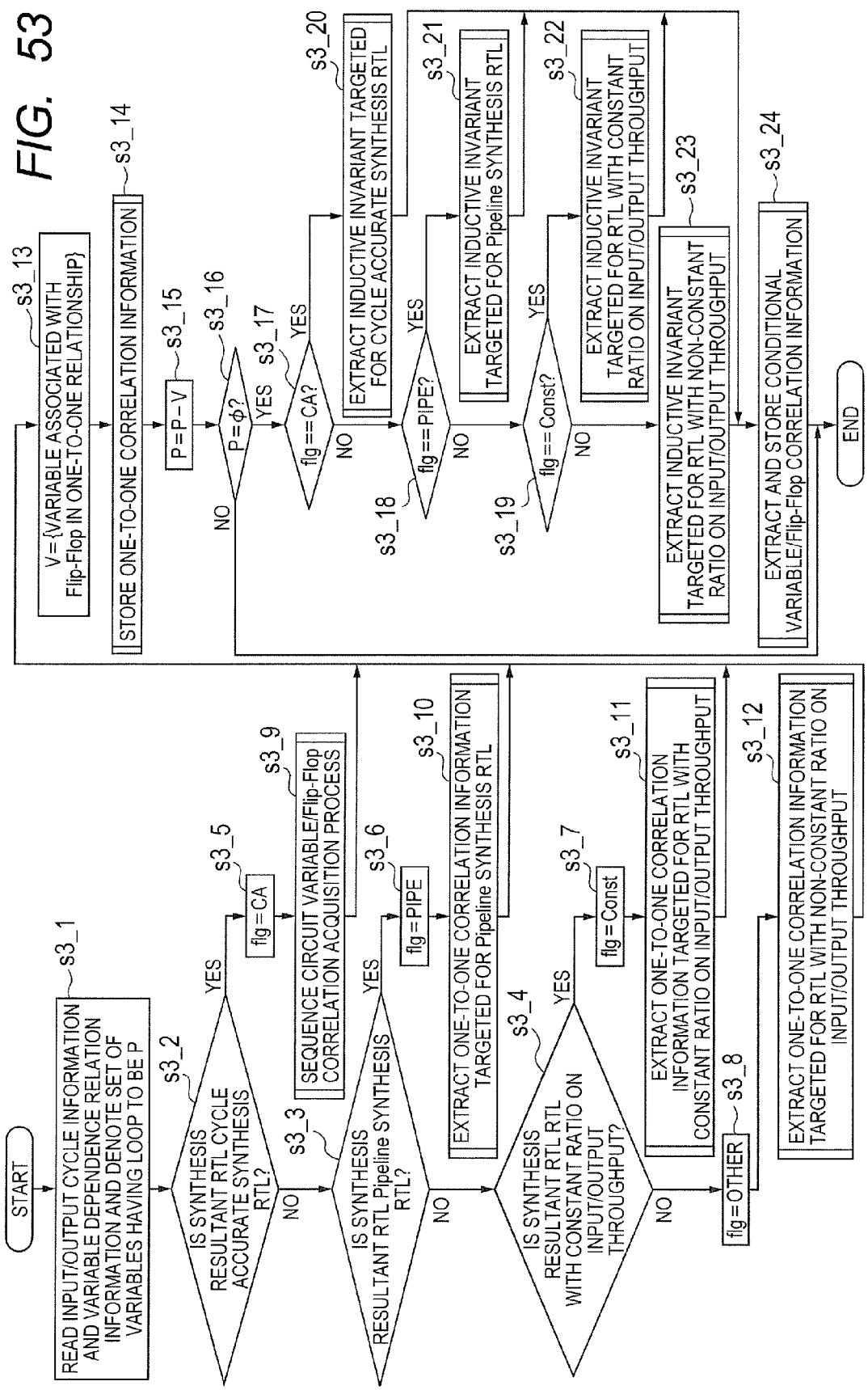
FIG. 53 is a flowchart illustrating an entire process of a correspondence-FF extraction process s3.

The entire process flow for the correspondence-FF extraction process s3 is illustrated in FIG. 53. The contents of processing in respective steps are as follows:

In s3_1, input/output cycle information and variable correlation information are read. A set of loop-existing variables is denoted to be P, and the process proceeds to s3_2.

In s3_2, reference is made to circuit type information included in the input/output cycle information. It is determined whether a synthesis resultant RTL is a cycle accurate synthesis RTL. If it is determined to be affirmative, then the process proceeds to s3_5. If it is not so, then the process proceeds to s3_3.

In s3_3, reference is made to the circuit type information included in the input/output cycle information. It is determined whether the synthesis resultant RTL is a Pipeline synthesis RTL. If it is determined to be the Pipeline synthesis RTL, then the process proceeds to s3_6. If it is not so, then the process proceeds to s3_4.

In s3_4, reference is made to the circuit type information included in the input/output cycle information. It is determined whether the synthesis resultant RTL is an RTL with a constant ratio on input/output throughput. If it is determined to be affirmative, then the process proceeds to s3_7. If it is not so, then the process proceeds to s3_8.

In s3_5, CA is substituted in a variable flg, and the process proceeds to s3_9.

In s3_6, PIPE is substituted in a variable flg, and the process proceeds to s3_10.

In s3_7, Const is substituted in a variable flg, and the process proceeds to s3_11.

In s3_8, OTHER is substituted in a variable flg, and the process proceeds to s3_12.

In s3_9, a "flip-flop variable/FF correlation acquisition process" is carried out, and the process proceeds to s3_13.

In s3_10, an "extraction of one-to-one correlation information targeted for a Pipeline synthesis RTL" is performed, and the process proceeds to s3_13.

In s3_11, an "extraction of one-to-one correlation information targeted for an RTL with a constant ratio on input/output throughput" is performed, and the process proceeds to s3_13.

In s3_12, an "extraction of one-to-one correlation information targeted for an RTL with a non-constant ratio on input/output throughput" is performed, and the process proceeds to s3_13.

In s3_13, V is set to be V={variable associated with FF in a one-to-one correspondence relation}, and the process proceeds to s3_14.

In s3_14, "storage of one-to-one correlation information" is carried out, and the process proceeds to s3_15.

In s3_15, P=P−V is executed, and the process proceeds to s3_16.

In s3_16, it is determined whether an output set P is empty. If it is determined to be empty, then the process is terminated. If it is determined not to be empty, then the process proceeds to s3_17.

In s3_17, it is determined whether a variable flg coincides with CA. If it is determined to be affirmative, then the process proceeds to s3_20. If it is determined to be negative, then the process proceeds to s3_18.

In s3_18, it is determined whether a variable flg coincides with PIPE. If it is determined to coincide therewith, then the process proceeds to s3_21. If it is not so, then the process proceeds to s3_19.

In s3_19, it is determined whether a variable flg coincides with Const. If it is determined to coincide therewith, then the process proceeds to s3_22. If it is not so, then the process proceeds to s3_23.

In s3_20, an "extraction of inductive invariants, targeted for a cycle accurate synthesis RTL" is performed, and the process proceeds to s3_24.

In s3_21, an "extraction of inductive invariants, targeted for a Pipeline synthesis RTL" is carried out, and the process proceeds to s3_24.

In s3_22, an "extraction of inductive invariants, targeted for an RTL with a constant ratio on input/output throughput" is performed, and the process proceeds to s3_24.

In s3_23, an "extraction of inductive invariants, targeted for an RTL with a non-constant ratio on input/output throughput" is performed, and the process proceeds to s3_24.

In s3_24, an "extraction/storage of conditional variable/FF correlation information" is performed, and the process is terminated.

Before the addition of detailed description about major steps in the correspondence-FF extraction process s3 in FIG. 53, the following processes will be explained. The first is a process for a "one-to-one variable/FF correspondence candidate extraction using an existing Sim-based equivalence checking method" taken as a random Sim method for extracting each one-to-one variable/FF correlation candidate, using an equivalence determination method based on Sim of a high-level description and a synthesis resultant RTL, which has been disclosed in Japanese Unexamined Patent Publication No. 2009-230451. The second is a "minterm configuration" process from a state transition table. The third is a process for a "conditional variable/FF correspondence candidate extraction using an existing Sim-based equivalence checking method" taken as a random Sim method for extracting each conditional variable/FF correlation candidate, using the equivalence determination method based on the Sim of the high-level description and the synthesis resultant RTL, which has been disclosed in Japanese Unexamined Patent Publication No. 2009-230451.

<<One-to-One Variable/FF Correspondence Candidate Extraction Process Flow Using Correspondence-FF Extraction Process_Exiting Sim-Based Equivalence Checking Method>>

Figure 54:
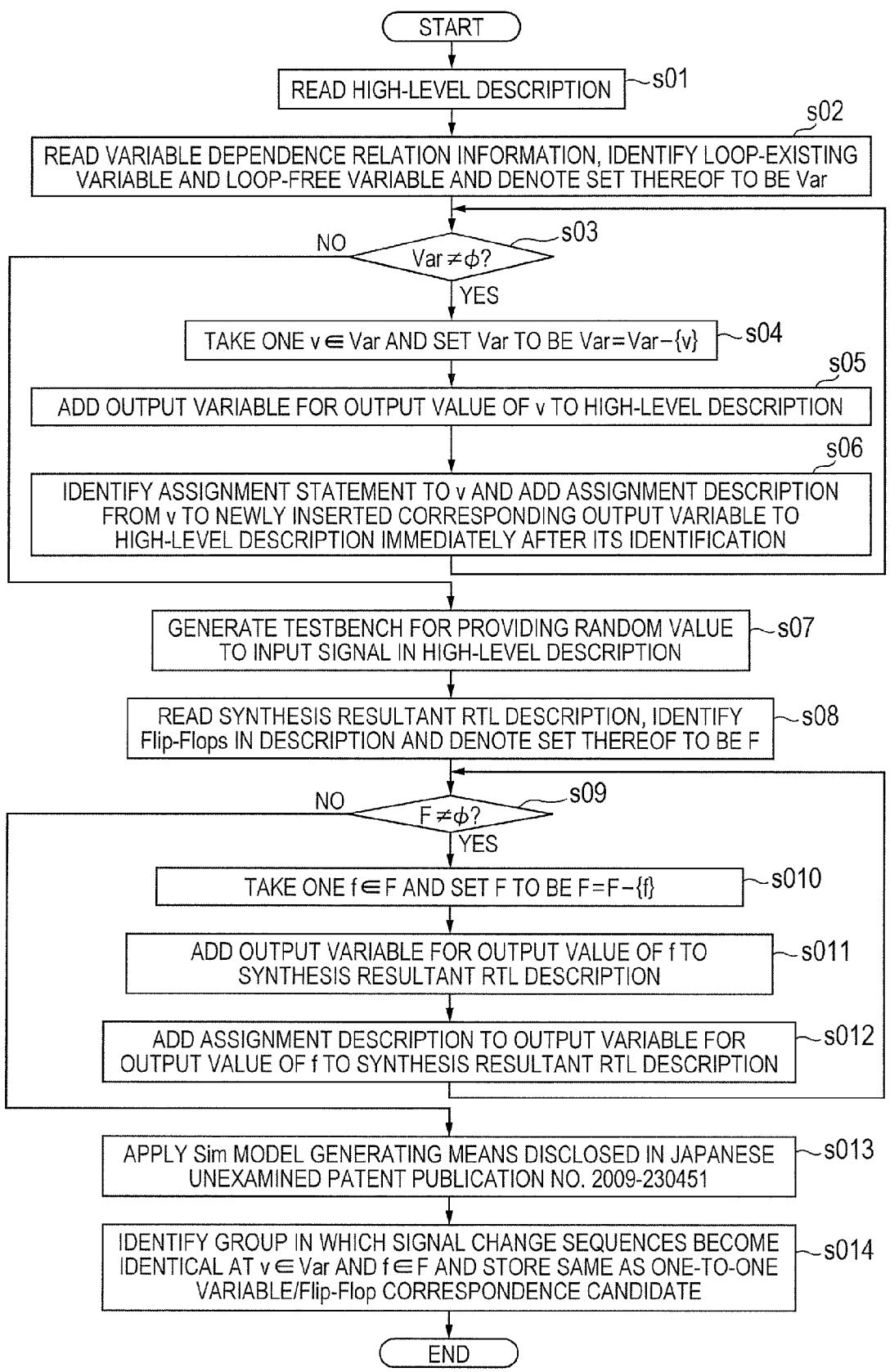
FIG. 54 is a flowchart illustrating a one-to-one variable/FF correspondence candidate extraction process using an existing Sim-based equivalence checking method.

The one-to-one variable/FF correspondence candidate extraction process flow using the existing Sim-based equivalence checking method is illustrated in FIG. 54. The contents of processing in respective steps are as follows:

In s01, a high-level description is read, and the process proceeds to s02.

In s02, variable correlation information is read to identify loop-existing variables and loop-free variables. A set thereof is denoted to be Var, and the process proceeds to s03.

In s03, it is determined whether the set Var is empty. If it is determined to be empty, then the process proceeds to s07. If it is determined not to be empty, then the process proceeds to s4.

In s04, one v∈Var is taken, and Var is set to be Var=Var−{v}. Then, the process proceeds to s05.

In s05, an output variable for the output value of v is added to the high-level description, and the process proceeds to s06.

In s06, an assignment statement to v is identified, and an assignment description from v to a newly inserted corresponding output variable is added to the high-level description immediately after its identification. Then, the process proceeds to s03.

In s07, a testbench for providing a random value to each input signal in the high-level description is generated, and the process proceeds to s08.

In s08, a synthesis resultant RTL description is read to identify FFs in the description. A set thereof is denoted to be F, and the process proceeds to s09. Here, upon the identification of each FF, the existing logic synthesis technology may be used or identification by the existing description style checker may be performed.

In s09, it is determined whether the set F is empty. If it is determined to be empty, then the process proceeds to s013. If it is determined not to be empty, then the process proceeds to s010.

In s010, one f∈F is taken and F is set to be F=F−{f}. Then, the process proceeds to s011.

In s011, an output variable for the output value of f is added to the synthesis resultant RTL description, and the process proceeds to s012.

In s012, an assignment description to an output variable for the output value of f is added to the synthesis resultant RTL description, and the process proceeds to s09. Here, when the RTL is of a Verilog description, for example, an assignment statement description using an assign statement may be added as an assignment statement.

In s013, the Sim model generating means disclosed in Japanese Unexamined Patent Publication No. 2009-230451 is applied, and an Sim model is configured. Thereafter, the process proceeds to s014.

In s014, a random Sim is performed with an Sim model as a target. Each set or group in which signal change sequences become the same at v∈Var and f∈F is identified and stored as a one-to-one variable/FF correspondence candidate. Then, the process is terminated. Here, each signal change sequence of (v,f) brought to the same is stored in its corresponding one-to-one variable/FF correspondence candidate inclusive of cycle information.

<<Correspondence-FF Extraction Process_Minimum Configuration Process Flow>>

Figure 55:
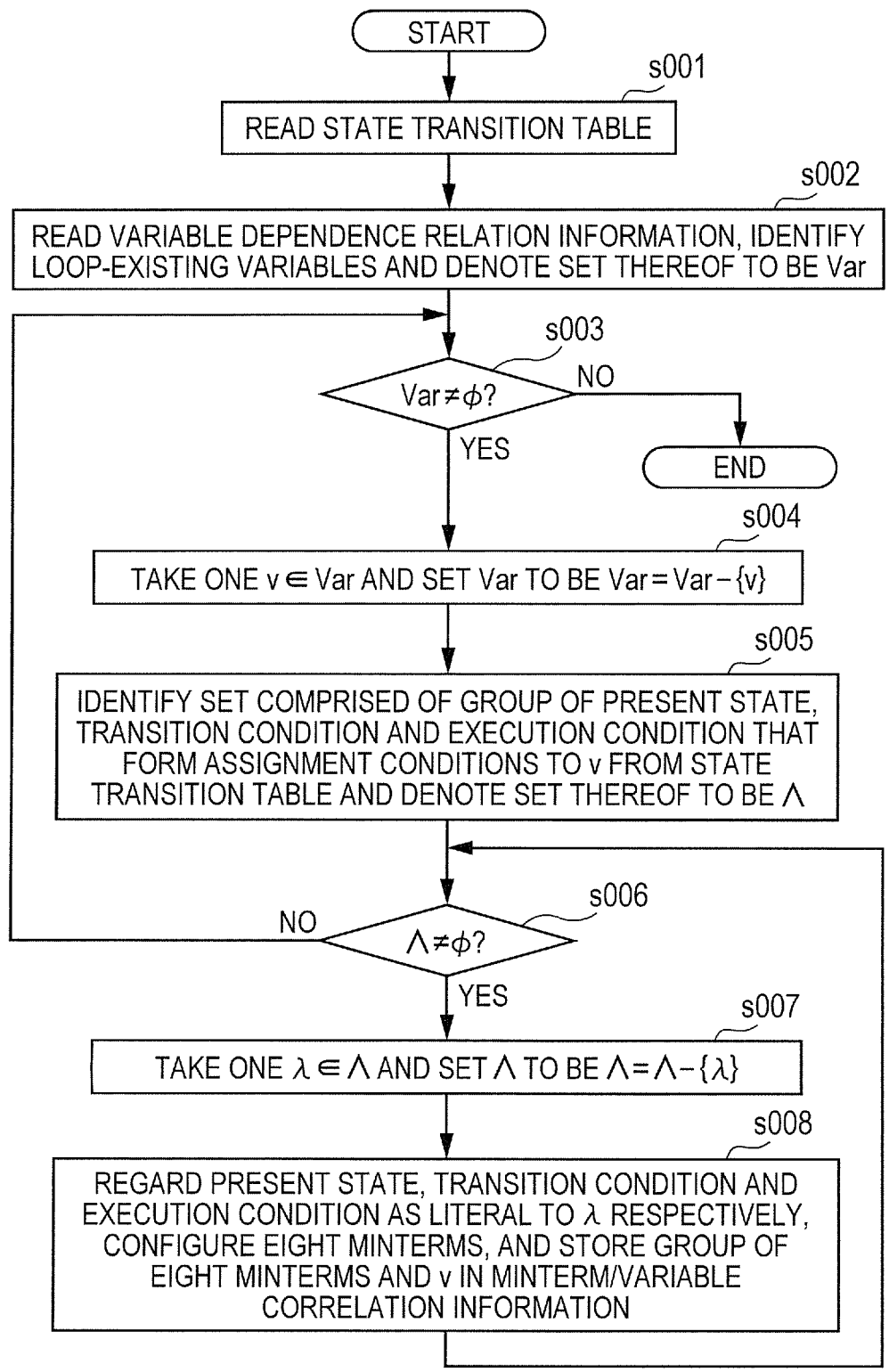
FIG. 55 is a flowchart illustrating a minimum configuration process.

The minimum configuration process flow is illustrated in FIG. 55. The contents of processing in respective steps are as follows:

In s001, a state transition table is read, and the process proceeds to s002.

In s002, variable correlation information is read and thereby loop-existing variables are identified. A set thereof is denoted to be Var, and the process proceeds to s003.

In s003, it is determined whether the set Var is empty. If it is determined to be empty, then the process is terminated. If it is determined not to be empty, then the process proceeds to s004.

In s004, one v∈Var is taken and Var is set to be Var=Var−{v}. Then, the process proceeds to s005.

In s005, a set comprised of each group of a present state, a transition condition and an execution condition, which configures assignment conditions to v, is identified from the state transition table. The set is denoted to be Λ, and the process proceeds to s006.

In s006, it is determined whether the set Λ is empty. If it is determined to be empty, then the process proceeds to s003. If it is determined not to be empty, then the process proceeds to s007.

In s007, one λ∈Λ is taken and Λ is set to be Λ=Λ−{λ}. Then, the process proceeds to s008.

In s008, a present state, a transition condition and an execution condition are respectively regarded as literals with respect to λ. Eight minterms are configured, and a group of the eight minterms and v is stored in minterm/variable correlation information. Then, the process proceeds to s006.

<<Conditional Variable/FF Correspondence Candidate Extraction Flow Using Correspondence-FF Extraction Process_Existing Sim-Based Equivalence Checking Method>>

Figure 56:
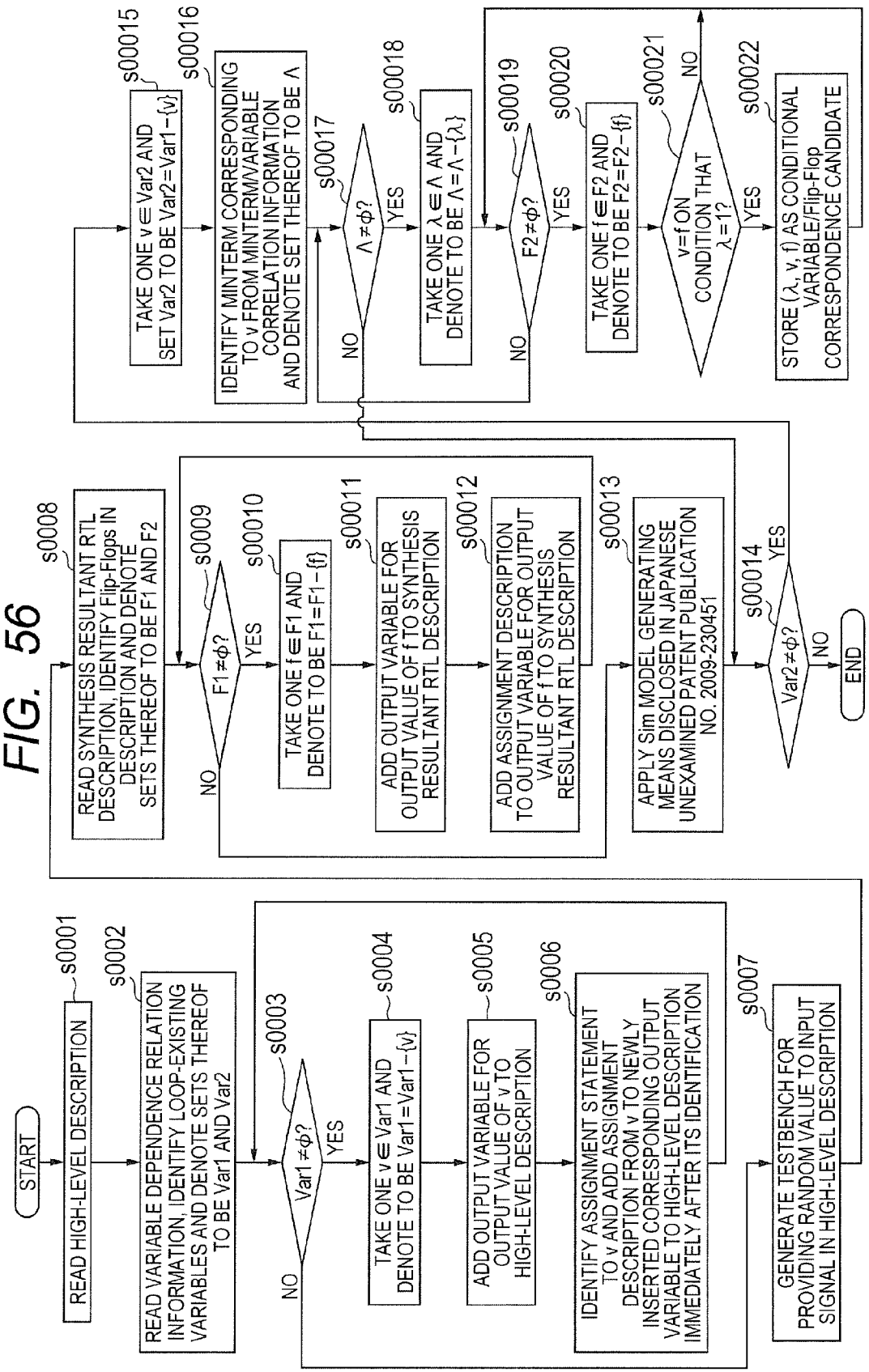
FIG. 56 is a flowchart illustrating a conditional variable/FF correspondence candidate extraction process using the existing Sim-based equivalence checking method.

A flow for the conditional variable/FF correspondence candidate extraction process using the existing Sim-based equivalence checking method is illustrated in FIG. 56. The contents of processing in respective steps are as follows:

In s0001, a high-level description is read, and the process proceeds to s0002.

In s0002, variable correlation information is read and thereby loop-existing variables and loop-free variables are identified. Sets thereof are respectively denoted to be Var1 and Var2. Then, the process proceeds to s0003.

In s0003, it is determined whether the set Var1 is empty. If it is determined to be empty, then the process proceeds to s0007. If it is determined not to be empty, then the process proceeds to s0004.

In s0004, one v∈Var1 is taken and Var1 is set to be Var1=Var1−{v}. Then, the process proceeds to s0005.

In s0005, an output variable for the output value of v is added to the high-level description, and the process proceeds to s0006.

In s0006, an assignment statement to v is identified, and an assignment description from v to a newly inserted corresponding output variable is added to the high-level description immediately after its identification. Then, the process proceeds to s0003.

In s0007, a testbench for providing a random value to each input signal in the high-level description is generated, and the process proceeds to s0008.

In s0008, a synthesis resultant RTL description is read to identify FFs in the description. Sets thereof are denoted to be F1 and F2 respectively, and the process proceeds to s0009. Here, in the identification of each FF, the existing logic synthesis technology may be used or identification by the existing description style checker may be performed. When a conjunction description is used in each FF in F2, a division according to the conjunction description is performed and hence the resulting plural FFs are added to F2. Along with it, FFs corresponding to the conjunction description targeted for partitioning are denoted to be deleted from F2.

In s0009, it is determined whether the set F1 is empty. If it is determined to be empty, then the process proceeds to s00013. If it is determined not to be empty, then the process proceeds to s00010.

In s00010, one f∈F1 is taken and F1 is set to be F1=F1−{f}. Then, the process proceeds to s00011.

In s00011, an output variable for the output value of f is added to the synthesis resultant RTL description, and the process proceeds to s00012.

In s00012, an assignment description to an output variable for the output value of f is added to the synthesis resultant RTL description, and the process proceeds to s0009. Here, when the RTL is of a Verilog description, for example, an assignment statement description using an assign statement may be added as an assignment statement.

In s00013, the Sim model generating means disclosed in Japanese Unexamined Patent Publication No. 2009-230451 is applied. An Sim model is configured and a random Sim is executed with the Sim model as a target. Thereafter, the process proceeds to s00014.

In s00014, it is determined whether the set Var2 is empty. If it is determined to be empty, then the process is terminated. If it is determined not to be empty, then the process proceeds to s00015.

In s00015, one v∈Var2 is taken and Var2 is set to be Var2=Var2−{v}. Then, the process proceeds to s00016.

In s00016, minterms corresponding to v are identified from the minterm/variable correlation information, and a set thereof is denoted to be Λ. Then, the process proceeds to s00017.

In s00017, it is determined whether the set Λ is empty. If it is determined to be empty, then the process proceeds to s00014. If it is determined not to be empty, then the process proceeds to s00018.

In s00018, one λ∈Λ is taken and Λ is set to be Λ=Λ−{λ}. Then, the process proceeds to s00019.

In s00019, it is determined whether the set F2 is empty. If it is determined to be empty, then the process proceeds to s00017. If it is determined not to be empty, then the process proceeds to s00020.

In s00020, one f∈F2 is taken and F2 is set to be F2=F2−{f}. Then, the process proceeds to s00021. Here, as f, one not greater than a Bit width of v is selected.

In s00021, it is determined whether a signal change sequence of v and a signal change sequence of f coincide with each other on the condition that λ=1. If it is determined that they coincide with each other, then the process proceeds to s00022. If they do not coincide with each other, then the process proceeds to s00019.

In s00022, (λ,v,f) is stored as conditional variable/FF correspondence candidates, and the process proceeds to s00019. Here, the signal change sequences of (λ,v,f) made identical are stored in the conditional variable/FF correspondence candidates inclusive of cycle information.

<<Detailed Process of s3-10 in Correspondence-FF Extraction Process_FIG. 53>>

Figure 57:
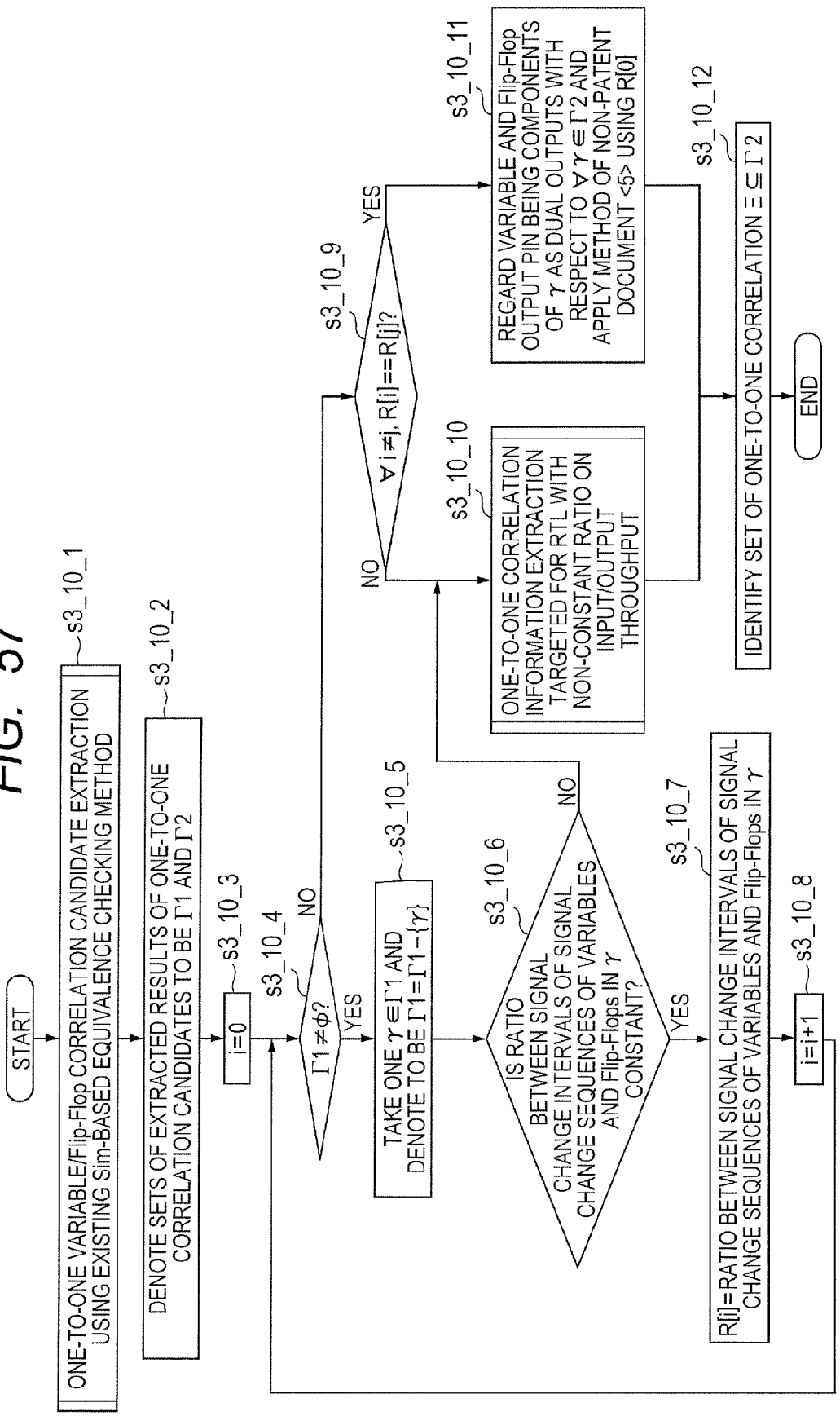
FIG. 57 is a flowchart illustrating the details of an extraction process of one-to-one correlation information targeted for a Pipeline synthesis RTL of s3-10 in the correspondence-FF extraction process of FIG. 53.

The details of the process for the "extraction of one-to-one correlation information targeted for Pipeline synthesis RTL" of s3-10 in the correspondence-FF extraction process of FIG. 53 are illustrated in FIG. 57. The contents of processing in respective steps are as follows:

In s3_10_1, the "extraction of one-to-one correlation information using the existing Sim-based equivalence checking method" is performed, and the process proceeds to s3_10_2.

In s3_10_2, sets of results of extractions of one-to-one correlation candidates are denoted to be Γ1 and Γ2. Then, the process proceeds to s3_10_3. Here, Γ1=Γ2.

In s3_10_3, a variable i is initialized to 0, and the process proceeds to s3_10_4.

In s3_10_4, it is determined whether the set Γ1 is empty. If it is determined to be empty, then the process proceeds to s3_10_9. If it is determined not to be empty, then the process proceeds to s3_10_5.

In s3_10_5, one γ∈Γ1 is taken and Γ1 is set to be Γ1=Γ1−{γ}. Then, the process proceeds to s3_10_6.

In s3_10_6, it is determined whether the ratio between signal change intervals of signal change sequences of variables and FFs that configure γ is constant. If it is determined to be constant, then the process proceeds to s3_10_7. If it is determined not to be constant, then the process proceeds to s3_10_10.

In s3_10_7, the ratio between the signal change intervals of the signal change sequences of the variables and FFs that configure γ is substituted in R[i], and the process proceeds to s3_10_8.

In s3_10_8, i=i+1 is performed, and the process proceeds to s3_10_4.

In s3_10_9, it is determined whether integers stored in an array R[ ] are all equal to each other. If it is determined that they are equal, then the process proceeds to s3_10_11. If they are not equal to each other, then the process proceeds to s3_10_10.

In s3_10_10, the "one-to-one correlation information extraction targeted for the input/output throughput ratio non-constant RTL" that is a defined process is performed, and the process is terminated.

In s3_10_11, with respect to an arbitrary γ∈Γ2, each variable and an FF output pin being components of γ are regarded as dual outputs, and the method of the document "Panka j Chauhan, Deepak Goyal, Gagan Hsteer, Anmol Mathur, and Nikhil Sharma, "Non-cycle-accurate Sequential Equivalence Checking," In Proc. of DAC, pp. 460-465, 2009." is applied using R[0], whereby the process is terminated.

<<Detailed Process of s3-11 in Correspondence-FF Extraction Process_FIG. 53>>

Figure 58:
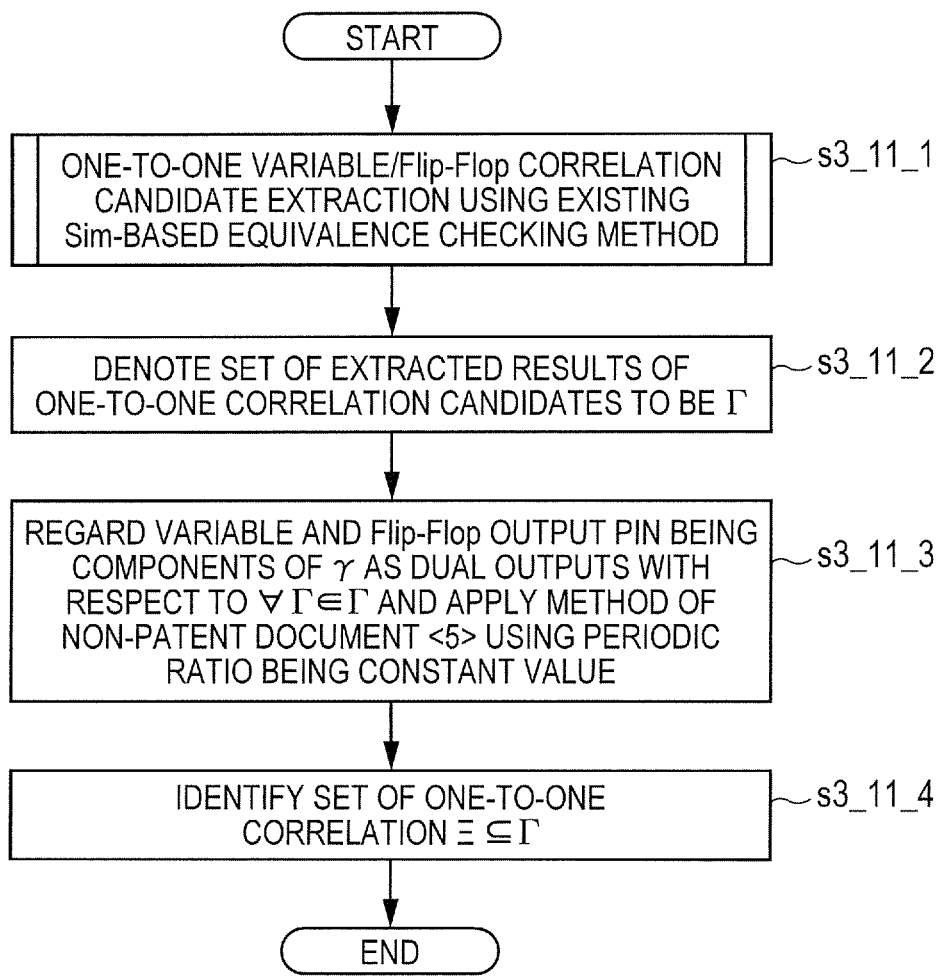
FIG. 58 is a flowchart illustrating the details of an extraction process of one-to-one correlation information targeted for an input/output throughput ratio constant RTL of s3-11 in the correspondence-FF extraction process of FIG. 53.

The details of the process for the "extraction of one-to-one correlation information targeted for the input/output throughput ratio constant RTL" of s3-11 in the correspondence-FF extraction process of FIG. 53 are illustrated in FIG. 58. The contents of processing in respective steps are as follows:

In s3_11_1, the "one-to-one variable/FF correlation candidate extraction using the existing Sim-based equivalence checking method" that is a defined process is performed, and the process proceeds to s3_11_2.

In s3_11_2, a set of results of extractions of one-to-one correlation candidates is denoted to be Γ, and the process proceeds to s3_11_3.

In s3_11_3, with respect to an arbitrary γ∈θ, each variable and an FF output pin being components of γ are regarded as dual outputs, and the method of the non-patent document "Panka j Chauhan, Deepak Goyal, Gagan Hsteer, Anmol Mathur, and Nikhil Sharma, "Non-cycle-accurate Sequential Equivalence Checking," In Proc. of DAC, pp. 460-465, 2009." is applied using a ratio R[0] in output period being a constat. Then, the process proceeds to s3_11_4.

In s3_11_4, a set Ξ of one-to-one correspondence relations, which is a subset of Γ, is identified, and the process is terminated.

<<Detailed Process of s3-12 in Correspondence-FF Extraction Process_FIG. 53>>

Figure 59:
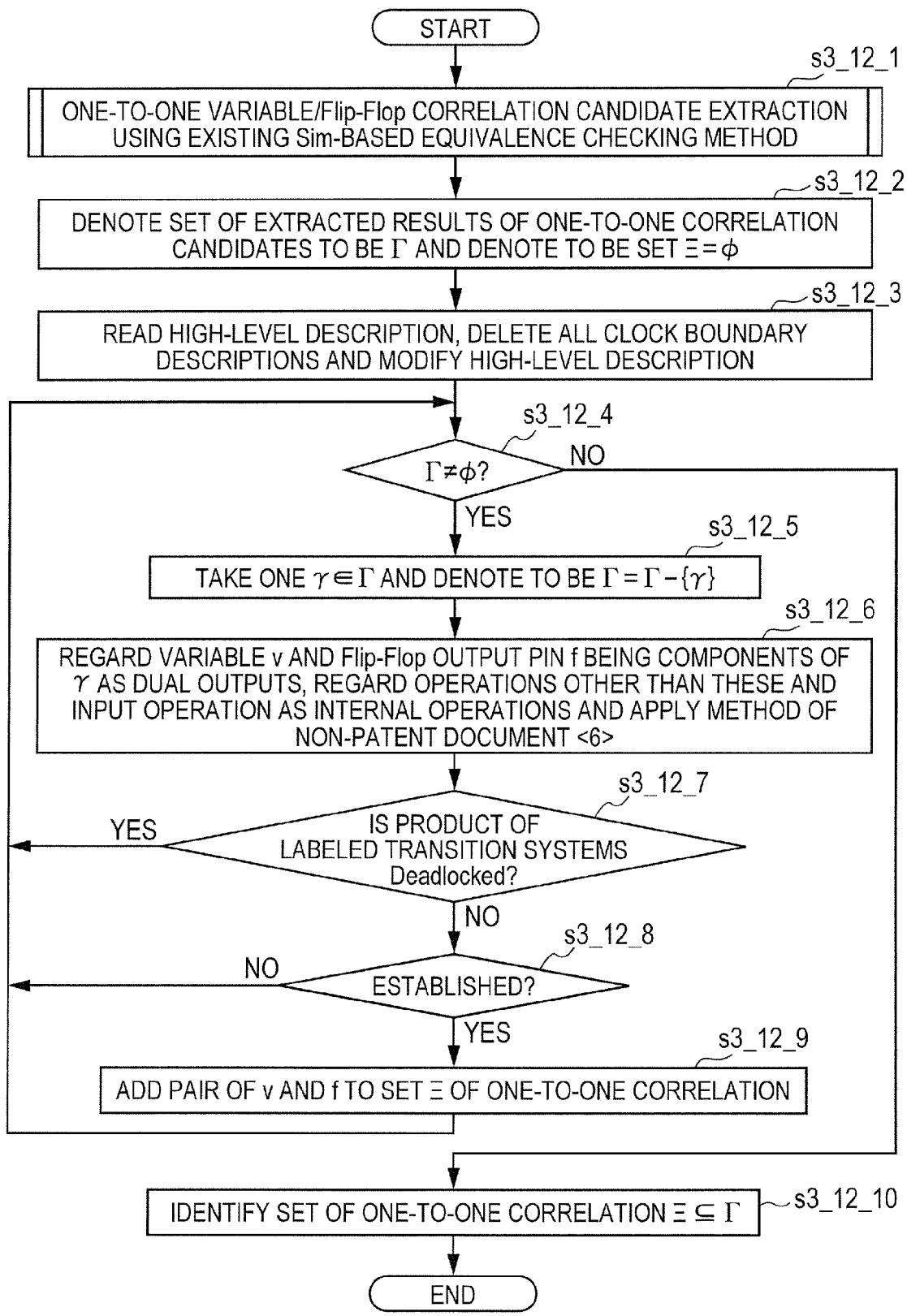
FIG. 59 is a flowchart illustrating the details of an extraction process of one-to-one correlation information targeted for an input/output throughput ratio non-constant RTL of s3-12 in the correspondence-FF extraction process of FIG. 53.

The details of the process for the "extraction of one-to-one correlation information targeted for the input/output throughput ratio non-constant RTL" of s3-12 in the correspondence-FF extraction process of FIG. 53 is illustrated in FIG. 59. The contents of processing in respective steps are as follows:

In s3_12_1, the "one-to-one variable/FF correlation candidate extraction using the existing Sim-based equivalence checking method" that is of the defined process is performed, and the process proceeds to s3_11_2.

In s3_12_2, a set of results of extractions of one-to-one correlation candidates is denoted to be Γ, and a set Ξ is initialized as an empty set. Then, the process proceeds to s3_12_3.

In s3_12_3, a high-level description is read and clock boundary descriptions are all deleted, whereby the high-level description is modified. Then, the process proceeds to s3_12_4.

In s3_12_4, it is determined whether the set Γ is empty. If it is determined to be empty, then the process proceeds to s3_12_10. If it is determined not to be empty, then the process proceeds to s3_12_5.

In s3_12_5, one γ∈Γ is taken and Γ is set to be Γ=Γ−{γ}. Then, the process proceeds to s3_12_6.

In s3_12_6, a variable v and an FF output pin f being components of γ are regarded as dual outputs. These and operations or behaviors other than an input operation are regarded as internal operations. The method of the non-patent document <6> is applied. Then, the process proceeds to s3_12_7.

In s3_12_7, it is checked whether each of product labeled transition systems configured in accordance with the method of the document "Daniel Kroening and Edmund Clarke, "Checking Consistency of C and Verilog Using Predicate Abstraction and Induction," In Proc. of ICCAD, pp. 66-72, 2004." is Deadlocked. If it is found to be Deadlocked, then the process proceeds to s3_12_4. If it is found not to be so, then the process proceeds to s3_12_8.

In s3_12_8, it is determined whether v==f is established. If it is determined that v==f has been established, then the process proceeds to s3_12_9. If it is not so, then the process proceeds to s3_12_4.

In s3_12_9, each pair of v and f is added to a set Ξ of one-to-one correlations, and the process proceeds to s3_12_10.

In s3_12_10, the set Ξ of the one-to-one correlations, which is a subset of Γ, is identified, and the process is terminated.

<<Detailed Process of s3-14 in Correspondence-FF Extraction Process_FIG. 53>>

Figure 60:
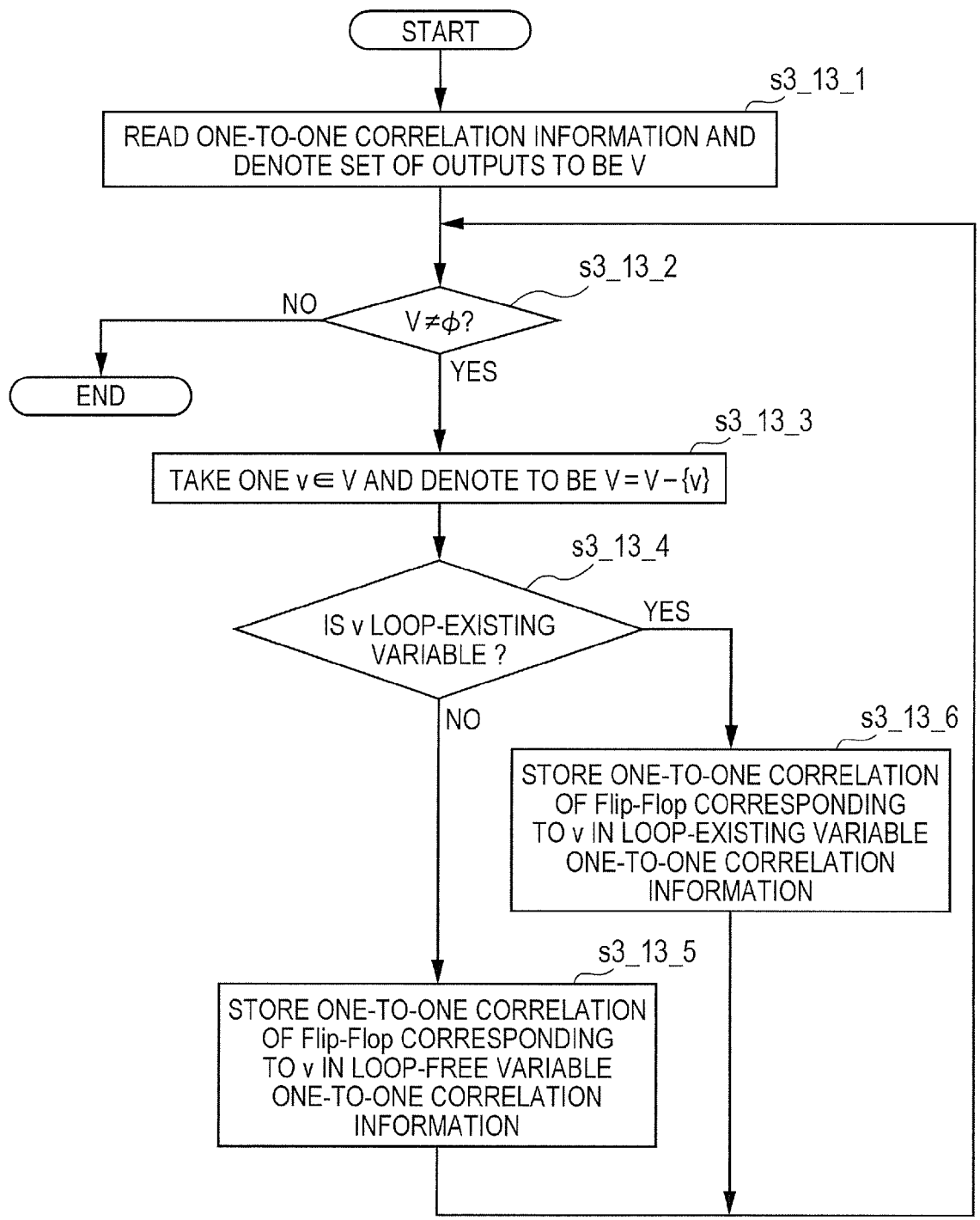
FIG. 60 is a flowchart illustrating the details of a storage process of one-to-one correlation information of s3-14 in the correspondence-FF extraction process of FIG. 53.

The details of the process for "storage of one-to-one correlation information" of s3-14 in the correspondence-FF extraction process of FIG. 53 are illustrated in FIG. 60. The contents of processing in respective steps are as follows:

In s3_13_1, one-to-one correlation information is read, and a set of outputs is denoted to be V. Then, the process proceeds to s3_13_2.

In s3_13_2, it is determined whether the set V is empty. If it is determined to be empty, then the process is terminated. If it is determined not to be empty, then the process proceeds to s3_13_3.

In s3_13_3, one v∈V is taken and V is set to be V=V−{v}. Then, the process proceeds to s3_13_4.

In s3_13_4, it is determined whether v is a loop-existing variable. If it determined to be so, then the process proceeds to s3_13_6. If it is not so, then the process proceeds to s3_13_5.

In s3_13_5, each one-to-one correlation of v and its corresponding FF is stored in loop-free variable one-to-one correlation information, and the process proceeds to s3_13_2.

In s3_13_6, each one-to-one correlation of v and its corresponding FF is stored in loop-existing variable one-to-one correlation information, and the process proceeds to s3_13_2.

<<Detailed Process of s3-20 in Correspondence-FF Extraction Process_FIG. 53>>

Figure 61:
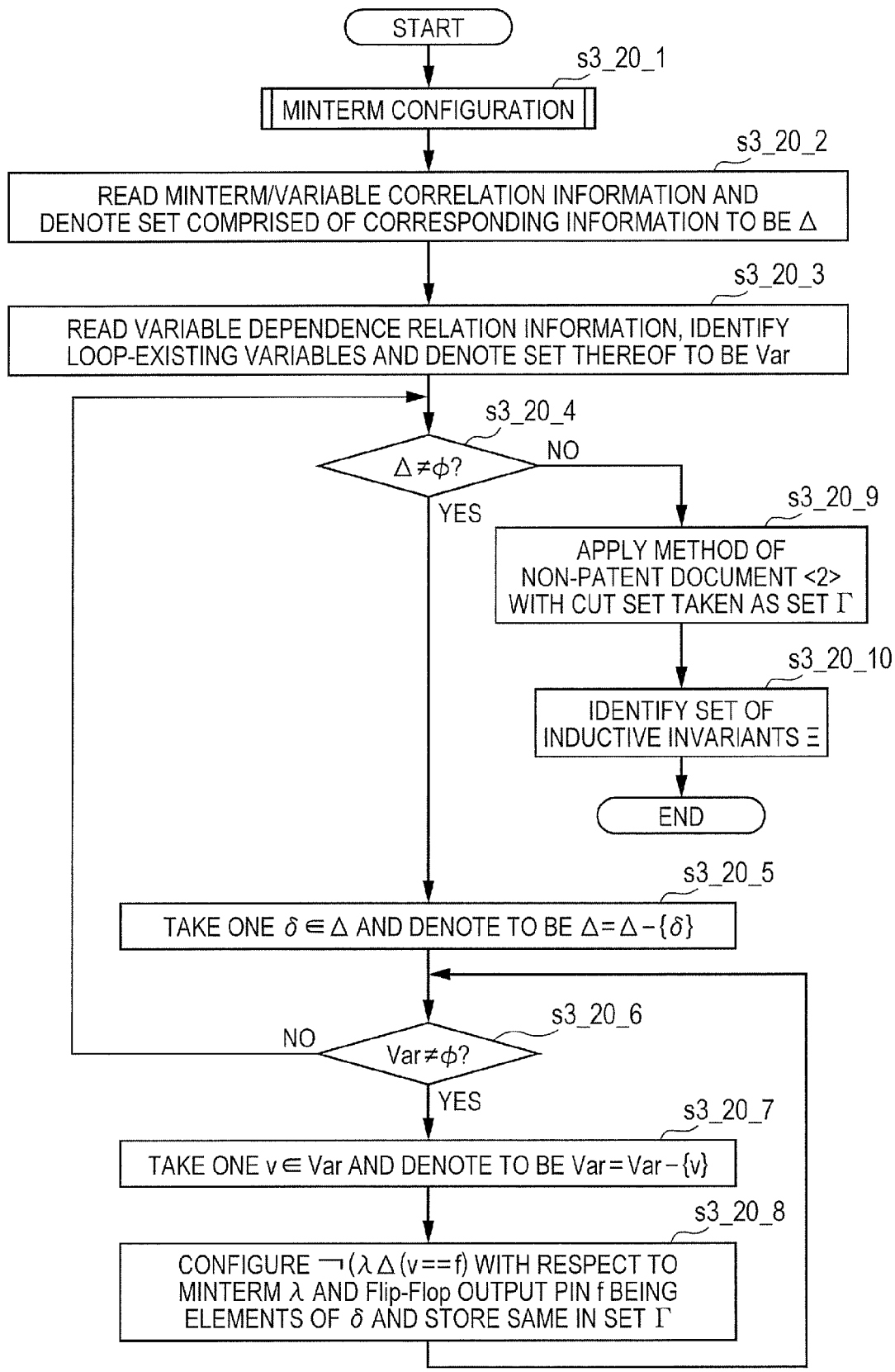
FIG. 61 is a flowchart illustrating the details of an extraction process of inductive invariants targeted for a cycle accurate synthesis RTL of s3-20 in the correspondence-FF extraction process of FIG. 53.

The details of the process for the "extraction of inductive invariants targeted for the cycle accurate synthesis RTL" of s3-20 in the correspondence-FF extraction process of FIG. 53 are illustrated in FIG. 61. The contents of processing in respective steps are as follows:

In s3_20_1, a "minterm configuration" process is performed, and the process proceeds to s3_20_2.

In s3_20_2, minterm/variable correlation information is read, and a set formed by the information is denoted to be Δ. Then, the process proceeds to s3_20_3.

In s3_20_3, variable dependence relation information is read and thereby loop-exiting variables are identified. A set thereof is denoted to be Var, and the process proceeds to s3_20_4.

In s3_20_4, it is determined whether the set Δ is empty. If it determined to be empty, then the process proceeds to s3_20_9. If it is determined not to be empty, then the process proceeds to s3_20_5.

In s3_20_5, one δ∈Δ is taken and Δ is set to be Δ=Δ−{δ}. Then, the process proceeds to s3_20_6.

In s3_20_6, it is determined whether a set Var is empty. If it is determined to be empty, then the process proceeds to s3_20_4. If it is determined not to be empty, then the process proceeds to s3_20_7.

In s3_20_7, one v∈Var is taken and Var is set to be Var=Var−{v}. Then, the process proceeds to s3_20_8.

In s3_20_8, ¬(λ∧(v==f)) is configured with respect to a minterm λ and an FF output pin f being elements of δ and stored in its corresponding set Γ. Then, the process proceeds to s3_20_6.

In s3_20_9, the method of the document "Michael Case, Alan Mishchenko, and Robert Brayton, "Cut-Based Inductive Invariant Computation," In Proc. of IWLS, pp. 253-258, 2008." is applied with a cut set as the set Γ. Then, the process proceeds to s3_20_10.

In s3_20_10, a set Ξ of inductive invariants is identified, and the process is terminated. Here, ¬ξ∈Λ is always established with respect to ∀ξ∈Ξ. That is, the set Ξ is a set of propositional logics described in the format of λ∧(v==f) and becomes a set of inductive invariants.

<<Detailed Process of s3_21 in Correspondence-FF Extraction Process_FIG. 53>>

Figure 62:
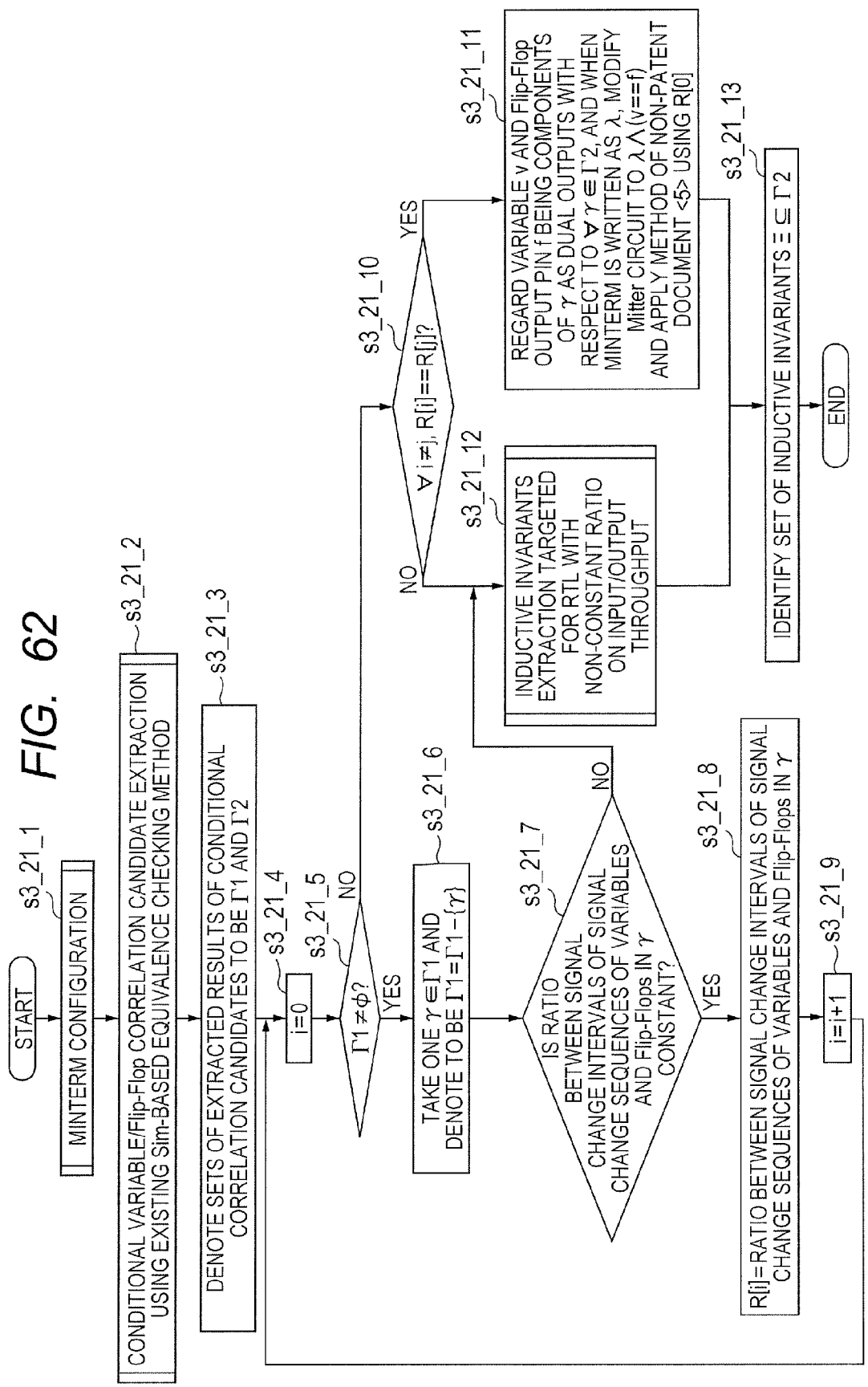
FIG. 62 is a flowchart illustrating the detail of an extraction process of inductive invariants targeted for a Pipeline synthesis RTL of s3-21 in the correspondence-FF extraction process of FIG. 53.

The details of the process for the "extraction of inductive invariants targeted for the Pipeline synthesis RTL" of s3-21 in the correspondence-FF extraction process of FIG. 53 are illustrated in FIG. 62. The contents of processing in respective steps are as follows:

In s3_21_1, a "minterm configuration" process is performed, and the process proceeds to s3_21_2.

In s3_21_2, the "conditional variable/FF correlation candidate extraction using the existing Sim-based equivalence checking method" is performed, and the process proceeds to s3_21_3.

In s3_21_3, sets of results of extractions of conditional correlation candidates are respectively denoted to be Γ1 and Γ2. Then, the process proceeds to s3_21_4. Here, Γ1=Γ2.

In s3_21_4, a variable i is initialized to 0, and the process proceeds to s3_21_5.

In s3_21_5, it is determined whether the set Γ1 is empty. If it is determined to be empty, then the process proceeds to s3_21_10. If it is determined not to be empty, then the process proceeds to s3_21_6.

In s3_21_6, one γ∈Γ1 is taken and Γ1 is set to be Γ1=Γ1−{γ}. Then, the process proceeds to s3_21_7.

In s3_21_7, it is determined whether the ratio between signal change intervals of signal change sequences of variables and FFs that configure γ is constant. If it is determined to be constant, then the process proceeds to s3_21_7. If it is determined not to be constant, then the process proceeds to s3_21_10.

In s3_21_8, the ratio between the signal change intervals of the signal change sequences of the variables and FFs that configure γ where only each cycle in which the minterm λ being a component of γ becomes 1 is taken as a target, is substituted in R[i], and the process proceeds to s3_21_9.

In s3_21_9, i=i+1 is performed, and the process proceeds to s3_21_10.

In s3_21_10, it is determined whether integers stored in an array R[ ] are all equal to each other. If it is determined that they are equal, then the process proceeds to s3_21_11. If they are not equal to each other, then the process proceeds to s3_21_12.

In s3_21_11, with respect to an arbitrary $\gamma \in \Gamma 2$, a variable v and an FF output pin being components of $\gamma$ are regarded as dual outputs, an output comparison determination circuit is modified to $\lambda \wedge (v==f)$ where the minterm corresponding to these v and f is taken as $\lambda$, and the method described in the document "Panka j Chauhan, Deepak Goyal, Gagan Hsteer, Anmol Mathur, and Nikhil Sharma, "Non-cycle-accurate Sequential Equivalence Checking," In Proc. of DAC, pp. 460-465, 2009." is applied using R[0], whereby the process proceeds to s3_21_13.

In s3_21_12, a process for the "inductive invariant extraction targeted for the input/output throughput ratio non-constant RTL" that is a defined process is performed, and the process proceeds to s3_21_13.

In s3_21_13, a set $\Xi$ of inductive invariants, which is a subset of $\Gamma 2$, is identified, and the process is terminated.

<<Detailed Process of s3-22 in Correspondence-FF Extraction Process_FIG. 53>>

Figure 63:
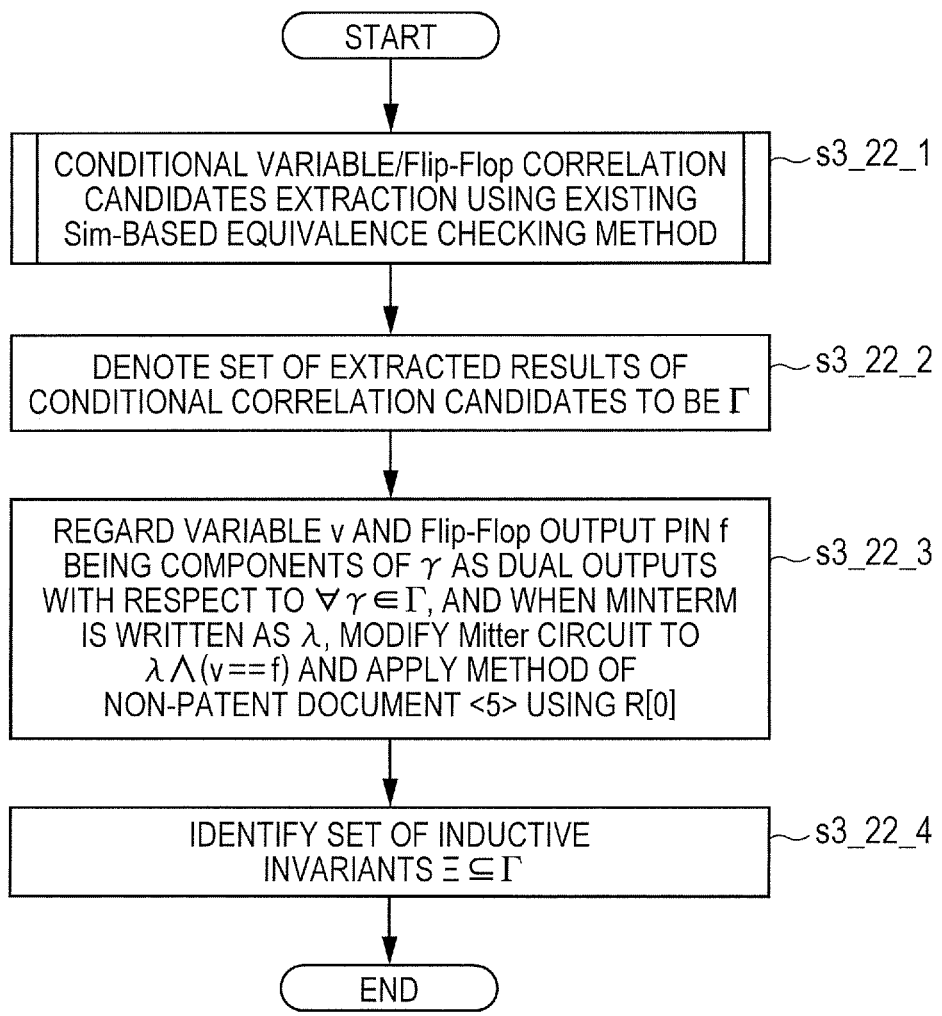
FIG. 63 is a flowchart illustrating the details of an extraction process of inductive invariants targeted for an input/output throughput ratio constant RTL of s3-22 in the correspondence-FF extraction process of FIG. 53.

The details of the process for the "extraction of inductive invariants targeted for the input/output throughput ratio constant RTL" of s3-22 in the correspondence-FF extraction process of FIG. 53 are illustrated in FIG. 63. The contents of processing in respective steps are as follows:

In s3_22_1, the "conditional variable/FF correlation candidate extraction using the existing Sim-based equivalence checking method" is performed, and the process proceeds to s3_22_2.

In s3_22_2, a set of results of extractions of conditional correlation candidates is denoted to be $\Gamma$, and the process proceeds to s3_22_3.

In s3_22_3, with respect to an arbitrary $\gamma \in \Gamma$, a variable v and an FF output pin being components of $\gamma$ are regarded as dual outputs, an output comparison determination circuit is modified to $\lambda \wedge (v==f)$ where the minterm corresponding to these v and f is taken as $\lambda$, and the method described in the document "Panka j Chauhan, Deepak Goyal, Gagan Hsteer, Anmol Mathur, and Nikhil Sharma, "Non-cycle-accurate Sequential Equivalence Checking," In Proc. of DAC, pp. 460-465, 2009." is applied using a ratio R[0] in output period being a constant, whereby the process proceeds to s3_22_4.

In s3_22_4, a set $\Xi$ of conditional correlations, which is a subset of $\Gamma$, is identified, and the process is terminated.

<<Detailed Process of s3-23 in Correspondence-FF Extraction Process_FIG. 53>>

Figure 64:
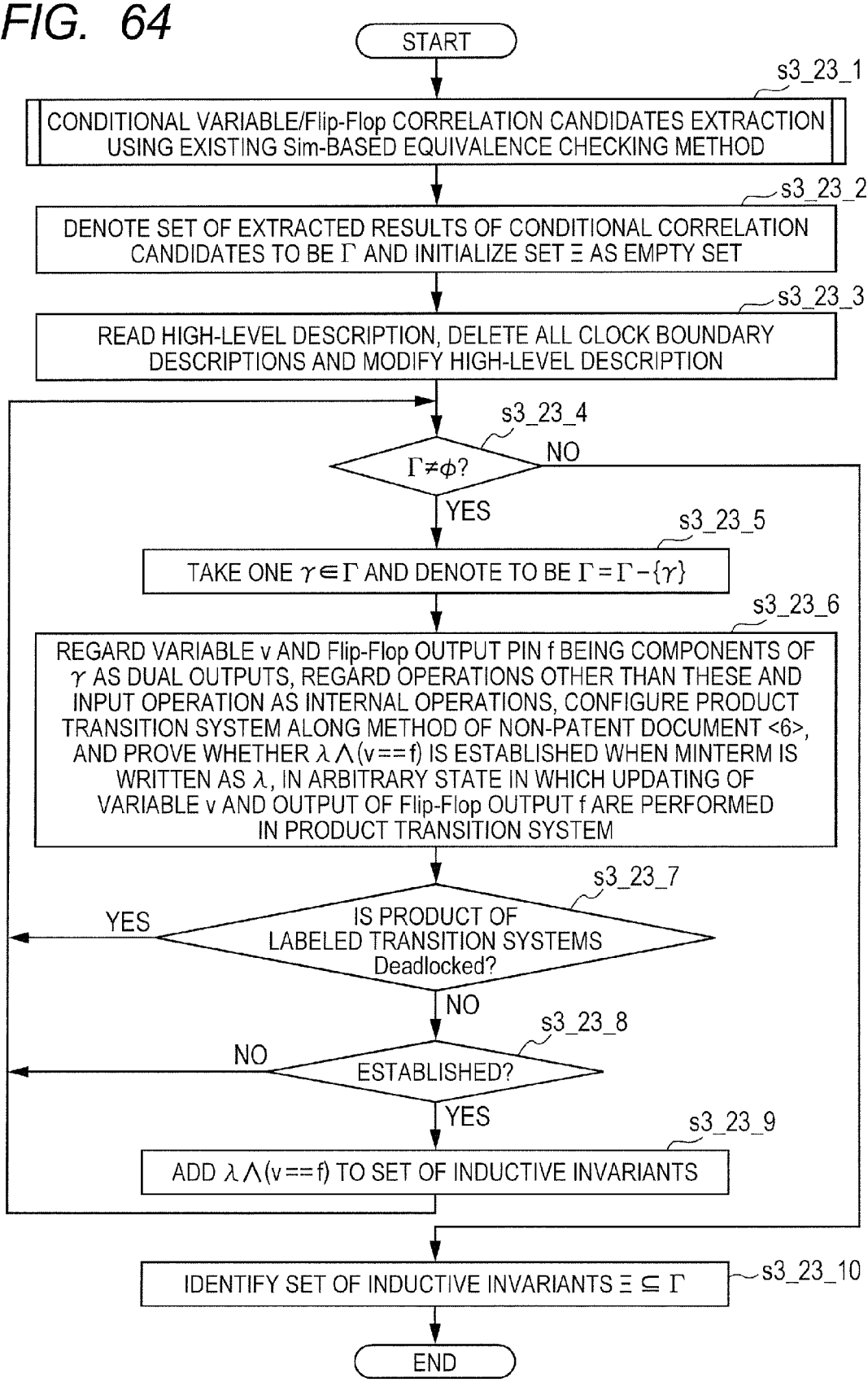
FIG. 64 is a flowchart illustrating the details of an extraction process of inductive invariants targeted for an input/output throughput ratio non-constant RTL of s3-23 in the correspondence-FF extraction process of FIG. 53.

The details of the process for the "extraction of inductive invariants targeted for the input/output throughput ratio non-constant RTL" of s3-23 in correspondence-FF extraction process of FIG. 53 are illustrated in FIG. 64. The contents of processing in respective steps are as follows:

In s3_23_1, the "conditional variable/FF correlation candidate extraction using the existing Sim-based equivalence checking method" is performed, and the process proceeds to s3_23_2.

In s3_23_2, a set of results of extractions of conditional correlation candidates is denoted to be $\Gamma$, and a set $\Xi$ is initialized as an empty set. Then, the process proceeds to s3_23_3.

In s3_23_3, a high-level description is read and clock boundary descriptions are all deleted, whereby the high-level description is modified. Then, the process proceeds to s3_23_4.

In s3_23_4, it is determined whether the set $\Gamma$ is empty. If it is determined to be empty, then the process proceeds to s3_23_10. If it is determined not to be empty, then the process proceeds to s3_23_5.

In s3_23_5, one $\gamma \in \Gamma$ is taken and $\Gamma$ is set to be $\Gamma = \Gamma - \{\gamma\}$. Then, the process proceeds to s3_23_6.

In s3_23_6, a variable v and an FF output pin f being components of $\gamma$ are regarded as dual outputs. These and operations or behaviors other than an input operation are regarded as internal operations. Each product transition system is configured along the method described in the document "Daniel Kroening and Edmund Clarke, "Checking Consistency of C and Verilog Using Predicate Abstraction and Induction," In Proc. of ICCAD, pp. 66-72, 2004.". When the minterm corresponding to these v and f is taken as $\lambda$ in an arbitrary state in which the updating of the variable v and the output of the FF output f in the product transition system are performed, it is proved whether $\lambda \wedge (v==f)$ is established. Then, the process proceeds to s3_23_7.

In s3_23_7, it is checked whether each of product labeled transition systems configured in accordance with the method described in the document "Daniel Kroening and Edmund Clarke, "Checking Consistency of C and Verilog Using Predicate Abstraction and Induction," In Proc. of ICCAD, pp. 66-72, 2004." is Deadlocked. If it is found to be Deadlocked, then the process proceeds to s3_23_4. If it is found not to be so, then the process proceeds to s3_23_8.

In s3_23_8, it is determined whether $\lambda \wedge (v==f)$ is established. If it is determined that it has been established, then the process proceeds to s3_23_9. If it is not so, then the process proceeds to s3_23_4.

In s3_23_9, each pair of v and f is added to a set $\Xi$ of conditional correlations, and the process proceeds to s3_23_10.

In s3_23_10, the set $\Xi$ of the conditional correlations, which is a subset of $\Gamma$, is identified, and the process is terminated.

<<Detailed Process of s3-24 in Correspondence-FF Extraction Process_FIG. 53>>

Figure 65:
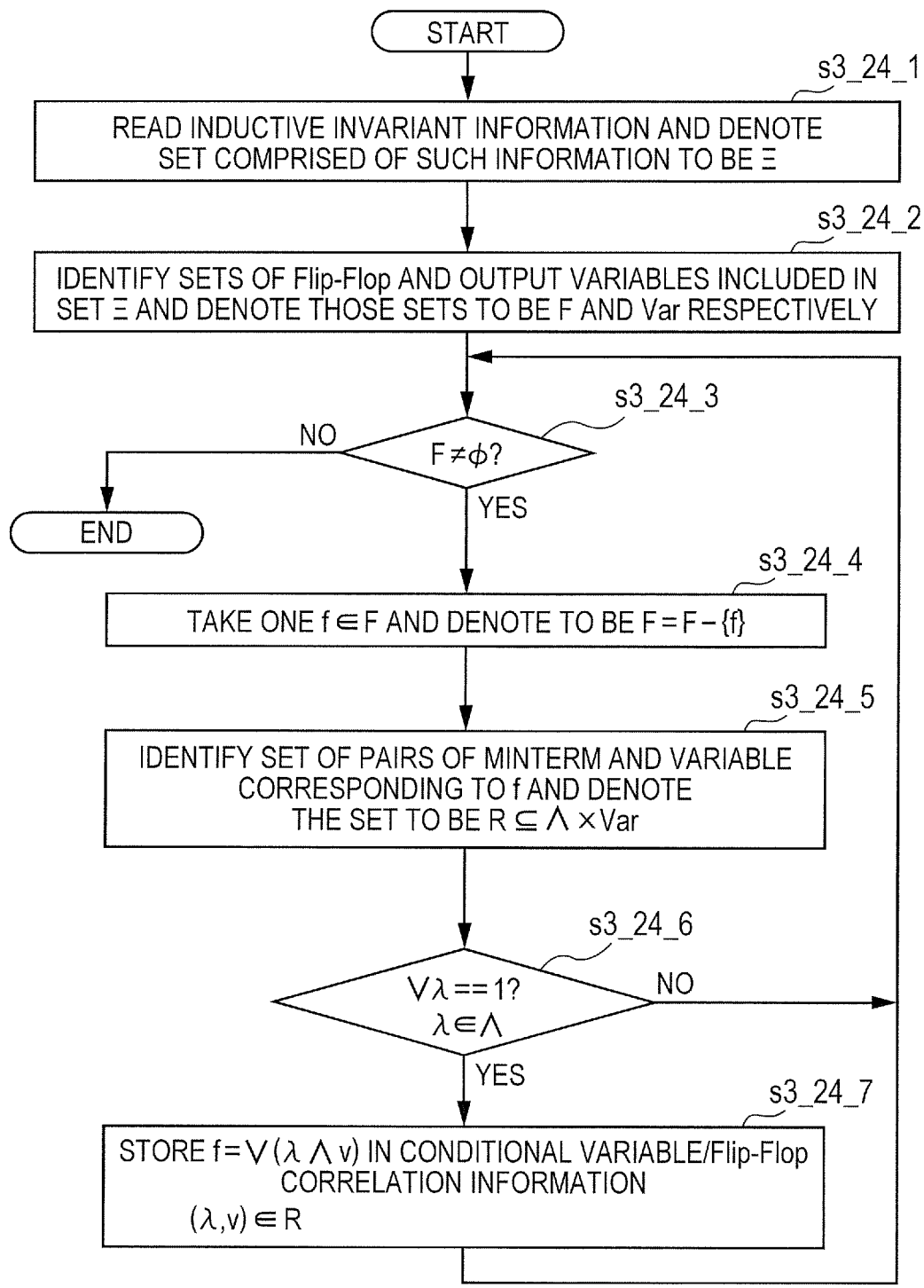
FIG. 65 is a flowchart illustrating the details of an extraction/storage process of conditional variable/FF correlation information of s3-24 in the correspondence-FF extraction process of FIG. 53.

The details of the process for the "extraction/storage of conditional variable/FF correlation information" of s3-24 in the correspondence-FF extraction process of FIG. 53 are illustrated in FIG. 65. The contents of processing in respective steps are as follows:

In s3_24_1, inductive invariant information is read, and a set formed by the information is denoted to be $\Xi$. Then, the process proceeds to s3_24_2.

In s3_24_2, sets of FFs and output variables included in the set $\Xi$ are identified, and their sets are denoted to be F and Var respectively. Then, the process proceeds to s3_24_3.

In s3_24_3, it is determined whether the set F is empty. If it is determined to be empty, then the process is terminated. If it is determined not to be empty, then the process proceeds to s3_24_4.

In s3_24_4, one f$\in$F is taken and F is set to be F=F-{f}. Then, the process proceeds to s3_24_5.

In s3_24_5, a set of each group or pair of a minterm and a variable corresponding to f is identified, and the set is denoted to be R$\subseteq \Lambda \times$Var. Then, the process proceeds to s3_24_6. Here, $\Lambda$ is a set formed by minterms, and Var is a set formed by variables.

In s3_24_6, minterms that appear in each expression of inductive invariants including FF f are all extracted. It is determined whether a logical sum of all of those minterms is true. If it is determined to be true, then the process proceeds to s3_24_7. If it is determined not to be so, then the process proceeds to s3_24_3.

In s3_24_7, an expression of (1) shown in the following manner with respect to FF f is configured and stored in the conditional variable/FF correlation information. Then, the process proceeds to s3_24_3.

$$f = \bigcup_{(\lambda,v) \in R} (\lambda \wedge v) \qquad (1)$$

<<Reset Elongation Cycle Extraction Process>>

A reset elongation cycle extraction process s4 will be explained in detail.

The reset elongation cycle extraction process s4 performs the following processes with the synthesis resultant RTL, loop-existing variable one-to-one correlation information and loop-existing variable non one-to-one correlation information, and input/output cycle information as inputs.

Firstly, it is analyzed whether a feedback loop formed by FF f associated with loop-existing variables in each RTL description exists. The identification of the feedback loop is performed by constructing a graph G with relationships of connections via combinational logic between FFs being taken as directed edges with FFs as vertices, from a net list obtained by logically synthesizing the RTL descriptions, performing a division to strongly connected components and denoting a set of the resulting strongly connected components to be SCC. The present analysis is performed by determining whether each strongly connected component includes FF f.

Secondly, when the feedback loop exists judging from the analysis result, a minimum cycle number required to perform value propagation to all FFs in the feedback loop including FF f is calculated. The shortest path to the vertex from f other than f in each strongly connected component including FF f is determined by the Dijkstra's algorithm. The number of vertices being through the shortest path is taken as distance to each vertex. The maximum value therein is identified as the minimum cycle number required to perform the value propagation to all FFs in the feedback loop including FF f. The value propagation is made possible to each vertex in the cycle number equivalent to this value. It is self-evident from the way of configuration that this results in the minimum cycle number required to perform the value propagation to all FFs in the feedback loop including FF f.

Thirdly, they are performed on all FFs. The maximum value is determined from within the resulting cycle numbers. When the Pipeline synthesis RTL is not taken, the maximum value is stored in its corresponding reset cycle period information. When the Pipeline synthesis RTL is taken, the large one of the maximum value and the value of a Latency cycle −1 as a Pipeline circuit is stored in the reset cycle period information.

Fourthly, when the feedback loop is not configured with RTL, correlation information included in variables are respectively stored in loop-free variable one-to-one correlation information and loop-free variable non one-to-one correlation information. These variables are deleted from the loop-existing variable one-to-one correlation information and the loop-existing variable non one-to-one correlation information.

Figure 66:
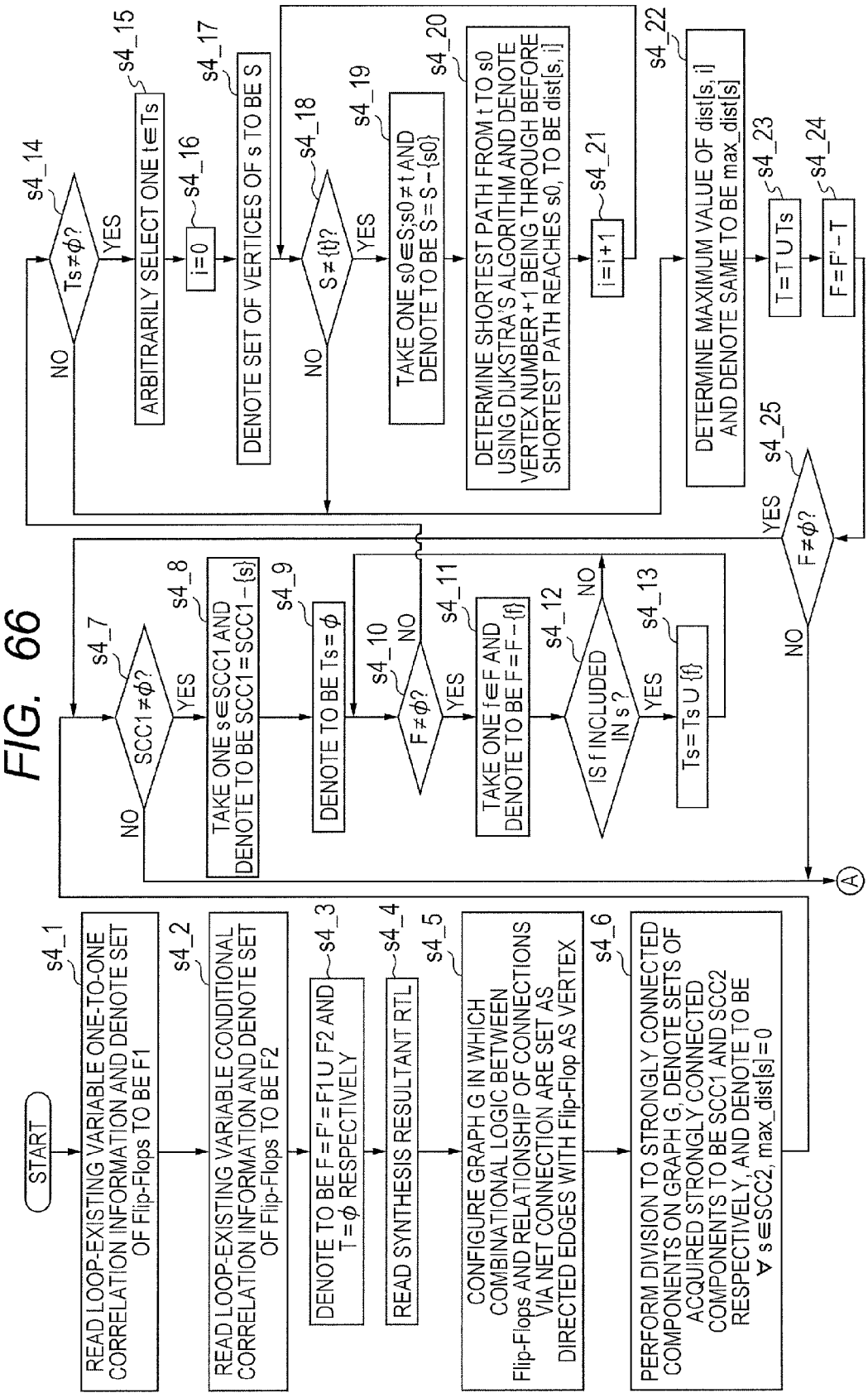
FIG. 66 is a flowchart illustrating the details of the first half of a reset elongation cycle extraction process.

The details of the reset elongation cycle extraction process are illustrated in FIGS. 66 and 67. The contents of processing in respective steps are as follows:

In s4_1, loop-existing variable one-to-one correlation information is read and thereby a set of FFs is identified. The set is denoted to be F1, and the process proceeds to s4_2.

In s4_2, loop-existing variable conditional correlation information is read and thereby a set of FFs is identified. The set thereof is denoted to be F2, and the process proceeds to s4_3.

In s4_3, the sets F and F' are initialized to F=F'=F1∪F2. A set T is initialized to T=φ. Then, the process proceeds to s4_4.

In s4_4, a synthesis resultant RTL is read, and the process proceeds to s4_5.

In s4_5, a graph G is configured in which relationships of connections via combinational logic between FFs and net connections are set as directed edges with each FF as a vertex. Then, the process proceeds to s4_6.

In s4_6, a division to strongly connected components is performed on the graph G, and sets of the resulting strongly connected components are respectively denoted to be SCC1 and SCC2. All s∈SCC2 are initialized to max_dist[s]=0. Then, the process proceeds to s4_7. Here, SCC1 and SCC2 are equal to each other as sets. That is, SCC1=SCC2.

In s4_7, it is determined whether the set SCC1 is empty. If it is determined to be empty, then the process proceeds to s4_26. If it is determined not to be empty, then the process proceeds to s4_8.

In s4_8, one s∈SCC1 is taken and SCC1 is set to be SCC1=SCC1−{s}. Then, the process proceeds to s4_9.

In s4_9, a set Ts is initialized to Ts=φ (empty set), and the process proceeds to s4_10.

In s4_10, it is determined whether the set F is empty. If it is determined to be empty, then the process proceeds to s4_14. If it is determined not to be empty, then the process proceeds to s4_11.

In s4_11, one f∈F is taken and F is set to be F=F−{f}. Then, the process proceeds to s4_12.

In s4_12, it is determined whether f is included as the vertex of a directed graph s. If it is determined to be included therein, then the process proceeds to s4_13. If it is determined not to be included therein, then the process proceeds to s4_10.

In s4_13, Ts=Ts∪{f}, that is, f is added to the set Ts, and the process proceeds to s4_10.

In s4_14, it is determined whether the set Ts is empty. If it is determined to be empty, then the process proceeds to s4_22. If it is determined not to be empty, then the process proceeds to s4_15.

In s4_15, one t∈Ts is arbitrarily selected, and the process proceeds to s4_16.

In s4_16, a variable i is initialized to 0, and the process proceeds to s4_17.

In s4_17, a set of the vertices of the directed graph is denoted to be S, and the process proceeds to s4_18.

In s4_18, it is determined whether the set S includes only {t}. If it is determined that the set S includes only {t}, then the process proceeds to s4_22. If it is not determined that the set S includes only {t}, then the process proceeds to s4_19.

In s4_19, one vertex s0∈S different from t is selected and S is set to be S=S−{s0}. Then, the process proceeds to s4_20.

In s4_20, the shortest path from t to s0 is determined using the Dijkstra's algorithm. The number of vertices+1, which are through before the shortest path reaches s0, is denoted to be dist[s,i]. Then, the process proceeds to s4_21.

In s4_21, i=i+1 is performed, and the process proceeds to s4_18.

In s4_22, the maximum value of dist[s,j](1≤j≤i) is determined and denoted to be max_dis[s]. Then, the process proceeds to s4_23.

In s4_23, T=T∪Ts, that is, the set T and the set Ts are substituted in the set T, and the process proceeds to s4_24.

In s4_24, F=F'−T, that is, a differential set between the set F' and the set T is substituted in the set F, and the process proceeds to s4_25.

In S4_25, it is determined whether the set F is empty. If it is determined to be empty, then the process proceeds to s4_26. If it is determined not to be empty, then the process proceeds to s4_7.

In s4_26, the maximum value max_dist of max_dixt[s] is determined with respect to s∈SCC2, and the process proceeds to s4_27.

In s4_27, input/output cycle information is read, and the process proceeds to s4_28.

In s4_28, it is determined whether a Pipeline synthesis RTL is taken. If it is determined that the Pipeline synthesis RTL is taken, the process proceeds to s4_29. If it is determined that the Pipeline synthesis RTL is not taken, then the process proceeds to s4_30.

In s4_29, max_dist is stored in its corresponding reset cycle period information, and the process proceeds to s4_32.

In s4_30, a determination of max_dist>latency cycle number−1 is made. If the result of its determination is true, then the process proceeds to s4_29. If the result thereof is false, then the process proceeds to s4_31.

In s4_31, the latency cycle number−1 is stored in the reset cycle period information, and the process proceeds to s4_32.

In s4_32, correlation information with each FF included in the set F is identified from the corresponding loop-existing variable conditional correlation information. This is stored in the corresponding loop-free variable conditional correlation information and deleted from the loop-existing variable conditional correlation information. Then, the process proceeds to s4_28.

In s4_33, correlation information with each FF included in the set F is identified from the corresponding loop-existing variable one-to-one correlation information. It is added to the corresponding loop-free variable one-to-one correlation information and deleted from the loop-existing variable one-to-one correlation information. Then, the process is terminated.

<<Verification Script Alteration Process_Process Outline>>

An outline of the verification script alternation process s5 will first be described.

The verification script alternation process performs the generation and alteration of reset cycle period information, input/output cycle information and variable/FF correspondence information on a model script with a high-level description, a synthesis resultant RTL, reset cycle period information, input/output cycle information, variable/FF correspondence information and a model verification script outputted by a behavioral synthesis tool being taken as inputs. Here, the process of generation and alteration of script information targeted for "verification script command examples" will be described in detail by way of example.

In the verification script alteration process, the classification of synthesis resultant RTLs from synthesis resultant RTL structure information of the read input/output cycle information is performed. The following script alteration processes are performed as to an RTL structure adaptable in "verification script command examples" to be shown next. The first is a script alteration process for an input/output correspondence setting. This is based on the premise that the relation of correspondence of respective input/output signals between the high-level description/synthesis resultant RTL has been described in a model verification script. The second is a one-to-one correspondence variable/FF-based cycle information extraction process. The third is a script alteration process for a reset cycle period setting. The fourth is a script generation process for variable/FF correspondence settings.

During the execution of the above generation and alteration process, priorities are assigned to script information to generate three verification scripts shown below. The first verification script is a script in which the addition of an input/output correspondence setting and the alteration of a reset cycle period setting are performed on a model script. The second verification script is a script in which a loop-existing variable one-to-one correspondence setting and a loop-existing variable non one-to-one correspondence setting are added to the first verification script. The third verification script is a script in which a loop-free variable one-to-one correspondence setting and a loop-free variable non one-to-one correspondence setting are added to the second verification script.

As examples of commands executed in the verification script alteration process, verification script commands shown below are used.

(1) Reset cycle period setting command: reset

The reset cycle period setting command specifies or designates an input port to be reset to a high-level description or an RTL, and specifies a reset cycle period and an input value to be input during that period.

The description format of this command and a command description example are shown in FIG. 68.

(2) Throughput cycle setting command: throughput

The Throughput cycle setting command specifies Throughput of the entire circuit to the high-level description or RTL. The description format of the command, and a command description example are shown in FIG. 69.

(3) Input port correspondence setting command: input_map

The input port correspondence setting command is a command which specifies a corresponding input port between the high-level description and the RTL. The input port specified by the present command between the high-level description and the RTL is inputted with an input value of the same pattern. A cycle number (Latency cycle value) and an input value change periodic cycle value from a reset process to a first change in input value can be specified to the high-level description and the RTL respectively.

The description format of the command, and a command description example are shown in FIG. 70.

(4) Output port correspondence setting command: output_map

The output port correspondence setting command specifies a corresponding output port between the high-level description and the RTL. A comparison operation is performed on the output port specified by the present command between the high-level description and the RTL. A cycle number (Latency cycle value) and an output value comparison periodic cycle value from a reset process to a first output value comparison can be specified to the high-level description and the RTL respectively.

The description format of the command, and a command description example are shown in FIG. 71.

(5) Variable/FF one-to-one correspondence setting command: flop_map

The variable/FF one-to-one correspondence setting command specifies variables/FFs put in a one-to-one correspondence between a high-level description and an RTL. A comparison operation is performed on each variable in the high-level description and each FF in the RTL, both specified by the present command. A cycle number (Latency cycle value) and a value comparison periodic cycle value from a reset process to a first value comparison can be specified to the high-level description and the RTL respectively.

The description format of the command, and a command description example are shown in FIG. 72.

(6) Variable/FF non one-to-one correspondence setting command: conditional_flop_map The variable/FF non one-to-one correspondence setting command specifies variables/FFs associated with conditions between a high-level description and an RTL. A comparison operation is performed on each variable in the high-level description and each FF in the RTL, both specified by the present command. The present embodiment images a case where the variables in the high-level description are associated with the FFs in the RTL in plural form. Conditions (assignment execution conditions) for corresponding to the FFs in the RTL are also specified together with respect to the respective variables.

The description format of the command, and a command description example are shown in FIG. 73.

<<Details of Verification Script Alteration Process s5>>

The verification script alteration process s5 will be described in detail.

For the verification script alteration process s5, the following classification is performed with respect to an RTL description being a behavioral synthesis result in term of a structure thereof. An input/output throughput ratio constant classification or an input/output throughput ratio non-constant classification is performed on a cycle accurate synthesis RTL. A classification in which the number of appearances of the full input and output is 1 or a classification (including an input/output at which the number of appearances thereof is greater than or equal to 2) other than the above is performed on a Pipeline synthesis RTL. An input/output throughput ratio constant classification or an input/output throughput ratio non-constant classification is performed on each RTL other than the above.

Those adaptable to the above classifications in the verification script command example are as follows: The input/output throughput ratio constancy and the input/output throughput ratio non-constancy are adaptable to the cycle accurate synthesis RTL. The Pipeline synthesis RTL is capable of adapting to the case where the number of appearances of the full input and output is 1. The input/output throughput ratio constancy is adaptable to each RTL other than the above.

Figure 74:
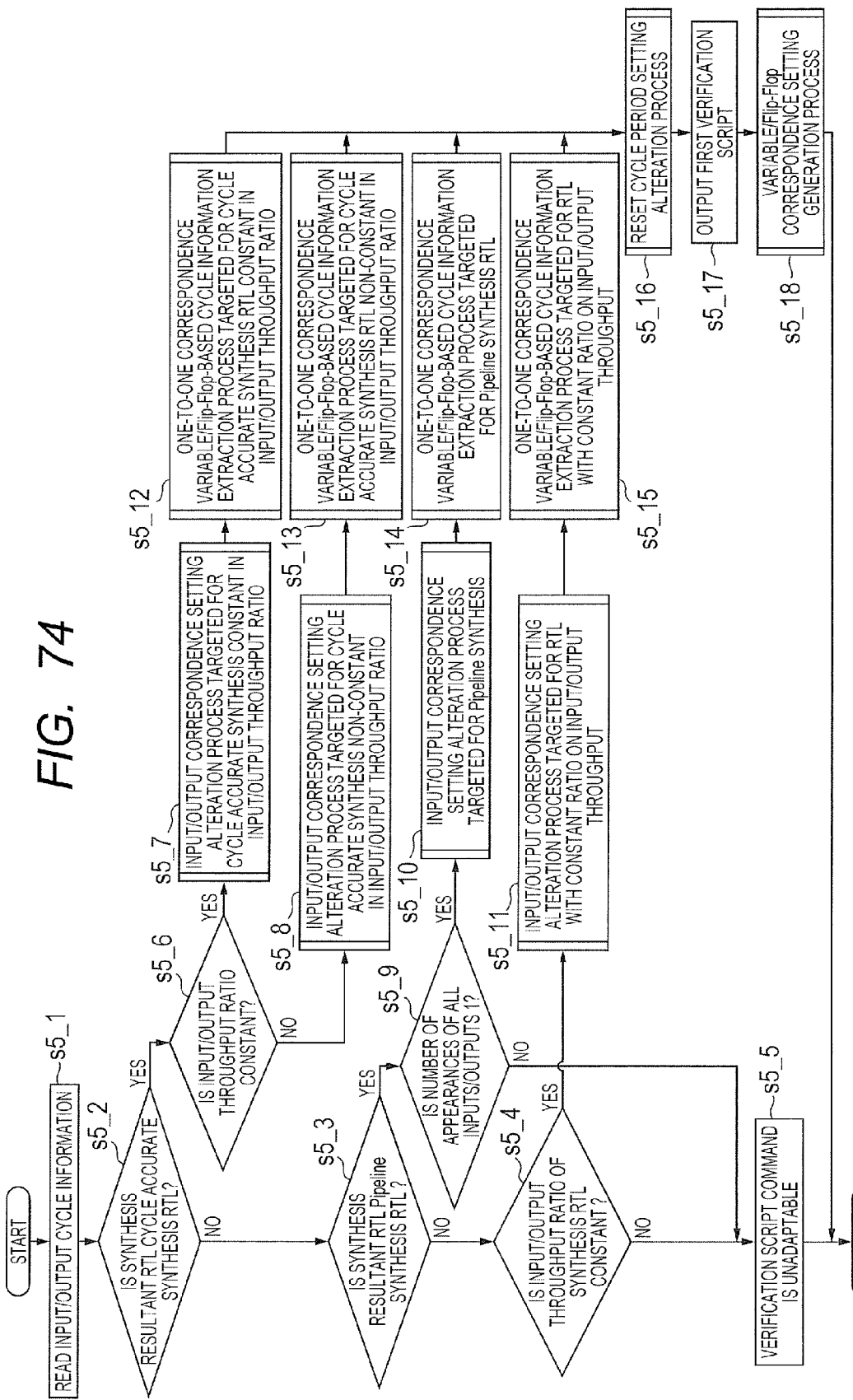
FIG. 74 is a flowchart showing the whole of a verification script alteration process s5.

An entire process flow for the verification script alteration process s5 is illustrated in FIG. 74. The contents of processing in respective steps are as follows:

In s5_1, input/output cycle information is read, and the process proceeds to s5_2.

In s5_2, reference is made to circuit type information included in the input/output cycle information. It is determined whether a synthesis resultant RTL is a cycle accurate synthesis. If it is determined to be affirmative, then the process proceeds to s5_6. If it is not so, then the process proceeds to s5_3.

In s5_3, reference is made to the circuit type information included in the input/output cycle information. It is determined whether the synthesis resultant RTL is a Pipeline synthesis. If it is determined to be the Pipeline synthesis, then the process proceeds to s5_9. If it is not so, then the process proceeds to s5_4.

In s5_4, reference is made to the circuit type information included in the input/output cycle information. It is determined whether the synthesis resultant RTL is an input/output throughput ratio constant RTL. If it is determined to be affirmative, then the process proceeds to s5_11. If it is not so, then the process proceeds to s5_5.

In s5_5, the content of "unadaptable" is outputted as a standard because the verification script command example used in the present embodiment takes an unadaptable structure, and the process is terminated.

In s5_6, reference is made to both of Throughput information common to the full input, included in the input/output cycle information and Throughput information common to the full output, included therein. It is determined whether both are constant together. If it is determined that both are constant, then the process proceeds to s5_7. If it is determined that both are not constant, then the process proceeds to s5_8.

In s5_7, an "input/output correspondence setting alteration process targeted for a cycle accurate synthesis RTL constant in input/output throughput ratio" is performed, and the process proceeds to s5_12.

In s5_8, an "input/output correspondence setting alteration process targeted for a cycle accurate synthesis RTL non-constant in input/output throughput ratio" is performed, and the process proceeds to s5_13.

In s5_9, reference is made to information on the number of appearances of respective inputs/outputs, included in the input/output cycle information. It is determined whether the number of appearances of all inputs/outputs is 1. If it is determined to be affirmative, then the process proceeds to s5_10. If it is determined to be negative, then the process proceeds to s5_5.

In s5_10, an "input/output correspondence setting alteration process targeted for a Pipeline synthesis RTL" is performed, and the process proceeds to s5_14.

In s5_11, an "input/output correspondence setting alteration process targeted for an RTL with a constant ratio on input/output throughput" is performed, and the process proceeds to s5_15.

In s5_12, a "one-to-one correspondence variable/FF-based cycle information extraction process targeted for a cycle accurate synthesis RTL constant in input/output throughput ratio" is performed, and the process proceeds to s5_16.

In s5_13, a "one-to-one correspondence variable/FF-based cycle information extraction process targeted for a cycle accurate synthesis RTL non-constant in input/output throughput ratio" is performed, and the process proceeds to s5_16.

In s5_14, a "one-to-one correspondence variable/FF-based cycle information extraction process targeted for the Pipeline synthesis RTL" is performed, and the process proceeds to s5_16.

In s5_15, a "one-to-one correspondence variable/FF-based cycle information extraction process targeted for the input/output throughput ratio constant RTL" is performed, and the process proceeds to s5_16.

In s5_16, a "reset cycle period setting alteration process" is performed, and the process proceeds to s5_17.

In s5_17, a script in which the addition of an input/output correspondence setting is made to a model script and a reset cycle period setting is altered with respect therewith, is outputted as a first script, and process proceeds to s5_18.

In s5_18, a "variable/FF correspondence setting generation process" is performed, and the process is terminated.

Steps s5_7, s5_8, s5_10, s5_11, s5_12, s5_13, s5_14, s5_15, s5_16 and s5_18 with function calls in the above Steps will be described below in detail.

<<s5_7 in Verification Script Alteration Process>>

In the input/output correspondence setting alteration process s5_7 targeted for the cycle accurate synthesis constant in input/output throughput ratio, input/output cycle information and a model verification script are used in a high-level description and a cycle accurate synthesis RTL constant in input/output throughput ratio to thereby alter the following.

Targets for alteration include a correspondence setting command input_map for each input port, a correspondence setting command output_map for each output port, and a Throughput cycle setting command throughput for each of the high-level description/RTL.

Specifically, the following are set to the input_map command for each input port. That is, they include an input port name, an initial Throughput value (–lat) and a Throughput value (–freq) in a high-level description, and an input port name, an initial Throughput value (–lat) and a Throughput value (–freq) for its corresponding RTL. Incidentally, since the cycle accurate synthesis is taken, the initial Throughput value and the Throughput value for each input port become the same values as the high-level description in the RTL.

The following are set to the output_map command for each output port. That is, they include an output port name, an initial Throughput value (–lat) and a Throughput value (–freq) in a high-level description, and further include an output port name, an initial Throughput value (–lat) and a Throughput value (–freq) for its corresponding RTL. Incidentally, because of the cycle accurate synthesis, the initial Throughput value and the Throughput value for each output port become the same values as the high-level description in the RTL.

The following are set to the throughput commands for the high-level description/RTL. That is, a Throughput value in the high-level description is the maximum value of Throughput values of the full input/output in the high-level description. A Throughput value in the RTL is the maximum value of Throughput values of the full input/output in the RTL. Incidentally, since the cycle accurate synthesis constant in input/output throughput ratio is taken, the Throughput value of the entire circuit becomes the same value as the high-level description in the RTL.

<<s5_8 in the Verification Script Alteration Process>>

In the input/output correspondence setting alteration process s5_8 targeted for the cycle accurate synthesis non-constant in input/output throughput ratio, input/output cycle information and a model verification script are used in the high-level description and the cycle accurate synthesis RTL non-constant in input/output throughput ratio to alter the following. Targets for alteration include a correspondence setting command input_map for each input port, a correspondence setting command output_map for each output port and a Throughput cycle setting command throughput for each of the high-level description/RTL.

Specifically, the following are set to the input_map command for each input port. That is, they include an input port name, an initial Throughput value (–lat) and a Throughput value (–freq) in a high-level description, and an input port name, an initial Throughput value (–lat) and a Throughput value (–freq) for its corresponding RTL. Incidentally, since the cycle accurate synthesis non-constant in input/output throughput ratio is taken, each input port is denoted to change for each cycle, and the initial Throughput value and the Throughput value for each input port are denoted to be 1 in both the high-level description/RTL.

The following are set to the output_map command for each output port. That is, they include an output port name, an initial Throughput value (–lat) and a Throughput value (–freq) in a high-level description, and an output port name, an initial Throughput value (–lat) and a Throughput value (–freq) for its corresponding RTL. Incidentally, since the cycle accurate synthesis non-constant in input/output throughput ratio is taken, each output port is denoted to change for each cycle, and the initial Throughput value and Throughput value for each output port are denoted to be 1 in both the high-level description/RTL.

The Throughput value of the entire circuit is set to each of the throughput commands for the high-level description/RTL. Incidentally, since the cycle accurate synthesis non-constant in input/output throughput ratio is taken, the full input and output are denoted to change for each cycle, and the Throughput value of the entire circuit in both the high-level description/RTL is denoted to be 1.

<<s5_10 in Verification Script Alteration Process>>

In the input/output correspondence setting alteration process s5_10 targeted for the Pipeline synthesis, input/output cycle information and a model verification script are used in the high-level description and Pipeline synthesis RTL to alter the following. Targets for alteration include a correspondence setting command input_map for each input port, a correspondence setting command output_map for each output port, and a Throughput cycle setting command throughput for each of the high-level description/RTL.

Specifically, the following are set to the input_map command for each input port. That is, they include an input port name, an initial Throughput value (–lat) and Throughput value (–freq) in a high-level description, and an input port name, a Latency value (–lat) and a Throughput value (–freq) for its corresponding RTL.

The following are set to the output_map command for each output port. That is, they include an output port name, an initial Throughput value (–lat) and a Throughput value (–freq) in a high-level description, and an output port name, a Latency value (–lat) and a Throughput value (–freq) for its corresponding RTL.

The following are set to the throughput command for each of the high-level description/RTL. That is, the maximum value of the Throughput values of the full input/output in the high-level description is set to the Throughput value in the high-level description. A Throughput value common to the full output is set to the Throughput value in the RTL.

<<s5_11 in Verification Script Alteration Process>>

In the input/output correspondence setting alteration process s5_11 targeted for the input/output throughput ratio constant RTL, input/output cycle information and a model verification script are used in the high-level description and the input/output throughput ratio constant RTL to alter the following. Targets for alteration include a correspondence setting command input_map for each input port, a correspondence setting command output_map for each output port, and a Throughput cycle setting command throughput for each of the high-level description/RTL.

Specifically, the following are set to the input_map command for each input port. That is, they include an input port name, an initial Throughput value (–lat) and a Throughput value (–freq) in a high-level description, and an input port name, an initial Throughput value (–lat) and a Throughput value (–freq) for its corresponding RTL.

The following are set to the output_map command for each output port. That is, they include an output port name, an initial Throughput value (–lat) and a Throughput value (–freq) in a high-level description, and an input port name, an initial Throughput value (–lat) and a Throughput value (–freq) for its corresponding RTL.

The following are set to the throughput command for each of the high-level description/RTL. That is, the maximum value of the Throughput values of the full input/output in the high-level description is set to the Throughput value in the high-level description. The maximum value of the Throughput values of the full input/output for the RTL is set to the Throughput value for the RTL.

<<s5_12 in Verification Script Alteration Process>>

In the one-to-one correspondence variable/FF-based cycle information extraction process s5_12 targeted for the cycle accurate synthesis RTL constant in input/output throughput ratio, loop-existing variable one-to-one correlation information, loop-free variable one-to-one correlation information, a high-level description, and a synthesis resultant RTL description are used. A document "Alfred Koelbl and Carl Pixley, "Constructing Efficient Formal Models from High-Level Descriptions Using Symbolic Simulation," International Journal of Parallel Programming 33(6), pp. 645-666, 2005." that is a symbolic Sim method targeted for a high-level description, a document "Alfred Koelbl, James Kukula, and Robert Damiano, "Symbolic RTL simulation," In Proc. of DAC, 2001" that is a symbolic Sim method targeted for an RTL description, and a random Sim are applied thereto, whereby the following information are extracted with respect to each variable/FF put in a one-to-one correspondence. Targets for extraction include a Latency value (cycle number in which a first value change occurs as viewed from a reset process) of each variable/FF, and a Throughput value (periodic cycle in which a value change occurs) of each variable/FF.

The Latency value is extracted by the following method. That is, a cycle number from a reset process of each variable/FF to the occurrence of a first change in symbolic value is extracted from a symbolic Sim result as the Latency value.

The Throughput value is extracted by the following method. That is, cycle intervals of signal value changes in respective variables/FFs are identified from a random Sim result to determine a minimum value of signal value change cycles. It is determined whether a cycle interval for all signal changes that appear in a signal change sequence is an integral multiple of the minimum value. An accurate cycle interval can also be extracted by applying a symbolic Sim. Since there is however a possibility that its information cannot be extracted in real time, cycle interval information about a value change in each variable/FF is extracted by a random Sim in the present embodiment. When the cycle interval for all signal changes is the integral multiple of the minimum value, the minimum value is extracted as the Throughput value. When the cycle interval is not the integral multiple of the minimum value, the Throughput value is denoted to be 1.

After the extraction of the above cycle information about each variable/FF, the extracted cycle information is added to loop-existing variable one-to-one correlation information or loop-free variable one-to-one correlation information with each variable/FF being stored therein.

<<s5_13 in Verification Script Alteration Process>>

In the one-to-one correspondence variable/FF-based cycle information extraction process s5_13 targeted for the cycle accurate synthesis RTL non-constant in input/output throughput ratio, loop-existing variable one-to-one correlation information and loop-free variable one-to-one correlation information are used and thereby the following information are extracted with respect to variables/FFs placed in a one-to-one correspondence. The extracted information include a Latency value (cycle number from a reset process to the occurrence of a first value change) of each variable/FF, and a Throughput value (periodic cycle in which a value change occurs) of each variable/FF.

The Latency value is extracted by the following method. That is, the Latency value of each variable/FF is denoted to be 1.

The Throughput value is extracted by the following method. That is, the Throughput value of each variable/FF is denoted to be 1.

After the extraction of the above cycle information of each variable/FF, the extracted cycle information is added to loop-existing variable one-to-one correlation information or loop-free variable one-to-one correlation information with each variable/FF being stored therein.

<<s5_14 in Verification Script Alteration Process>>

In the one-to-one correspondence variable/FF-based cycle information extraction process s5_14 targeted for the Pipeline synthesis RTL, loop-existing variable one-to-one correlation information, loop-free variable one-to-one correlation information, a high-level description and a synthesis resultant RTL description are used. The non-patent document "Alfred Koelbl and Carl Pixley, "Constructing Efficient Formal Models from High-Level Descriptions Using Symbolic Simulation," International Journal of Parallel Programming 33(6), pp. 645-666, 2005." that is of a symbolic Sim method targeted for a high-level description, the document "Alfred Koelbl, James Kukula, and Robert Damiano, "Symbolic RTL simulation," In Proc. of DAC, 2001" that is of a symbolic Sim method targeted for an RTL description, and a random Sim are applied thereto, whereby the following information are extracted with respect to each variable/FF placed in a one-to-one correspondence. The extracted information include a Latency value (cycle number in which a first value change occurs as viewed from a reset process) of each variable/FF, and a Throughput value (periodic cycle in which a value change occurs) of each variable/FF.

The Latency value is extracted by the following method. That is, a cycle number from a reset process of each variable/FF to the occurrence of a first change in symbolic value is extracted from a symbolic Sim result as the Latency value.

The Throughput value is extracted by the following method. That is, cycle intervals of signal value changes in respective variables are identified from a random Sim result to determine a minimum value of signal value change cycles. The minimum value is extracted as a Throughput value of each variable. Although applying a symbolic Sim enables even the extraction of an accurate cycle interval, there is a possibility that its information cannot be extracted in real time. Therefore, in the present embodiment, cycle interval information about a value change in each variable is extracted by a random Sim. A Throughput value for the full output in the Pipeline synthesis RTL is extracted as a Throughput value of each FF.

After the extraction of the above cycle information about each variable/FF, the extracted cycle information is added to loop-existing variable one-to-one correlation information or loop-free variable one-to-one correlation information with each variable/FF being stored therein.

<<s5_15 in Verification Script Alteration Process>>

In the one-to-one correspondence variable/FF-based cycle information extraction process s5_15 targeted for the input/output throughput ratio constant RTL, loop-existing variable one-to-one correlation information, loop-free variable one-to-one correlation information, a high-level description and a synthesis resultant RTL description are used. The document "Alfred Koelbl and Carl Pixley, "Constructing Efficient Formal Models from High-Level Descriptions Using Symbolic Simulation," International Journal of Parallel Programming 33(6), pp. 645-666, 2005." that is of a symbolic Sim method targeted for a high-level description, the non-patent document "Alfred Koelbl, James Kukula, and Robert Damiano, "Symbolic RTL simulation," In Proc. of DAC, 2001" that is of a symbolic Sim method targeted for an RTL description, and a random Sim are applied thereto, whereby the following information are extracted with respect to each variable/FF placed in a one-to-one correspondence. The extracted information include a Latency value (cycle number in which a first value change occurs as viewed from a reset process) of each variable/FF, and a Throughput value (periodic cycle in which a value change occurs) of each variable/FF.

The Latency value is extracted by the following method. That is, a cycle number from a reset process of each variable/FF to the occurrence of a first change in symbolic value is extracted from a symbolic Sim result as the Latency value.

The Throughput value is extracted by the following method. That is, cycle intervals of signal value changes in respective variables/FFs are identified from a random Sim result to determine a minimum value of signal value change cycles. It is determined whether a cycle interval for all signal changes that appear in a signal change sequence is an integral multiple of the minimum value. An accurate cycle interval can also be extracted by applying a symbolic Sim. However, since there is a possibility that its information cannot be extracted in real time, cycle interval information about value changes in each variable/FF are extracted by a random Sim in the present embodiment. When the cycle intervals for all signal changes relative to each variable and FF put in a one-to-one correspondence are both an integral multiple of the minimum value, the minimum values of the cycle intervals for the signal value changes relative to both each variable and FF are extracted as their corresponding Throughput values. On the other hand, when the cycle interval for all signal value changes relative to either of each variable/FF placed in the one-to-one correspondence is not the integral multiple of the minimum value, the values set to the respective throughput commands for the high-level description/RTL, generated in the above "input/output correspondence setting generation process targeted for the input/output throughput ratio constant RTL" are respectively extracted as Throughput values of each variable and FF.

After the extraction of the above cycle information of each variable/FF, the extracted cycle information is added to loop-existing variable one-to-one correlation information or loop-free variable one-to-one correlation information with each variable/FF being stored therein.

<<s5_16 in Verification Script Alteration Process>>

In the reset cycle period setting alteration process s5_16, reset cycle period information and a reset cycle period setting of a model script are used in a high-level description and an RTL to alter the following. A target for alteration is a reset cycle period setting command reset for each of the high-level description and the RTL.

A cycle period in which a cycle period (which is excepted where a non-reset value is set) for a reset value set in the model script and a cycle period for the reset cycle period information are combined or brought together, is denoted to be an altered reset cycle period and set to a reset command for both of the high-level description/RTL.

<<s5_18 in Verification Script Alteration Process>>

In the variable/FF correspondence setting generation process, variable/FF correspondence information is used in a high-level description and an RTL to set the following. That is, targets for setting include a variable/FF one-to-one correspondence setting command flop_map, and a variable/FF non one-to-one correspondence setting command conditional_flop_map.

The following are set to the variable/FF one-to-one correspondence setting command flop_map. That is, they include a variable name of a high-level description, a cycle number (−lat) from a reset process to the execution of a first value change, a periodic cycle (−freq) for a value change, an FF name of a corresponding RTL, a cycle number (−lat) from the reset process to the execution of a first value change, and a periodic cycle (−freq) for a value change.

The following are set to the variable/FF non one-to-one correspondence setting command conditional_flop_map. That is, they include an FF name of an RTL and all corresponding variables of a high level, and an assignment execution condition (−cond) on which an assignment is performed on each variable.

When variable/FF correspondence settings are specified as much as possible, checking at to whether a correspondence relation is correct, is necessary for equivalence checking. A problem arises in that since this checking is done, the overhead of its execution time become innegligible where they are specified a lot. Therefore, in the present embodiment, the variable/FF correspondence settings are given priorities shown below: 1) loop-existing variable one-to-one correspondence setting, 2) loop-exiting variable non one-to-one correspondence setting, 3) loop-free variable one-to-one correspondence setting, and 4) loop-free variable non one-to-one correspondence setting. In the variable/FF correspondence setting process, a second verification script and a third verification script are outputted in accordance with the above priorities. Their contents of settings are as follows: The input/output correspondence setting and reset cycle period setting of up to the above are set to the first verification script. The loop-existing variable one-to-one correspondence setting or the loop-existing variable non one-to-one correspondence setting is set to the second verification script in addition to the setting of the first verification script. The loop-free variable one-to-one correspondence setting or the loop-free non one-to-one correspondence setting is set to the third verification script in addition to the setting of the second verification script.

<<Detailed Flow of s5_7 in Verification Script Alteration Process>>

Figure 75:
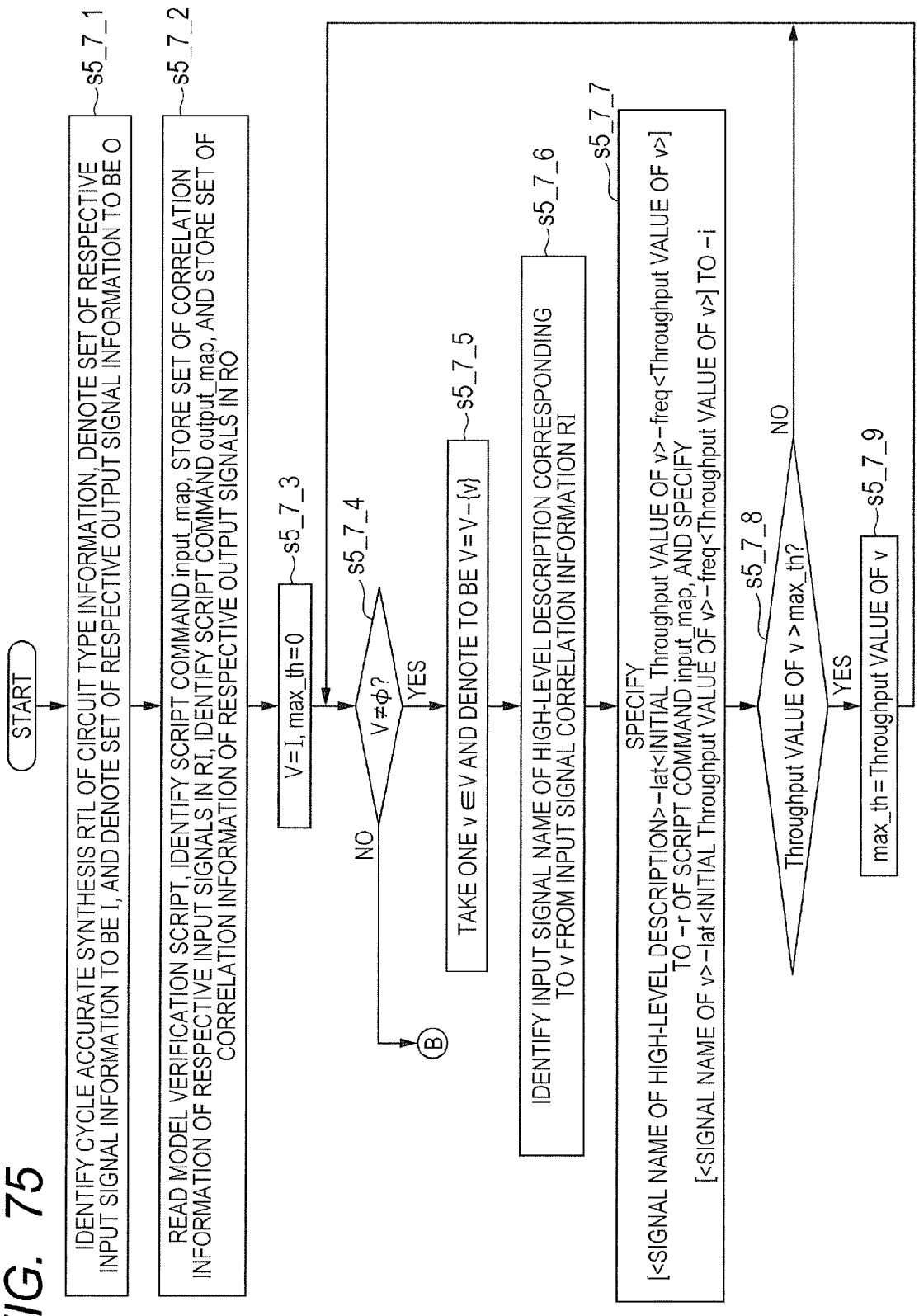
FIG. 75 is a flowchart illustrating the first half of an input/output correspondence setting alteration process targeted for a cycle accurate synthesis constant in input/output throughput ratio in s5_7.
Figure 76:
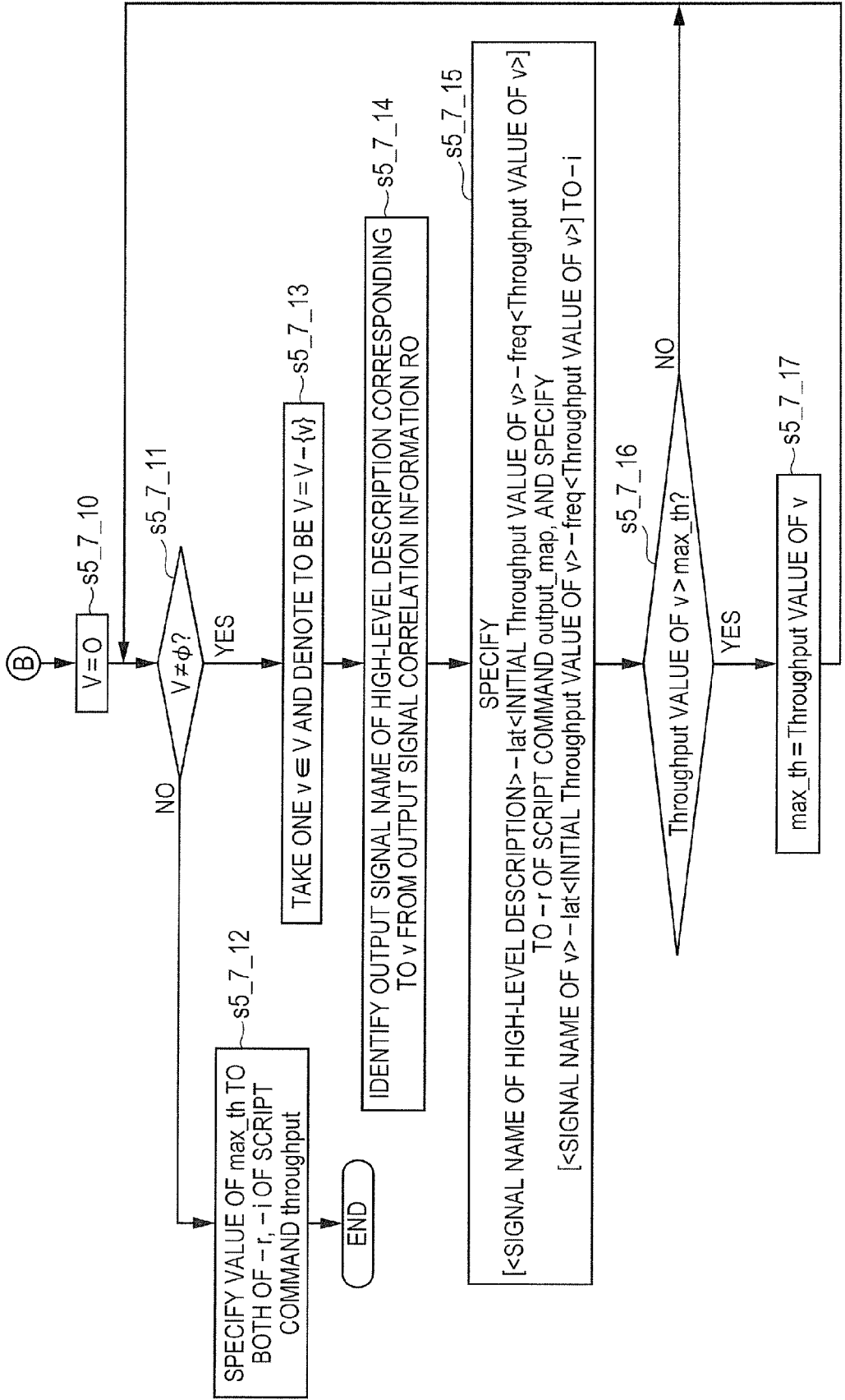
FIG. 76 is a flowchart illustrating the second half of the input/output correspondence setting alteration process targeted for the cycle accurate synthesis constant in the input/output throughput ratio in s5_7.

The first half of a flow for the "input/output correspondence setting alteration process targeted for the cycle accurate synthesis constant in input/output throughput ratio" in s5_7 is illustrated in FIG. 75. The latter half of its process flow is illustrated in FIG. 76. The contents of respective steps are as follows:

In s5_7_1, a cycle accurate synthesis RTL is identified from circuit type information included in input/output cycle information. A set of respective input information with respect to an RTL is denoted to be I, and a set of respective output information is denoted to be 0. Then, the process proceeds to s5_7_2.

In s5_7_2, a model verification script is read, and a script command input_map is identified. A set of correlation information of respective input signals is stored in a set variable RI. Further, a script command output_map is identified, and a set of correlation information of respective output signals is stored in a set variable RO. Then, the process proceeds to s5_7_3.

In s5_7_3, I is substituted in a set variable V, and a variable max_th is initialized to 0. Then, the process proceeds to s5_7_4.

In s5_7_4, it is determined whether the set V is empty. If it is determined to be empty, then the process proceeds to s5_7_5. If it is determined not to be empty, then the process proceeds to s5_7_10.

In S5_7_5, one v∈V is taken and V is set to be V=V−{v}. Then, the process proceeds to s5_7_6.

In s5_7_6, an input signal name of a high-level description corresponding to v is identified from input signal correlation information RI. Then, the process proceeds to s5_7_7.

In s5_7_7, [<Signal name of high-level description>–lat<initial Throughput value of v>–freq<Throughput value of v>] is specified to −r of the script command input_map. [<Signal name of v>–lat<initial Throughput value of v>–freq<Throughput value of v>] is specified to −i thereof. Then, the process proceeds to s5_7_8.

In s5_7_8, a determination of Throughput value of v>max_th is done. If it is determined to be so, then the process proceeds to s5_7_9. If it is not so, then the process proceeds to s5_7_4.

In s5_7_9, the Throughput value of v is substituted in the variable max_th, and the process proceeds to s5_7_4.

In s5_7_10, 0 is substituted in a set variable V, and the process proceeds to s5_7_11.

In s5_7_11, it is determined whether the set V is empty. If it is determined to be empty, then the process proceeds to s5_7_13. If it is determined not to be empty, then the process proceeds to s5_7_12.

In s5_7_12, the value of max_th is set to both of −r and −i of the script command throughput, and the process is terminated.

In s5_7_13, one v∈V is taken, and V is set to be V=V−{v}. Then, the process proceeds to s5_7_14.

In s5_7_14, an output signal name of a high-level description corresponding to v is identified from output signal correlation information RO, and the process proceeds to s5_7_15.

In s5_7_15, [<Signal name of high-level description>–lat<initial Throughput value of v>–freq<Throughput value of v>] is specified to −r of the script command output_map. [<Signal name of v>–lat<initial Throughput value of v>–freq<Throughput value of v>] is specified to −i thereof. Then, the process proceeds to s5_7_16.

In s5_7_16, a determination of Throughput value of v>max_th is done. If it is determined to be so, then the process proceeds to s5_7_17. If it is determined not to be so, then the process proceeds to s5_7_11.

In s5_7_17, the Throughput value of v is substituted in the variable max_th, and the process proceeds to s5_7_11.

<<Detailed Flow of s5_8 in Verification Script Alteration Process>>

Figure 77:
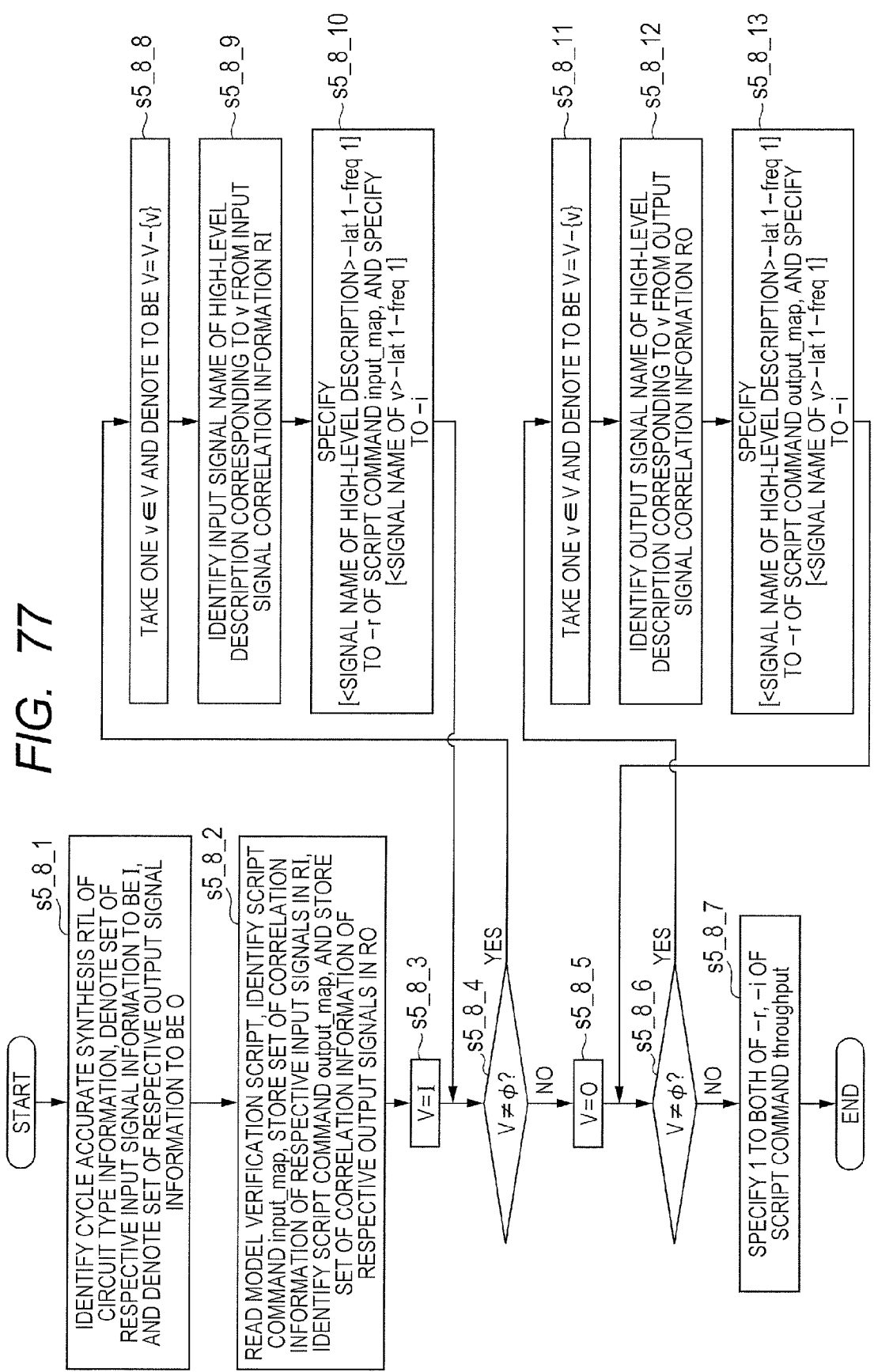
FIG. 77 is a flowchart showing an input/output correspondence setting alteration process targeted for a cycle accurate synthesis non-constant in input/output throughput ratio in s5_8.

A flow for the "input/output correspondence setting alteration process targeted for the cycle accurate synthesis non-constant in input/output throughput ratio" in s5_8 is illustrated in FIG. 77. The contents of respective steps are as follows:

In s5_8_1, a cycle accurate synthesis RTL is identified from circuit type information included in input/output cycle information. A set of respective input information with respect to an RTL is denoted to be I, and a set of respective output information is denoted to be O. Then, the process proceeds to s5_8_2.

In s5_8_2, a model verification script is read, and a script command input_map is identified. A set of correlation information of respective input signals is stored in a set variable RI. A script command output_map is identified. And a set of correlation information of respective output signals is stored in a set variable RO. Then, the process proceeds to s5_8_3.

In s5_8_3, I is substituted in a set variable V, and the process proceeds to s5_8_4.

In s5_8_4, it is determined whether the set V is empty. If it is determined to be empty, then the process proceeds to s5_8_8. If it is determined not to be empty, then the process proceeds to s5_8_5.

In s5_8_5, 0 is substituted in the set variable V, and the process proceeds to s5_8_6.

In s5_8_6, it is determined whether the set V is empty. If it is determined to be empty, then the process proceeds to s5_8_11. If it is determined not to be empty, then the process proceeds to s5_8_7.

In s5_8_7, 1 is set to both of −r and −i of a script command throughput, and the process is terminated.

In s5_8_8, one v∈V is taken and V is set to be V=V−{v}. Then, the process proceeds to s5_8_9.

In s5_8_9, an input signal name of a high-level description corresponding to v is identified from input signal correlation information RI. Then, the process proceeds to s5_8_10.

In s5_8_10, [<signal name of high-level description>–lat 1–freq 1] is specified to −r of the script command input_map. [<signal name of v>–lat 1–freq 1] is specified to −r thereof. Then, the process proceeds to s5_8_4.

In s5_8_11, one v∈V is taken and V is set to be V=V−{v}. Then, the process proceeds to s5_8_12.

In s5_8_12, an input signal name of a high-level description corresponding to v is identified from output signal correlation information RO. Then, the process proceeds to s5_8_13.

In s5_8_13, [<Signal name of high-level description>–lat 1–freq 1] is specified to −r of the script command output_map. [<Signal name of v>–lat 1–freq 1] is specified to −i thereof. Then, the process proceeds to s5_8_6.

<<Detailed Flow of s5_10 in Verification Script Alteration Process>>

Figure 78:
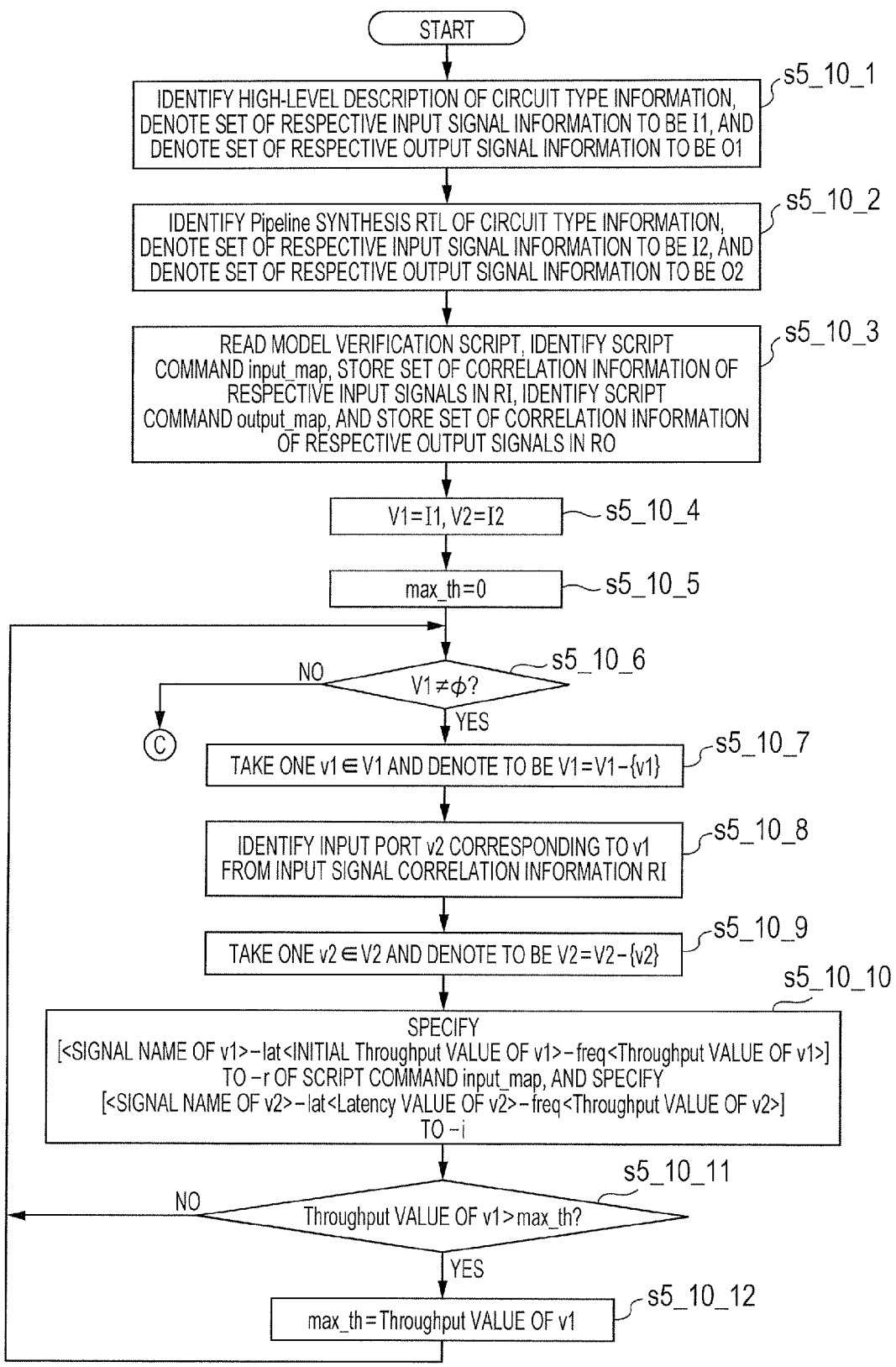
FIG. 78 is a flowchart showing the first half of an input/output correspondence setting alteration process targeted for a Pipeline synthesis RTL in s5_10.
Figure 79:
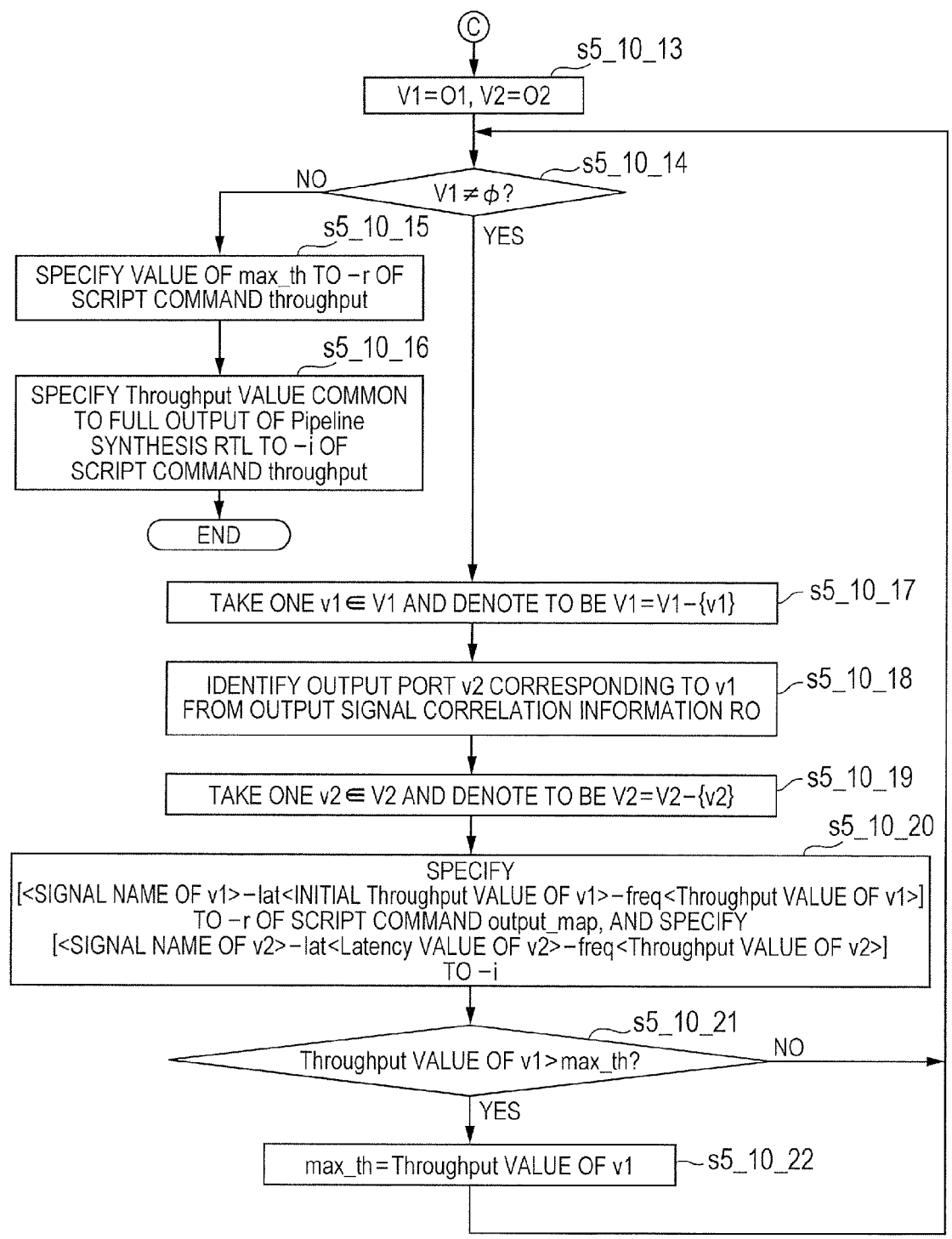
FIG. 79 is a flowchart showing the second half of the input/output correspondence setting alteration process targeted for the Pipeline synthesis RTL in s5_10.

The first half of a flow for the "input/output correspondence setting alteration process targeted for the Pipeline synthesis RTL" in s5_10 is illustrated in FIG. 78. The latter half of its process flow is illustrated in FIG. 79. The contents of respective steps are as follows:

In s5_10_1, a high-level description is identified from circuit type information included in input/output cycle information. A set of respective input information relative to the high-level description is substituted in a set variable I1, and a set of respective output information is substituted in a set variable O1, respectively. Then, the process proceeds to s5_10_2.

In s5_10_2, a Pipeline synthesis RTL is identified from circuit type information included in input/output cycle information. A set of respective input information relative to the Pipeline synthesis RTL is substituted in a set variable I2, and a set of respective output information is substituted in a set variable O2, respectively. Then, the process proceeds to s5_10_3.

In s5_10_3, a model verification script is read, and a script command input_map is identified. A set of correlation information of respective input signals is stored in a set variable RI. A script command output_map is identified, and a set of correlation information of respective output signals is stored in a set variable RO. Then, the process proceeds to s5_10_4.

In s5_10_4, I1 is substituted in a set variable V1 and I2 is substituted in a set variable V2, respectively. Then, the process proceeds to s5_10_5.

In s5_10_5, a variable max_th is initialized to 0, and the process proceeds to s5_10_6.

In s5_10_6, it is determined whether the set V1 is empty. If it is determined to be empty, then the process proceeds to s5_10_7. If it is determined not to be empty, then the process proceeds to s5_10_13.

In s5_10_7, one v1∈V1 is taken and V1 is set to be V1=V1−{v1}. Then, the process proceeds to s5_10_8.

In s5_10_8, an input port v2 corresponding to v1 is identified from the corresponding input signal correlation information RI, and the process proceeds to s5_10_9.

In s5_10_9, v2∈V2 is taken and V2 is set to be V2=V2−{v2}. Then, the process proceeds to s5_10_10.

In s5_10_10, [<signal name of v1>−lat<initial Throughput value of v1>−freq<Throughput value of v1>] is specified to −r of the script command input_map. [<Signal name of v2>−lat<Latency value of v2>−freq<Throughput value of v2>] is specified to −i thereof. Then, the process proceeds to s5_10_11.

In s5_10_11, a determination of Throughput value of v1>max_th is done. If it is determined to be so, then the process proceeds to s5_10_12. If it is determined not to be so, then the process proceeds to s5_10_6.

In s5_10_12, the Throughput value of v1 is substituted in the variable max_th, and the process proceeds to s5_10_6.

In s5_10_13, O1 is substituted in a set variable V1 and O2 is substituted in a set variable V2, respectively. Then, the process proceeds to s5_10_14.

In s5_10_14, it is determined whether the set V1 is empty. If it is determined to be empty, then the process proceeds to s5_10_17. If it is determined not to be empty, then the process proceeds to s5_10_15.

In s5_10_15, the value of max_th is specified to −r of a script command throughput, and the process proceeds to s5_10_16.

In s5_10_16, a Throughput value of an entire circuit in the Pipeline synthesis RTL is specified to −i of the script command throughput, and the process is terminated.

In s5_10_17, one v1∈V1 is taken and V1 is set to be V1=V1−{v1}. Then, the process proceeds to s5_10_18.

In s5_10_18, an output port v2 corresponding to v1 is identified from the corresponding output signal correlation information RO, and the process proceeds to s5_10_19.

In s5_10_19, v2∈V2 is taken and V2 is set to be V2=V2−{v2}. Then, the process proceeds to s5_10_20.

In s5_10_20, [<signal name of v1>−lat<initial Throughput value of v1>−freq<Throughput value of v1>] is specified to −r of the script command output_map. [<Signal name of v2>−lat<Latency value of v2>−freq<Throughput value of v2>] is specified to −i thereof. Then, the process proceeds to s5_10_21.

In s5_10_21, a determination of Throughput value of v1>max_th is done. If it is determined to be Throughput value of v1>max_th, then the process proceeds to s5_10_22. If it is not determined to be Throughput value of v1>max_th, then the process proceeds to s5_10_14.

In s5_10_22, the Throughput value of v1 is substituted in the variable max_th, and the process proceeds to s5_10_14.

<<Detailed Flow of s5_11 in Verification Script Alteration Process>>

Figure 80:
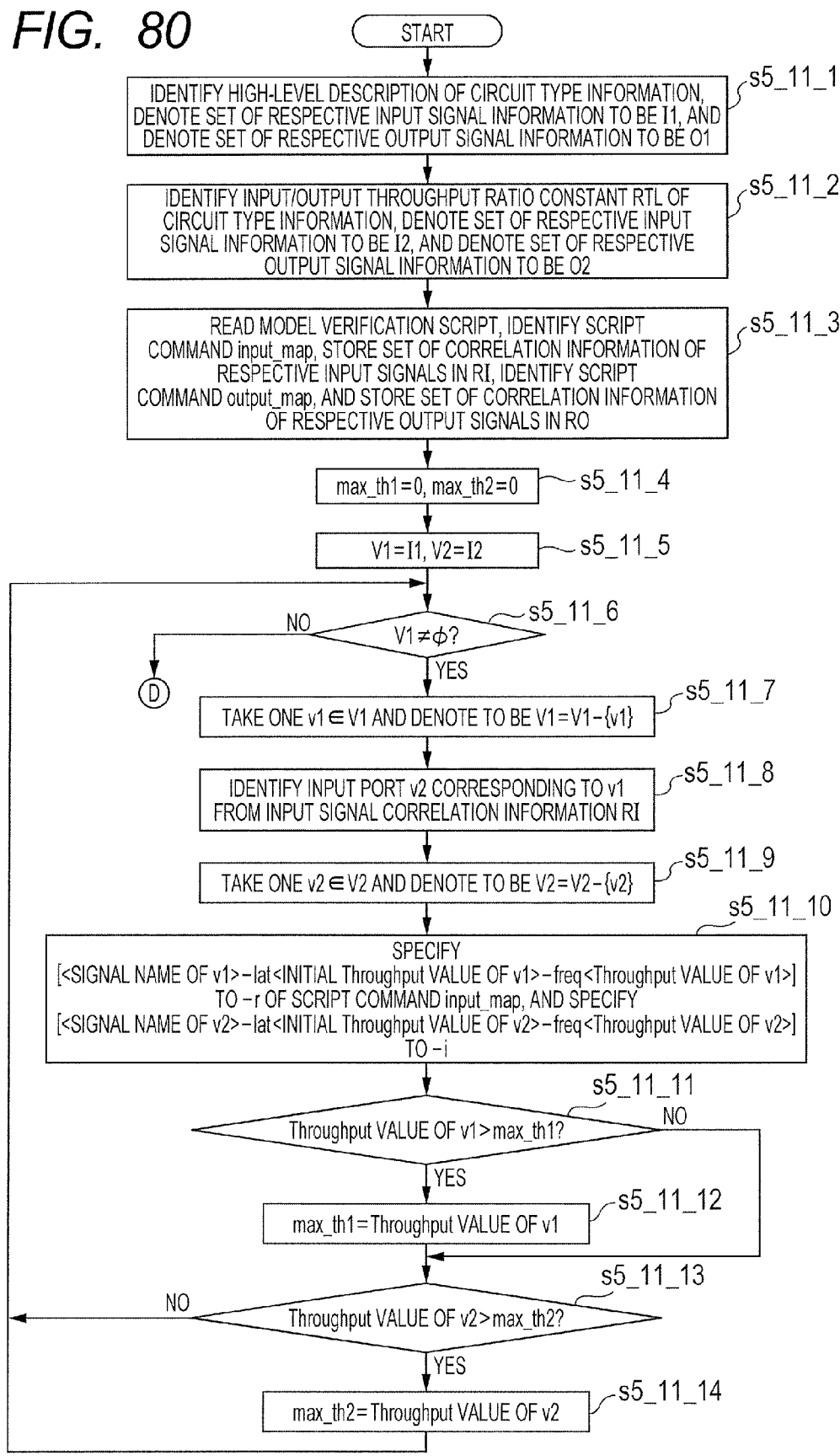
FIG. 80 is a flowchart illustrating the first half of an input/output correspondence setting alteration process targeted for an input/output throughput ratio constant RTL in s5_11.
Figure 81:
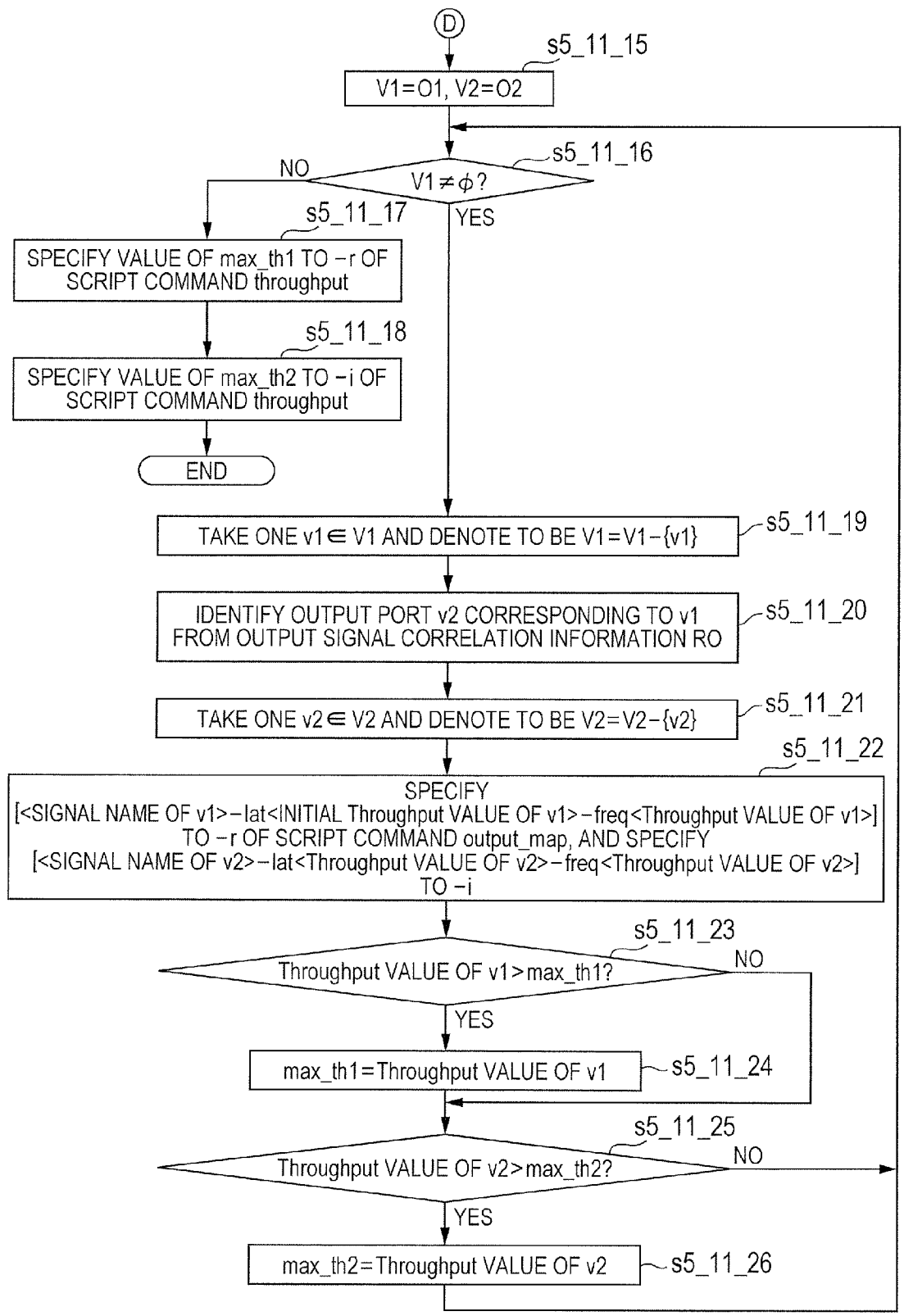
FIG. 81 is a flowchart illustrating the second half of the input/output correspondence setting alteration process targeted for the input/output throughput ratio constant RTL in s5_11.

A flow for the first half of the "input/output correspondence setting alteration process targeted for the input/output throughput ratio constant RTL" in s5_11 is illustrated in FIG. 80. A process flow for the latter half thereof is illustrated in FIG. 81. The contents of respective steps are as follows:

In s5_11_1, a high-level description is identified from circuit type information included in input/output cycle information. A set of respective input information relative to the high-level description is denoted to be I1, and a set of respective output information is denoted to be O1, respectively. Then, the process proceeds to s5_11_2.

In s5_11_2, an input/output throughput ratio constant RTL is identified from circuit type information included in input/output cycle information. A set of respective input information relative to the input/output throughput ratio constant RTL is denoted to be I2, and a set of respective output information is denoted to be O2, respectively. Then, the process proceeds to s5_11_3.

In s5_11_3, a model verification script is read, and a script command input_map is identified. A set of correlation information of respective input signals is stored in a set variable RI. A script command output_map is identified, and a set of correlation information of respective output signals is stored in a set variable RO. Then, the process proceeds to s5_11_4.

In s5_11_4, variables max_th1 and max_th2 are initialized to 0, and the process proceeds to s5_11_5.

In s5_11_5, I1 and I2 are respectively substituted in set variables V1 and V2, and the process proceeds to s5_11_6.

In s5_11_6, it is determined whether the set V1 is empty. If it is determined to be empty, then the process proceeds to s5_11_7. If it is determined not to be empty, then the process proceeds to s5_11_15.

In s5_11_7, one v1∈V1 is taken and V1 is set to be V1=V1−{v1}. Then, the process proceeds to s5_11_8.

In s5_11_8, an input port v2 corresponding to v1 is identified from the corresponding input signal correlation information RI, and the process proceeds to s5_11_9.

In s5_11_9, v2∈V2 is taken and V2 is set to be V2=V2−{v2}. Then, the process proceeds to s5_11_10.

In s5_11_10, [<signal name of v1>−lat<initial Throughput value of v1>−freq<Throughput value of v1>] is specified to −r of the script command input_map. [<Signal name of v2>−lat<initial Throughput value of v2>−freq<Throughput value of v2>] is specified to −i thereof. Then, the process proceeds to s5_11_11.

In s5_11_11, a determination of Throughput value of v1>max_th1 is done. If it is determined to be Throughput value of v1>max_th1, then the process proceeds to s5_11_12. If it is determined not to be Throughput value of v1>max_th1, then the process proceeds to s5_11_13.

In s5_11_12, the Throughput value of v1 is substituted in the variable max_th1, and the process proceeds to s5_11_13.

In s5_11_13, a determination of Throughput value of v2>max_th2 is performed. If it is determined to be so, then the process proceeds to s5_11_14. If it is determined not to be so, then the process proceeds to s5_11_6.

In s5_11_14, the Throughput value of v2 is substituted in the variable max_th2, and the process proceeds to s5_11_6.

In s5_11_15, O1 is substituted in the set variable V1, and O2 is substituted in the set variable V2, respectively. Then, the process proceeds to s5_11_16.

In s5_11_16, it is determined whether the set V1 is empty. If it is determined to be empty, then the process proceeds to s5_11_19. If it is determined not to be empty, then the process proceeds to s5_11_17.

In s5_11_17, the value of max_th1 is specified to −r of a script command throughput, and the process proceeds to s5_11_18.

In s5_11_18, the value of max_th2 is specified to −r of the script command throughput, and the process is terminated.

In s5_11_19, one v1∈V1 is taken and V1 is set to be V1=V1−{v1}. Then, the process proceeds to s5_11_20.

In s5_11_20, an input port v2 corresponding to v1 is identified from the corresponding output signal correlation information RO, and the process proceeds to s5_11_21.

In s5_11_21, v2∈V2 is taken and V2 is set to be V2=V2−{v2}. Then, the process proceeds to s5_11_22.

In s5_11_22, [<signal name of v1>−lat<initial Throughput value of v1>−freq<Throughput value of v1>] is specified to −r of the script command output_map. [<Signal name of v2>−lat<initial Throughput value of v2>−freq<Throughput value of v2>] is specified to −i thereof. Then, the process proceeds to s5_11_23.

In s5_11_23, a determination of Throughput value of v1>max_th1 is done. If it is determined to be so, then the process proceeds to s5_11_24. If it is determined not to be so, then the process proceeds to s5_11_25.

In s5_11_24, the Throughput value of v1 is substituted in the variable max_th1, and the process proceeds to s5_11_25.

In s5_11_25, a determination of Throughput value of v2>max_th2 is performed. If it is determined to be so, then the process proceeds to s5_11_26. If it is determined not to be so, then the process proceeds to s5_11_16.

In s5_11_26, the Throughput value of v2 is substituted in the variable max_th2, and the process proceeds to s5_11_16.

<<Detailed Flow of s5_12 in Verification Script Alteration Process>>

Figure 82:
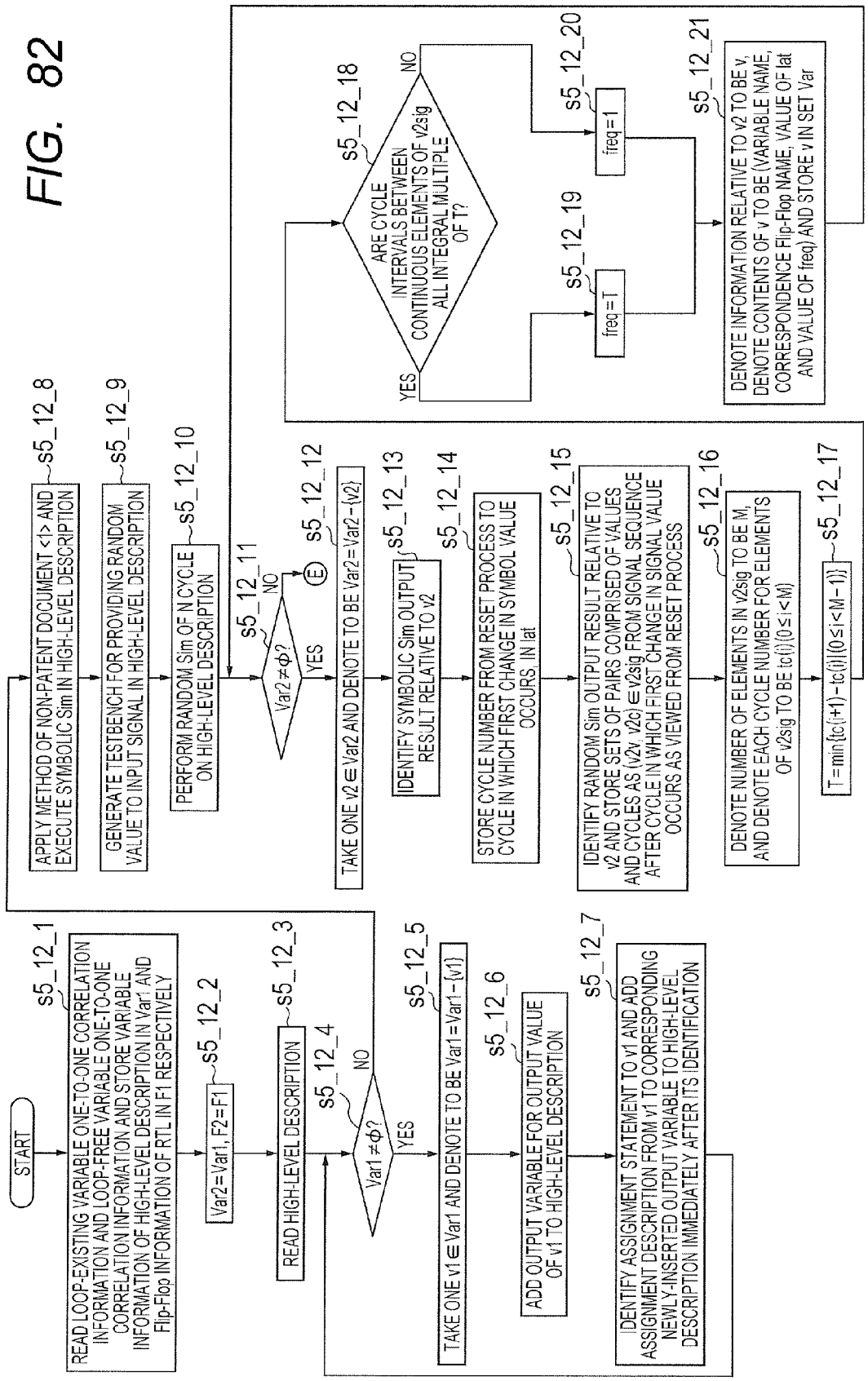
FIG. 82 is a flowchart illustrating a partial process from the start of a one-to-one correspondence variable/FF-based cycle information extraction process targeted for a cycle accurate synthesis RTL constant in input/output throughput ratio in s5_12.
Figure 83:
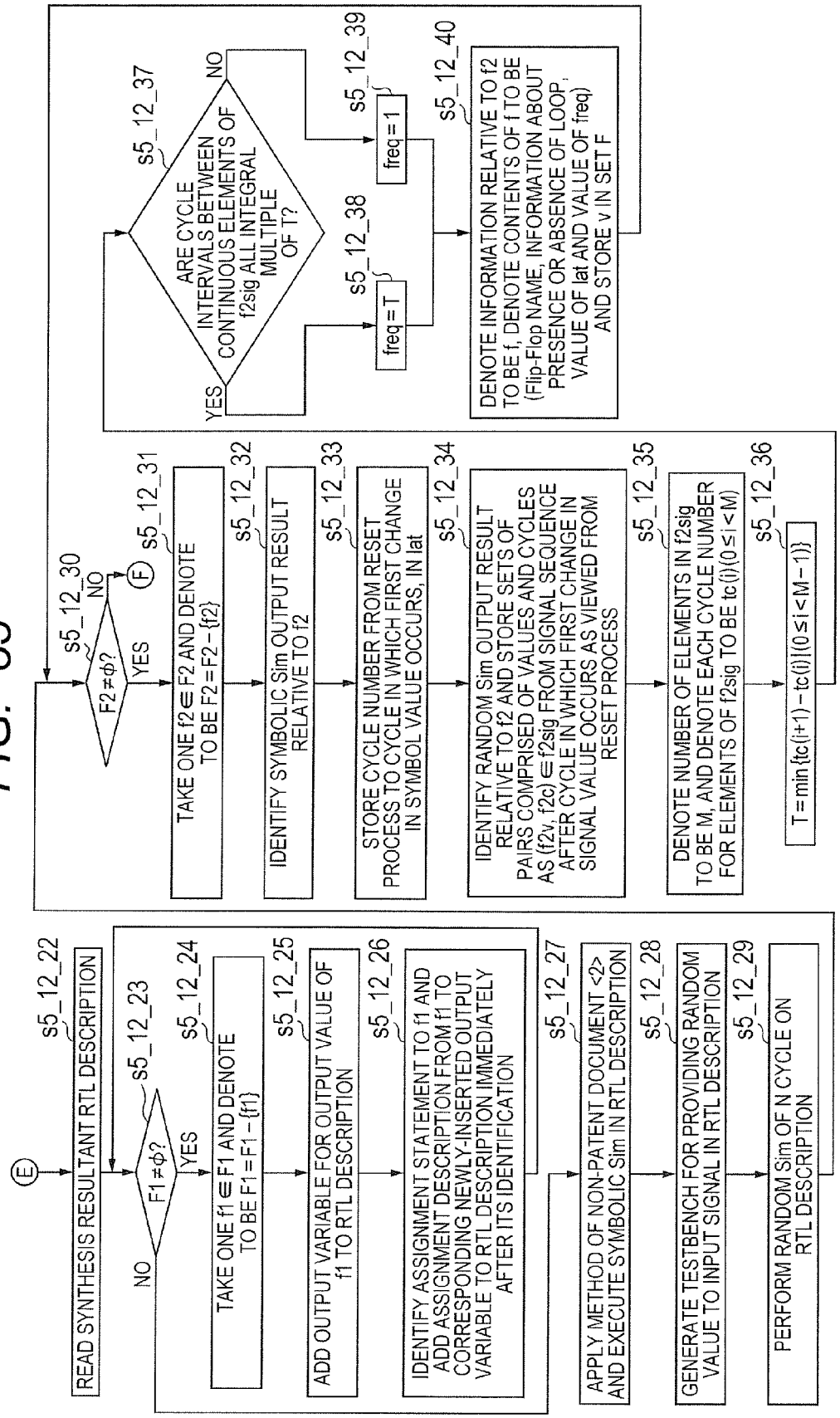
FIG. 83 is a flowchart illustrating a process following FIG. 82.
Figure 84:
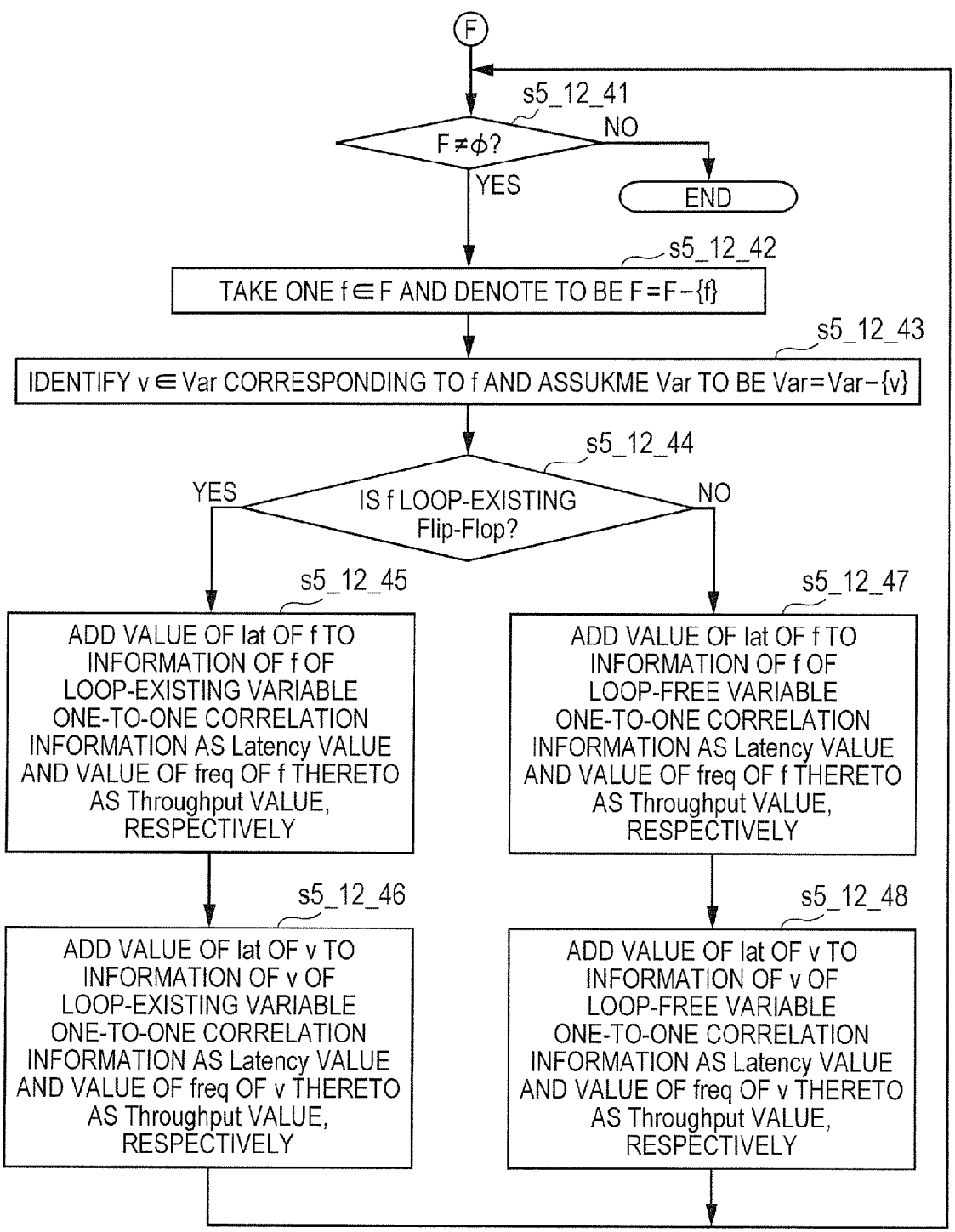
FIG. 84 is a flowchart illustrating a process up to the completion of the process, following FIG. 83.

A partial flow from the start of "the one-to-one correspondence variable/FF-based cycle information extraction process targeted for the cycle accurate synthesis RTL constant in input/output throughput ratio" in s5_12 is illustrated in FIG. 82. A process flow following FIG. 82 is illustrated in FIG. 83. A process flow leading to the completion of the above process, following FIG. 83 is illustrated in FIG. 84. The contents in respective steps are as follows:

In s5_12_1, loop-existing variable one-to-one correlation information and loop-free variable one-to-one correlation information are read. Variable information of each high-level description is stored in a set variable Var1, and FF information of each RTL is stored in a set variable F1. Then, the process proceeds to s5_12_2.

In s5_12_2, Var1 is substituted in a set variable Var2 and F1 is substituted in F2, respectively, and the process proceeds to s5_12_3.

In s5_12_3, a high-level description is read, and the process proceeds to s5_12_4.

In s5_12_4, it is determined whether the set Var1 is empty. If it is determined to be empty, then the process proceeds to s5_12_8. If it is determined not to be empty, then the process proceeds to s5_12_5.

In s5_12_5, one v1∈Var1 is taken and Var1 is set to be Var1=Var1−{v1}. Then, the process proceeds to s5_12_6.

In s5_12_6, an output variable for the output value of v1 is added to the high-level description, and the process proceeds to s5_12_7.

In s5_12_7, an assignment statement to v1 is identified, and an assignment description from v1 to a newly inserted corresponding output variable is added to the high-level description immediately after its identification. Then, the process proceeds to s5_12_4.

In s5_12_8, the method described in the document "Alan Mishchenko, Michael Case, Robert Brayton, and Stephan Jang, "Scalable and Scalably-Verifiable Sequential Synthesis" In Proc. of ICCAD, pp. 234-241, 2008." is applied and thereby a symbolic Sim in a high-level description is carried out. Then, the process proceeds to s5_12_9.

In s5_12_9, a testbench for providing a random value to each input signal in the high-level description is generated, and the process proceeds to s5_12_10.

In s5_12_10, an N cycle-based random Sim is performed on the high-level description, and the process proceeds to s5_12_11.

In s5_12_11, it is determined whether the set Var2 is empty. If it is determined to be empty, then the process proceeds to s5_12_22. If it is determined not to be empty, then the process proceeds to s5_12_12.

In s5_12_12, one v2∈Var2 is taken and Var2 is set to be Var2=Var2−{v2}. Then, the process proceeds to s5_12_13.

In s5_12_13, a symbolic Sim output result corresponding to v2 is identified, and the process proceeds to s5_12_14.

In s5_12_14, a cycle number from a reset process to a cycle in which a first change in symbolic value occurs, is stored in a variable lat, and the process proceeds to s5_12_15.

In s5_12_15, a random Sim result corresponding to v2 is identified. Sets of pairs of values and cycles are stored as (v2v,v2c)∈v2sig from each signal sequence after a cycle in which a first change in signal value occurs as viewed from a reset process. Then, the process proceeds to s5_12_16.

In s5_12_16, the number of elements in v2sig is denoted to be M, and each cycle number for the elements in v2sig is denoted to be $tc(i) (0 \le i < M)$. Then, the process proceeds to s5_12_17.

In s5_12_17, the minimum value $(\min\{(tc(i+1)-tc(i)|(0 \le i < M-1))\})$ of each cycle interval between the continuous elements is substituted in a variable T. Then, the process proceeds to s5_12_18.

In s5_12_18, it is determined whether cycle intervals between the continuous elements in v2sig are all an integral multiple of T. If it is determined that the cycle intervals between the continuous elements in v2sig are all an integral multiple of T, then the process proceeds to s5_12_19. If it is determined that the cycle intervals between the continuous elements in v2sig are not all an integral multiple of T, then the process proceeds to s5_12_20.

In s5_12_19, the value of the variable T is substituted in a variable freq, and the process proceeds to s5_12_21.

In s5_12_20, 1 is substituted in a variable freq, and the process proceeds to s5_12_22.

In s5_12_21, information for a variable v2 in a high-level description is denoted to be v. The contents of v are denoted to be (a variable name, a correspondence FF name, the value of lat and the value of freq). v is stored in a set Var. Then, the process proceeds to s5_12_11.

In s5_12_22, a synthesis resultant RTL is read, and the process proceeds to s5_12_23.

In s5_12_23, it is determined whether the set F1 is empty. If it is determined to be empty, then the process proceeds to s5_12_27. If it is determined not to be empty, then the process proceeds to s5_12_24.

In s5_12_24, one f1∈F1 is taken and F1 is set to be F1=F1−{f1}. Then, the process proceeds to s5_12_25.

In s5_12_25, an output variable for the output value of f1 is added to its corresponding RTL description, and the process proceeds to s5_12_26.

In s5_12_26, an assignment statement to f1 is identified, and an assignment description from f1 to a newly inserted corresponding output variable is added to the RTL description immediately after its identification. Then, the process proceeds to s5_12_23.

In s5_12_27, the method described in the document "Michael Case, Alan Mishchenko, and Robert Brayton, "Cut-Based Inductive Invariant Computation," In Proc. of IWLS, pp. 253-258, 2008." is applied, and thereby a symbolic Sim in an RTL description is performed. Then, the process proceeds to s5_12_28.

In s5_12_28, a testbench for providing a random value to each input signal in the RTL description is generated, and the process proceeds to s5_12_29.

In s5_12_29, an N cycle-based random Sim is performed on the RTL description, and the process proceeds to s5_12_30.

In s5_12_30, it is determined whether the set F2 is empty. If it is determined to be empty, then the process proceeds to s5_12_41. If it is determined not to be empty, then the process proceeds to s5_12_31.

In s5_12_31, one f2∈F2 is taken and F2 is set to be F2=F2−{f2}. Then, the process proceeds to s5_12_32.

In s5_12_32, a symbolic Sim output result corresponding to f2 is identified, and the process proceeds to s5_12_33.

In s5_12_33, a cycle number from a reset process to a cycle in which a first change in signal value occurs, is stored in a variable lat, and the process proceeds to s5_12_34.

In s5_12_34, a random Sim output result corresponding to f2 is identified. Sets of pairs of values and cycles are stored as (f2v,f2c)∈f2sig from each signal sequence after a cycle in which a first change in signal value occurs as viewed from a reset process. Then, the process proceeds to s5_12_35.

In s5_12_35, the number of elements in f2sig is denoted to be M, and each cycle number for the elements in f2sig is denoted to be tc(i)(0≤i<M). Then, the process proceeds to s5_12_36.

In s5_12_36, the minimum value (min{(tc(i+1)−tc(i)| (0≤i<M−1))}) of each cycle interval between the continuous elements is substituted in a variable T. Then, the process proceeds to s5_12_37.

In s5_12_37, it is determined whether cycle intervals between the continuous elements in f2sig are all an integral multiple of T. If it is determined to be so, then the process proceeds to s5_12_38. If it is determined not to be so, then the process proceeds to s5_12_39.

In s5_12_38, the value of the variable T is substituted in a variable freq, and the process proceeds to s5_12_40.

In s5_12_39, 1 is substituted in a variable freq, and the process proceeds to s5_12_40.

In s5_12_40, information relative to f2 being an FF of the synthesis resultant RTL is denoted to be f. The contents of f are denoted to be (an FF name, information about the presence or absence of a loop, the value of lat and the value of freq). f is stored in its corresponding set F. Then, the process proceeds to s5_12_30.

In s5_12_41, it is determined whether the set F is empty. If it is determined to be empty, then the process is terminated. If it is determined not to be empty, then the process proceeds to s5_12_42.

In s5_12_42, one f∈F is taken and F is set to be F=F−{f}. Then, the process proceeds to s5_12_43.

In s5_12_43, a variable v∈Var of a high level corresponding to f is identified, and Var is set to be Var=Var−{v}. Then, the process proceeds to s5_12_44.

In s5_12_44, it is determined from the loop presence/absence information of f whether f is an FF having a feedback loop. If it is determined that the loop exists, then the process proceeds to s5_12_45. If it is determined not to be so, then the process proceeds to s5_12_47.

In s5_12_45, the value of lat of f and the value of freq of f are added to information of f in the loop-existing variable one-to-one correlation information as a Latency value and a Throughput value respectively. Then, the process proceeds to s5_12_46.

In s5_12_46, the value of lat of v and the value of freq of v are added to information of v in the loop-existing variable one-to-one correlation information as a Latency value and a Throughput value respectively. Then, the process proceeds to s5_12_41.

In s5_12_47, the value of lat of f and the value of freq of f are added to information of f in the loop-free variable one-to-one correlation information as a Latency value and a Throughput value respectively. Then, the process proceeds to s5_12_48.

In s5_12_48, the value of lat of v and the value of freq of v are added to information of v in the loop-free variable one-to-one correlation information as a Latency value and a Throughput value respectively. Then, the process proceeds to s5_12_41.

<<Detailed Flow of s5_13 in Verification Script Alteration Process>>

A flow for the "one-to-one correspondence variable/FF-based cycle information extraction process targeted for the cycle accurate synthesis RTL non-constant in input/output throughput ratio" in s5_13 is illustrated in FIG. 85. The contents in respective steps are as follows:

In s5_13_1, loop-existing variable one-to-one correlation information and loop-free variable one-to-one correlation information are read. Variable information of each high-level description is stored in a set variable Var1, and FF information of each RTL is stored in a set variable F1. Then, the process proceeds to s5_13_2.

In s5_13_2, it is determined whether the set Var1 is empty. If it is determined to be empty, then the process proceeds to s5_13_6. If it is determined not to be empty, then the process proceeds to s5_13_3.

In s5_13_3, one v1∈Var1 is taken and Var1 is set to be Var1=Var1−{v1}. Then, the process proceeds to s5_13_4.

In s5_13_4, 1 is substituted in a variable lat and 1 is substituted in a variable freq, respectively. Then, the process proceeds to s5_13_5.

In s5_13_5, information for a variable v1 in a high-level description is denoted to be v. The contents of v are denoted to be (a variable name, a correspondence FF name, the value of lat and the value of freq). And v is stored in a set Var. Then, the process proceeds to s5_13_2.

In s5_13_6, it is determined whether the set F1 is empty. If it is determined to be empty, then the process proceeds to s5_13_10. If it is determined not to be empty, then the process proceeds to s5_13_7.

In s5_13_7, one f1∈F1 is taken and F1 is set to be F1=F1−{f1}. Then, the process proceeds to s5_13_8.

In s5_13_8, 1 is substituted in a variable lat and 1 is substituted in a variable freq, respectively. Then, the process proceeds to s5_13_9.

In s5_13_9, information relative to f1 being an FF of a synthesis resultant RTL is denoted to be f. The contents of f are denoted to be (an FF name, information about the presence or absence of a loop, the value of lat and the value of freq). f is stored in its corresponding set F. Then, the process proceeds to s5_13_6.

In s5_13_10, it is determined whether the set F is empty. If it is determined to be empty, then the process is terminated. If it is determined not to be empty, then the process proceeds to s5_13_11.

In s5_13_11, one f∈F is taken and F is set to be F=F−{f}. Then, the process proceeds to s5_13_11.

In s5_13_12, a variable v∈Var of a high level corresponding to f is identified, and Var is set to be Var=Var−{v}. Then, the process proceeds to s5_13_12.

In s5_13_13, it is determined from the loop presence/absence information of f whether f is an FF having a feedback loop. If it is determined that the loop is included, then the process proceeds to s5_13_14. If it is determined not to be so, then the process proceeds to s5_13_16.

In s5_13_14, the value of lat of f and the value of freq of f are added to information of f in the loop-existing variable one-to-one correlation information as a Latency value and a Throughput value respectively. Then, the process proceeds to s5_13_15.

In s5_13_15, the value of lat of v and the value of freq of v are added to information of v in the loop-existing variable one-to-one correlation information as a Latency value and a Throughput value respectively. Then, the process proceeds to s5_13_10.

In s5_13_16, the value of lat of f and the value of freq of f are added to information of f in the loop-free variable one-to-one correlation information as a Latency value and a Throughput value respectively. Then, the process proceeds to s5_13_17.

In s5_13_17, the value of lat of v and the value of freq of v are added to information of v in the loop-free variable one-to-one correlation information as a Latency value and a Throughput value respectively. Then, the process proceeds to s5_13_10.

<<Detailed Flow of s5_14 in Verification Script Alteration Process>>

Figure 86:
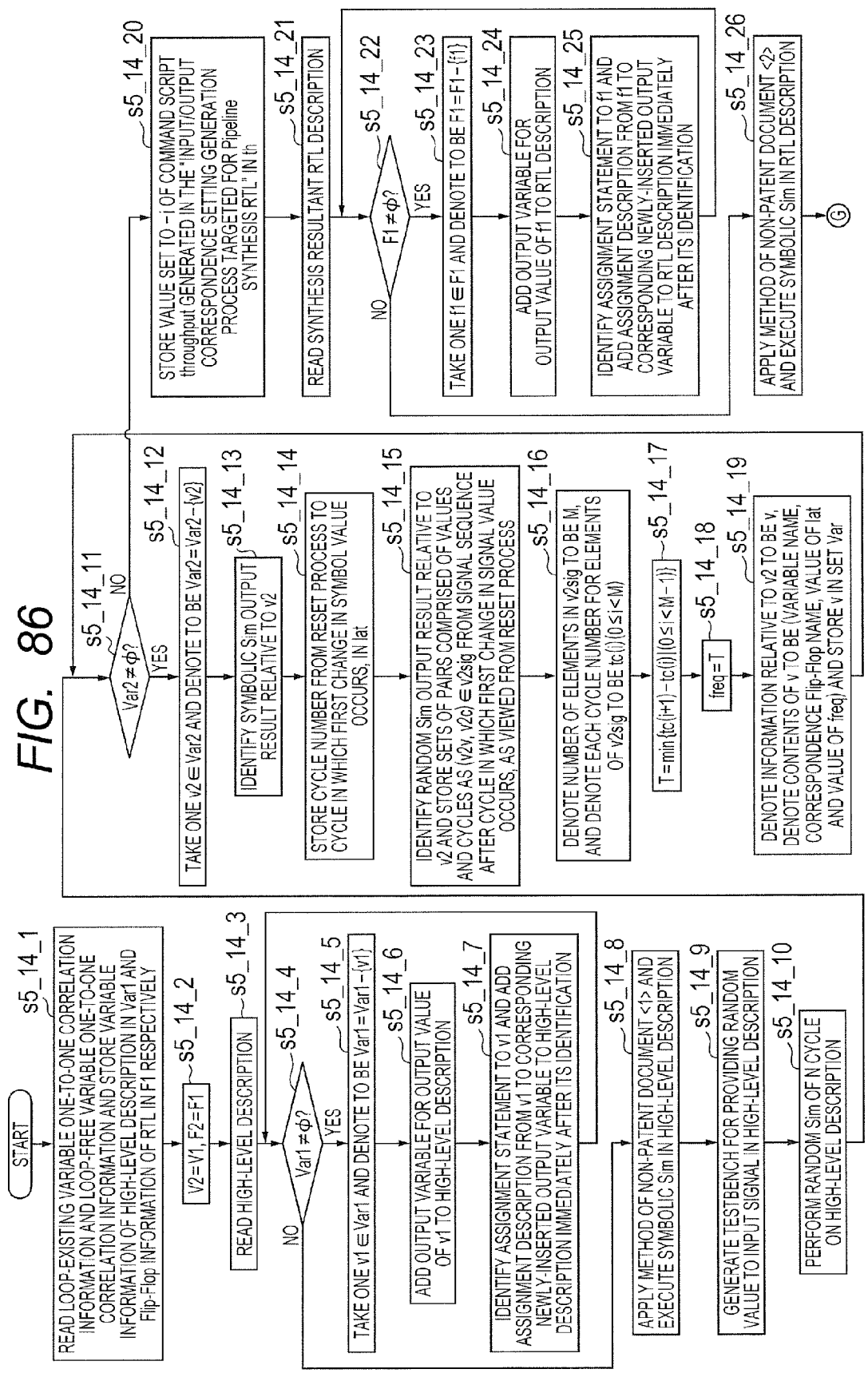
FIG. 86 is a flowchart illustrating the first half of a one-to-one correspondence variable/FF-based cycle information extraction process targeted for a Pipeline synthesis RTL in s5_14.
Figure 87:
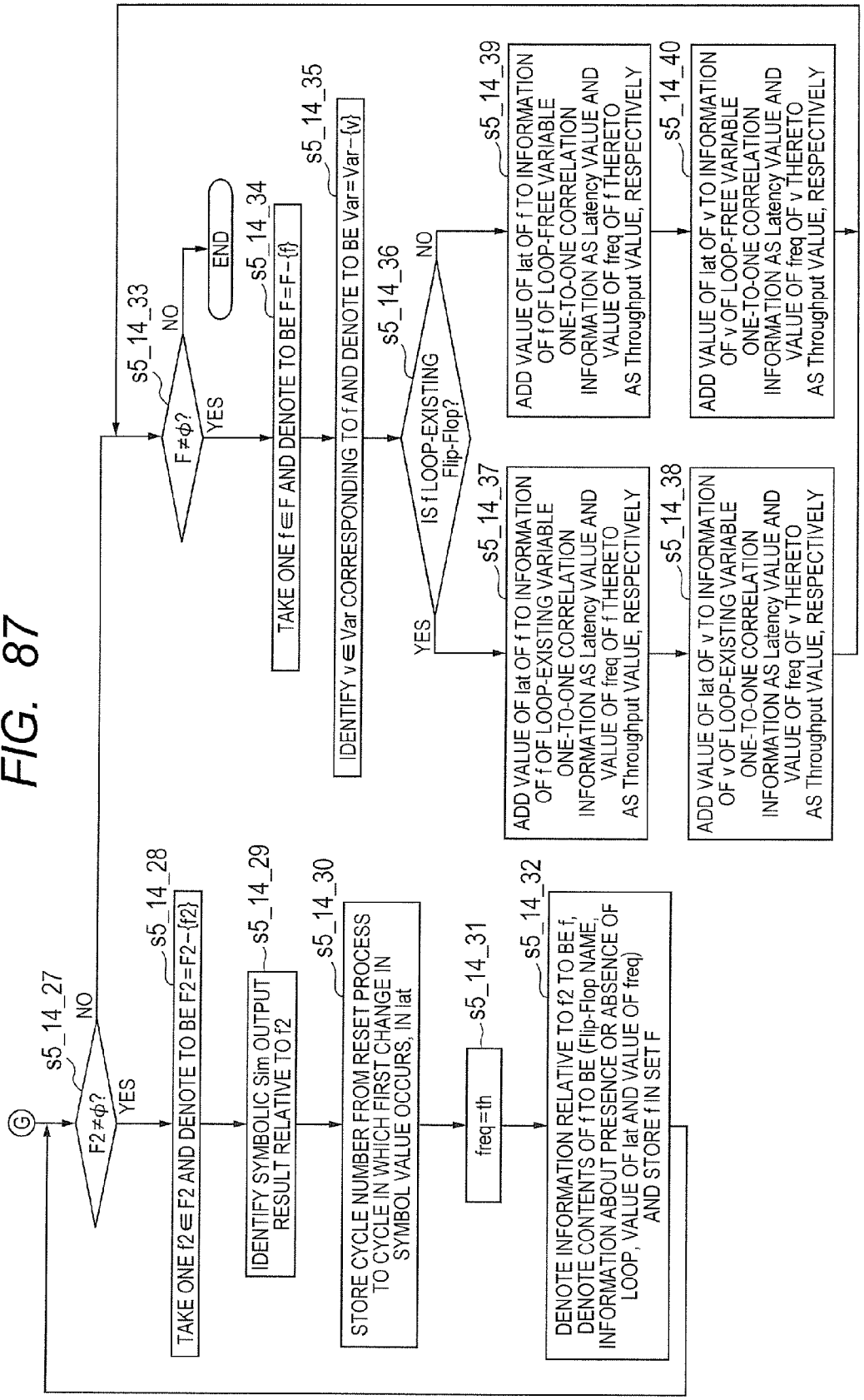
FIG. 87 is a flowchart illustrating the second half of the one-to-one correspondence variable/FF-based cycle information extraction process targeted for the Pipeline synthesis RTL in s5_14.

A flow for the first half of the "one-to-one correspondence variable/FF-based cycle information extraction process targeted for the Pipeline synthesis RTL" in s5_14 is illustrated in FIG. 86. A flow for the latter process following FIG. 86 is illustrated in FIG. 87. The contents in respective steps are as follows:

In s5_14_1, loop-existing variable one-to-one correlation information and loop-free variable one-to-one correlation information are read. Variable information of each high-level description is stored in a set variable Var1, and FF information of each RTL is stored in a set variable F1. Then, the process proceeds to s5_14_2.

In s5_14_2, Var1 is substituted in a set variable Var2 and F1 is substituted in F2, respectively. Then, the process proceeds to s5_14_3.

In s5_14_3, a high-level description is read, and the process proceeds to s5_14_4.

In s5_14_4, it is determined whether the set Var1 is empty. If it is determined to be empty, then the process proceeds to s5_14_8. If it is determined not to be empty, then the process proceeds to s5_14_5.

In s5_14_5, one v1∈Var1 is taken and Var1 is set to be Var1=Var1−{v1}. Then, the process proceeds to s5_14_6.

In s5_14_6, an output variable for the output value of v1 is added to the high-level description, and the process proceeds to s5_14_7.

In s5_14_7, an assignment statement to v1 is identified, and an assignment description from v1 to a newly inserted corresponding output variable is added to the high-level description immediately after its identification. Then, the process proceeds to s5_14_4.

In s5_14_8, the method described in the document "Alan Mishchenko, Michael Case, Robert Brayton, and Stephan Jang, "Scalable and Scalably-Verifiable Sequential Synthesis" In Proc. of ICCAD, pp. 234-241, 2008." is applied and thereby a symbolic Sim in a high-level description is carried out. Then, the process proceeds to s5_14_9.

In s5_14_9, a testbench for providing a random value to each input signal in the high-level description is generated, and the process proceeds to s5_14_10.

In s5_14_10, an N cycle-based random Sim is performed on the high-level description, and the process proceeds to s5_14_11.

In s5_14_11, it is determined whether the set Var2 is empty. If it is determined to be empty, then the process proceeds to s5_14_20. If it is determined not to be empty, then the process proceeds to s5_14_12.

In s5_14_12, one v2∈Var2 is taken and Var2 is set to be Var2=Var2−{v2}. Then, the process proceeds to s5_14_13.

In s5_14_13, a symbolic Sim output result corresponding to v2 is identified, and the process proceeds to s5_14_14.

In s5_14_14, a cycle number from a reset process to a cycle in which a first change in symbolic value occurs, is stored in a variable lat, and the process proceeds to s5_14_15.

In s5_14_15, a random Sim result corresponding to v2 is identified. Sets of pairs of values and cycles are stored as (v2v,v2c)∈v2sig from each signal sequence after a cycle in which a first change in signal value occurs as viewed from a reset process. Then, the process proceeds to s5_14_16.

In s5_14_16, the number of elements in v2sig is denoted to be M, and each cycle number for the elements in v2sig is denoted to be tc(i)(0≤i<M). Then, the process proceeds to s5_14_17.

In s5_14_17, the minimum value $(\min\{(tc(i+1)-tc(i)|(0 \le i<M-1))\})$ of each cycle interval between the continuous elements is substituted in a variable T. Then, the process proceeds to s5_14_18.

In s5_14_18, the value of the variable T is substituted in a variable freq, and the process proceeds to s5_14_19.

In s5_14_19, information for a variable v2 in a high-level description is denoted to be v. The contents of v are denoted to be (a variable name, a correspondence FF name, the value of lat and the value of freq). v is stored in a set Var. Then, the process proceeds to s5_14_11.

In s5_14_20, the value set to −i of a command script throughput generated in the above "input/output correspondence setting generation process targeted for the Pipeline synthesis RTL" is stored in th, and the process proceeds to s5_14_21.

In s5_14_21, a synthesis resultant RTL is read, and the process proceeds to s5_14_22.

In s5_14_22, it is determined whether the set F1 is empty. If it is determined to be empty, then the process proceeds to s5_14_26. If it is determined not to be empty, then the process proceeds to s5_14_23.

In s5_14_23, one f1∈F1 is taken and F1 is set to be F1=F1−{f1}. Then, the process proceeds to s5_14_24.

In s5_14_24, an output variable for the output value of f1 is added to its corresponding RTL description, and the process proceeds to s5_14_25.

In s5_14_25, an assignment statement to f1 is identified, and an assignment description from f1 to a newly inserted corresponding output variable is added to the RTL description immediately after its identification. Then, the process proceeds to s5_14_22.

In s5_14_26, the method of the non-patent document <2> is applied and thereby a symbolic Sim in the RTL description is performed. The process proceeds to s5_14_27.

In s5_14_27, it is determined whether the set F2 is empty. If it is determined to be empty, then the process proceeds to s5_14_33. If it is determined not to be empty, then the process proceeds to s5_14_28.

In s5_14_28, one f2∈F2 is taken and F2 is set to be F2=F2−{f2}. Then, the process proceeds to s5_14_29.

In s5_14_29, a symbolic Sim output result corresponding to f2 is identified, and the process proceeds to s5_14_30.

In s5_14_30, a cycle number from a reset process to a cycle in which a first change in signal value occurs, is stored in a variable lat, and the process proceeds to s5_14_31.

In s5_14_31, the value of the is stored in its corresponding variable freq, and the process proceeds to s5_14_32.

In s5_14_32, information relative to f2 being an FF of a synthesis resultant RTL is denoted to be f. The contents of f are denoted to be (an FF name, information about the presence or absence of a loop, the value of lat and the value of freq). f is stored in its corresponding set F. Then, the process proceeds to s5_14_27.

In s5_14_33, it is determined whether the set F is empty. If it is determined to be empty, then the process is terminated. If it is determined not to be empty, then the process proceeds to s5_14_34.

In s5_14_34, one f∈F is taken and F is set to be F=F−{f}. Then, the process proceeds to s5_14_35.

In s5_14_35, a variable v∈Var of a high level corresponding to f is identified, and Var is set to be Var=Var−{v}. Then, the process proceeds to s5_14_36.

In s5_14_36, it is determined from the loop presence/absence information of f whether f is an FF having a feedback loop. If it is determined that the loop is included, then the process proceeds to s5_14_37. If it is determined not to be so, then the process proceeds to s5_14_39.

In s5_14_37, the value of lat of f and the value of freq of f are added to information of f in the loop-existing variable one-to-one correlation information as a Latency value and a Throughput value respectively. Then, the process proceeds to s5_14_38.

In s5_14_38, the value of lat of v and the value of freq of v are added to information of v in the loop-existing variable one-to-one correlation information as a Latency value and a Throughput value respectively. Then, the process proceeds to s5_14_33.

In s5_14_39, the value of lat of f and the value of freq of f are added to information of f in the loop-free variable one-to-one correlation information as a Latency value and a Throughput value respectively. Then, the process proceeds to s5_14_40.

In s5_14_40, the value of lat of v and the value of freq of v are added to information of v in the loop-free variable one-to-one correlation information as a Latency value and a Throughput value respectively. Then, the process proceeds to s5_14_33.

<<Detailed Flow of s5_15 in Verification Script Alteration Process>>

Figure 88:
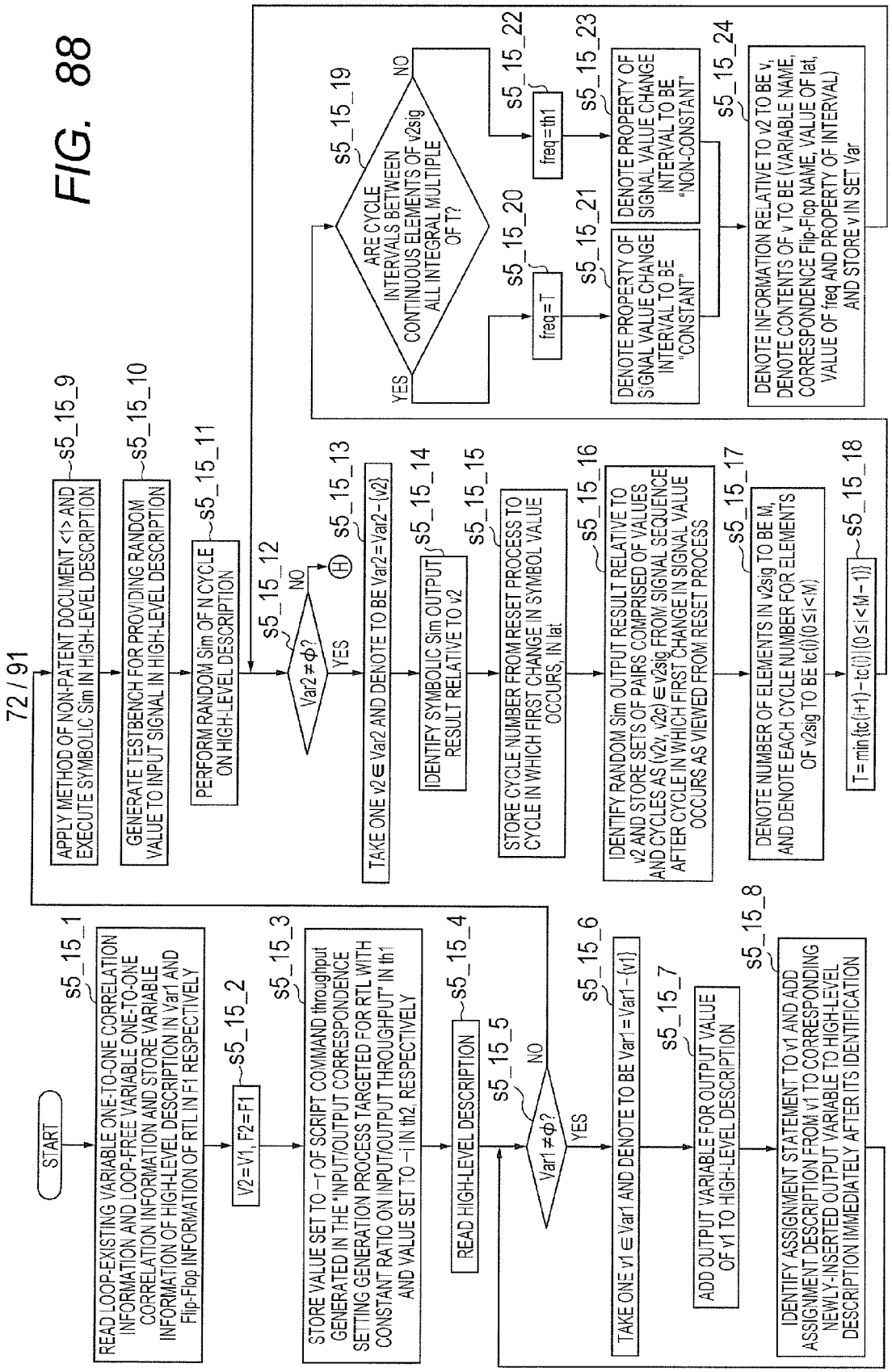
FIG. 88 is a flowchart illustrating a part from the start of a one-to-one correspondence variable/FF-based cycle information extraction process targeted for an input/output throughput ratio constant RTL in s5_15.
Figure 89:
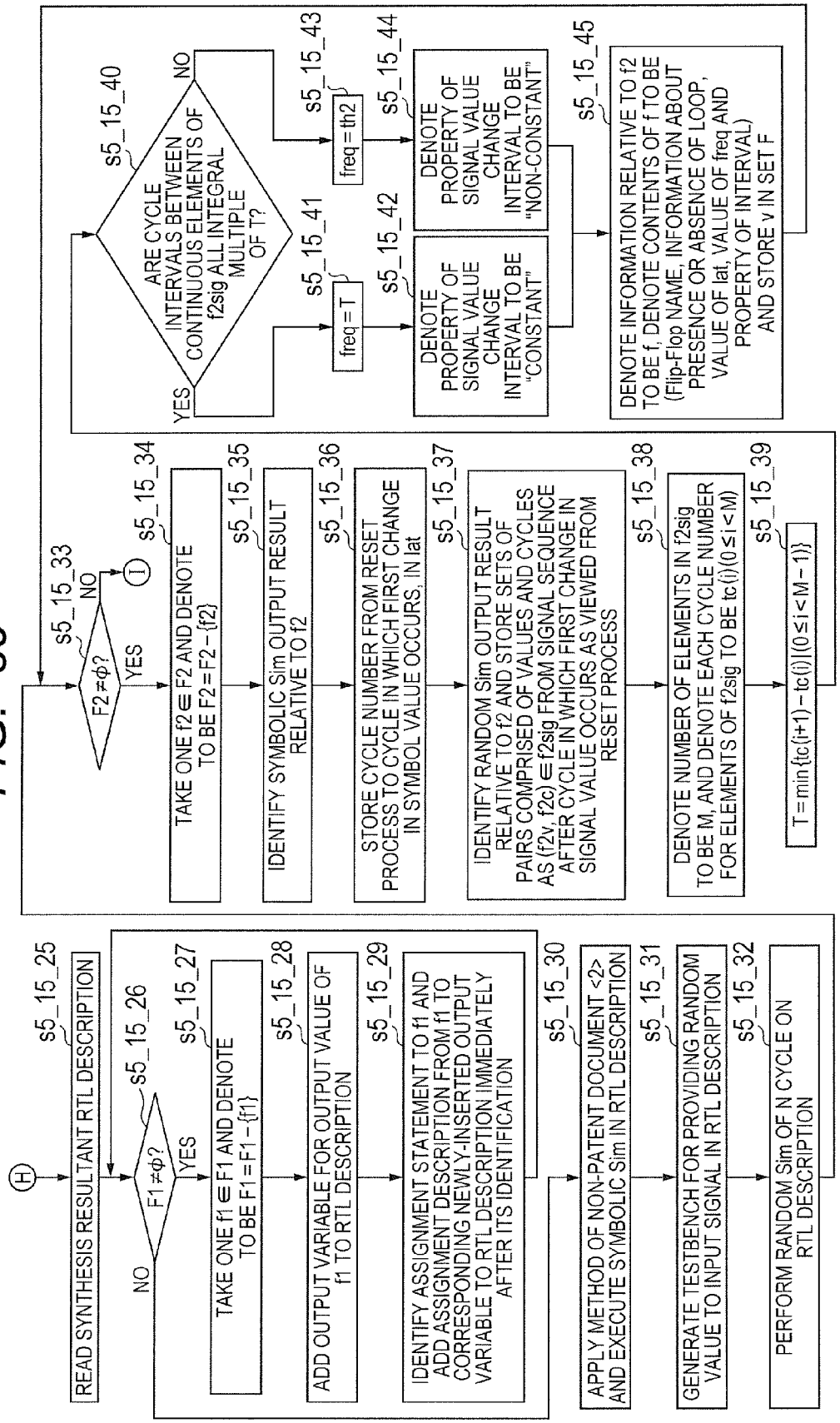
FIG. 89 is a flowchart illustrating a process following FIG. 88.
Figure 90:
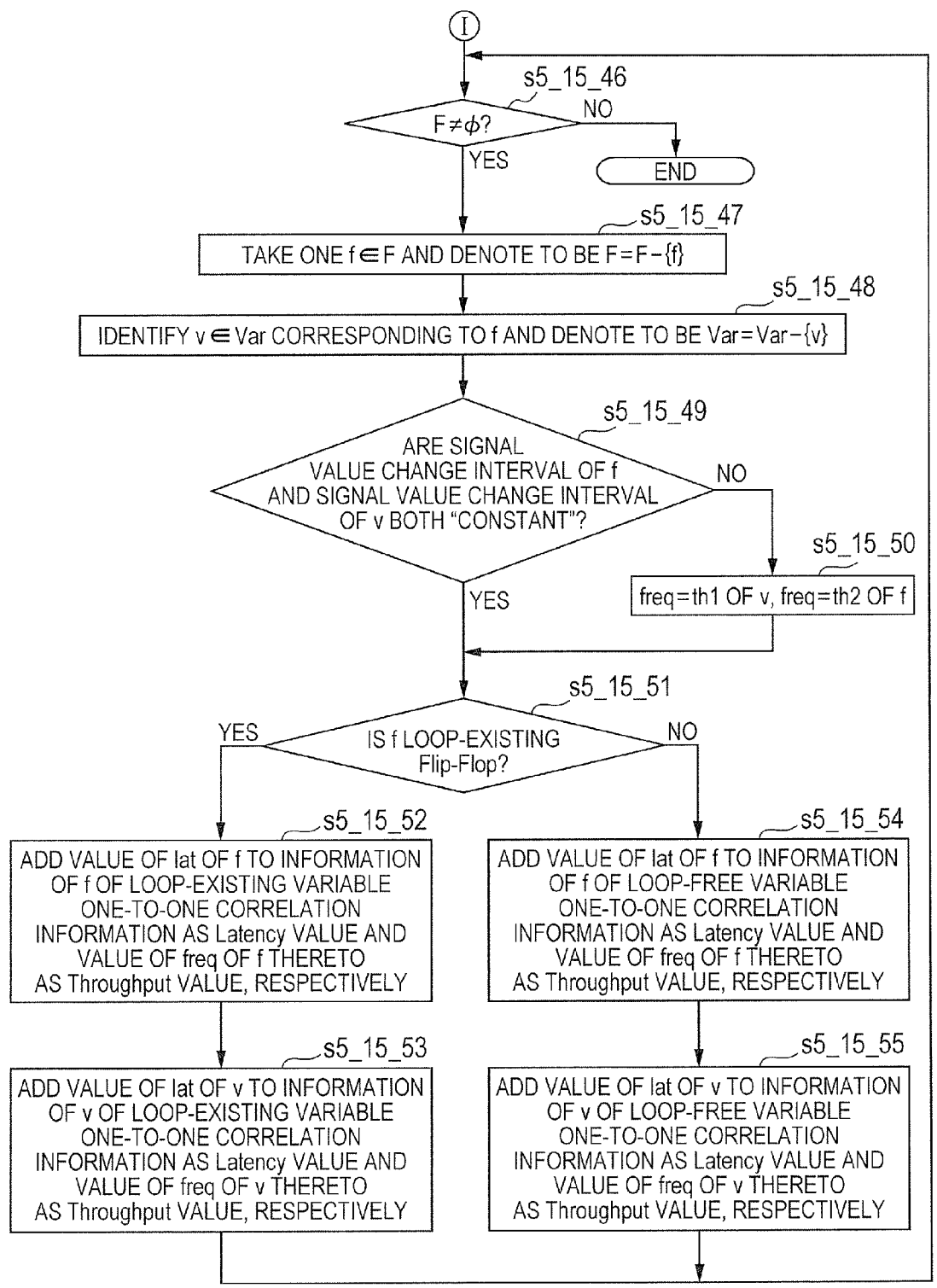
FIG. 90 is a flowchart illustrating a process up to completion, following FIG. 89.

A partial process flow from the start of the "one-to-one correspondence variable/FF-based cycle information extraction process targeted for the input/output throughput ratio constant RTL" in s5_15 is illustrated in FIG. 88. A process flow following FIG. 88 is illustrated in FIG. 89. A process flow leading to the completion of the above process, following FIG. 89 is illustrated in FIG. 90. The contents in respective steps are as follows:

In s5_15_1, loop-existing variable one-to-one correlation information and loop-free variable one-to-one correlation information are read. Variable information of each high-level description is stored in a set variable Var1, and FF information of each RTL is stored in a set variable F1. Then, the process proceeds to s5_15_2.

In s5_15_2, Var1 is substituted in a set variable Var2 and F1 is substituted in F2, respectively. Then, the process proceeds to s5_15_3.

In s5_15_3, the value set to −r of a script command throughput generated in the above "input/output correspondence setting generation process targeted for the input/output throughput ratio constant RTL" is stored in th1, and the value set to −i thereof is stored in th2, respectively. Then, the process proceeds to s5_15_4.

In s5_15_4, a high-level description is read, and the process proceeds to s5_15_5.

In s5_15_5, it is determined whether the set Var1 is empty. If it is determined to be empty, then the process proceeds to s5_15_9. If it is determined not to be empty, then the process proceeds to s5_15_6.

In s5_15_6, one v1∈Var1 is taken and Var1 is set to be Var1=Var1−{v1}. Then, the process proceeds to s5_15_7.

In s5_15_7, an output variable for the output value of v1 is added to the high-level description, and the process proceeds to s5_15_8.

In s5_15_8, an assignment statement to v1 is identified, and an assignment description from v1 to a newly inserted corresponding output variable is added to the high-level description immediately after its identification. Then, the process proceeds to s5_15_5.

In s5_15_9, the method of the non-patent document <1> is applied and thereby a symbolic Sim in a high-level description is carried out. Then, the process proceeds to s5_15_10.

In s5_15_10, a testbench for providing a random value to each input signal in the high-level description is generated, and the process proceeds to s5_15_11.

In s5_15_11, an N cycle-based random Sim is performed on the high-level description, and the process proceeds to s5_15_12.

In s5_15_12, it is determined whether the set Var2 is empty. If it is determined to be empty, then the process proceeds to s5_15_25. If it is determined not to be empty, then the process proceeds to s5_15_13.

In s5_15_13, one v2∈Var2 is taken and Var2 is set to be Var2=Var2−{v2}. Then, the process proceeds to s5_15_14.

In s5_15_14, a symbolic Sim output result corresponding to v2 is identified, and the process proceeds to s5_15_15.

In s5_15_15, a cycle number from a reset process to a cycle in which a first change in symbolic value occurs, is stored in a variable lat, and the process proceeds to s5_15_16.

In s5_15_16, a random Sim result corresponding to v2 is identified. Sets of pairs of values and cycles are stored as (v2v,v2c)∈v2sig from each signal sequence after a cycle in which a first change in signal value occurs as viewed from a reset process. Then, the process proceeds to s5_15_17.

In s5_15_17, the number of elements in v2sig is denoted to be M, and each cycle number for the elements in v2sig is denoted to be tc(i)(0≤i<M). Then, the process proceeds to s5_15_18.

In s5_15_18, the minimum value (min{(tc(i+1)−tc(i)| (0≤i<M−1))}) of each cycle interval between the continuous elements is substituted in a variable T. Then, the process proceeds to s5_15_19.

In s5_15_19, it is determined whether cycle intervals between the continuous elements in v2sig are all an integral multiple of T or not. If it is determined to be so, then the process proceeds to s5_15_20. If it is determined not to be so, then the process proceeds to s5_15_22.

In s5_15_20, the value of the variable T is substituted in a variable freq, and the process proceeds to s5_15_21.

In s5_15_21, the property of a cycle interval for a change in signal value is denoted to be "constant", and the process proceeds to s5_15_24.

In s5_15_22, the value of th1 is substituted in a variable freq, and the process proceeds to s5_15_23.

In s5_15_23, the property of a cycle interval for a change in signal value is denoted to be "non-constant", and the process proceeds to s5_15_24.

In s5_15_24, information for a variable v2 in a high-level description is denoted to be v. The contents of v are denoted to be (a variable name, a correspondence FF name, the value of lat, the value of freq and the property of a symbolic value change interval). v is stored in a set Var. Then, the process proceeds to s5_15_12.

In s5_15_25, a synthesis resultant RTL is read, and the process proceeds to s5_15_26.

In s5_15_26, it is determined whether the set F1 is empty. If it is determined to be empty, then the process proceeds to s5_15_30. If it is determined not to be empty, then the process proceeds to s5_15_27.

In s5_15_27, one f1∈F1 is taken and F1 is set to be F1=F1−{f1}. Then, the process proceeds to s5_15_28.

In s5_15_28, an output variable for the output value of f1 is added to its corresponding RTL description, and the process proceeds to s5_15_29.

In s5_15_29, an assignment statement to f1 is identified, and an assignment description from f1 to a newly inserted corresponding output variable is added to the RTL description immediately after its identification. Then, the process proceeds to s5_15_26.

In s5_15_30, the method described in the document "Michael Case, Alan Mishchenko, and Robert Brayton, "Cut-Based Inductive Invariant Computation," In Proc. of IWLS, pp. 253-258, 2008." is applied, and thereby a symbolic Sim in an RTL description is performed. Then, the process proceeds to s5_15_31.

In s5_15_31, a testbench for providing a random value to each input signal in the RTL description is generated, and the process proceeds to s5_15_32.

In s5_15_32, an N cycle-based random Sim is performed on the RTL description, and the process proceeds to s5_15_33.

In s5_15_33, it is determined whether the set F2 is empty. If it is determined to be empty, then the process proceeds to s5_15_46. If it is determined not to be empty, then the process proceeds to s5_15_34.

In s5_15_34, one f2∈F2 is taken and F2 is set to be F2=F2−{f2}. Then, the process proceeds to s5_15_35.

In s5_15_35, a symbolic Sim output result corresponding to f2 is identified, and the process proceeds to s5_15_36.

In s5_15_36, a cycle number from a reset process to a cycle in which a first change in signal value occurs, is stored in a variable lat, and the process proceeds to s5_15_37.

In s5_15_37, a random Sim output result corresponding to f2 is identified. Sets of pairs of values and cycles are stored as (f2v,f2c)∈f2sig from each signal sequence after a cycle in which a first change in signal value occurs as viewed from a reset process. Then, the process proceeds to s5_15_38.

In s5_15_38, the number of elements in f2sig is denoted to be M, and each cycle number for the elements in f2sig is denoted to be tc(i)(0≤i<M). Then, the process proceeds to s5_15_39.

In s5_15_39, the minimum value (min{(tc(i+1)−tc(i)| (0≤i<M−1))}) of each cycle interval between the continuous elements is substituted in a variable T. Then, the process proceeds to s5_15_40.

In s5_15_40, it is determined whether cycle intervals between the continuous elements in f2sig are all an integral multiple of T or not. If it is determined to be so, then the process proceeds to s5_15_41. If it is determined not to be so, then the process proceeds to s5_15_43.

In s5_15_41, the value of the variable T is substituted in a variable freq, and the process proceeds to s5_15_42.

In s5_15_42, the property of a cycle interval for a change in signal value is denoted to be "constant", and the process proceeds to s5_15_45.

In s5_15_43, the value of th2 is substituted in a variable freq, and the process proceeds to s5_15_44.

In s5_15_44, the property of a cycle interval for a change in signal value is denoted to be "non-constant", and the process proceeds to s5_15_45.

In s5_15_45, information for a variable v2 being an FF of the synthesis resultant RTL is denoted to be f. The contents of f are denoted to be (an FF name, information about the presence or absence of a loop, the value of lat, the value of freq and the property of a symbolic value change interval). f is stored in its corresponding set F. Then, the process proceeds to s5_15_33.

In s5_15_46, it is determined whether the set F is empty. If it is determined to be empty, then the process is terminated. If it is determined not to be empty, then the process proceeds to s5_15_47.

In s5_15_47, one f∈F is taken and F is set to be F=F−{f}. Then, the process proceeds to s5_15_48.

In s5_15_48, a variable v∈Var of a high level corresponding to f is identified, and Var is set to be Var=Var−{v}. Then, the process proceeds to s5_15_49.

In s5_15_49, it is determined whether the symbolic value change interval of f and the symbolic value change interval of v are both "constant" or not. If it is determined that they are constant, then the process proceeds to s5_15_50. If it is determined that they are not constant, then the process proceeds to s5_15_51.

In s5_15_50, the value of th1 and the value of th2 are respectively substituted in freq of v and freq of f. Then, the process proceeds to s5_15_51. It is determined from the loop presence/absence information of f in s5_15_51 whether f is an FF having a feedback loop. If it is determined to have the loop, then the process proceeds to s5_15_52. If it is determined not to have it, then the process proceeds to s5_15_54.

In s5_15_52, the value of lat of f and the value of freq of f are added to information of f in the loop-existing variable one-to-one correlation information as a Latency value and a Throughput value respectively. Then, the process proceeds to s5_15_53.

In s5_15_53, the value of lat of v and the value of freq of v are added to information of v in the loop-existing variable one-to-one correlation information as a Latency value and a Throughput value respectively. Then, the process proceeds to s5_15_46.

In s5_15_54, the value of lat of f and the value of freq of f are added to information of f in the loop-free variable one-to-one correlation information as a Latency value and a Throughput value respectively. Then, the process proceeds to s5_15_55.

In s5_15_55, the value of lat of v and the value of freq of v are added to information of v in the loop-free variable one-to-one correlation information as a Latency value and a Throughput value respectively. Then, the process proceeds to s5_15_46.

<<Detailed Flow of s5_16 in Verification Scrip Alteration Process>>

Figure 91:
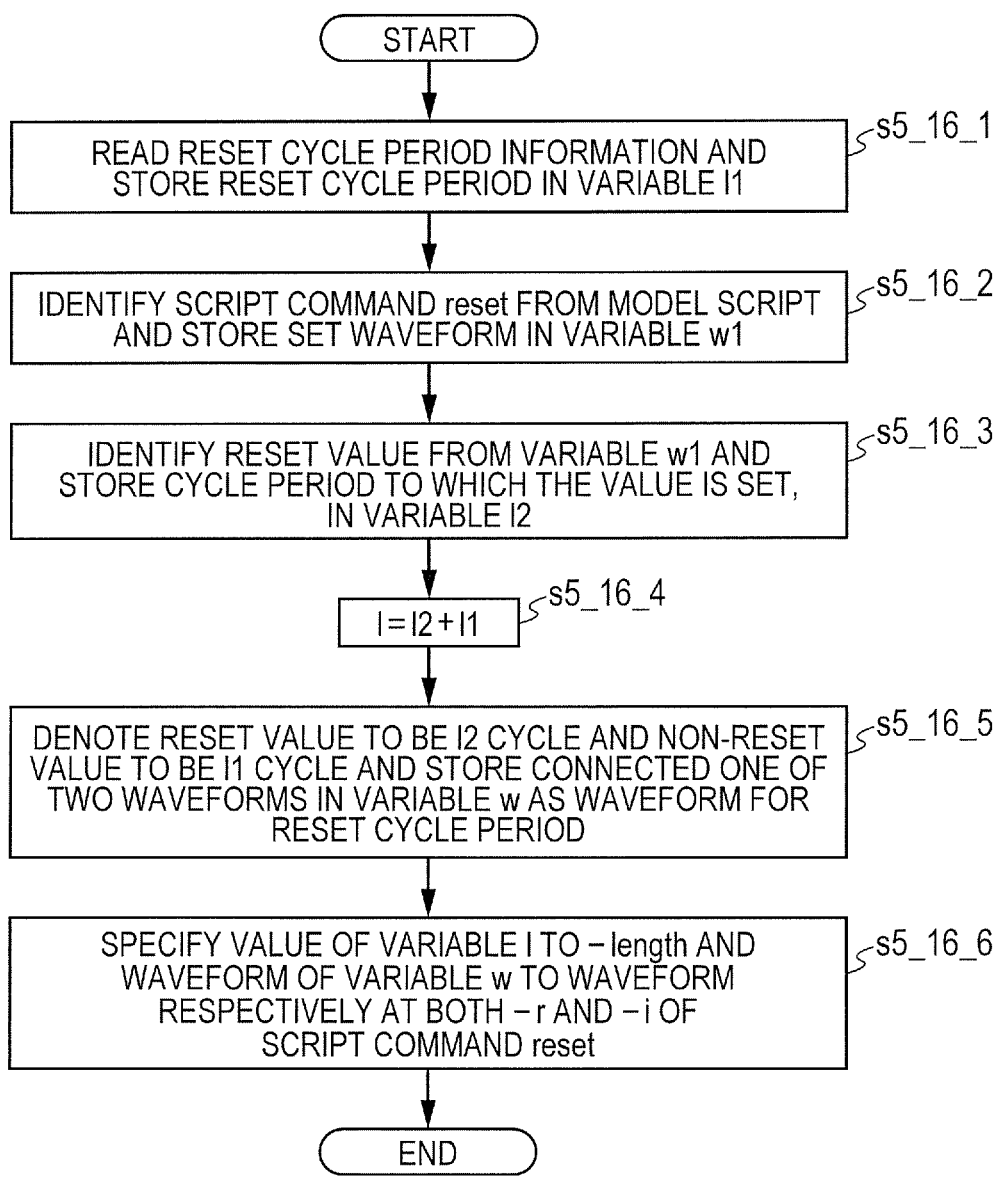
FIG. 91 is a flowchart illustrating a reset cycle period setting alteration process in s5_16.

A process flow for the "reset cycle period setting alteration process" in s5_16 is illustrated in FIG. 91. The contents in respective steps are as follows:

In s5_16_1, reset cycle period information is read, and a reset cycle period is stored in a variable l1. Then, the process proceeds to s5_16_2.

In s5_16_2, a script command reset of a model script is identified, and a set waveform is stored in a variable w1. Then, the process proceeds to s5_16_3.

In s5_16_3, a reset value is identified from the variable w1, and a cycle period in which the reset value is being set is stored in a variable l2. Then, the process proceeds to s5_16_4.

In s5_16_4, the value of l2+l1 is stored in a variable l, and the process proceeds to s5_16_5.

In s5_16_5, a reset value is denoted to be an l2 cycle, and a non-reset value is denoted to be an l1 cycle. A connected one of two waveforms is stored in a variable w. Then, the process proceeds to s5_16_6.

In s5_16_6, the value of the variable l is specified to −length, and the waveform of the variable w is specified as the waveform of the reset cycle period, respectively, at both of −r and −i of the script command reset. Then, the process is terminated.

<<Detailed Flow of s5_18 in Verification Script Alteration Process>>

Figure 92:
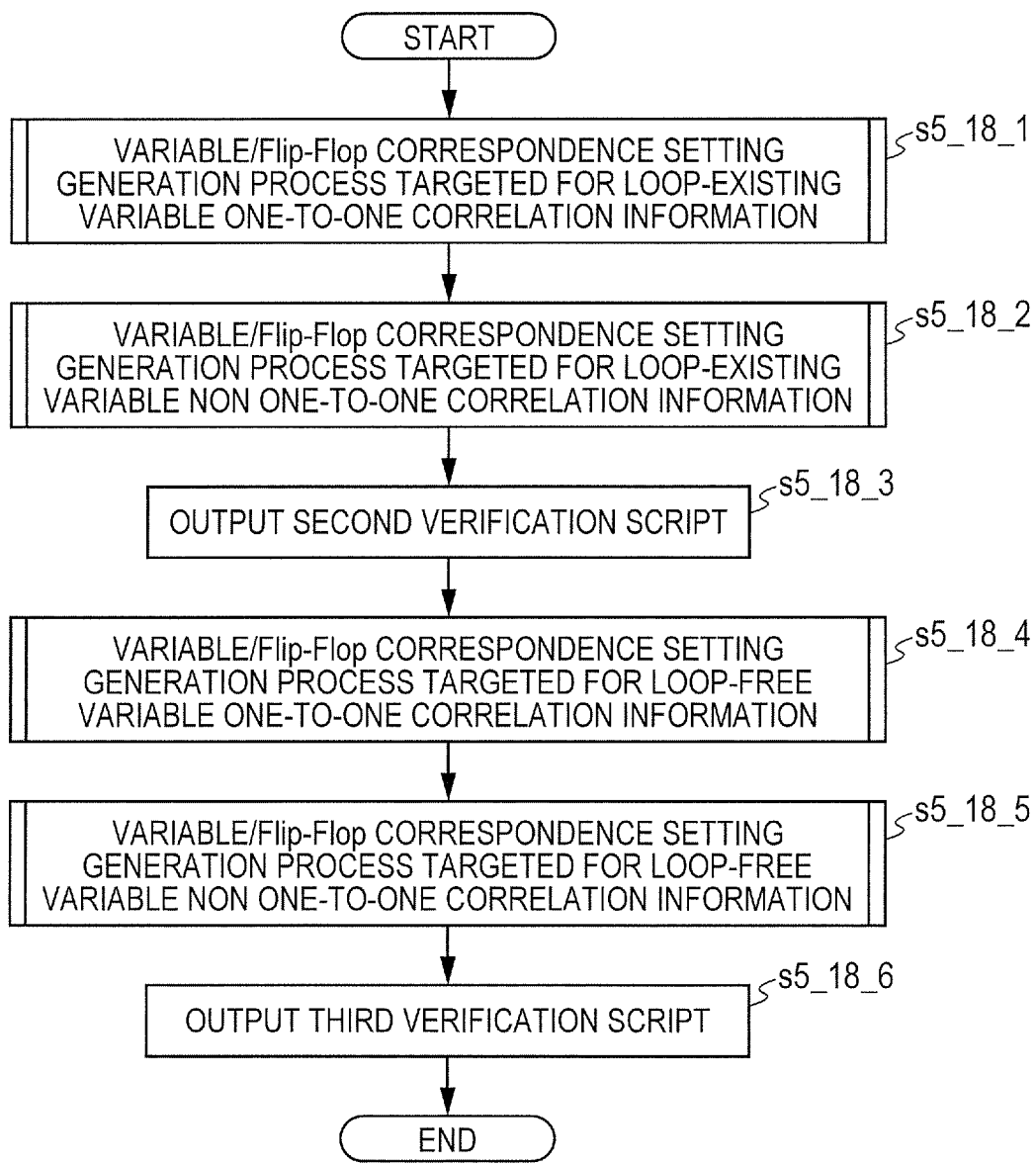
FIG. 92 is a flowchart illustrating a variable/FF correspondence setting generation process in s5_18.

A process flow for the "variable/FF correspondence setting generation process" in s5_18 is illustrated in FIG. 92. The contents in respective steps are as follows:

In s5_18_1, the "variable/FF correspondence setting generation process targeted for loop-existing variable one-to-one correlation information" is performed, and the process proceeds to s5_18_2.

In s5_18_2, the "variable/FF correspondence setting generation process for loop-existing variable non one-to-one correlation information" is performed, and the process proceeds to s5_18_3.

In s5_18_3, a script in which a loop-existing variable one-to-one correspondence setting and a loop-existing variable non one-to-one correspondence setting are added to a first verification script, is outputted as a second verification script. Then, the process proceeds to s5_18_4.

In s5_18_4, the "variable/FF correspondence setting generation process for loop-free variable one-to-one correlation information" is performed, and the process proceeds to s5_18_5.

In s5_18_5, the "variable/FF correspondence setting generation process for loop-free variable non one-to-one correlation information" is performed, and the process proceeds to s5_18_6.

In s5_18_6, a script in which a loop-free variable one-to-one correspondence setting and a loop-free variable non one-to-one correspondence setting are added to the second verification script, is outputted as a third verification script. Then, the process is terminated.

<<Detailed Flow of s5_18_1 in Verification Script Alteration Process>>

Figure 93:
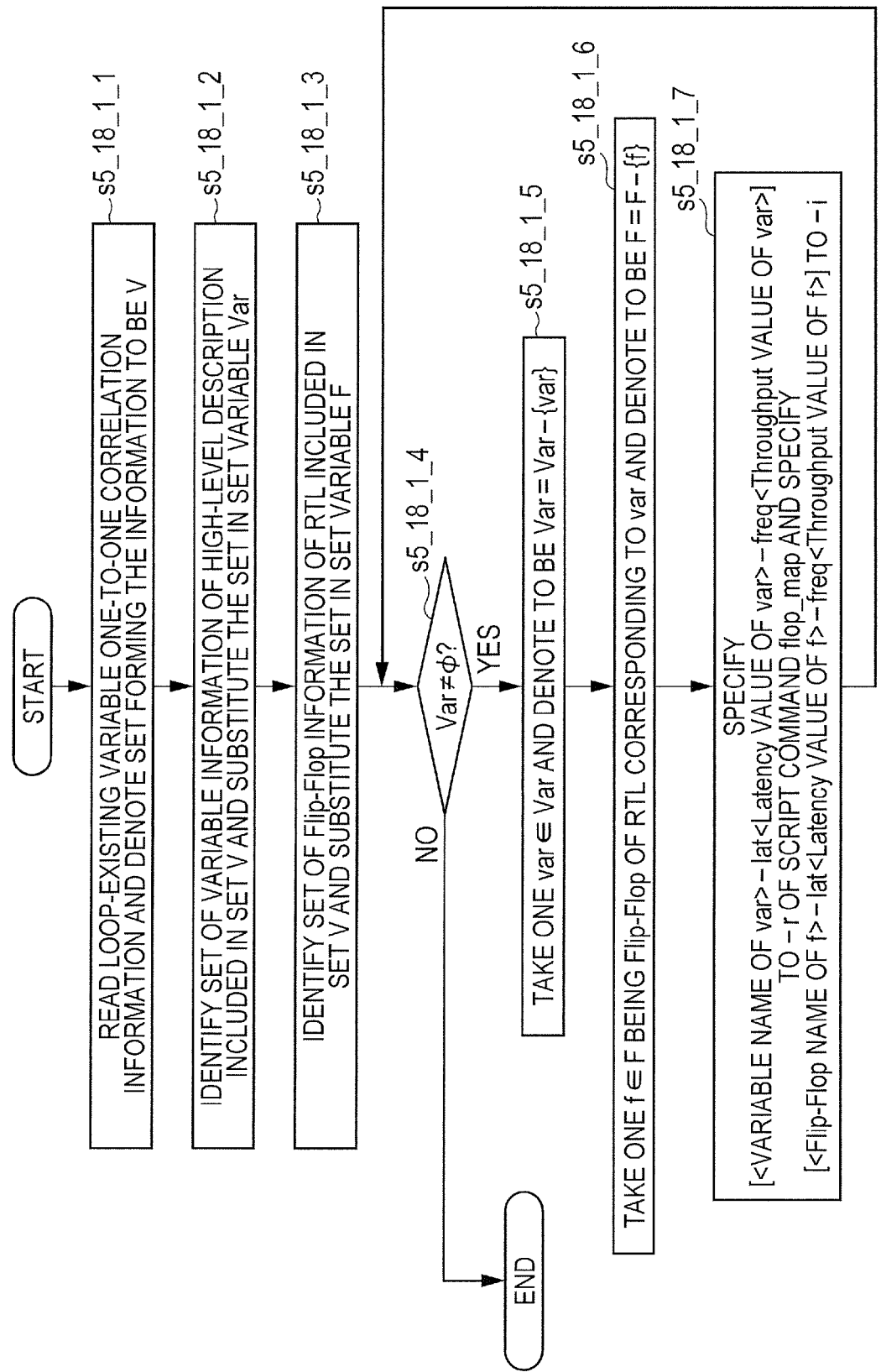
FIG. 93 is a flowchart illustrating a variable/FF correspondence setting generation process targeted for variable one-to-one correlation information with the existence of a loop in s5_18_1.

A process flow for the "variable/FF correspondence setting generation process targeted for loop-existing variable one-to-one correlation information" in s5_18_1 is illustrated in FIG. 93. The contents in respective steps are as follows:

In s5_18_1_1, loop-existing variable one-to-one correlation information is read, and a set that forms the information is denoted to be V. Then, the process proceeds to s5_18_1_2.

In s5_18_1_2, a set of variable information of each high-level description, included in the set V is identified, and the set thereof is substituted in a set variable Var. Then, the process proceeds to s5_18_1_3.

In s5_18_1_3, a set of FF information of each RTL, included in the set V is identified, and the set thereof is substituted in a set variable F. Then, the process proceeds to s5_18_1_4.

In s5_18_1_4, it is determined whether the set Var is empty. If it is determined to be empty, then the process is terminated. If it is determined not to be empty, then the process proceeds to s5_18_1_5.

In s5_18_1_5, one v∈Var is taken and Var is set to be Var=Var−{var}. Then, the process proceeds to s5_18_1_6.

In s5_18_1_6, one f∈F being an FF of an RTL corresponding to Var is taken, and F is set to be F=F−{f}. Then, the process proceeds to s5_19_1_7.

In s5_18_1_7, [<variable name of var>−lat<Latency value of var>−freq<Throughput value of var>] is specified to −r of a script command flop_map. [<FF name of f>−lat<Latency value of f>−freq<Throughput value of f>] is specified to −i thereof. Then, the process proceeds to s5_18_1_4.

<<Detailed Flow of s5_18_2 in Verification Script Alteration Process>>

Figure 94:
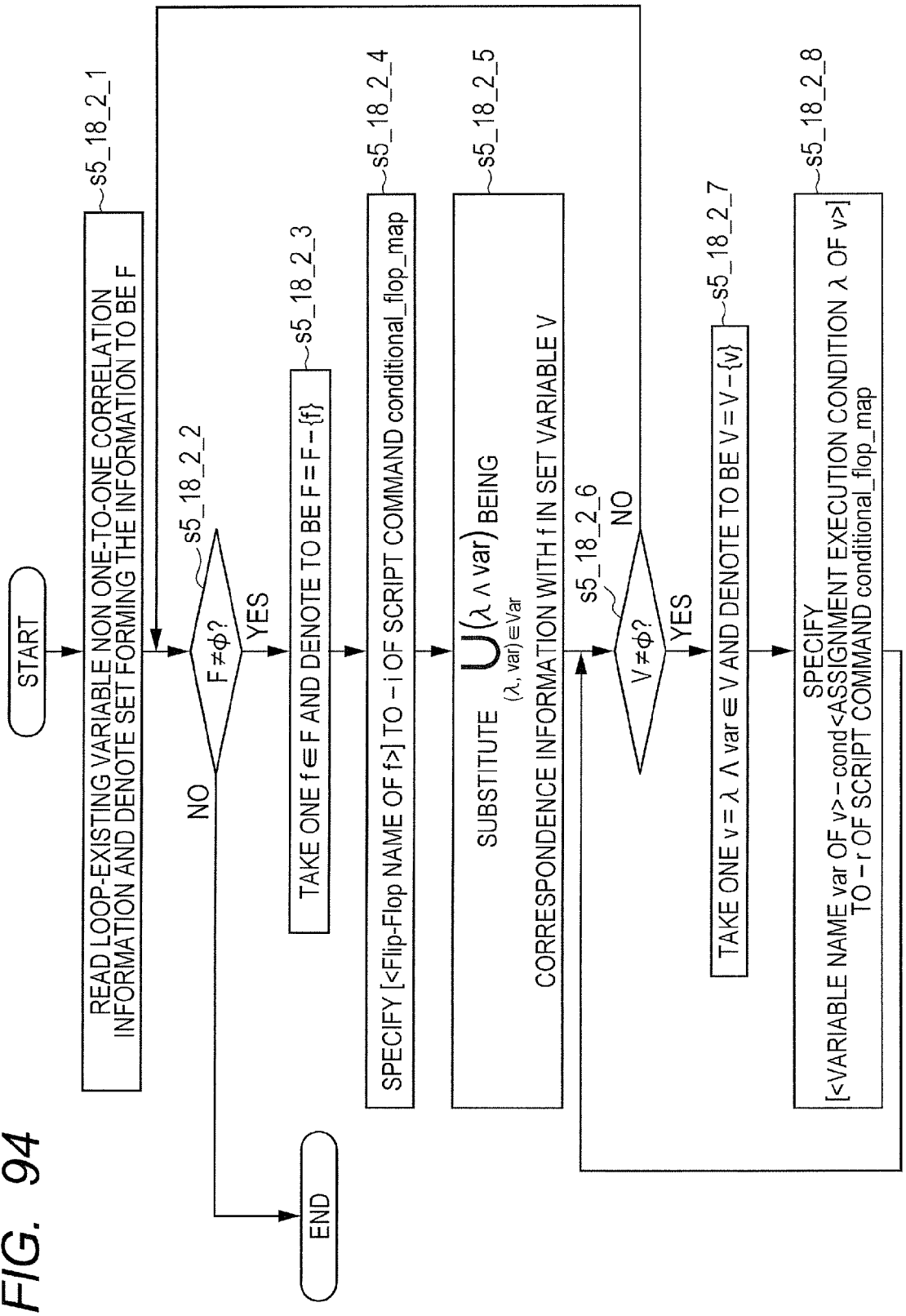
FIG. 94 is a flowchart illustrating a variable/FF correspondence setting generation process targeted for variable non one-to-one correlation information with the existence of a loop in s5_18_2.

A process flow for the "variable/FF correspondence setting generation process targeted for loop-existing variable non one-to-one correlation information" in s5_18_2 is illustrated in FIG. 94. The contents in respective steps are as follows:

In s5_18_2_1, loop-existing variable non one-to-one correlation information is read, and a set that forms the information is denoted to be F. Then, the process proceeds to s5_18_2_2.

In s5_18_2_2, it is determined whether the set F is empty. If it is determined to be empty, then the process is terminated. If it is determined not to be empty, then the process proceeds to s5_18_2_3.

In s5_18_2_3, one f∈F is taken, and F is set to be F=F−{f}. Then, the process proceeds to s5_18_2_4.

In s5_18_2_4, [<FF name of f> is specified to −i of a script command conditional_flop_map, and the process proceeds to s5_18_2_5.

In s5_18_2_5, information related to an expression (2) being correspondence information with f is substituted in a set variable V, and the process proceeds to s5_18_2_6.

$$f = \bigcup_{(\lambda, var) \in Var} (\lambda \wedge var) \quad (2)$$

In s5_18_2_6, it is determined whether the set V is empty. If it is determined to be empty, then the process proceeds to s5_18_2_2. If it is determined not to be empty, then the process proceeds to s5_18_2_7.

In s5_18_2_7, one v=λ∧var∈V is taken, and V is set to be V=V−{v}. Then, the process proceeds to s5_18_2_8.

In s5_18_2_8, [<variable name var of v>−cond<assignment execution condition λ of v>] is specified to −r of the script command conditional_flop_map. Then, the process proceeds to s5_18_2_6.

<<Detailed Flow of s5_18_4 in Verification Script Alteration Process>>

Figure 95:
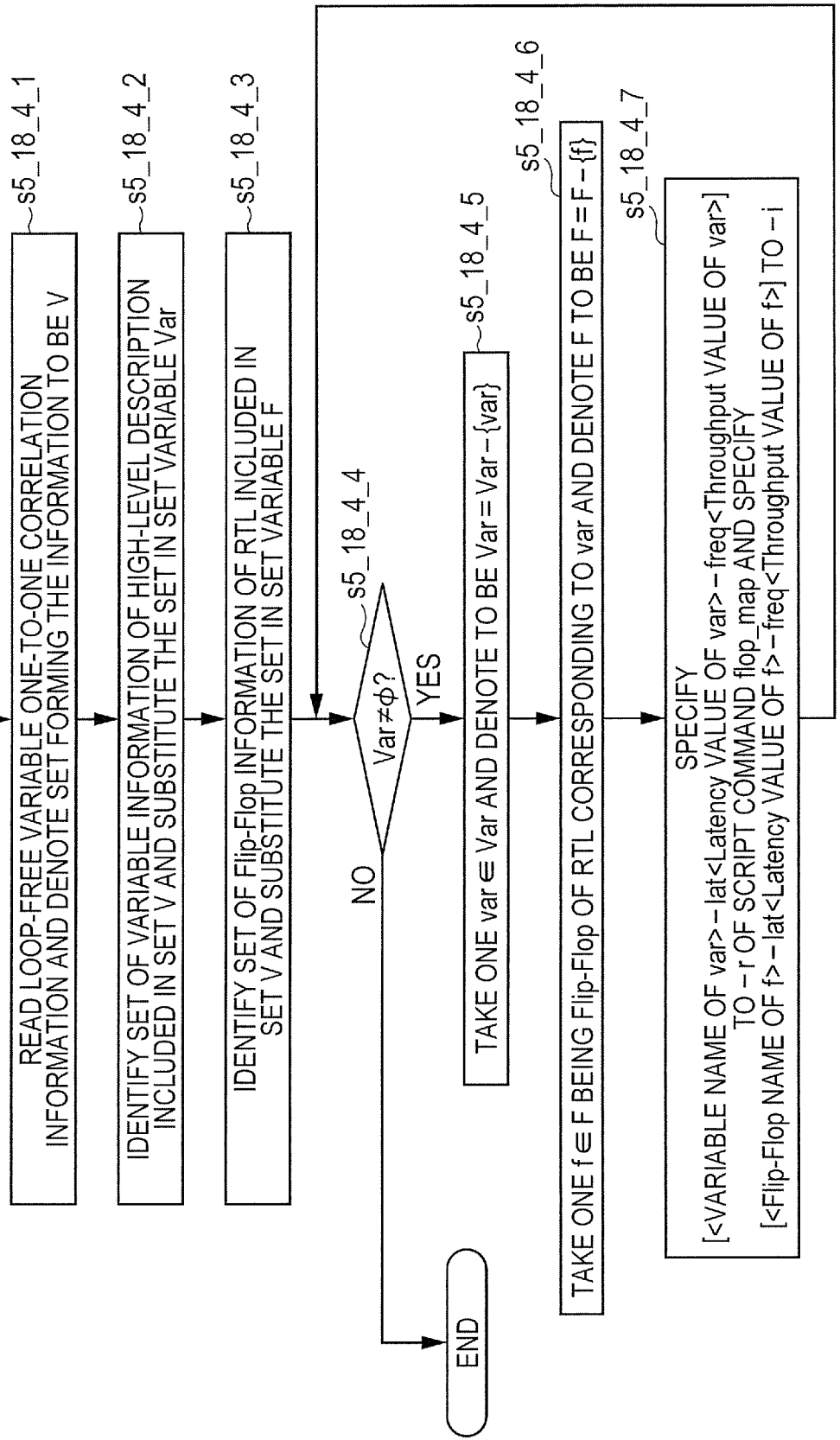
FIG. 95 is a flowchart illustrating a variable/FF correspondence setting generation process targeted for variable one-to-one correlation information free of a loop in s5_18_4.

A process flow for the "variable/FF correspondence setting generation process targeted for loop-free variable one-to-one correlation information" in s5_18_4 is illustrated in FIG. 95. The contents in respective steps are as follows:

In s5_18_4_1, loop-existing variable one-to-one correlation information is read, and a set that forms the information is denoted to be V. Then, the process proceeds to s5_18_4_2.

In s5_18_4_2, a set of variable information of each high-level description, included in the set V is identified, and the set thereof is substituted in a set variable Var. Then, the process proceeds to s5_18_4_3.

In s5_18_4_3, a set of FF information of each RTL, included in the set V is identified, and the set thereof is substituted in a set variable F. Then, the process proceeds to s5_18_4_4.

In s5_18_4_4, it is determined whether the set Var is empty. If it is determined to be empty, then the process is terminated. If it is determined not to be empty, then the process proceeds to s5_18_4_5.

In s5_18_4_5, one v∈Var is taken and Var is set to be Var=Var−{var}. Then, the process proceeds to s5_18_4_6.

In s5_18_4_6, one f∈F being an FF of an RTL corresponding to Var is taken, and F is set to be F=F−{f}. Then, the process proceeds to s5_19_4_7.

In s5_18_4_7, [<variable name of var>−lat<Latency value of var><Throughput value of var>] is specified to −r of a script command flop_map. [<FF name of f>−lat<Latency value of f><Throughput value of f>] is specified to −i thereof. Then, the process proceeds to s5_18_4_4.

<<Detailed Flow of s5_18_5 in Verification Script Alteration Process>>

Figure 96:
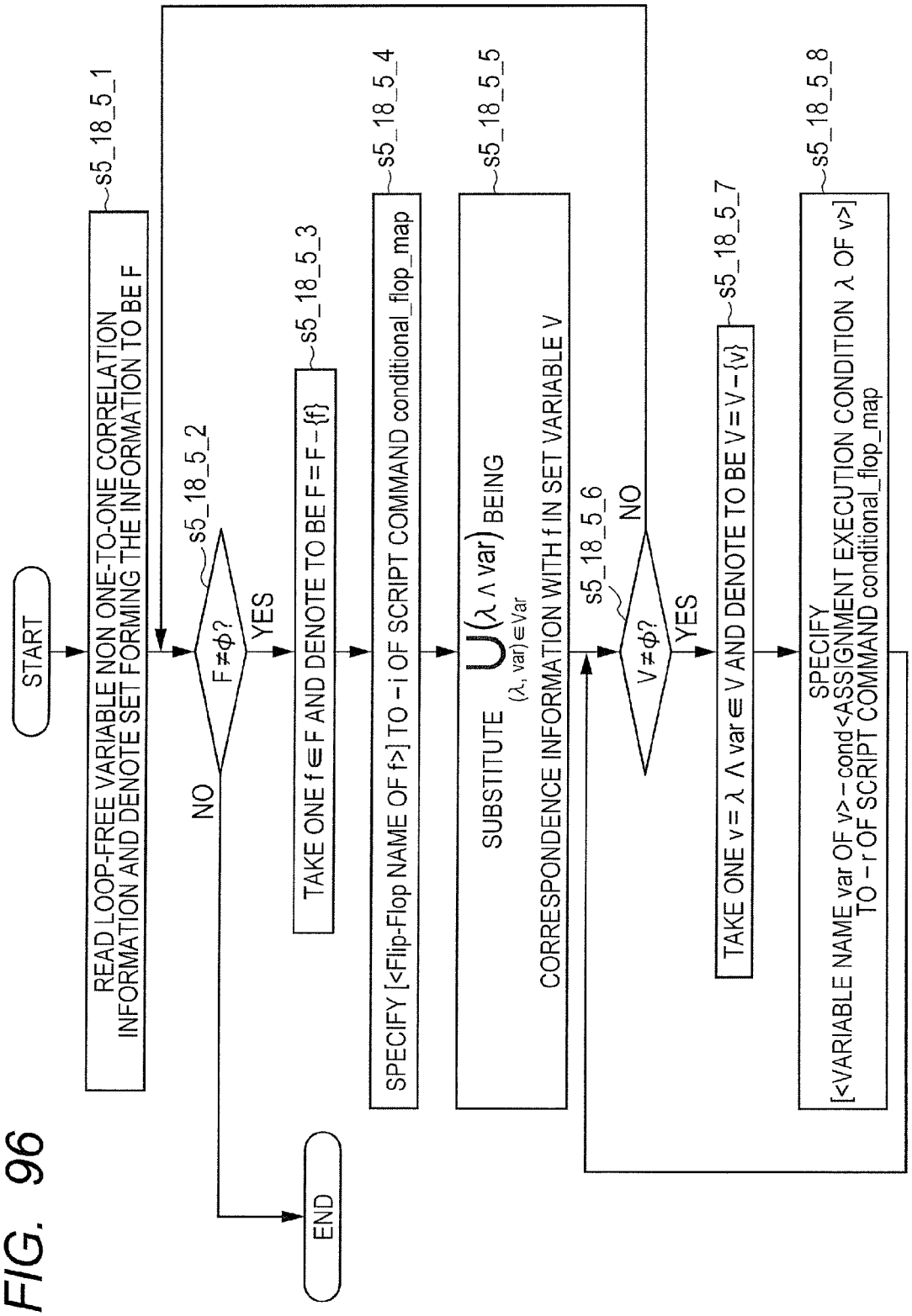
FIG. 96 is a flowchart illustrating a variable/FF correspondence setting generation process targeted for variable non one-to-one correlation information free of a loop in s5_18_5.

A process flow for the "variable/FF correspondence setting generation process targeted for loop-free variable non one-to-one correlation information" in s5_18_5 is illustrated in FIG. 96. The contents in respective steps are as follows:

In s5_18_5_1, loop-existing variable non one-to-one correlation information is read, and a set that forms the information is denoted to be F. Then, the process proceeds to s5_18_5_2.

In s5_18_5_2, it is determined whether the set F is empty. If it is determined to be empty, then the process is terminated. If it is determined not to be empty, then the process proceeds to s5_18_5_3.

In s5_18_5_3, one f∈F is taken, and F is set to be F=F−{f}. Then, the process proceeds to s5_18_5_4.

In s5_18_5_4, [<FF name of f> is specified to −i of a script command conditional_flop_map, and the process proceeds to s5_18_5_5.

In s5_18_5_5, the information expressed in the expression (2) being correspondence information with f is substituted in a set variable V, and the process proceeds to s5_18_5_6.

In s5_18_5_6, it is determined whether the set V is empty. If it is determined to be empty, then the process proceeds to s5_18_5_2. If it is determined not to be empty, then the process proceeds to s5_18_5_7.

In s5_18_5_7, one v=λ∧var∈V is taken, and V is set to be V=V−{v}. Then, the process proceeds to s5_18_5_8.

In s5_18_5_8, [<variable name var of v>−cond<assignment execution condition λ of v>] is specified to −r of the script command conditional_flop_map. Then, the process proceeds to s5_18_5_6.

2-5. Fifth Embodiment

Figure 97:
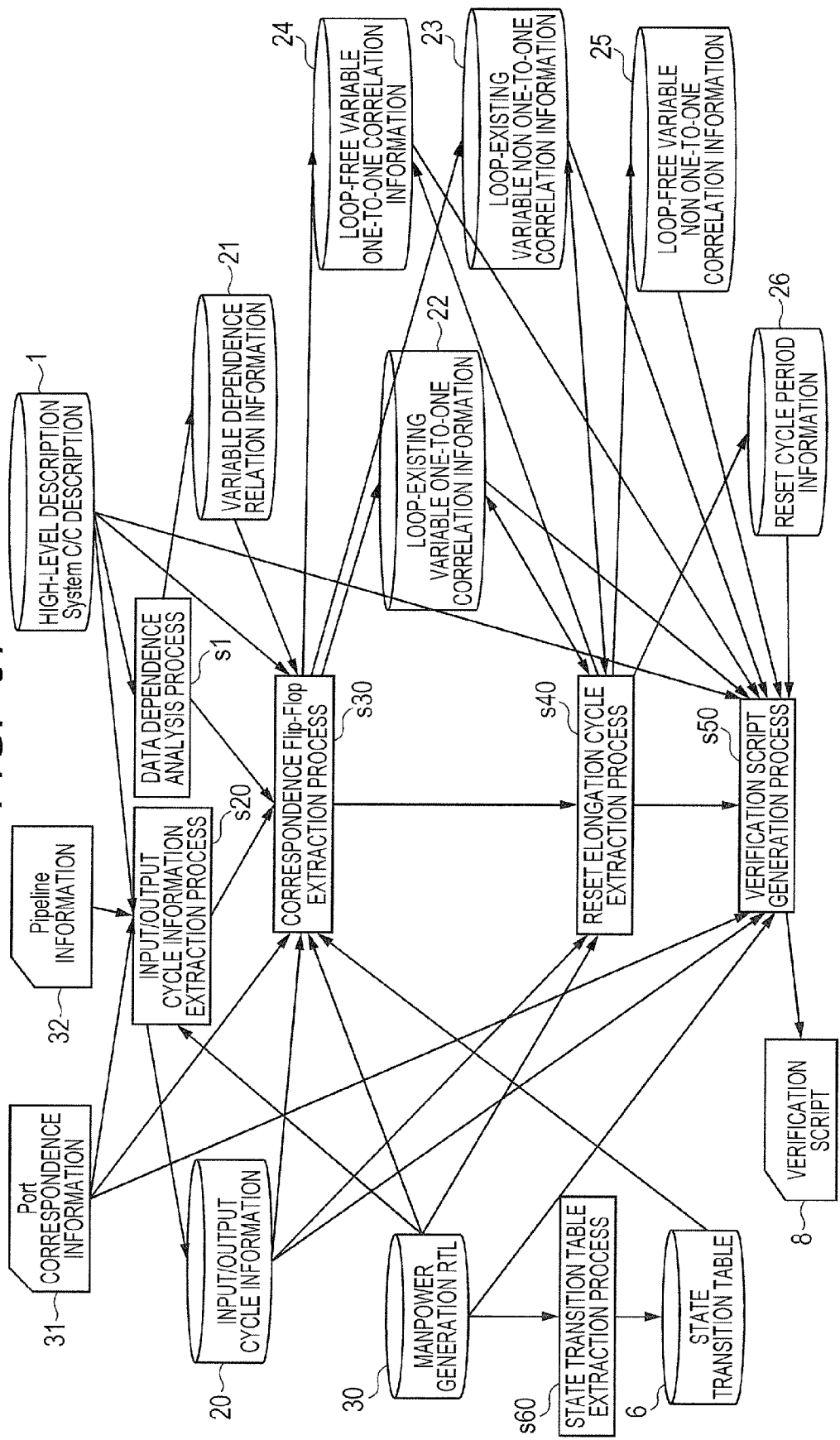
FIG. 97 is a flowchart illustrating the details of an information extraction process targeted for a high-level description and a manpower generation RTL.

The method described in each of the above embodiments is extensible in the following case. That is, it is the case where a high-level description and a manpower generation RTL are taken as targets. Namely, it is the case where an RTL that becomes functional equivalence is generated by manpower with a high-level description as a function model, and equivalence checking for both is performed (where the first embodiment is a more general case including a targeted RTL). The details of an information extraction process for such a case are illustrated in FIG. 97.

This case is premised on the following. That is, correlation information for input/output Ports, between a high-level description and a manpower generation RTL have been given. A state transition table is extractable from a manpower generation RTL 30 or the state transition table exists as a specification description. When an RTL description is of a two-process model, the extraction of the state transition table is easily implementable from the definition of the state transition table and the two-process model. Thus, a state transition table extraction process s60 from the two-process model RTL description may be added.

The differences between this case and the case where the behavioral synthesis resultant RTL described so far is targeted are as follows: Firstly, a model script for high level equivalence checking is not generated. Accordingly, the generation of model script information is required separately. Thus, the verification script alteration process is changed to a verification script generation process s50.

Secondly, a behavioral synthesis script and synthesis directive information necessary for the estimation of a synthesis resultant RTL circuit structure are not given. The acquisition of input/output cycle information by the manpower generation RTL 30 is required separately, but an estimated value can simultaneously be acquired upon the estimation of the structure of the manpower generation RTL by the "existing Sim-based equivalence checking method". There is a need to separately provide a means for estimating the circuit structure of the manpower generation RTL. Only case branching of either of the following may, however, basically be performed. The first is a cycle accurate synthesis RTL. In this case, there is a need to make a determination as to whether consistence is being made inclusive a cycle operation. In a correspondence FF extraction, a process in the cycle accurate synthesis RTL can be modified and diverted. The second is an RTL other than the above. In this case, it is possible for a correspondence FF extraction to modify and divert a process for an input/output throughput ratio constant/no-constant RTL.

<<Outline of Information Extraction Process>>

A description will be made of the outline of the information extraction process illustrated in FIG. 97.

In a data dependence analysis process s1, a data dependence relation analysis for each variable is performed with a high-level description 1 as an input as with the case of FIG. 16. It is estimated whether each variable has the potential for being associated with an FF with a feedback loop in a synthesis resultant RTL. A result of its classification is stored in variable dependence relation information. Since this is exactly the same as the case of FIG. 16, a more detailed description thereof will be omitted.

In an input/output cycle information extraction process s20, Pipeline information 32, Port correspondence information 31 for the high-level description 1 and the manpower generation RTL 30, and the manpower generation RTL 30 are read. A random Sim is executed N cycles using the "existing Sim-based equivalence checking method". Thus, checking as to whether the manpower generation RTL 30 has a specified Pipeline architecture is executed where it is implemented as a Pipeline circuit. When it is not implemented as the Pipeline circuit, a determination as to whether it corresponds to a cycle accurate synthesis RTL and a determination as to whether it becomes an RTL in which a periodic input/output is conducted, are performed. Along with it, the estimation of throughput cycle numbers for respective input/output Ports in the high-level description and the manpower generation RTL from an execution sequence acquired by Sim is performed. These acquired information are stored in input/output cycle information 20. Incidentally, when inconsistency is found by the "existing Sim-based equivalence checking method", the present process is interrupted inclusive of subsequent processes at that time, and the "inconsistency" is returned as a verification result.

In the state transition table extraction process s60, the extraction of a state transition table 6 from the manpower generation RTL 30 is performed on the premise that the manpower generation RTL 30 is described in a two-process model. Since this implementation method is self-evident as shown in the definition of the state transition table, a more detailed description thereof will be omitted.

In a correspondence-FF extraction process s30, the high-level description 1, manpower generation RTL 30, variable dependence relation information 21, state transition table 6, Port correspondence information 31 and input/output cycle information 20 are read to thereby analyze a correlation between each variable in the high-level description 1 and each FF in the manpower generation RTL 30. Here, as to variables (hereinafter called loop-free variables) each having no potential for being associated with each FF with a feedback loop in the manpower generation RTL 30, whether or not each FF put in a one-to-one correspondence exists in each variable, is analyzed. If it exists therein, its correlation is stored in loop-free variable one-to-one correlation information. As to variables (hereinafter called loop-existing variables) each having the potential for being associated with each FF with a feedback loop in the manpower generation RTL 30, whether or not each FF placed in a one-to-one correspondence exists in each variable is first analyzed. If it exists therein, its correspondence relation is stored in loop-existing variable one-to-one correlation information. If the variables in which the FFs put in the one-to-one correspondence do not exist remain, attention is given to assignment conditions to FFs in the state transition table, and whether or not the FFs associated therewith with conditions exist is analyzed. If they exist, their correlations are stored in loop-existing variable non one-to-one correlation information. That is, the differences between the present case and the case of FIG. 16 reside only in two portions in an input/output cycle extraction process s20: the portion that needs to take into consideration a case in which the process is ended, and the portion that reads a manpower RTL instead of the synthesis resultant RTL.

In a reset elongation cycle extraction process s40, the manpower generation RTL 30, loop-existing variable one-to-one correlation information 22 and loop-exiting variable non one-to-one correlation information 23, and input/output cycle information 20 are taken as inputs. It is analyzed whether each feedback loop formed by FFs associated with loop-existing variables in the RTL description exists. If it is found to exist, then the minimum cycle number required to propagate values to all FFs in each feedback loop is determined. Of this cycle information, the maximum value is stored in reset cycle period information when the Pipeline circuit is not taken. In the case of the Pipeline circuit, the large one between the maximum value and the value of a latency cycle number −1 is stored in the reset cycle period information. On the other hand, when the feedback loop is not configured by the RTL, correlation information that variables thereof have are respectively stored in loop-free variable one-to-one correlation information 24 and loop-free variable non one-to-one correlation information 25. The variables are respectively deleted from loop-existing variable one-to-one correlation information 22 and loop-existing non one-to-one correlation information 23. That is, the differences between the present case and the case of FIG. 16 reside only in two portions in the input/output cycle extraction process s20: the portion that needs to take into consideration a case in which the process is ended, and the portion that reads the manpower RTL 30 instead of the synthesis resultant RTL.

In a verification script generation process s50, the high-level description 1, manpower generation RTL 30, Port correspondence information 31, input/output cycle information 20, four variable/FF correlation information (loop-existing variable non one-to-one correlation information 23, loop-existing variable one-to-one correlation information 22, loop-free variable non one-to-one correlation information 25, and loop-free variable one-to-one correlation information 24), and reset cycle period information are taken as inputs, and thereby a verification script is outputted.

<<Input/Output Cycle Information Extraction Process s20>>

The input/output cycle information extraction process s20 will be described.

The input/output cycle information extraction process s20 reads the Pipeline information 32, high-level description 1 and manpower generation RTL 30 and thereby perform the following processes.

Firstly, a throughput cycle number for each input/output in a high-level description is extracted. Incidentally, the following are included in the Pipeline information. One of them is information as to whether the manpower generation RTL is a Pipeline circuit. When the manpower generation RTL is of the Pipeline circuit, the following Pipeline architecture information are included. That is, they are Throughput/Latency information in the entire Pipeline circuit, Pipeline Stage information to which each input/output is assigned, and the same information as the synthesis restriction information for generating the Pipelining RTL in FIG. 16.

Secondly, a throughput cycle number for each input/output in a manpower generation RTL is extracted. Particularly when the manpower generation RTL is specified as being the Pipeline circuit, checking as to whether a behavior or operation contradictory to the Pipeline architecture information should be done, is performed by the "existing Sim-based equivalence checking method", based on Pipeline information. When the contradictory behavior is performed, checking is interrupted inclusive of subsequent processes at that time, and "Pipeline architecture specification inconsistency" is returned.

Thirdly, architecture information for manpower generation RTLs are extracted and classified as follows: A Pipeline RTL: an RTL having a fixed Throughput/Latency cycle in the entire circuit, a cycle accurate RTL: an RTL in which a consumption cycle from each input to each output in a high-level description is maintained, a periodic ratio constant RTL: an RTL in which each input/output throughput in a high-level description is constant, each input/output throughput in a manpower RTL is constant, and the ratio between respective throughput cycles becomes a constant value, and a periodic ratio non-constant RTL: an RTL other than above two.

<<Outline of Throughput Cycle Number Extraction Process for Input/Output in High-Level Description>>

In the output throughput cycle number extraction process in the high-level description, information to be extracted include Throughput cycle information (as to whether or not being constant) corresponding to each input/output, and Throughput cycle information (as to whether or not being constant) common to the full output/full input.

As to the acquisition of Throughput cycle information of each output, a synthesis script and a synthesis directive are changed to thereby modify it to the contents for performing a cycle accurate synthesis. Then, an input/output Throughput cycle information extraction process targeted for a cycle accurate synthesis RTL may be performed as it is. The present embodiment, however, discloses the method of performing the estimation of the Sim result from each input/output signal sequence, acquired by the "existing Sim-based equivalence checking method".

As to the output of input/output cycle information, Throughput cycle information (as to whether or not being constant) corresponding to each input/output, and Throughput cycle information (as to whether or not being constant) common to the full output/full input are outputted in a table format shown in FIG. 98. That is, the process of "acquisition of the throughput cycle information of each input/output variable targeted for the cycle accurate RTL" in FIG. 16 may be applied to the high-level description as it is.

<<Outline of Throughput Cycle Number Extraction Process for Output in Manpower Generation RTL>>

In the description of Japanese Unexamined Patent Publication No. 2009-230451, there has been disclosed the method (hereinafter called "existing Sim-based equivalence checking method" for checking by the random Sim whether each output signal sequence having the same value change is obtained in disregard for the cycles from each output pair in which the high-level description and the synthesis resultant RTL are placed in the correspondence relation, where the input signal sequence having the same value change is given to the high-level description and the RTL in disregard for the cycles.

Thus, the Port correspondence information, high-level description and manpower generation RTL are read and the method for high-level disclosed in Japanese Unexamined Patent Publication No. 2009-230451 is applied, whereby a change sequence of each input value and output value corresponding to N cycles can be acquired.

When the manpower generation RTL is specified as being a Pipeline circuit, it is checked based on Pipeline information whether a value change interval of each signal performs an operation contradictory to Pipeline architecture information. If a contradiction exists, "Pipeline architecture specification inconsistency" is returned. If no contradiction exists, input/output cycle information is extracted from the Pipeline architecture information by a procedure similar to the case of FIG. 16.

When it is not specified as the Pipeline circuit, it is determined whether the value change interval of each signal becomes constant. If it is determined to be constant, a resulting constant cycle number is denoted to be a throughput cycle number for the corresponding signal. The property thereof is denoted to be 'constant' and stored in its corresponding input/output cycle information.

On the other hand, when it is determined not to be constant, the greatest common divisor of a plurality of acquired cycle numbers is denoted to be a throughput cycle number for the corresponding signal. Its property is denoted to be 'non-constant' and stored in its corresponding input/output cycle information.

Incidentally, although a means for acquiring a change cycle of an input signal to an RTL description has not directly been described in Japanese Unexamined Patent Publication No. 2009-230451, a read cycle to an input FIFO group from the RTL is acquired, so that it can be identified as the change cycle of the input signal.

Sequences of respective input/output signals can be identified as a list format with (signal values and cycle numbers) taken as elements, in which the cycle numbers are arranged in ascending order, and such information is denoted to have been stored.

Particularly when the input/output operations in the high-level description and the RTL description completely coincide with each other in the random Sim using the method described in Japanese Unexamined Patent Publication No. 2009-230451, the RTL description is identified as a cycle accurate RTL.

When the properties of all inputs [outputs] are "constant", and Throughput cycle numbers are all identical to each other, the property of the full input[output] is denoted to be "constant", and its cycle number is denoted to be a Throughput cycle number for the full input[output]. If not so, the property of the full input[output] is denoted to be "non-constant", and the greatest common divisor of Throughput cycle numbers for all inputs[outputs] is denoted to be the Throughput cycle number for the full input[output].

Here, instead of the random Sim, a symbolic Sim method targeted for the high-level description and a symbolic Sim method targeted for an RTL description both shown in, for example, the documents "Alfred Koelbl and Carl Pixley, "Constructing Efficient Formal Models from High-Level Descriptions Using Symbolic Simulation," International Journal of Parallel Programming 33(6), pp. 645-666, 2005." and "Alfred Koelbl, James Kukula, and Robert Damiano, "Symbolic RTL simulation," In Proc. of DAC, 2001" may be amalgamated to perform a symbolic Sim. When the symbolic Sim is used, the execution time becomes longer, but the accuracy in the above determination is improved.

Incidentally, the format of FIG. 99 can be adopted as the format of storage of each throughput cycle number.

<<Details of Input/Output Cycle Information Extraction Process s20>>

Figure 100:
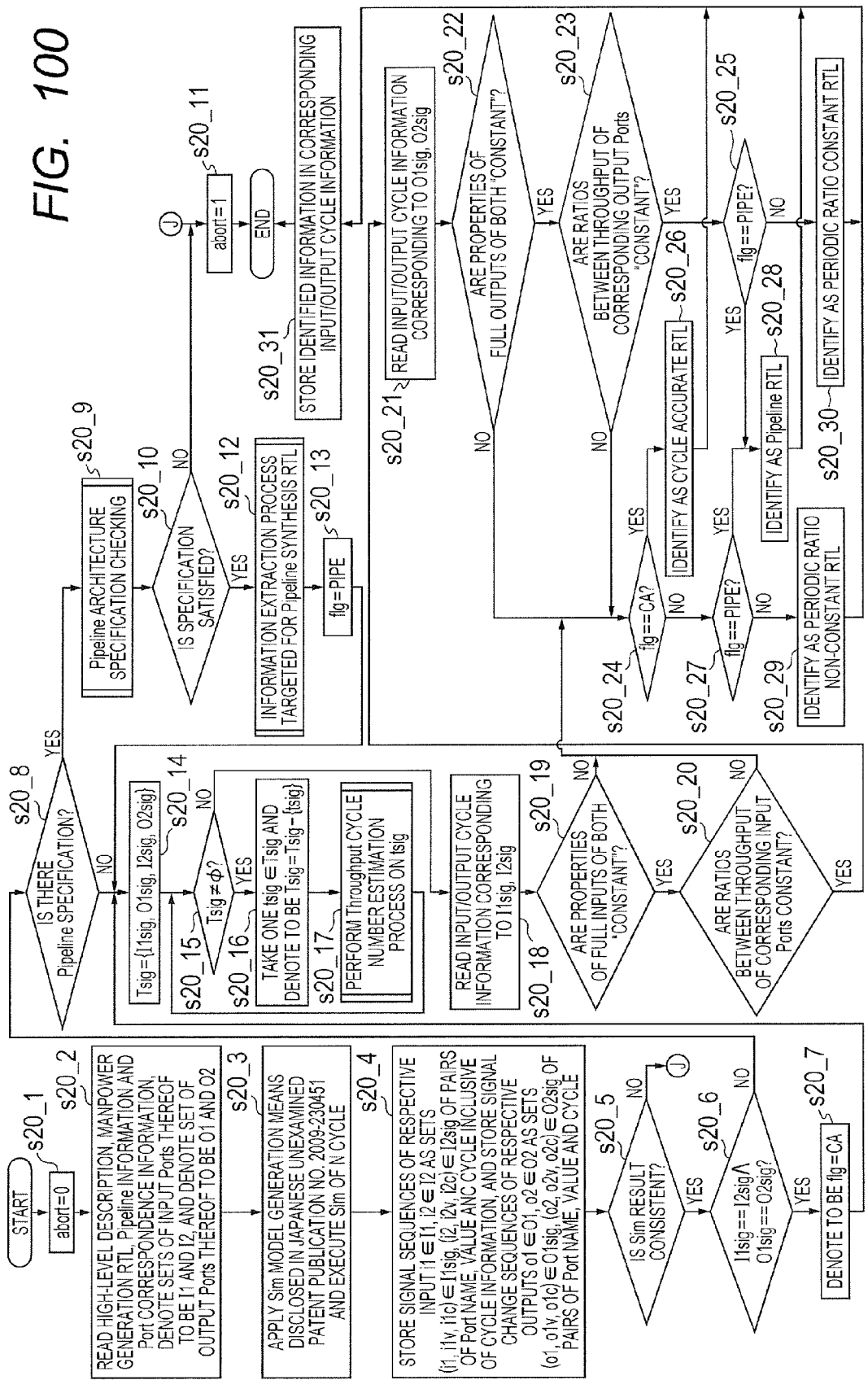
FIG. 100 is a flowchart illustrating a detailed process of an input/output cycle information extraction process s20.

A detailed flow for the input/output cycle information extraction process s20 is illustrated in FIG. 100. The contents in respective steps are as follows:

In s20_1, 0 is substituted in a global variable abort, and the process proceeds to s20_2.

In s20_2, a high-level description, a manpower generation RTL, Pipeline information and Port correspondence information are read. Thus, a set of input Ports in the high-level description is denoted to be I1, and a set of output Ports therein is denoted to be O1. Further, a set of input Ports in the manpower generation RTL is denoted to be I2, and a set of output Ports therein is denoted to be O2. Then, the process proceeds to s20_3.

In s20_3, the Sim model generating means disclosed in Japanese Unexamined Patent Publication No. 2009-230451 is applied and thereby Sim corresponding to N cycles with a generation Sim model as a target is executed. Then, the process proceeds to s20_4.

In s20_4, signal sequences of respective inputs i1∈I1 and i2∈I2 are stored as sets (i1,i1v,i1c)∈I1sig and (i2,i2v,i2c) ∈I2sig of pairs of Port names, values and cycles inclusive of cycle information. Then, signal change sequences of respective outputs o1∈O1 and o2∈O2 are stored inclusive of cycle information with sets (o1,o1v,o1c)∈O1sig and (o2,o2v,o2c) ∈O2sig of pairs of Port Names, values and cycles being taken as global variables in particular. Then, the process proceeds to s20_5.

In s20_5, it is determined whether the Sim results are consistent. If it is determined to coincide with each other, then the process proceeds to s20_6. If it is determined not to coincide with each other, then the process proceeds to s20_11.

In s20_6, it is determined whether an input signal sequence and an output signal sequence in the high-level description and the manpower generation RTL completely coincide with each other (I1sig==I2sig∧ O1sig==O2sig). If it is determined that they completely coincide with each other, then the process proceeds to s20_7. If it is determined that they do not coincide with each other, then the process proceeds to s20_8.

In s20_7, a character string CA is substituted in a variable flg, and the process proceeds to s20_8.

In s20_8, it is determined based on Pipeline information whether a Pipeline specification is present. If it is determined to exist, then the process proceeds to s20_9. If it is determined not to exist, then the process proceeds to s20_14.

In s20_9, "Checking for Pipeline architecture specification" to be described later is executed, and the process proceeds to s20_10.

In s20_10, it is determined whether the manpower generation RTL satisfies the Pipeline architecture specification. If it is determined to be satisfied, then the process proceeds to s20_12. If it is determined not to be satisfied, then the process proceeds to s20_11.

In s20_11, 1 is substituted in a global variable abort, and the process is terminated.

In s20_12, the "information extraction process targeted for the Pipeline synthesis RTL" that is of the process defined in the embodiment shown in FIG. 16 is executed, and the process proceeds to s20_13.

In s20_13, a character string PIPE is substituted in a variable flg, and the process proceeds to s20_14.

In s20_14, a global variable Tsig indicative of a set of sets is denoted to be Tsig={I1sig, O1sig, I2sig, O2sig}, and the process proceeds to s20_15.

In s20_15, it is determined whether Tsig is empty. If it is determined to be empty, then the process proceeds to s20_18. If it is determined not to be empty, then the process proceeds to s20_16.

In s20_16, one tsig∈Tsig is taken, and Tsig is set to be Tsig=Tsig−{tsig}. Then, the process proceeds to s20_17.

In s20_17, a "Throughput cycle number estimation process for tsig" to be described later is performed, and the process proceeds to s20_15.

In s20_18, input cycle information corresponding to I1sig and I2sig, i.e., input cycle information in a high-level description, and input cycle information in a manpower RTL description are read, and the process proceeds to s20_19.

In s20_19, it is determined whether the properties of the full inputs for the input cycle information corresponding to the high-level description and the manpower RTL description are both "constant" or not. If it is determined to be both constant, then the process proceeds to s20_20. If it is determined not to be so, then the process proceeds to s20_24.

In s20_20, the ratios between Throughput cycles of corresponding Ports relative to the input cycle information corresponding to the high-level description and the manpower RTL description are determined respectively. It is determined whether they all become the same value. If it is determined that they are the same value, then the process proceeds to s20_21. If it is determined that they are not the same value, then the process proceeds to s20_24.

In s20_21, output cycle information corresponding to O1sig and O2sig, i.e., output cycle information in a high-level description, and output cycle information in a manpower RTL description are read, and the process proceeds to s20_22.

In s20_22, it is determined whether the properties of the full inputs for the output cycle information corresponding to the high-level description and the manpower RTL description are both "constant" or not. If it is determined to be both constant, then the process proceeds to s20_23. If it is determined not to be so, then the process proceeds to s20_24.

In s20_23, the ratios between Throughput cycles of corresponding Ports relative to the output cycle information corresponding to the high-level description and the manpower RTL description are determined respectively. It is determined whether they all become the same value. If it is determined that they are the same value, then the process proceeds to s20_25. If it is determined that they are not the same value, then the process proceeds to s20_24.

In s20_24, it is determined whether a variable flg coincides with a character string CA. If it is determined that they coincide with each other, then the process proceeds to s20_26. If it is determined not to be so, then the process proceeds to s20_27.

In s20_25, it is determined whether the variable flg coincides with a character string PIPE. If it is determined that they coincide with each other, then the process proceeds to s20_28. If it is determined not to be so, then the process proceeds to s20_30.

In s20_26, a manpower RTL is identified as a cycle accurate RTL, and the process proceeds to s20_31.

In s20_27, it is determined whether the variable flg coincides with a character string PIPE. If it is determined that they coincide with each other, then the process proceeds to s20_28. If it is determined not to be so, then the process proceeds to s20_29.

In s20_28, the manpower RTL is identified as a Pipeline RTL, and the process proceeds to s20_31.

In s20_29, the manpower RTL is identified as a periodic ratio constant RTL, and the process proceeds to s20_31.

In s20_30, the manpower RTL is identified as a periodic ratio non-constant RTL, and the process proceeds to s20_31.

In s20_31, classification information on each identified manpower RTL is added to and stored in its corresponding input/output cycle information of the manpower RTL. Then, the process is terminated.

<<Detailed Flow for Input/Output Cycle Information Extraction s20_9>>

Figure 101:
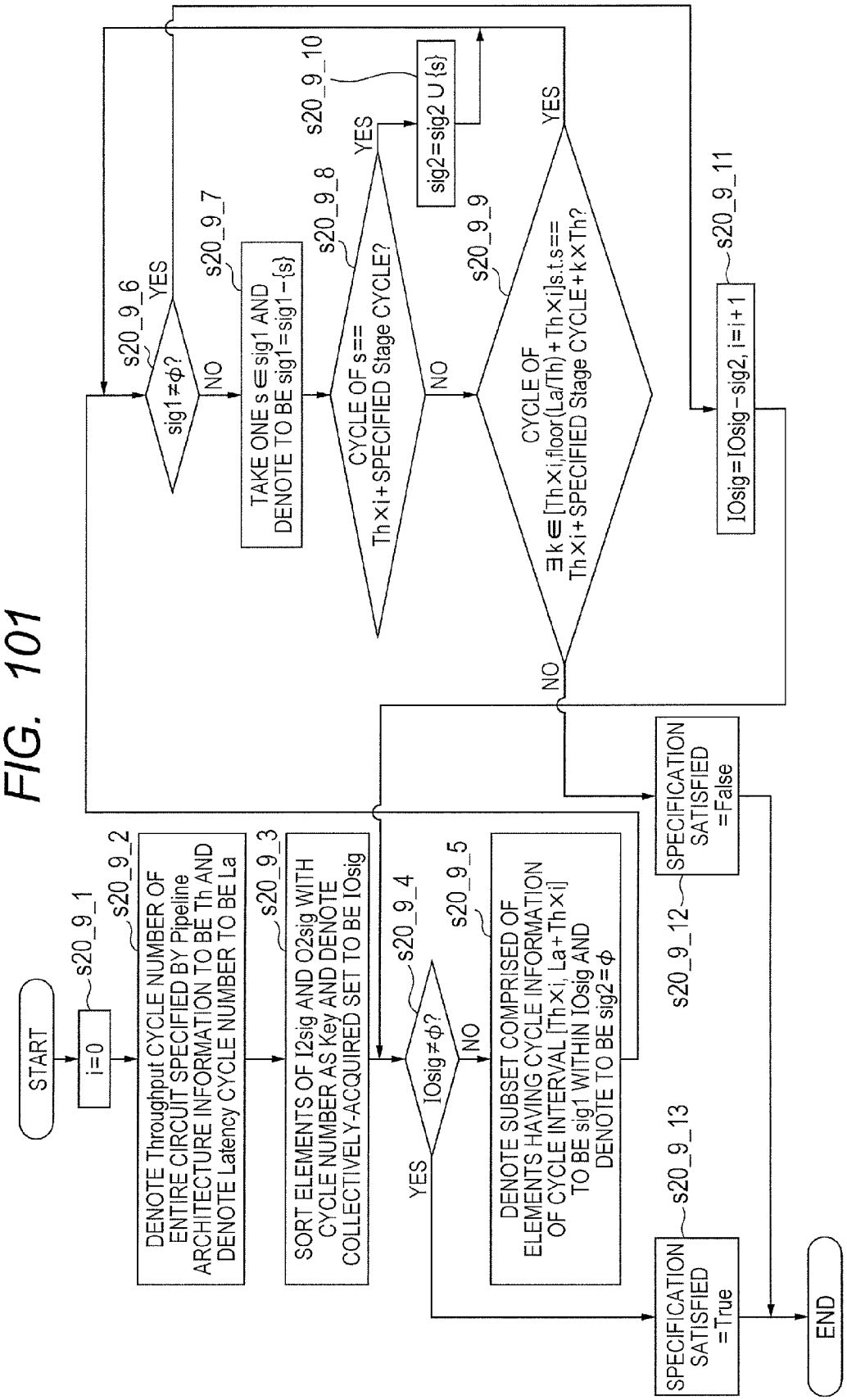
FIG. 101 is a flowchart illustrating a detailed process for Pipeline architecture specification checking of s20_9.

A detailed process flow for the Pipeline architecture specification checking in s20_9 is illustrated in FIG. 101. The contents in respective steps are as follows:

In s20_9_1, 0 is substituted in a variable i, and the process proceeds to s20_9_2.

In s20_9_2, a Throughput cycle number specified by Pipeline architecture information is substituted in a variable Th, and a Latency cycle number is substituted in a variable La. Then, the process proceeds to s20_9_3.

In s20_9_3, the sum of sets of an input signal sequence I2sig and an output signal change sequence O2sig in a manpower RTL is taken. Elements are sorted with a cycle number as a key in ascending order. The resulting set is denoted to be IOsig, and the process proceeds to s20_9_4.

In s20_9_4, it is determined whether IOsig is empty. If it is determined to be empty, then the process proceeds to s20_9_13. If it is determined not to be empty, then the process proceeds to s20_9_5.

In s20_9_5, in IOsig, a subset comprised of elements in which cycle numbers are included in a cycle period or interval [Th*i, La+Th*i] is identified. It is denoted to be sig1, and a set sig2 is denoted to be an empty set. Then, the process proceeds to s20_9_6.

In s20_9_6, it is determined whether the set sig1 is empty. If it is determined to be empty, then the process proceeds to s20_9_11. If it is determined not to be empty, then the process proceeds to s20_9_7.

In s20_9_7, one s∈sig1 is taken, and sig1 is set to be sig1=sig1−{s}. Then, the process proceeds to s20_9_8.

In s20_9_8, it is determined whether the cycle number of s coincides with "Th*i+specified Stage cycle number". If it is determined that they coincide with each other, then the process proceeds to s20_9_10. If it is determined that the do not coincide with each other, then the process proceeds to s20_9_9.

In s20_9_9, it is determined whether such a positive number k∈[Th*i, floor(La/Th)+Th*i] that the cycle number of s coincides with "Th*i+specified Stage cycle number+k*Th" exists. If it is determined to exist, then the process proceeds to s20_9_6. If it is determined not to exist, then the process proceeds to s20_9_12. Here, the function floor ( ) is a function of returning the rounding-down of a result of partitioning.

In s20_9_10, sig2=sig2∪{s} is executed, and the process proceeds to s20_9_6.

In s20_9_11, IOsig=IOsig−sig2 and i=i+1 are carried out, and the process proceeds to s20_9_4.

In s20_9_12, the process is terminated assuming that specification satisfied=False, that is, a specification in which a manpower RTL is specified to its corresponding Pipeline architecture information is not satisfied.

In s20_9_13, the process is terminated assuming that specification satisfied=True, i.e., a specification in which a manpower RTL is specified to its corresponding Pipeline architecture information is satisfied.

<<Detailed Flow for Input/Output Cycle Information Extraction s20_17>>

Figure 102:
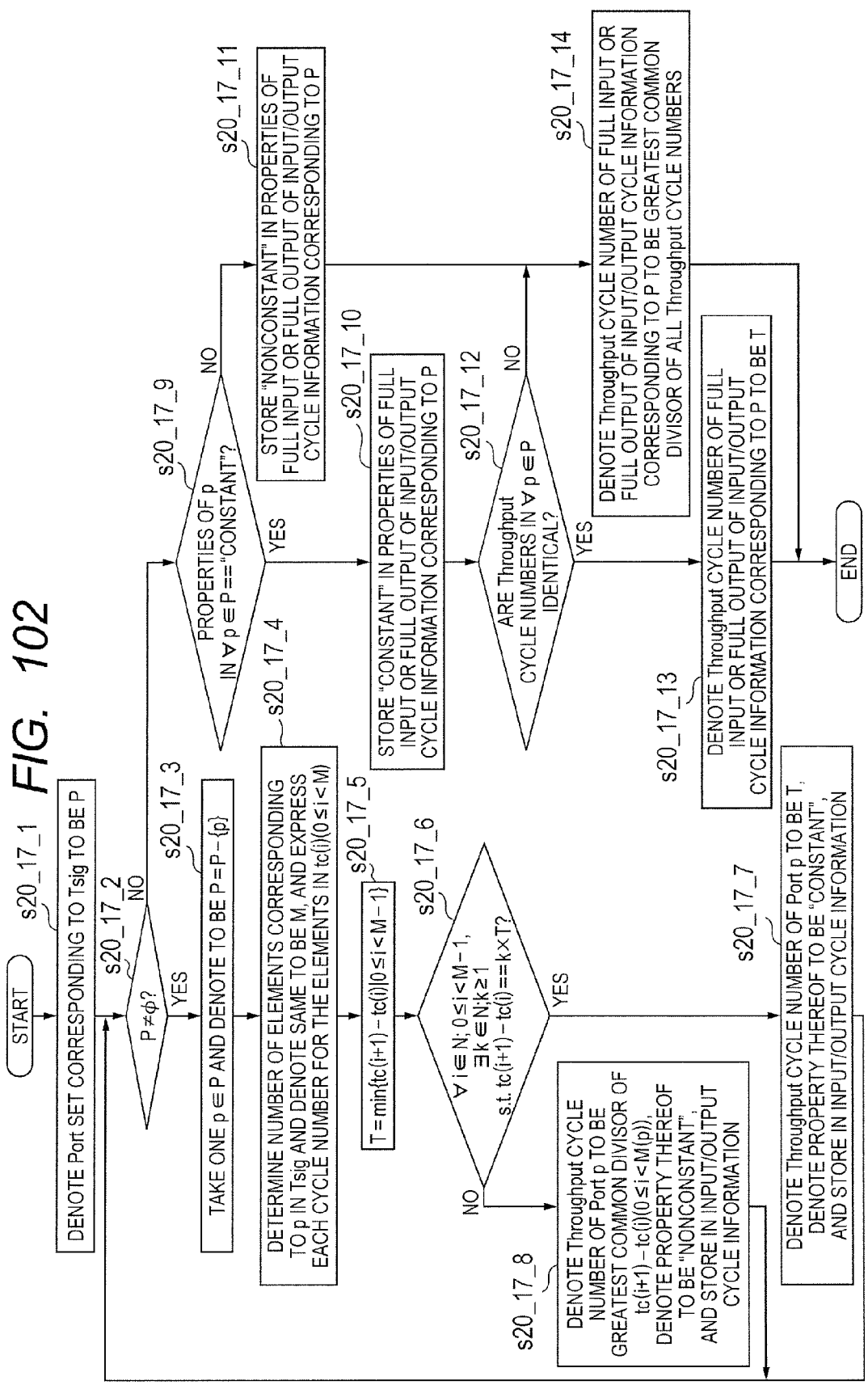
FIG. 102 is a flowchart illustrating a detailed process at a Throughput cycle-number estimation of s20_17.

A detailed process flow for the estimation of Throughput cycle number in s20_17 is illustrated in FIG. 102. The contents in respective steps are as follows:

In s20_17_1, a Port set corresponding to Tsig is denoted to be P, and the process proceeds to s20_17_2.

In s20_17_2, it is determined whether the set P is empty. If it is determined to be empty, then the process proceeds to s20_17_9. If it is determined not to be empty, then the process proceeds to s20_17_3.

In s20_17_3, one p∈P is taken, and P is set to be P=P−{p}. Then, the process proceeds to s20_17_4.

In s20_17_4, the number of elements corresponding to p in Tsig is determined and denoted to be M. Then, the process proceeds to s20_17_5. Here, the respective cycle numbers for the corresponding elements are denoted to be expressed in tc(i)(0≤i<M).

In s20_17_5, the minimum value of cycle intervals between the continuous elements is determined and substituted in a variable T. That is, T=min{tc(i+1)−tc(i)|0≤i<M−1} is executed, and the process proceeds to s20_17_6.

In s20_17_6, it is determined whether the cycle intervals between the continuous elements are all an integral multiple of T, i.e., a proposition[∀i∈N; 0≤i<M−1, ∃k∈N; k≥1 s.t. tc(i+1)−tc(i)==k×T" is established. If it is determined that it is established, then the process proceeds to s20_17_7. If it is determined not to be established, then the process proceeds to s20_17_8.

In s20_17_7, a Throughput cycle number for each Port p is denoted to be T, and its property is denoted to be "constant", which is stored in its corresponding input/output cycle information corresponding to the Port set P. Then, the process proceeds to s20_17_2.

In s20_17_8, the Throughput cycle number for the Port p is denoted to be the greatest common advisor T of cycle intervals (tc(i+1)−tc(i)(0≤i<M−1)) between the continuous elements. Its property is denoted to be "non-constant" and stored in the input/output cycle information corresponding to the Port set P. Then, the process proceeds to s20_17_2.

In s20_17_9, it is determined whether the properties of Ports p that belong to the Port set P are all "constant". If it is determined to be so, then the process proceeds to s20_17_10. If it is determined not to be so, then the process proceeds to s20_17_11.

In s20_17_10, "constant" is stored in the property of the full input or output of the input/output cycle information corresponding to the Port set P, and the process proceeds to s20_17_2.

In s20_17_11, "non-constant" is stored in the property of the full input or output of the input/output cycle information corresponding to the Port set P, and the process proceeds to s20_17_4.

In s20_17_12, it is determined whether the Throughput cycle numbers of Ports p that belong to the Port set P are all identical to each other. If it is determined that they are identical, then the process proceeds to s20_17_13. If it is determined that even one of them is different thereamong, then the process proceeds to s20_17_14.

In s20_17_13, T is stored in the Throughput cycle number for the full input or output of the input/output cycle information corresponding to the Port set P, and the process is terminated.

In s20_17_14, the greatest common divisor of Throughput cycle numbers of all Ports is stored in the Throughput cycle number for the full input or output of the input/output cycle information corresponding to the Port set P. Then, the process is terminated.

<<Details of Correspondence-FF Extraction Process s30>>

The contents of processing in the correspondence-FF extraction process s30 are nearly identical to the correspondence-FF extraction process s3 in the fourth embodiment of FIG. 16. Points of difference therebetween are as follows: In FIG. 16, the synthesis resultant RTL has been read as the input information, but each manpower RTL is read in the fifth embodiment. In the input/output cycle information extraction process, the process is not performed in the fifth embodiment where the global variable abort is set to 1. Though the classification name of the manpower RTL differ between both embodiments, the process may comply with the correspondence of FIG. 103.

Figures 103, 104:
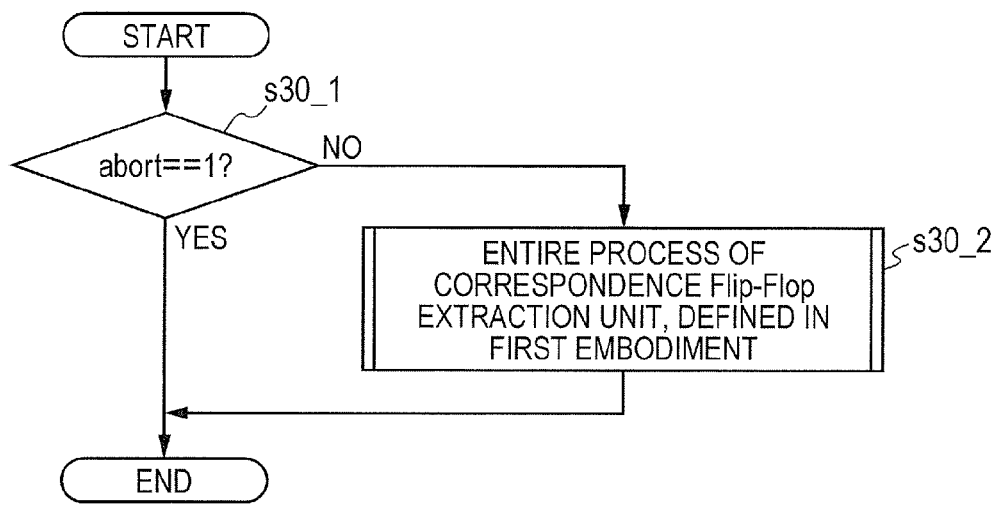
FIG. 103 is an explanatory diagram showing the correspondence of classified names of different manpower RTLs between fifth and fourth embodiments in a correspondence-FF extraction process s30.
FIG. 104 is a flowchart illustrating a process predicated on a change in reading behavior in accordance with FIG. 103.

Thus, if a process as to whether the processing is done in accordance with the value of the global variable abort is added to the fourth embodiment of FIG. 16, the replacement of each process in accordance with the correspondence relation shown in FIG. 103 is performed, and the synthesis resultant RTL is read as or replaced with its corresponding manpower RTL, the process of the fifth embodiment can be defined.

A flowchart for the process premised on such a replacement is illustrated in FIG. 104. The contents in respective steps are as follows:

In s30_2, the replacement of the "entire process of correspondence-FF extraction unit", which has been defined in the fourth embodiment, is performed in accordance with the correlation between the classification names of RTLs. And a synthesis resultant RTL reading process is replaced with a manpower RTL reading process, after which it is executed. Then, the process is terminated.

In s30_1, it is determined whether the global variable abort is equal to 1. If it is determined to be equal, then the process is terminated. If it is determined not to be equal, then the process proceeds to s30_2.

<<Details of Reset Elongation Cycle Extraction Process s40>>

The contents of the reset elongation cycle extraction process s40 are nearly identical to the fourth embodiment of FIG. 16.

Points of difference therebetween are as follows: Though the synthesis resultant RTL has been read as the input information in the first embodiment, the manpower RTL is read in the third embodiment. When the global variable abort has been set to 1 in the input/output cycle information extraction process, the process is not executed in the present embodiment. Although the classification name of the manpower RTL differs, the process may comply with the correspondence of FIG. 105.

Figures 105, 106:
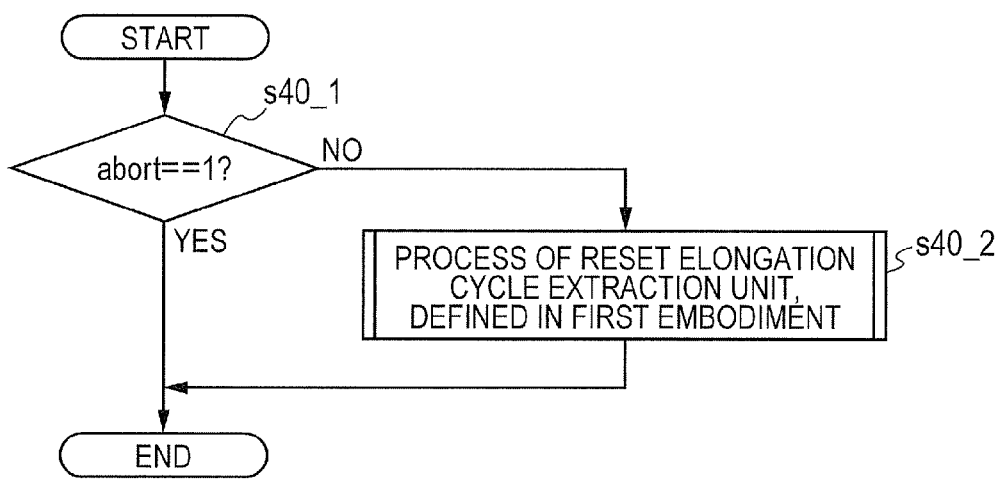
FIG. 105 is an explanatory diagram showing the correspondence of classified names of different manpower RTLs between the fifth and fourth embodiments in a reset elongation cycle extraction process s40.
FIG. 106 is a flowchart illustrating a process predicated on a change in reading behavior in accordance with FIG. 105.

Thus, if a process as to whether the processing is done in accordance with the value of the global variable abort is added to the fourth embodiment of FIG. 16, the replacement of each process in accordance with the correspondence relation shown in FIG. 105 is performed, and the synthesis resultant RTL is read as or replaced with its corresponding manpower RTL, the process of the fifth embodiment in FIG. 97 can be defined.

A flowchart for the process premised on such a replacement is illustrated in FIG. 106. The contents in respective steps are as follows:

In s40_1, it is determined whether the global variable abort is equal to 1. If it is determined to be equal, the process is terminated. If it is determined not to be equal, then the process proceeds to s40_2.

In s40_2, the replacement of the "process of the reset elongation cycle extraction unit" defined in the fourth embodiment of FIG. 16 is performed in accordance with the correlation between the classification names of RTLs. The synthesis resultant RTL reading process is replaced with a manpower RTL reading process, after which it is executed. Then, the process is terminated.

<<Details of Verification Script Generation Process s50>>

The contents of the verification script generation process s50 are almost identical to the verification script alteration process in the fourth embodiment in FIG. 16. Points of difference therebetween are as follows: Though the synthesis resultant RTL has been read as the input information in the fourth embodiment, the manpower RTL is read in the fifth embodiment of FIG. 97. When the global variable abort has been set to 1 in the input/output cycle information extraction process, the process is not executed in the fifth embodiment. Though the model verification script has been read as the input information in the fourth embodiment of FIG. 16, no model verification script exists in the fifth embodiment of FIG. 97. Although the classification name of the manpower RTL differs, the process may comply with the correspondence of FIG. 107.

Since the model verification script does not exist in the fifth embodiment, it is necessary to set a "high-level description/synthesis resultant RTL-based file reading" command and a "clock information setting" command to a verification script separately. Since the contents of processing are however self-evident, a detailed description thereof will be omitted.

The "input/output correspondence setting alteration process" executed in each RTL classification is replaced with the "input/output correspondence setting generation process". The input/output port correlation information extracted from the model verification script in the fourth embodiment of FIG. 16 is given by the Port correspondence information in the fifth embodiment of FIG. 97.

The "reset cycle period setting alteration process" in the fourth embodiment of FIG. 16 is replaced with a "reset cycle period setting generation process" to be shown subsequently in the fifth embodiment of FIG. 97.

Thus, a process as to whether the above process should be done in accordance with the value of a global variable abort is added to the fourth embodiment of FIG. 16, and the process of the fifth embodiment can be defined in the form of considering points of difference from the fourth embodiment.

A flow for a "verification script generation process" having taken into consideration the points of difference from the fourth embodiment of FIG. 16 is illustrated in FIG. 108. The contents in respective steps are as follows:

In s50_1, it is determined whether the global variable abort is equal to 1. If it is determined to be equal, then the process is terminated. If it is determined not to be equal, then the process proceeds to s50_2.

In s50_2, a command for specifying files in a high-level description and a synthesis resultant RTL, targeted for checking is generated, and the process proceeds to s50_3.

In s50_3, a command for setting clock information (clock name, period, Duty ratio, etc.) targeted for checking is generated, and the process proceeds to s50_4.

In s50_4, the process of the "verification script alteration unit" already defined in the fourth embodiment is performed, and the process is terminated. The "reset cycle period setting alteration process" of the "verification script alteration unit" is however replaced with a "reset cycle period setting generation process" to be described later.

<<Details of Reset Cycle Period Setting Generation Process>>

The reset cycle period setting generation process will be explained. The reset cycle period setting generation process makes use of a high-level description and reset cycle period information with respect to the high-level description and RTL to generate the following. That is, a reset cycle period setting command reset for each of the high-level description/RTL is generated. On the assumption that there is no difference in reset process between both of the high-level description and the synthesis resultant RTL, a reset signal name, a reset value and a cycle number necessary for the reset process are extracted from the high-level description. A cycle period in which the extracted cycle number for the reset process is combined with a cycle period for reset cycle period information is set to the reset commands for both the high-level description/RTL description.

Figure 109:
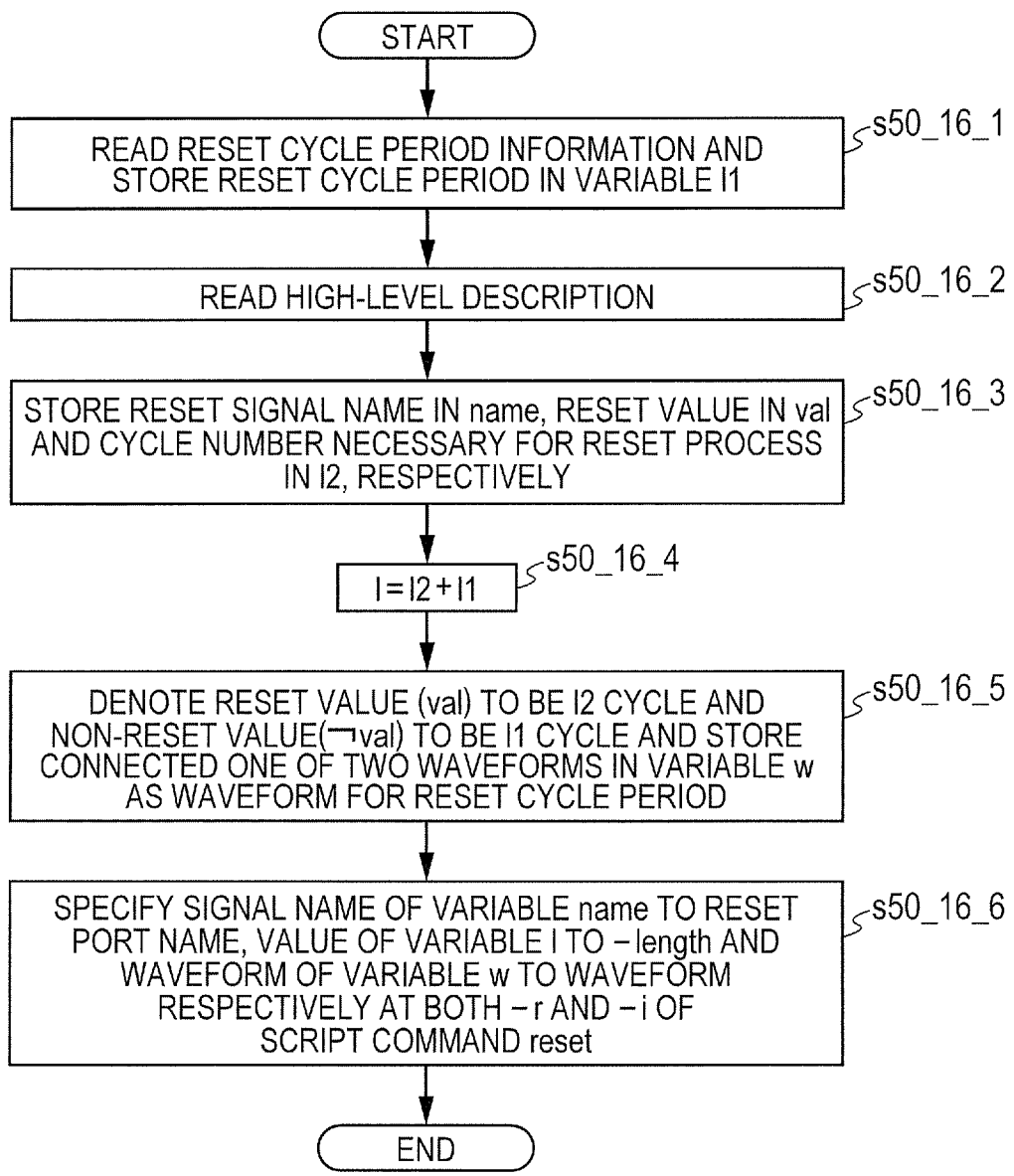
FIG. 109 is a flowchart illustrating a reset cycle period setting generation process in the verification script generation process s50.

A flow for the "reset cycle period setting generation process" is illustrated in FIG. 109. This process corresponds to the process of FIG. 91 in the fourth embodiment. The contents in respective steps in FIG. 109 are shown as follows: Step numbers in FIG. 109 are set as s50_16_1 through s50_16_6 for convenience so as to make easy correspondence to step numbers s5_16_1 through s5_16_6 in FIG. 91.

In s50_16_1, reset cycle period information is read, and a reset cycle period is stored in a variable l1. Then, the process proceeds to s50_16_2.

In s50_16_2, a high-level description is read, and the process proceeds to s50_16_3.

In s50_16_3, a reset signal name, a reset value, and a cycle number necessary for a reset process are respectively stored in a variable name, a variable val, and a variable l2 from the high-level description. Then, the process proceeds to s50_16_4.

In s50_16_4, the value of l2+l1 is stored in a variable l, and the process proceeds to s50_16_5.

In s50_16_5, a reset value (val) is denoted to be an l2 cycle, and a non-reset value ($\neg$ val) is denoted to be an l1 cycle. A connected one of two waveforms is stored in a variable w. Then, the process proceeds to s50_16_6.

In s50_16_6, the signal name of a variable name is specified to a reset port name, the value of the variable l is specified to −length, and the waveform of the variable w is specified as the waveform of the reset cycle period, respectively, at both of −r and −i of a script command reset. Then, the process is terminated.

The fifth embodiment also basically brings about operative effects similar to those in the first through fourth embodiments. In particular, unlike those, the speed-up of high level equivalence checking targeted for the high-level description and the manpower generation RTL, which is not taken before and after a behavioral synthesis, is enabled.

Although the invention made above by the present inventors has been described specifically on the basis of the preferred embodiments, the present invention is not limited to the embodiments. It is needless to say that various changes can be made thereto within the scope not departing from the gist thereof. The high-level description taken as the behavioral description is not limited to the System C, and the hardware description is not limited to the RTL description. They can respectively be modified as appropriate.

The present invention is generally applicable to the design of an electronic circuit and a logic module to which a behavioral synthesis can be applied. Specifically, the present invention can widely be applied to the design of an image processing IP (IP is a generic name for a semiconductor integrated circuit or a circuit module applied thereto) such as MPEG, a voice processing IP, a communication processing IP, a microcontroller peripheral IP typified by a timer or IIC, etc.

What is claimed is:

1. A method of checking the equivalence of a high-level description taken as a behavioral description, and a hardware description obtained based on the high-level description, using a computer, said equivalence checking method comprising the steps of:
causing the computer to generate information about correlations between flip-flops with a feedback loop in the hardware description and variables associated therewith with a backward data dependence in a high-level description; and
causing the computer to check the equivalence using the correlation information related to the backward data dependence.

2. The equivalence checking method according to claim 1, wherein when the equivalence is checked by an inductive method, the computer extracts a reset cycle number corresponding to the minimum number of stages of flip-flops necessary to carry values to the flip-flops in the feedback loop, and uses a symbolic simulation result about the extracted reset cycle number in checking of the equivalence as an initial state of the feedback loop.

3. The equivalence checking method according to claim 2, wherein the computer generates as the correlation information related to the backward data dependence, first correlation information in which flip-flops corresponding to variables are placed in a one-to-one correspondence with the variables.

4. The equivalence checking method according to claim 3, wherein the computer generates as the correlation information related to the backward data dependence, second correlation information in which flip-flops corresponding to variables are placed in a one-to-many correspondence with the variables.

5. The equivalence checking method according to claim 4, further including the step of causing the computer to generate information indicative of a correspondence relation between flip-flops without a feedback loop in the hardware description and variables associated therewith with only a forward data dependence in a high-level description,
wherein the computer performs equivalence checking using the correlation information related to the forward data dependence along with the correlation information related to the backward data dependence.

6. The equivalence checking method according to claim 5, wherein the computer generates as the correlation information related to the forward data dependence, third correlation information in which flip-flops corresponding to variables are placed in a one-to-one correspondence with the variables.

7. The equivalence checking method according to claim 6, wherein the computer generates as the correlation information related to the forward data dependence, fourth correlation information in which flip-flops corresponding to variables are placed in a one-to-many correspondence with the variables.

8. The equivalence checking method according to claim 7, wherein the computer checks equivalence while performing an addition and a modification on the reset cycle number, the first correlation information related to the backward data dependence, the second correlation information related to the backward data dependence, the third correlation information related to the forward data dependence and the fourth correlation information related to the forward data dependence, assign, as priorities related to the addition and the modification, a first priority to the reset cycle number, a second priority to the first correlation information related to the backward data dependence, a third priority to the second correlation information related to the backward data dependence, a fourth priority to the third correlation information related to the forward data dependence, and a fifth priority to the fourth correlation information related to the forward data dependence, respectively, and performs the addition and modification in accordance with the priorities when a process for the equivalence checking is not completed within a predetermined time constraint.

9. A non-transitory computer readable medium storing an executable equivalence checking program for causing a computer to check the equivalence of a high-level description taken as a behavioral description, and a hardware description obtained based on the high-level description, said equivalence checking program causing the computer to execute a step for generating as support information for equivalence checking, correlation information related to a backward data dependence between flip-flops with a feedback loop in the hardware description and variables associated therewith in a high-level description, and a step for performing checking for the equivalence using the correlation information related to the backward data dependence.

10. The non-transitory computer readable medium storing the executable equivalence checking program according to claim 9, wherein the computer is caused in the generation step to extract a reset cycle number corresponding to the minimum number of stages of flip-flops necessary to carry values to the flip-flops in the feedback loop, and
in the checking step the computer is caused to check equivalence by an inductive method, using a symbolic simulation result about the extracted reset cycle number in an initial state of the feedback loop.

11. The non-transitory computer readable medium storing the executable equivalence checking program according to claim 10, wherein the computer in the generation step is caused to generate as the correlation information related to the backward data dependence, first correlation information in which flip-flops corresponding to variables are placed in a one-to-one correspondence with the variables.

12. The non-transitory computer readable medium storing the executable equivalence checking program according to claim 11, wherein the computer in the generation step is caused to generate as the correlation information related to the backward data dependence, second correlation information in which flip-flops corresponding to variables are placed in a one-to-many correspondence with the variables.

13. The non-transitory computer readable medium storing the executable equivalence checking program according to claim 12,
wherein in the generation step the computer is further caused to generate as support information for equivalence checking, correlation information related to a forward data dependence indicative of a correspondence relation between flip-flops without a feedback loop in the hardware description and variables associated therewith in a high-level description, and
wherein in the checking step the computer is caused to check equivalence using the correlation information related to the forward data dependence along with the correlation information related to the backward data dependence.

14. The non-transitory computer readable medium storing the executable equivalence checking program according to claim 13, wherein in the generation step, the computer is caused to generate as the correlation information related to the forward data dependence, third correlation information in which flip-flops corresponding to variables are placed in a one-to-one correspondence with the variables.

15. The non-transitory computer readable medium storing the executable equivalence checking program according to claim 14, wherein in the generation step, the computer is caused to generate as the correlation information related to the forward data dependence, fourth correlation information in which flip-flops corresponding to variables are placed in a one-to-many correspondence with the variables.

16. The non-transitory computer readable medium storing the executable equivalence checking program according to claim 15, wherein in the generation step, the computer is caused to execute a necessary addition and modification on the reset cycle number, the first correlation information related to the backward data dependence, the second correlation information related to the backward data dependence, the third correlation information related to the forward data dependence and the fourth correlation information related to the forward data dependence in accordance with priorities, and wherein in the checking step the computer is caused to check equivalence by reflection of the support information for the equivalence checking subjected to the necessary addition and modification thereon, assign, as priorities related to the addition and modification, a first priority to the reset cycle number, a second priority to the first correlation information related to the backward data dependence, a third priority to the second correlation information related to the backward data dependence, a fourth priority to the third correlation information related to the forward data dependence, and a fifth priority to the fourth correlation information related to the forward data dependence, respectively, and perform the addition and modification in accordance with the priorities when a process for the equivalence checking is not completed within a predetermined time constraint.

17. An equivalence checking device which checks by a program process, the equivalence of a high-level description taken as a behavioral description, and a hardware description obtained based on the high-level description, said equivalence checking device comprising:
a generation unit which generates by the program process, as support information for equivalence checking, correlation information related to a backward data dependence between flip-flops with a feedback loop in the hardware description and variables associated therewith in a high-level description; and
a checking unit which performs by the program process, checking for the equivalence using the correlation information related to the backward data dependence.

18. The equivalence checking device according to claim 17,
wherein the generation unit extracts by the program process, a reset cycle number corresponding to the minimum number of stages of flip-flops necessary to carry values to the flip-flops in the feedback loop, and
wherein the checking unit checks by the program process, equivalence by an inductive method, with a symbolic simulation result corresponding to the extracted reset cycle number being taken as an initial state of the feedback loop.

19. The equivalence checking device according to claim 18, wherein the generation unit generates by the program process, as the correlation information related to the backward data dependence, first correlation information in which flip-flops corresponding to variables are placed in a one-to-one correspondence with the variables.

20. The equivalence checking device according to claim 19, wherein the generation unit generates by the program process, as the correlation information related to the backward data dependence, second correlation information in which flip-flops corresponding to variables are placed in a one-to-many correspondence with the variables.

21. The equivalence checking device according to claim 20,
wherein the generation unit further generates by the program process, as support information for equivalence checking, correlation information related to a forward data dependence indicative of a correspondence relation between flip-flops without a feedback loop in a behavioral synthesis result and variables associated therewith in a high-level description, and
wherein the checking unit checks by the program process, equivalence using the correlation information related to the forward data dependence along with the correlation information related to the backward data dependence.

22. The equivalence checking device according to claim 21, wherein the generation unit generates by the program process, as the correlation information related to the forward data dependence, third correlation information in which flip-flops corresponding to variables are placed in a one-to-one correspondence with the variables.

23. The equivalence checking device according to claim 22, wherein the generation unit generates by the program process, as the correlation information related to the forward data dependence, fourth correlation information in which flip-flops corresponding to variables are placed in a one-to-many correspondence with the variables.

24. The equivalence checking device according to claim 23, wherein the generation unit performs by the program process, a necessary addition and modification on the reset cycle number, the first correlation information related to the backward data dependence, the second correlation information related to the backward data dependence, the third correlation information related to the forward data dependence and the fourth correlation information related to the forward data dependence in accordance with priorities, and
wherein the checking unit checks by the program process, equivalence by reflection of the support information for the equivalence checking subjected to the necessary addition and modification thereon, assigns, as priorities related to the addition and modification, a first priority to the reset cycle number, a second priority to the first correlation information related to the backward data dependence, a third priority to the second correlation information related to the backward data dependence, a fourth priority to the third correlation information related to the forward data dependence, and a fifth priority to the fourth correlation information related to the forward data dependence, respectively, and performs the addition and modification in accordance with the priorities when a process for equivalence checking is not completed within a predetermined time constraint.

* * * * *